(12) United States Patent
Gorohmaru et al.

(10) Patent No.: US 9,899,606 B2
(45) Date of Patent: Feb. 20, 2018

(54) COMPOSITION FOR ORGANIC ELECTROLUMINESCENT ELEMENT, ORGANIC ELECTROLUMINESCENT ELEMENT, DISPLAY AND LIGHTING

(71) Applicant: MITSUBISHI CHEMICAL CORPORATION, Chiyoda-ku (JP)

(72) Inventors: Hideki Gorohmaru, Kanagawa (JP); Tomomi Okamoto, Kanagawa (JP); Wataru Shimizu, Kanagawa (JP); Kazuhiro Nagayama, Kanagawa (JP); Takashi Oya, Kanagawa (JP); Koichi Ishibashi, Kanagawa (JP); Ichiro Imada, Kanagawa (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 945 days.

(21) Appl. No.: 13/939,881

(22) Filed: Jul. 11, 2013

(65) Prior Publication Data
US 2016/0043325 A1  Feb. 11, 2016

Related U.S. Application Data

(63) Continuation of application No. PCT/JP2012/050288, filed on Jan. 10, 2012.

(30) Foreign Application Priority Data

Jan. 11, 2011  (JP) .................................. 2011-003081

(51) Int. Cl.
*H01L 51/00* (2006.01)
*C09K 11/06* (2006.01)
(Continued)

(52) U.S. Cl.
CPC ............ *H01L 51/0072* (2013.01); *C09B 1/00* (2013.01); *C09B 3/02* (2013.01); *C09B 57/00* (2013.01);
(Continued)

(58) Field of Classification Search
None
See application file for complete search history.

(56) References Cited

U.S. PATENT DOCUMENTS

2005/0194892 A1* 9/2005 Lu ........................ H01L 51/5016
                                                              313/504
2008/0038586 A1  2/2008 Nishizeki et al.
(Continued)

FOREIGN PATENT DOCUMENTS

EP    1 317 005 A2    6/2003
JP    2004022334 A  *  1/2004
(Continued)

OTHER PUBLICATIONS

Machine English translation of Shimizu et al. (JP 2010-206191 A). Dec. 28, 2015.*
(Continued)

*Primary Examiner* — J. L. Yang
(74) *Attorney, Agent, or Firm* — Oblon, McClelland, Maier & Neustadt, L.L.P.

(57) ABSTRACT

The invention relates to a composition for organic electroluminescent element, which comprises: a solvent; and a compound group α for organic electroluminescent element that is constituted of at least two kinds of compounds which each have a molecular weight of 3,000 or less and have a structure comprising a plurality of aromatic ring groups linked to each other, wherein the compound group α comprises: a compound α1; and another compound αn satisfying a specific condition.

10 Claims, 1 Drawing Sheet

(51) Int. Cl.
  *H01L 27/32* (2006.01)
  *C09B 57/00* (2006.01)
  *C09B 1/00* (2006.01)
  *C09B 3/02* (2006.01)
  *H01L 51/50* (2006.01)

(52) U.S. Cl.
  CPC .......... *C09B 57/001* (2013.01); *C09B 57/008* (2013.01); *C09K 11/06* (2013.01); *H01L 27/3244* (2013.01); *H01L 51/0004* (2013.01); *H01L 51/006* (2013.01); *H01L 51/0052* (2013.01); *H01L 51/0054* (2013.01); *H01L 51/0058* (2013.01); *H01L 51/0061* (2013.01); *H01L 51/0067* (2013.01); *H01L 51/0073* (2013.01); *H01L 51/0085* (2013.01); *H01L 51/5024* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1059* (2013.01); *C09K 2211/1088* (2013.01); *H01L 51/005* (2013.01); *H01L 51/5012* (2013.01); *H01L 2251/5384* (2013.01)

(56) References Cited

U.S. PATENT DOCUMENTS

| | | |
|---|---|---|
| 2009/0051273 A1 | 2/2009 | Tsuji et al. |
| 2009/0079329 A1* | 3/2009 | Murakami ............. C09K 11/06 313/504 |
| 2009/0146552 A1 | 6/2009 | Spindler et al. |
| 2012/0001158 A1 | 1/2012 | Asari et al. |
| 2012/0168730 A1 | 7/2012 | Kim et al. |

FOREIGN PATENT DOCUMENTS

| | | |
|---|---|---|
| JP | 2009-141339 | 6/2009 |
| JP | 2010-087488 | 4/2010 |
| JP | 2010-150425 A | 7/2010 |
| JP | 2010-183072 | 8/2010 |
| JP | 2010-206191 | 9/2010 |
| JP | 2011-26237 | 2/2011 |
| JP | 2011-51936 | 3/2011 |
| WO | 2006-008976 | 1/2006 |
| WO | 2006-093007 | 9/2006 |
| WO | 2010/082924 A1 | 7/2010 |
| WO | 2010/098246 A1 | 9/2010 |
| WO | WO 2010/147319 A2 | 12/2010 |

OTHER PUBLICATIONS

Machine English translation of Takeuchi et al. (JP 2009-141339 A). Apr. 1, 2016.*
Machine English translation of Matsuura et al. (JP 2004-022334 A). Dec. 15, 2016.*
International Search Report JP 2012-050288 Corresponding to Japanese patent application No. 2011-003081.
International Search Report dated Mar. 19, 2012, in PCT Application No. PCT/JP2012/050288.
Combined Chinese Office Action and Search Report dated Jun. 16, 2014, in Patent Application No. 201280005151.5 (with English-language translation).
International Search Report dated Mar. 19, 2012, in PCT/JP2012/050288 filed Jan. 10, 2012.
Supplementary Partial European Search Report dated Mar. 31, 2017, in European Patent Application No. 12734183.2 filed Jan. 10, 2012.
Extended European Search Report dated Aug. 16, 2017 in Patent Application No. 12734183.2.

* cited by examiner

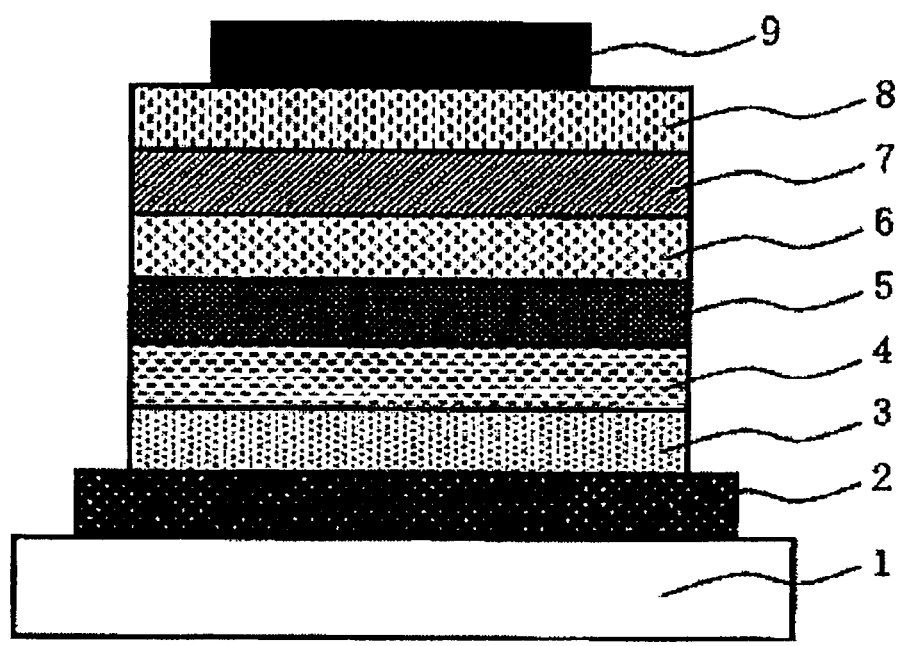

COMPOSITION FOR ORGANIC ELECTROLUMINESCENT ELEMENT, ORGANIC ELECTROLUMINESCENT ELEMENT, DISPLAY AND LIGHTING

TECHNICAL FIELD

The present invention relates to a composition for organic electroluminescent element, an organic electroluminescent element, a display, and a lighting. More particularly, the invention relates to a composition which contains, as a solid component, at least two kinds of low-molecular compounds that are similar in the framework, and to an organic electroluminescent element having a layer formed from the composition by a wet film formation method, and a display and a lighting which each include the organic electroluminescent element.

BACKGROUND ART

Organic electroluminescence (hereinafter sometimes abbreviated to "EL") displays have been developed enthusiastically since organic EL elements of the multilayer type produced by a vacuum deposition method were marketed by Kodak Company, and are presently coming to be put to practical use.

Such a multilayer type organic electroluminescent element is configured by superposing a plurality of organic layers (an emissive layer, hole injection layer, hole transport layer, electron transport layer, etc.) between an anode and a cathode. Since the organic electroluminescent element itself emits light, the display has a wide viewing angle and attains high visibility. This display is also attracting attention from the standpoint of space saving, etc. because the organic EL element is of a thin film type.

Unlike the light-emitting diodes and cold-cathode tubes which have been in practical use, organic electroluminescent element have a marked feature that the elements emit light areally. Among the applications where this feature is utilized are lightings and the backlights of full-color displays in which color filters are used.

In the case where organic electroluminescent element are used in a lighting, it is possible to obtain a desired color of luminescence by causing elements of multiple colors to emit light and mixing the colors. For example, in the case where red, green, and blue luminescent materials are used, white luminescence is possible. In the case where red and green luminescent materials are used, yellow luminescence is possible.

One method for mixing colors of luminescence is to incorporate luminescent materials of multiple colors into the same emissive layer. Examples of methods for forming an emissive layer include a vacuum deposition method and a wet film formation method.

In the case of the vacuum deposition method, at least four compounds, including red, green, and blue luminescent materials and a charge transport material, must be simultaneously vacuum-deposited (see, for example, patent document 1).

Meanwhile, in the case of the wet film forming method, luminescent materials and a charge transport material are used in the form of a solution in solvent, and there are cases where these materials are low-molecular compounds or where a high-molecular compound is used as the charge transport material (see, for example, patent document 2).

PRIOR-ART DOCUMENTS

Patent Documents

Patent Document 1: International Publication WO 2006/093007
Patent Document 2: International Publication WO 2006/008976

SUMMARY OF THE INVENTION

Problems that the Invention is to Solve

However, in the vacuum deposition method, it is exceedingly difficult to control the conditions of the vacuum deposition of three or more materials. Consequently, there is a problem that formation of such an emissive layer by a vacuum deposition method results in impaired reproducibility of element production, etc.

On the other hand, in the case of the wet film forming method, when luminescent materials and a charge transport material which are low-molecular compounds are used, there are cases where these materials have insufficient solubility or cause aggregation, frequently posing problems such as crystallizing-out and formation of a film which has blushed or is inhomogeneous. In addition, when a high-molecular compound is used as a charge transport material, there has been the following problem. Since the molecular weight of high-molecular materials are difficult to control and purification thereof is difficult as compared with low-molecular compounds, use of, for example, a phosphorescent compound as a luminescent material result in a decrease in luminescent efficiency.

Means for Solving the Problems

The present inventors diligently made investigations in order to overcome those problems. As a result, the inventors have found that a composition which contains at least two low-molecular compounds that are akin in chemical structure has high storage stability and is suitable for industrial use, and that an organic electroluminescent element having an emissive layer formed from the composition has a low operating voltage and a high luminescence efficiency. The invention has been thus completed.

Essential points of the invention reside in the following (1) to (17).
(1) A composition for organic electroluminescent element, which comprises a compound group α for organic electroluminescent element and a solvent, wherein
the compound group α is constituted of at least two kinds of compounds which each have a molecular weight of 3,000 or less and have a structure comprising a plurality of aromatic ring groups linked to each other,
the compound group α comprises a compound α1 which is the smallest in the number of aromatic ring groups and another compound αn (n is any integer of 2 or larger), and when a structure which is the largest in the number of the aromatic ring groups, of partial structures that are common between the compound α1 and the compound αn, is taken as a basic framework,
60% or more of the structure of the compound α1 is identical with the basic framework, and
the compounds which constitute the compound group α each is mixed in an amount of 1% by weight or larger.
(2) The composition for organic electroluminescent element according to the item (1) above, wherein the proportion of the compound group α to all solid components of the composition is 0.1-100% by weight.

(3) The composition for organic electroluminescent element according to the item (1) or (2) above, wherein the proportion of the solvent in the composition is 10% by weight or higher.

(4) The composition for organic electroluminescent element according to any one of the items (1) to (3) above, wherein the compounds included in the compound group α each are a charge transport material.

(5) The composition for organic electroluminescent element according to any one of the items (1) to (4) above, wherein the compounds included in the compound group α each are a compound represented by the following general formula (A):

[Chem. 1]

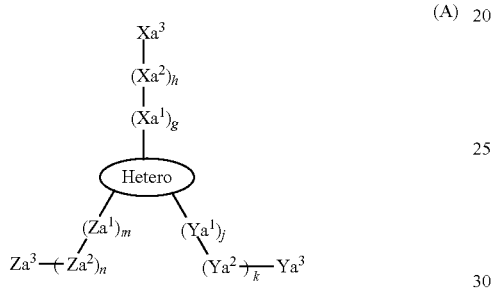
(A)

wherein "Hetero" represents any of trivalent substituents represented by the following structural formulae (A-1), (A-2), and (A-3); $Xa^1$, $Xa^2$, $Ya^1$, $Ya^2$, $Za^1$, and $Za^2$ each independently represent an aromatic hydrocarbon ring group which has 6-30 carbon atoms and may have a substituent or a heteroaromatic ring group which has 3-30 carbon atoms and may have a substituent; $Xa^3$, $Ya^3$, and $Za^1$ each independently represent a hydrogen atom, an aromatic hydrocarbon ring group which has 6-30 carbon atoms and may have a substituent, or a heteroaromatic ring group which has 3-30 carbon atoms and may have a substituent; and g, h, j, k, m, and n each represent an integer of 0 or larger).

[Chem. 2]

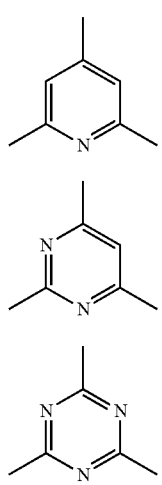

(A-1)

(A-2)

(A-3)

(6) The composition for organic electroluminescent element according to the item (5) above, wherein the compounds represented by general formula (A) each are any of compounds represented by the following general formulae (A-4), (A-5), and (A-6):

[Chem. 3]

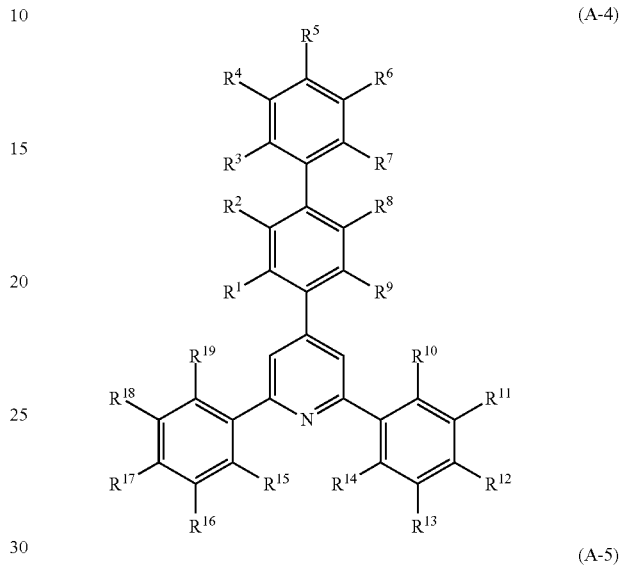
(A-4)

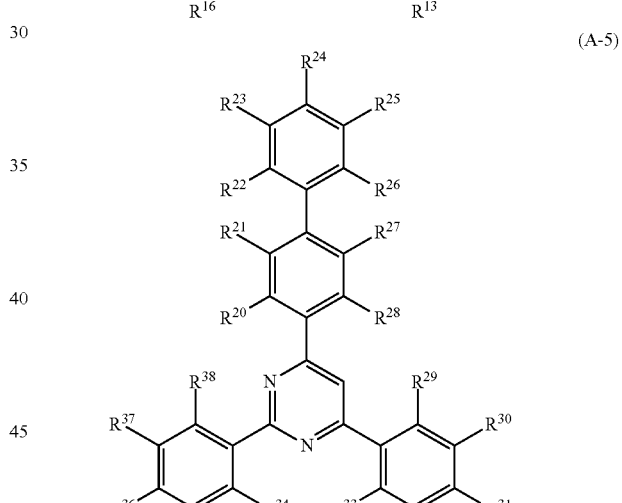
(A-5)

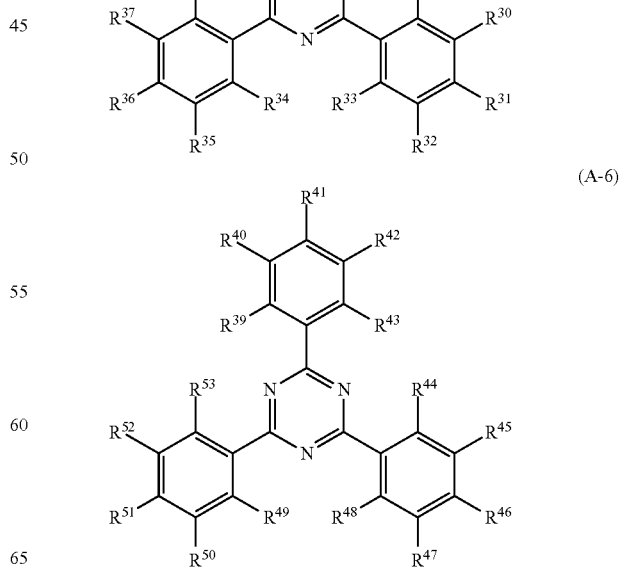
(A-6)

wherein $R^1$ to $R^{53}$ each independently represent a hydrogen atom, a nitrogen atom, an oxygen atom, a sulfur atom, an aromatic hydrocarbon ring group which has 6-30 carbon atoms and may have a substituent, or a heteroaromatic ring group which has 3-30 carbon atoms and may have a substituent, with the proviso that when $R^1$ to $R^{53}$ each are a nitrogen atom, an oxygen atom, or a sulfur atom, this atom combines with part of an adjoining substituent to form a ring.

(7) The composition for organic electroluminescent element according to the item (5) above, wherein the compounds represented by general formula (A) are represented by any of only two formulae selected from the group consisting of general formulae (A-4), (A-5), and (A-6).

(8) The composition for organic electroluminescent element according to the item (5) above, wherein the compounds represented by general formula (A) are represented by only one formula selected from the group consisting of general formulae (A-4), (A-5), and (A-6).

(9) The composition for organic electroluminescent element according to any one of the items (1) to (4) above, wherein the compounds included in the compound group α each are a compound represented by the following general formula (B):

[Chem. 4]

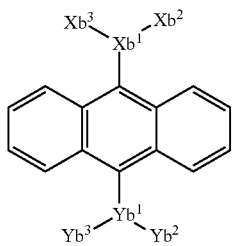

(B)

wherein $Xb^1$ and $Yb^1$ each independently represent an aromatic hydrocarbon ring group which has 6-30 carbon atoms and may have a substituent or a heteroaromatic ring group which has 3-30 carbon atoms and may have a substituent; and $Xb^2$, $Xb^3$, $Yb^2$, and $Yb^3$ each independently represent a hydrogen atom, an aromatic hydrocarbon ring group which has 6-30 carbon atoms and may have a substituent, or a heteroaromatic ring group which has 3-30 carbon atoms and may have a substituent.

(10) The composition for organic electroluminescent element according to any one of the items (1) to (4) above, wherein the materials included in the compound group α each are a compound represented by the following general formula (C):

[Chem. 5]

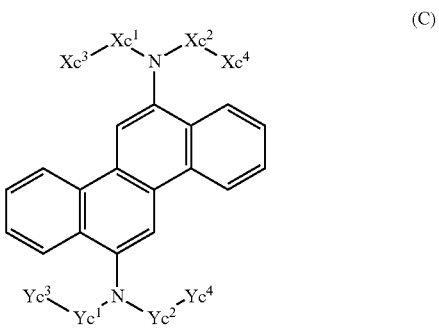

(C)

wherein $Xc^1$, $Xc^2$, $Yc^1$, and $Yc^2$ each independently represent an aromatic hydrocarbon ring group which has 6-30 carbon atoms and may have a substituent or a heteroaromatic ring group which has 3-30 carbon atoms and may have a substituent; and $Xc^3$, $Xc^4$, $Yc^3$, and $Yc^4$ each independently represent a hydrogen atom, an aromatic hydrocarbon ring group which has 6-30 carbon atoms and may have a substituent, or a heteroaromatic ring group which has 3-30 carbon atoms and may have a substituent.

(11) The composition for organic electroluminescent element according to any one of the items (1) to (4) above, wherein the compounds included in the compound group α each are a compound represented by the following general formula (D):

[Chem. 6]

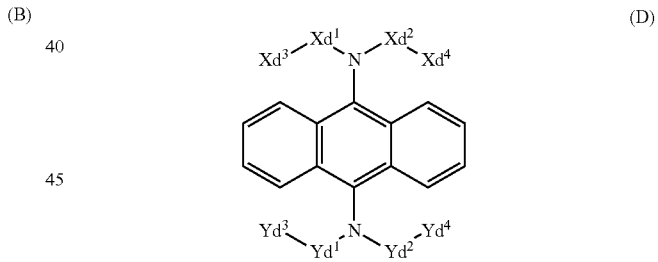

(D)

wherein $Xd^1$, $Xd^2$, $Yd^1$, and $Yd^2$ each independently represent an aromatic hydrocarbon ring group which has 6-30 carbon atoms and may have a substituent or a heteroaromatic ring group which has 3-30 carbon atoms and may have a substituent; and $Xd^3$, $Xd^4$, $Yd^3$, and $Yd^4$ each independently represent a hydrogen atom, an aromatic hydrocarbon ring group which has 6-30 carbon atoms and may have a substituent, or a heteroaromatic ring group which has 3-30 carbon atoms and may have a substituent.

(12) The composition for organic electroluminescent element according to any one of the items (1) to (4) above, wherein the compounds included in the compound group α each are a compound represented by the following general formula (E):

[Chem. 7]

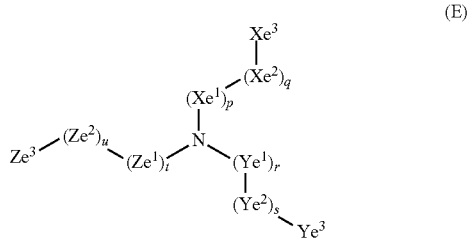

(E)

wherein $Xe^1$, $Xe^2$, $Ye^1$, $Ye^2$, $Ze^1$, and $Ze^2$ each independently represent an aromatic hydrocarbon ring group which has 6-30 carbon atoms and may have a substituent or a heteroaromatic ring group which has 3-30 carbon atoms and may have a substituent; $Xe^3$, $Ye^3$, and $Ze^3$ each independently represent a hydrogen atom, an aromatic hydrocarbon ring group which has 6-30 carbon atoms and may have a substituent, or a heteroaromatic ring group which has 3-30 carbon atoms and may have a substituent; and p, q, r, s, t, and u each represent an integer of 0 or larger.

(13) The composition for organic electroluminescent element according to the item (12) above, wherein the compounds represented by general formula (E) are compounds represented by the following general formula (E-1):

[Chem. 8]

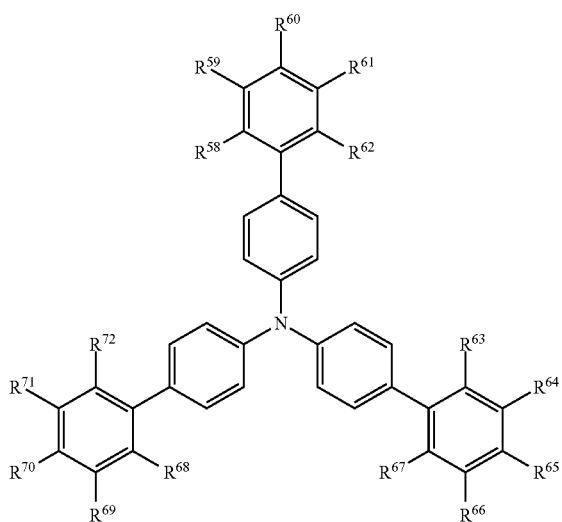

(E-1)

wherein $R^{58}$ to $R^{72}$ each independently represent a hydrogen atom, a nitrogen atom, an oxygen atom, a sulfur atom, an aromatic hydrocarbon ring group which has 6-30 carbon atoms and may have a substituent, or a heteroaromatic ring group which has 3-30 carbon atoms and may have a substituent, with the proviso that when $R^{58}$ to $R^{72}$ each are a nitrogen atom, an oxygen atom, or a sulfur atom, this atom combines with part of an adjoining substituent to form a ring.

(14) An organic electroluminescent element which comprises an anode, a cathode, and at least one organic layer interposed therebetween, wherein at least one of the organic layer(s) is a layer formed using the composition for organic electroluminescent element according to any one of the items (1) to (13) above.

(15) The organic electroluminescent element according to the item (14) above, wherein the layer formed using the composition for organic electroluminescent element according to any one of the items (1) to (13) above is an emissive layer.

(16) A display which comprises the organic electroluminescent element according to the item (14) or (15) above.

(17) A lighting which comprises the organic electroluminescent element according to the item (14) or (15) above.

Effects of the Invention

According to the invention, it is possible to obtain a composition which can be inhibited from suffering the crystallizing-out of the solutes therein and which has excellent storage stability.

Furthermore, by using the composition, an even layer can be formed and an organic electroluminescent element having a long life, low operating voltage, and high luminescent efficiency can be provided.

Moreover, the organic electroluminescent element of the invention is expected to be used in applications which take advantage of the feature of a surface light emitter, such as lightings, white-light sources (e.g., the light sources of copiers, the backlights of liquid-crystal displays or instruments, and color-filter displays), display boards, and marker lamps. This organic electroluminescent element has an exceedingly high technical value.

BRIEF DESCRIPTION OF THE DRAWING

The FIGURE is a sectional view which diagrammatically shows one example of the structure of an organic electroluminescent element of the invention.

MODES FOR CARRYING OUT THE INVENTION

Modes for carrying out the invention are explained below in detail. However, the invention should not be construed as being limited to the following modes.

The term "aromatic ring group" in the invention means both an aromatic hydrocarbon ring group and a heteroaromatic ring group.

The term "(hetero)aryl" in the invention includes both an aromatic hydrocarbon ring and a heteroaromatic ring. In the invention, the expression "may have a substituent" means that one or more substituents may be possessed.

[1] Compound Group α

The composition for organic electroluminescent element of the invention contains a compound group α for organic electroluminescent element and a solvent. The compound group α is constituted of at least two compounds which each have a molecular weight of 3,000 or less and have a structure including a plurality of aromatic ring groups linked to each other. In the compound group α, the compound which is the smallest in the number of aromatic ring groups is referred to as α1 and another compound is referred to as αn (n is any integer of 2 or larger). When the structure which is the largest in the number of aromatic ring groups, of partial structures that are common between the compound α1 and the compound αn, is taken as a basic framework, then 60% or more of the structure of the compound α1 is identical with the basic framework. Furthermore, the composition is characterized in that the compounds which constitute the compound group α each have been mixed in an amount of 1% by weight or larger.

Here, an explanation is given on that "when the structure which is the largest in the number of aromatic ring groups, of partial structures that are common between the compound α1 and the compound αn, is taken as a basic framework, then 60% or more of the structure of the compound α1 is identical with the basic framework".

The term "basic framework" means the structure which is the largest in the number of aromatic ring groups, of the partial structures that are common between the compound α1 and the compound αn. The term "common partial structure" means the structure of portions which, when the structural formulae of the compound α1 and compound αn are compared, are identical with each other in all of ring framework, the order of bonding to other groups, and the positions of bonding sites. The term "basic framework" means the structure which is the largest in the number of aromatic ring groups, of such common partial structures. The term "ring framework" herein means the number of ring-forming atoms in the case of an aromatic ring group derived from a monocycle, or means both the number of ring-forming atoms of each cycle and the fused state in the case of an aromatic ring group derived from a fused ring. Consequently, when an aromatic hydrocarbon ring and a heteroaromatic ring are equal in the number of ring-forming atoms of the aromatic ring and in the fused state, these two rings are regarded as equal in framework.

A more specific explanation is given below using examples.

In the following (Case 1), when the two compounds are compared first in the number of constituent aromatic ring groups, then compound 1, which is the smaller in the number of aromatic ring groups, is considered to be "compound α1" and compound 2 can be regarded as "compound α2". Next, compound 1 and compound 2 are compared in structural formula. Since the structure which is the largest in the number of aromatic ring groups, of the common partial structures, is compound 1 itself (the rings a to d which constitute compound 1 are identical with the rings e to h of compound 2), the basic framework is the compound α1 itself. Consequently, the basic framework of both the compound α1 and the compound α2 is considered to be identical with the compound α1 to a degree of 100%.

(Case 1)

[Chem. 9]

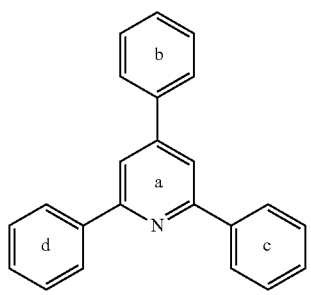

(Compound α1)

Compound 1

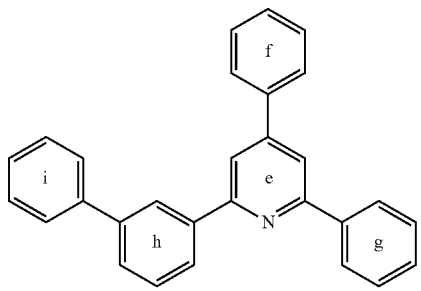

(Compound α2; degree of identity, 100%)

Compound 2

In the following (Case 2), compounds 3 and 4 are equal in the number of constituent aromatic ring groups and, hence, either may be taken as "compound α1". Here, compound 3 is taken, for convenience, as "compound α1" and compound 4 as "compound α2". Of the partial structures common between compounds 3 and 4, the partial structure which is the largest in the number of aromatic ring groups is the portion constituted of the rings a to f of compound 3 (compound α1) (the rings h to m of compound 4); this portion is the basic framework. Incidentally, the methyl groups are not taken into account when "identity" in the invention is determined, because methyl is not an aromatic ring group. (It is, however, noted that in the case of luminescent materials, the positions of alkyl substituents in the general formulae (C) and (D) which will be explained later are also taken into account because the properties change considerably depending on the presence or absence of the substituents and on the positions thereof.) A comparison between the basic framework and the compound α1 reveals that the aromatic ring groups (rings a to 0 which constitute the basic framework are identical with six of the seven aromatic ring groups (rings a to g) which constitute the compound α1. It is hence considered that 86% of the structure of the compound α1 is identical with the basic framework.

(Case 2)

[Chem. 10]

Compound 3

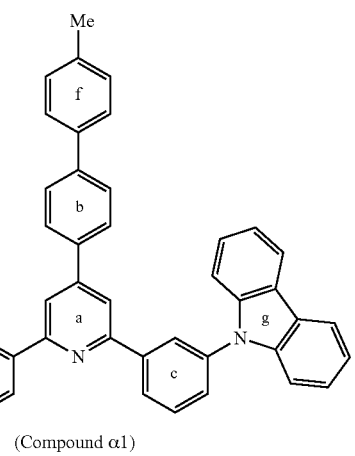

(Compound α1)

Compound 4

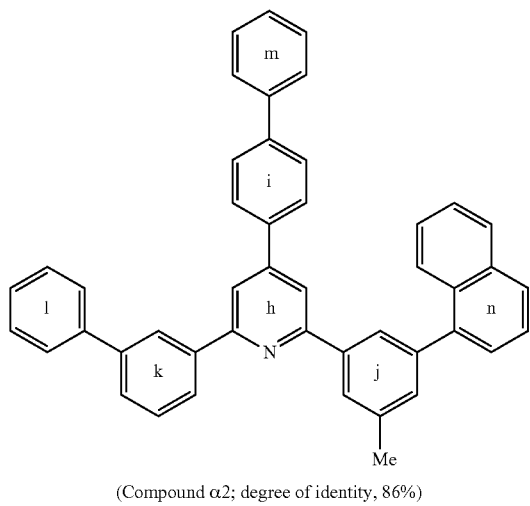

(Compound α2; degree of identity, 86%)

In the following (Case 3), compounds 5 to 7 are equal in the number of constituent aromatic ring groups and, hence, any of these may be taken as "compound α1". Furthermore, these compounds are identical in each of the ring framework of the constituent aromatic ring groups, the order of bonding with other groups, and the positions of bonding sites, and these compounds are equal also in basic framework. Namely, when compound 5 is taken, for convenience, as "compound α1", the three aromatic ring groups which constitute compound 5 is the basic framework, and this basic framework is "identical" with the aromatic ring groups of compound 6 (compound α2) and with those of compound 7 (compound α3). It is hence considered that compound 5 (compound α1) is "identical" to a degree of 100% with the basic framework of both compound 6 and compound 7.

(Case 3)

[Chem. 11]

Compound 5

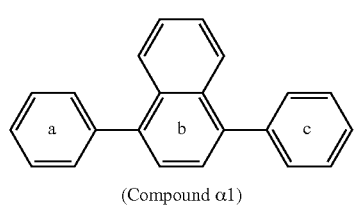

(Compound α1)

Compound 6

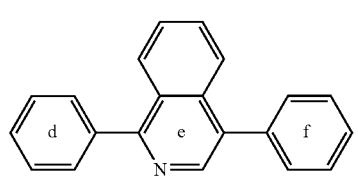

(Compound α2; degree of identity, 100%)

Compound 7

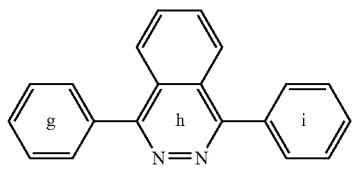

(Compound α3; degree of identity, 100%)

Similarly, in the following (Case 4), compound 8 is the smallest, of compounds 8 to 10, in the number of constituent aromatic ring groups. Consequently, compound 8 is "compound α1", and compound 9 and compound 10 are taken as "compound α2" and "compound α3", respectively. First, the compound α2 and the compound α1 are examined for common partial structure in order to determine a basic framework of these compounds and, as a result, it can be seen that the basic framework is the rings a, b, d, e, f, and g of the compound α1 (the rings h, i, l, m, n, and o of the compound α2). (As stated above, heteroaromatic ring groups which are different in kind but are equal in the number of ring-forming atoms and in the positions of bonding sites are regarded as identical.) This basic framework of both the compound α1 and the compound α2 is identical with six of the seven aromatic ring groups (rings a to g) which constitute the compound α1. This means that 86% of the structure of the compound α1 is identical with the basic framework. Next, the compound α3 and the compound α1 are examined for common partial structure in order to determined a basic framework of these compounds and, as a result, it can be seen that the basic framework is the rings a, b, d, and f of the compound α1 (the rings p, q, t, and v of the compound α3). This basic framework of both the compound α1 and the compound α3 is identical with four of the seven aromatic ring groups (rings a to g) which constitute the compound α1. This means that 57% of the structure of the compound α1 is identical with the basic framework. In the invention, since the compounds which constitute the compound group α include compounds which have a degree of identity of 60% or higher, compound 10 is not included in the compound group α and cannot be regarded as compound α3.

(Case 4)

[Chem. 12]

Compound 8

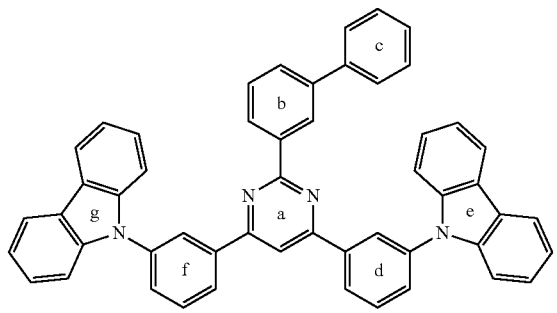

(Compound α1)

Compound 9

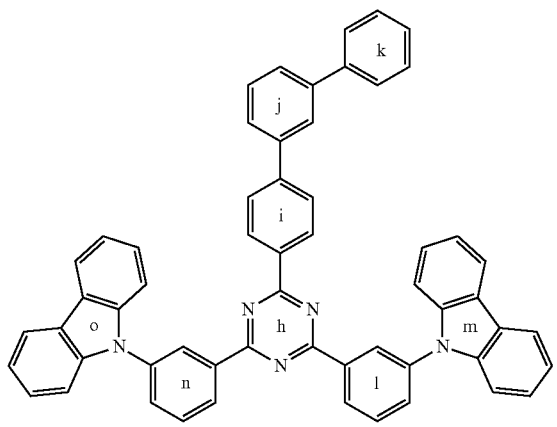

(Compound α2; degree of identity, 86%)

Compound 10

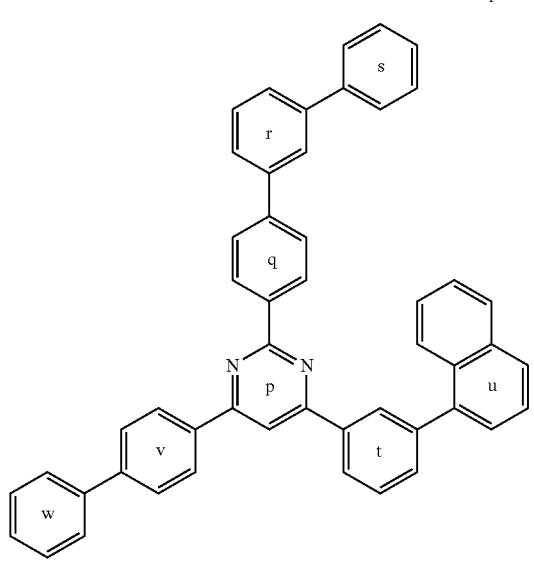

(Compound α3; degree of identity, 57%)

The composition for organic electroluminescent element of the invention contains the compound group α for organic electroluminescent element and a solvent. In the composition for organic electroluminescent element, which contains such compound group, the crystallizing-out of the solutes in the composition is inhibited because the plurality of compounds included in the group satisfy the relationships described above. Consequently, a composition having high storage stability is obtained. Furthermore, since the multiple materials used in the composition are akin in structure, these materials are substantially equal in material properties including charge-transporting ability. Consequently, an organic electroluminescent element produced by a wet film formation method using the composition undergoes no adverse influence on the characteristics thereof such as luminescent efficiency, operating voltage, and durability. In addition, some material combinations inhibit crystallization in the film and thereby bring about an improvement in amorphousness, resulting in a reduction in operating voltage.

Compounds to be included in the compound group α are not particularly limited so long as these compounds satisfy the requirements described above. It is, however, preferred that the compounds should be represented by any of the following general formulae (A) to (E). Namely, the compound group α includes a compound α1 which is the smallest in the number of aromatic ring groups and another compound αn (n is any integer of 2 or larger), and when the structure which is the largest in the number of aromatic ring groups, of partial structures that are common between the compound α1 and the compound αn, is taken as a basic framework, the structure of the compound α1 is identical with the basic framework to a degree of 60% or higher. It is therefore preferred that the compound group α should be a group of a plurality of compounds which are represented by one formula selected from the following general formulae (A) to (E).

<General Formula (A)>

[Chem. 13]

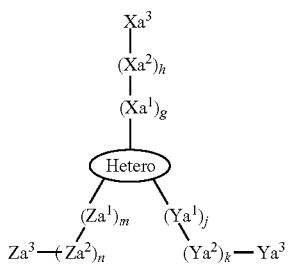

(A)

(In general formula (A), "Hetero" represents any of the trivalent substituents represented by the following structural formulae (A-1), (A-2), and (A-3); $Xa^1$, $Xa^2$, $Ya^1$, $Ya^2$, $Za^1$, and $Za^2$ each independently represent an aromatic hydrocarbon ring group which has 6-30 carbon atoms and may have a substituent or a heteroaromatic ring group which has 3-30 carbon atoms and may have a substituent; $Xa^3$, $Ya^3$, and $Za^1$ each independently represent a hydrogen atom, an aromatic hydrocarbon ring group which has 6-30 carbon atoms and may have a substituent, or a heteroaromatic ring group which has 3-30 carbon atoms and may have a substituent; and g, h, j, k, m, and n each represent an integer of 0 or larger.)

[Chem. 14]

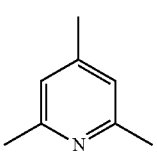

(A-1)

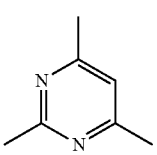

(A-2)

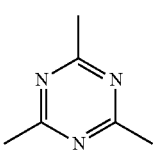

(A-3)

<General Formula (B)>

[Chem. 15]

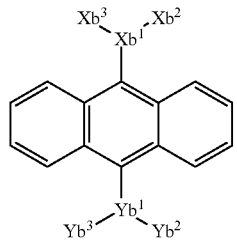

(B)

(In general formula (B), $Xb^1$ and $Yb^1$ each independently represent an aromatic hydrocarbon ring group which has 6-30 carbon atoms and may have a substituent or a heteroaromatic ring group which has 3-30 carbon atoms and may have a substituent; and $Xb^2$, $Xb^3$, $Yb^2$, and $Yb^3$ each independently represent a hydrogen atom, an aromatic hydrocarbon ring group which has 6-30 carbon atoms and may have a substituent, or a heteroaromatic ring group which has 3-30 carbon atoms and may have a substituent.)

<General Formula (C)>

[Chem. 16]

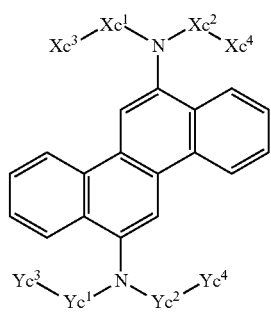

(C)

(In general formula (C), $Xc^1$, $Xc^2$, $Yc^1$, and $Yc^2$ each independently represent an aromatic hydrocarbon ring group which has 6-30 carbon atoms and may have a substituent or a heteroaromatic ring group which has 3-30 carbon atoms and may have a substituent; and $Xc^3$, $Xc^4$, $Yc^3$, and $Yc^4$ each independently represent a hydrogen atom, an aromatic hydrocarbon ring group which has 6-30 carbon atoms and may have a substituent, or a heteroaromatic ring group which has 3-30 carbon atoms and may have a substituent.)

<General Formula (D)>

[Chem. 17]

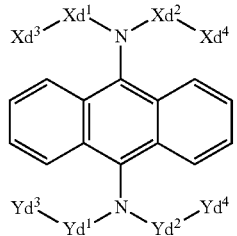

(D)

(In general formula (D), $Xd^1$, $Xd^2$ and $Yd^2$ each independently represent an aromatic hydrocarbon ring group which has 6-30 carbon atoms and may have a substituent or a heteroaromatic ring group which has 3-30 carbon atoms and may have a substituent; and $Xd^3$, $Xd^4$, $Yd^3$, and $Yd^4$ each independently represent a hydrogen atom, an aromatic hydrocarbon ring group which has 6-30 carbon atoms and may have a substituent, or a heteroaromatic ring group which has 3-30 carbon atoms and may have a substituent.)

<General Formula (E)>

[Chem. 18]

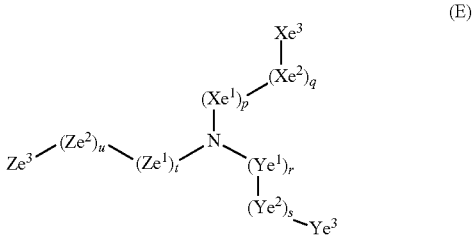

(E)

(In general formula (E), $Xe^1$, $Xe^2$, $Ye^1$, $Ye^2$, $Ze^1$, and $Ze^2$ each independently represent an aromatic hydrocarbon ring group which has 6-30 carbon atoms and may have a substituent or a heteroaromatic ring group which has 3-30 carbon atoms and may have a substituent; $Xe^3$, $Ye^3$, and $Ze^3$ each independently represent a hydrogen atom, an aromatic hydrocarbon ring group which has 6-30 carbon atoms and may have a substituent, or a heteroaromatic ring group which has 3-30 carbon atoms and may have a substituent; and p, q, r, s, t, and u each represent an integer of 0 or larger.)

$Xa^1$, $Xa^2$, $Ya^1$, $Ya^2$, $Za^1$, and $Za^2$ in general formula (A), $Xb^1$ and $Yb^1$ in general formula (B), $Xc^1$, $Xc^2$, $Yc^1$, and $Yc^2$ in general formula (C), $Xd^1$, $Xd^2$, $Yd^1$, and $Yd^2$ in general formula (D), and $Xe^1$, $Xe^2$, $Ye^1$, $Ye^2$, $Ze^1$, and $Ze^2$ in general formula (E) each independently represent an aromatic hydrocarbon ring group which has 6-30 carbon atoms and may have a substituent or a heteroaromatic ring group which has 3-30 carbon atoms and may have a substituent.

Preferred as the aromatic hydrocarbon ring group having 6-30 carbon atoms is a 6-membered monocycle having a free valence of 2 or a fused ring which is composed of two to five 6-membered monocycles fused together and has a free valence of 2. Examples thereof include a benzene ring, naphthalene ring, anthracene ring, phenanthrene ring, perylene ring, tetracene ring, pyrene ring, benzpyrene ring, chrysene ring, triphenylene ring, and fluoranthene ring which each have a free valence of 2. Preferred of these is a benzene ring having a free valence of 2.

The term "free valence" in the invention means a valence which is capable of combining with another free valence, as described in Yūki-kagaku/Sei-kagaku Meimei-hō (Jō) (revised version, second edition, Nankodo Co., Ltd., 1992). For example, "a benzene ring having a free valence of 1" means a phenyl group, and "a benzene ring having a free valence of 2" means a phenylene group.

Preferred as the heteroaromatic ring group having 3-30 carbon atoms is a 5- or 6-membered monocycle having a free valence of 2 or a fused ring which is composed of two to five 5- or 6-membered monocycles fused together and which has a free valence of 2. Examples thereof include a furan ring, benzofuran ring, dibenzofuran ring, thiophene ring, benzothiophene ring, dibenzothiophene ring, pyrrole ring, pyrazole ring, imidazole ring, oxadiazole ring, indole ring, carbazole ring, indolocarbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, perimidine ring, quinazoline ring, and quinazolinone ring which each have a free valence of 2. Preferred of these are a dibenzofuran ring, dibenzothiophene ring, and pyridine ring which each have a free valence of 2.

Furthermore, $Xa^3$, $Ya^3$, and $Za^1$ in general formula (A),
$Xb^2$, $Xb^3$, $Yb^2$, and $Yb^3$ in general formula (B),
$Xc^3$, $Xc^4$, $Yc^3$, and $Yc^4$ in general formula (C),
$Xd^3$, $Xd^4$, $Yd^3$, and $Yd^4$ in general formula (D), and
$Xe^3$, $Ye^3$, and $Ze^3$ in general formula (E)

each independently represent a hydrogen atom, an aromatic hydrocarbon ring group which has 6-30 carbon atoms and may have a substituent, or a heteroaromatic ring group which has 3-30 carbon atoms and may have a substituent.

Preferred as the aromatic hydrocarbon ring group having 6-30 carbon atoms is a 6-membered monocycle having a free valence of 1 or a fused ring which is composed of two to five 6-membered monocycles fused together and has a free valence of 1. Examples thereof include aromatic hydrocarbon rings which are the same as those enumerated above as examples of the $Xa^1$ and other groups contained in general formula (A) and which each have a free valence of 1. Preferred of these is a benzene ring, naphthalene ring, or phenanthrene ring which has a free valence of 1.

Preferred as the heteroaromatic ring group having 3-30 carbon atoms is a 5- or 6-membered monocycle having a free valence of 1 or a fused ring which is composed of two to five 5- or 6-membered monocycles fused together and which has a free valence of 1. Examples thereof include heteroaromatic rings which are the same as those enumerated above as examples of the $Xa^1$ and other groups contained in general formula (A) and which each have a free valence of 1. Preferred of these is a carbazole ring, indolocarbazole ring, dibenzofuran ring, or dibenzothiophene ring which has a free valence of 1.

The substituents which may be possessed by the aromatic hydrocarbon ring groups having 6-30 carbon atoms and heteroaromatic ring groups having 3-30 carbon atoms described above are not particularly limited unless the effects of the invention are lessened thereby. Usually, however, substituents having a molecular weight of 400 or less, in particular, 250 or less, are preferred. Examples of the substituents include alkyl groups having 1-20 carbon atoms, alkenyl groups having 2-20 carbon atoms, aromatic hydrocarbon ring groups having 6-25 carbon atoms, aromatic heterocyclic groups having 3-20 carbon atoms, diarylamino groups having 12-60 carbon atoms, alkyloxy groups having 1-20 carbon atoms, (hetero)aryloxy groups having 3-20 carbon atoms, alkylthio groups having 1-20 carbon atoms, (hetero)arylthio groups having 3-20 carbon atoms, and cyano. Preferred of these, from the standpoint of solubility, are saturated hydrocarbon groups having 1-20 carbon atoms, alkenyl groups having 2-20 carbon atoms, aromatic hydrocarbon ring groups having 6-25 carbon atoms, aromatic heterocyclic groups having 3-20 carbon atoms, and alkyloxy groups having 1-20 carbon atoms. More preferred of these, from the standpoint of heat resistance, are saturated hydrocarbon groups having 1-10 carbon atoms, alkenyl groups having 2-10 carbon atoms, aromatic hydrocarbon ring groups having 6-25 carbon atoms, and aromatic heterocyclic groups having 3-20 carbon atoms. Especially preferred of these, from the standpoint of the durability of the charge transport materials for organic electroluminescent element, are aromatic hydrocarbon ring groups having 6-25 carbon atoms or aromatic heterocyclic groups having 3-20 carbon atoms.

Specifically, examples of the alkyl groups having 1-20 carbon atoms include methyl, ethyl, propyl, isopropyl, butyl, isobutyl, sec-butyl, tert-butyl, hexyl, octyl, cyclohexyl, decyl, and octadecyl. Preferred of these, from the standpoints of the availability and inexpensiveness of starting materials, etc., are methyl, ethyl, and isopropyl. More preferred are methyl and ethyl.

Examples of the monovalent aromatic hydrocarbon ring groups having 6-25 carbon atoms include: phenyl and naphthyl groups such as 1-naphthyl and 2-naphthyl; phenanthyl groups such as 9-phenanthyl and 3-phenanthyl; anthryl groups such as 1-anthryl, 2-anthryl, and 9-anthryl; naphthacenyl groups such as 1-naphthacenyl and 2-naphthacenyl; chrysenyl groups such as 1-chrysenyl, 2-chrysenyl, 3-chrysenyl, 4-chrysenyl, 5-chrysenyl, and 6-chrysenyl; pyrenyl groups such as 1-pyrenyl; triphenylenyl groups such as 1-triphenylenyl; coronenyl groups such as 1-coronenyl; biphenyl groups such as 4-biphenyl and 3-biphenyl; groups having a fluoranthene ring; groups having a fluorene ring; groups having an acenaphthene ring; and substituents having a benzpyrene ring or the like. Preferred of these, from the standpoint of the durability of the charge transport materials for organic electroluminescent element, are phenyl, 2-naphthyl, and 3-biphenyl. Phenyl is especially preferred from the standpoint of ease of purification.

Examples of the aromatic heterocyclic groups having 3-20 carbon atoms include: thienyl groups such as 2-thienyl; furyl groups such as 2-furyl; imidazolyl groups such as 2-imidazolyl; carbazolyl groups such as 9-carbazolyl; pyridyl groups such as 2-pyridyl; and triazinyl groups such as 1,3,5-triazin-2-yl. Carbazolyl groups are preferred of these from the standpoint of the durability of the charge transport materials for organic electroluminescent element.

Examples of the diarylamino groups having 12-60 carbon atoms include diphenylamino, N-1-naphthyl-N-phenylamino, N-2-naphthyl-N-phenylamino, N-9-phenanthryl-N-phenylamino, N-(biphenyl-4-yl)-N-phenylamino, and bis(biphenyl-4-yl)amino. Preferred of these are diphenylamino, N-1-naphthyl-N-phenylamino, and N-2-naphthyl-N-phenylamino. Diphenylamino is especially preferred from the standpoint of stability. With respect to general formula (B), however, it is preferred that the groups should have no diarylamino substituent, from the standpoint of durability.

Examples of the alkyloxy groups having 1-20 carbon atoms include methoxy, ethoxy, isopropyloxy, cyclohexyloxy, and octadecyloxy.

Examples of the (hetero)aryloxy groups having 3-20 carbon atoms include aryloxy groups such as phenoxy, 1-naphthyloxy, and 9-anthranyloxy and a heteroaryloxy group such as 2-thienyloxy.

Examples of the alkylthio groups having 1-20 carbon atoms include methylthio, ethylthio, isopropylthio, and cyclohexylthio.

Examples of the (hetero)arylthio groups having 3-20 carbon atoms include arylthio groups such as phenylthio, 1-naphthylthio, and 9-anthranylthio and heteroarylthio groups such as 2-thienylthio.

In the case where the compound group α includes a plurality of compounds represented by general formula (A), it is more preferred that these compounds should be represented by the following general formulae (A-4) to (A-6).

[Chem. 19]

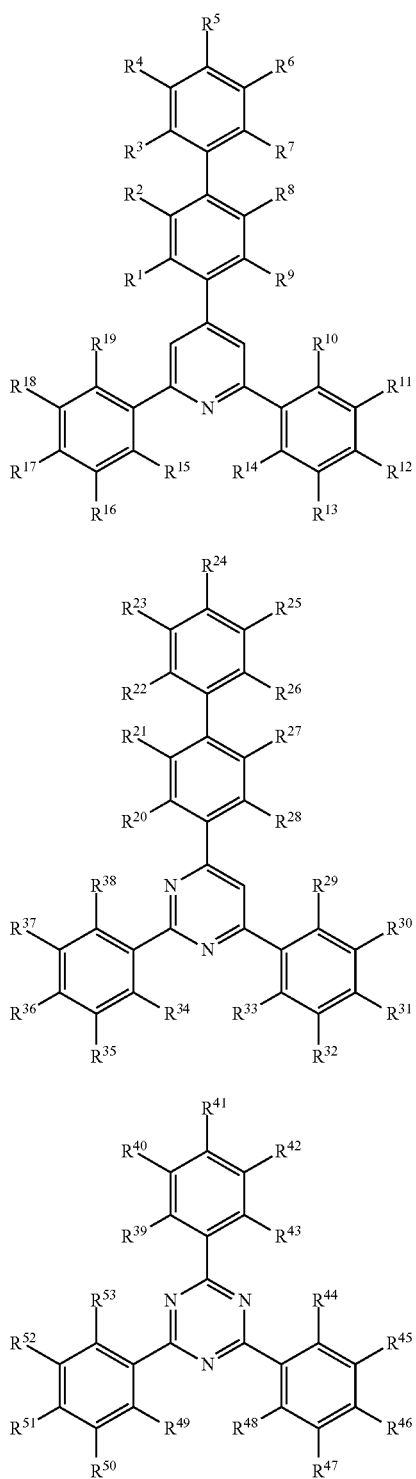

(A-4)

(A-5)

(A-6)

(In general formulae (A-4), (A-5), and (A-6), $R^1$ to $R^{53}$ each independently represent a hydrogen atom, a nitrogen atom, an oxygen atom, a sulfur atom, an aromatic hydrocarbon ring group which has 6-30 carbon atoms and may have a substituent, or a heteroaromatic ring group which has 3-30 carbon atoms and may have a substituent. However, when $R^1$ to $R^{53}$ each are a nitrogen atom, oxygen atom, or sulfur atom, this atom combines with part of an adjoining substituent to form a ring.)

Preferred as the aromatic hydrocarbon ring group having 6-30 carbon atoms is a 5- or 6-membered monocycle having a free valence of 1 or a fused ring which is composed of two to five 5- or 6-membered monocycles fused together and which has a free valence of 1. Examples thereof include aromatic hydrocarbon rings which are the same as those enumerated above as examples of the $Xa^3$ and other groups contained in general formula (A) and which each have a free valence of 1. Preferred of these is a benzene ring, naphthalene ring, or phenanthrene ring which has a free valence of 1.

Preferred as the heteroaromatic ring group having 3-30 carbon atoms is a 5- or 6-membered monocycle having a free valence of 1 or a fused ring which is composed of two to five 5- or 6-membered monocycles fused together and which has a free valence of 1. Examples thereof include heteroaromatic rings which are the same as those enumerated above as examples of the $Xa^1$ and other groups contained in general formula (A) and which each have a free valence of 1. Preferred of these is a carbazole ring, indolocarbazole ring, dibenzofuran ring, or dibenzothiophene ring which has a free valence of 1.

Examples of the substituents which may be possessed by the aromatic hydrocarbon ring groups having 6-30 carbon atoms and heteroaromatic ring groups having 3-30 carbon atoms described above include the same substituents as enumerated above.

When $R^1$ to $R^{53}$ each are a nitrogen atom, oxygen atom, or sulfur atom, this atom combines with part of an adjoining substituent to form a ring. Examples thereof include a carbazole ring, indolocarbazole ring, imidazole ring, benzimidazole ring, dibenzofuran ring, and dibenzothiophene ring. Preferred of these are a carbazole ring, dibenzofuran ring, and dibenzothiophene ring. The ring formed may further have a substituent, examples of which include the same substituents as enumerated above.

In the case where the compound group α includes a plurality of compounds represented by general formula (E), it is more preferred that these compounds should be compounds represented by the following general formula (E-1).

(E-1)

[Chem. 20]

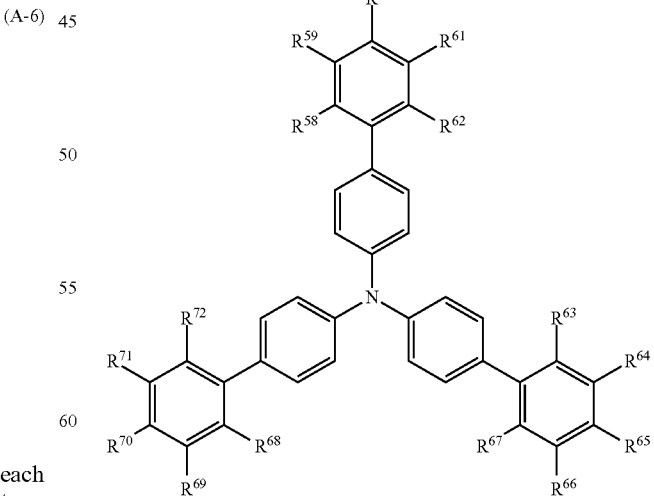

(In general formula (E-1), $R^{58}$ to $R^{72}$ each independently represent a hydrogen atom, a nitrogen atom, an oxygen atom, a sulfur atom, an aromatic hydrocarbon ring group which has 6-30 carbon atoms and may have a substituent, or a heteroaromatic ring group which has 3-30 carbon atoms and may have a substituent. However, when $R^{58}$ to $R^{72}$ each are a nitrogen atom, oxygen atom, or sulfur atom, this atom combines with part of an adjoining substituent to form a ring.)

Preferred as the aromatic hydrocarbon ring group having 6-30 carbon atoms is a 6-membered monocycle having a free valence of 1 or a fused ring which is composed of two to five 6-membered monocycles fused together and has a free valence of 1. Examples thereof include the same aromatic hydrocarbon rings as those enumerated above as examples of the $Xa^1$ and other groups contained in general formula (A). Preferred of these is a benzene ring, naphthalene ring, or phenanthrene ring which has a free valence of 1.

Preferred as the heteroaromatic ring group having 3-30 carbon atoms is a 5- or 6-membered monocycle having a free valence of 1 or a fused ring which is composed of two to five 5- or 6-membered monocycles fused together and which has a free valence of 1. Examples thereof include the same heteroaromatic rings as those enumerated above as examples of the $Xa^3$ and other groups contained in general formula (A). Preferred of these is a group which is derived from a carbazole ring, indolocarbazole ring, dibenzofuran ring, or dibenzothiophene ring and which has a free valence of 1.

Examples of the substituents which may be possessed by the aromatic hydrocarbon ring groups having 6-30 carbon atoms and heteroaromatic ring groups having 3-30 carbon atoms described above include the same substituents as those enumerated above.

When $R^{58}$ to $R^{72}$ each are a nitrogen atom, oxygen atom, or sulfur atom, this atom combines with part of an adjoining substituent to form a ring. Examples thereof include a carbazole ring, indolocarbazole ring, imidazole ring, benzimidazole ring, dibenzofuran ring, and dibenzothiophene ring. Preferred of these are a carbazole ring, dibenzofuran ring, and dibenzothiophene ring. The ring formed may further have a substituent, examples of which include the same substituents as enumerated above.

Specific examples of the compounds included in the compound group α according to the invention are enumerated below. However, the compound group α should not be construed as being limited to the following compounds.

Examples of Compounds Represented by General Formula (A)

[Chem. 21]

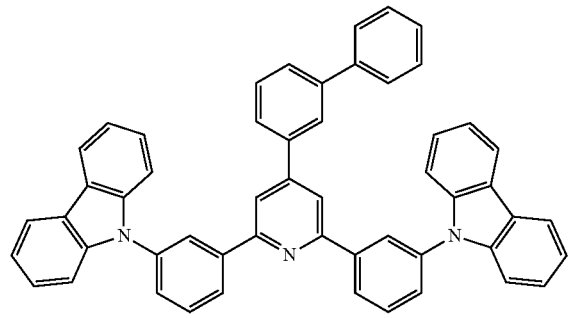

(H-A-1)

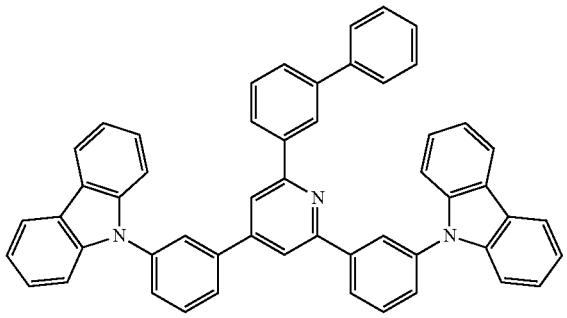

(H-A-2)

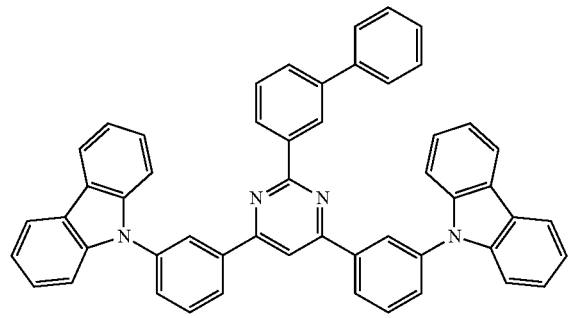

(H-A-3)

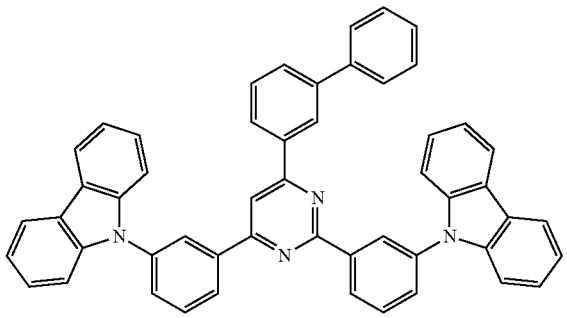

(H-A-4)

-continued
(H-A-5)
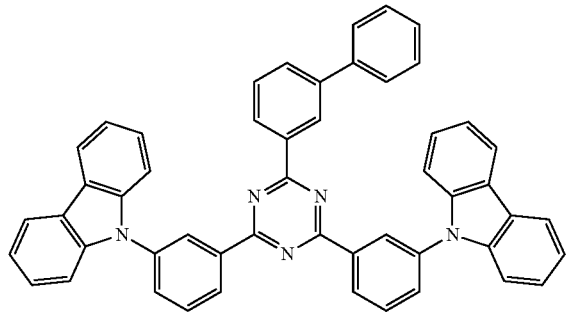
(H-A-6)
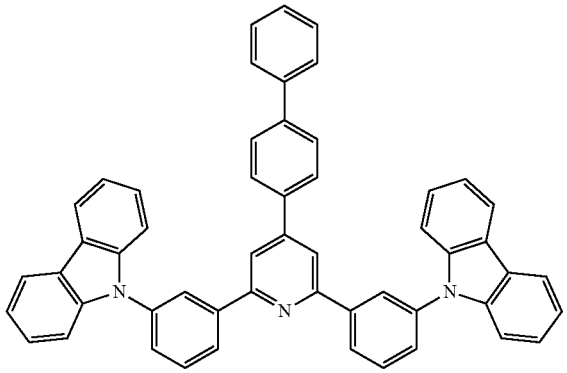
(H-A-7)
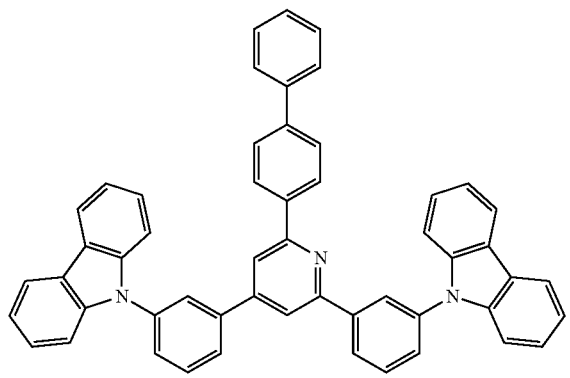
(H-A-8)
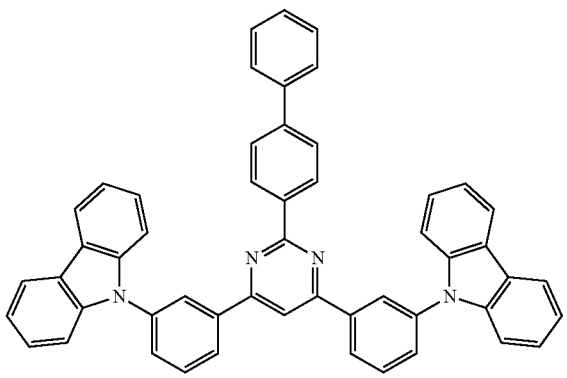
(H-A-9)
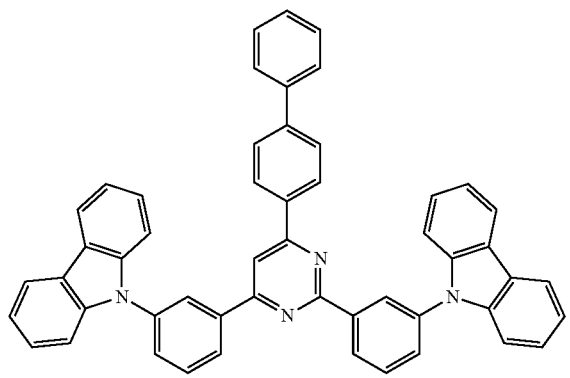
(H-A-10)
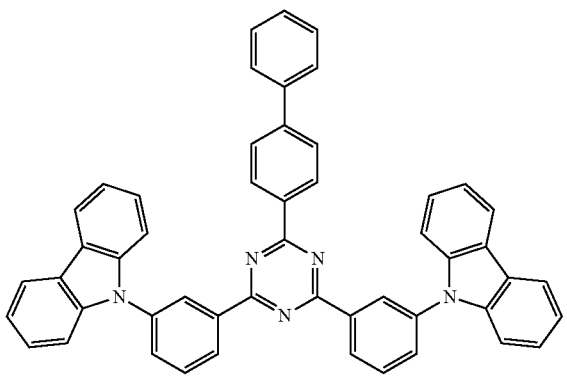

[Chem. 22]
(H-A-11) 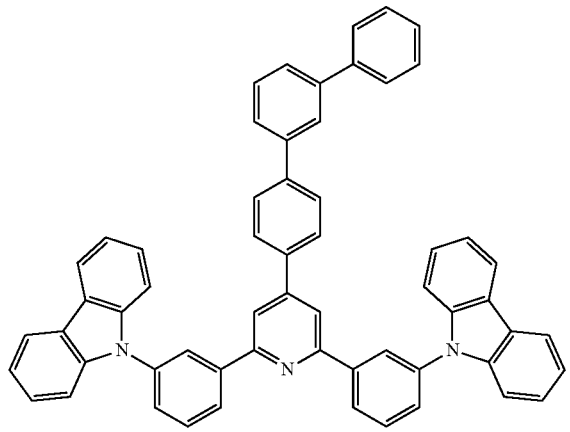
(H-A-12) 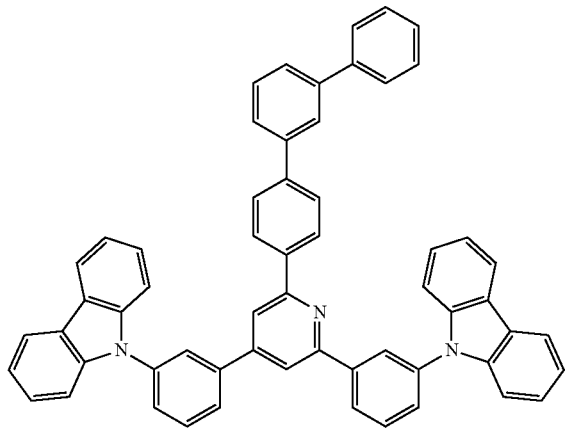
(H-A-13) 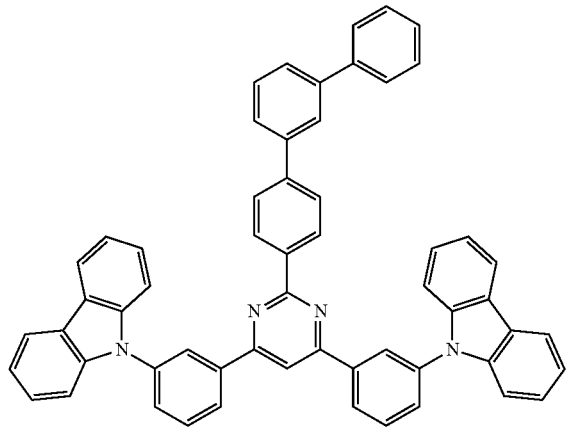
(H-A-14) 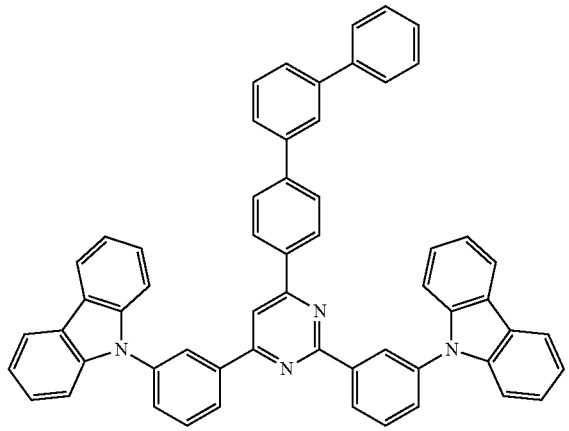
(H-A-15) 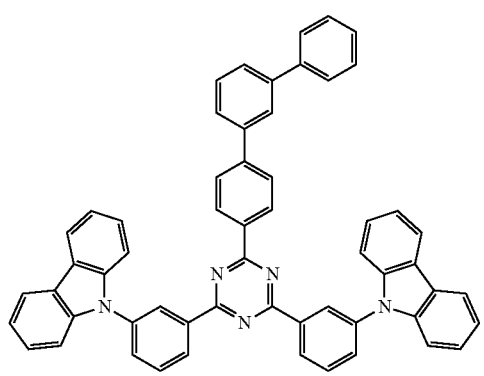
(H-A-16) 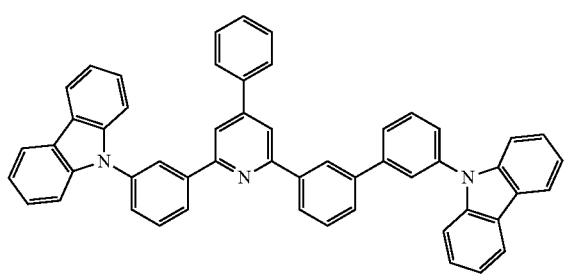
(H-A-17) 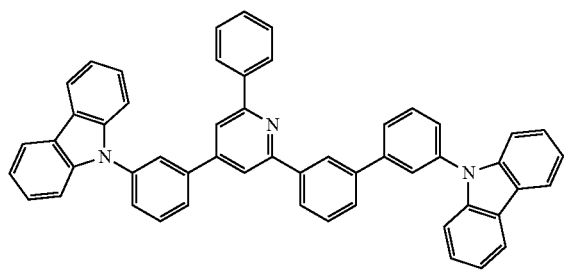
(H-A-18) 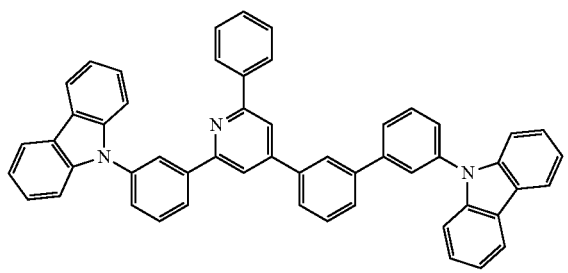

(H-A-19)
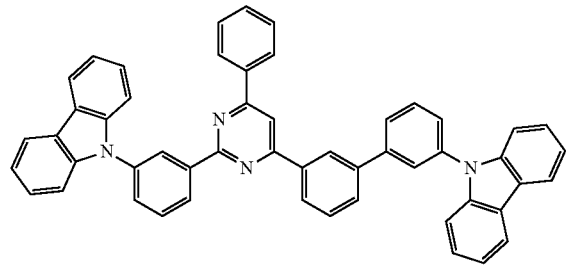
(H-A-20)
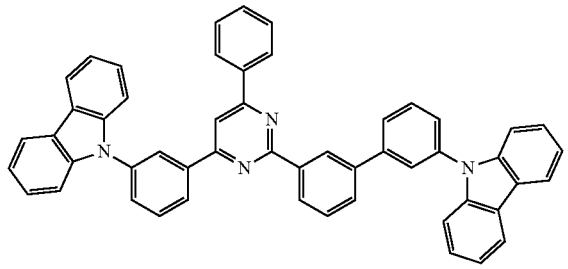
[Chem. 23]
(H-A-21)
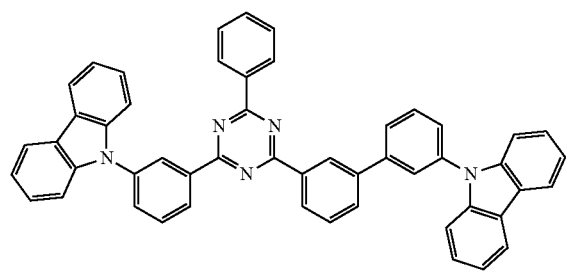
(H-A-22)
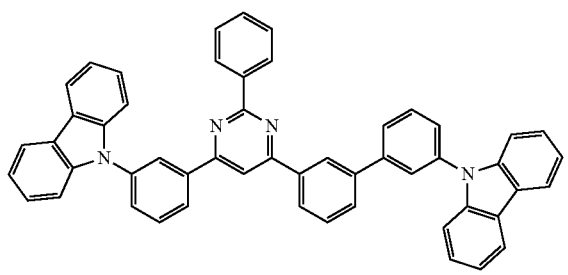
(H-A-23)
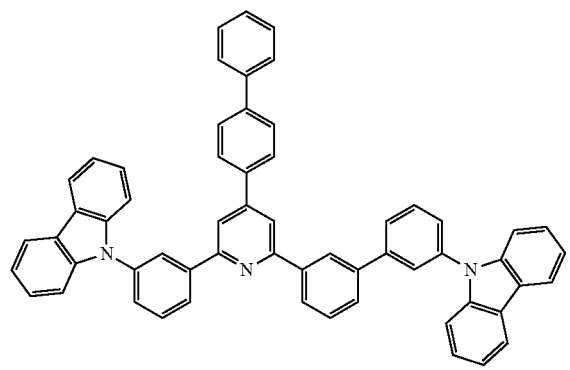
(H-A-24)
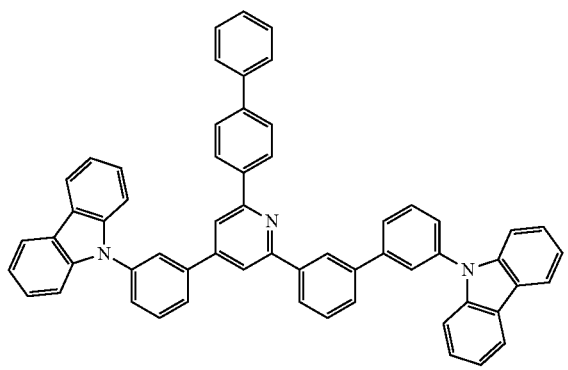
(H-A-25)
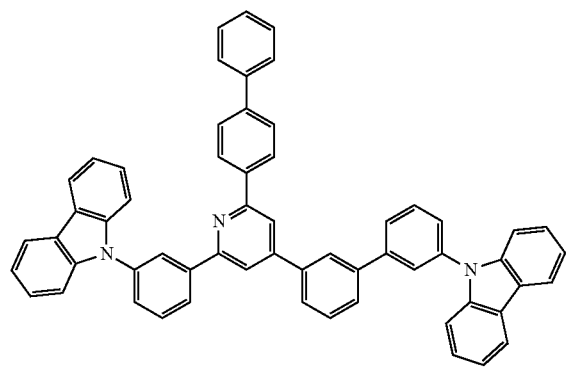
(H-A-26)
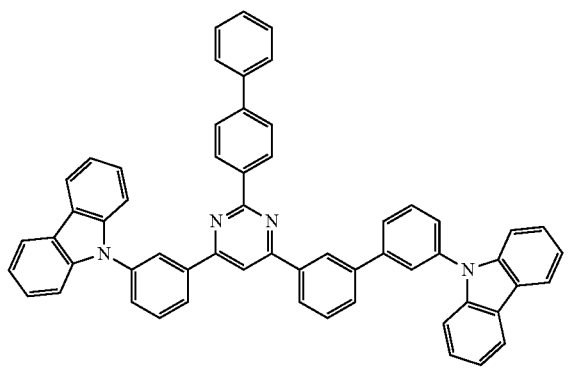

(H-A-27) 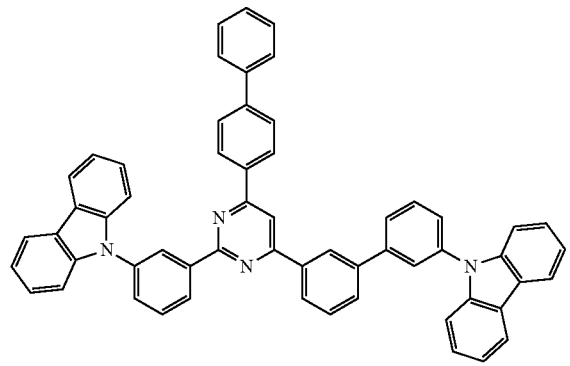
(H-A-28) 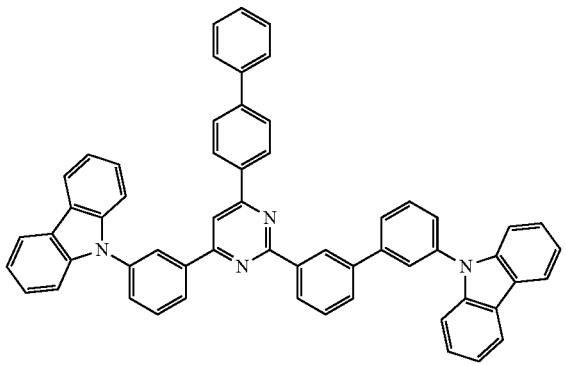
(H-A-29) 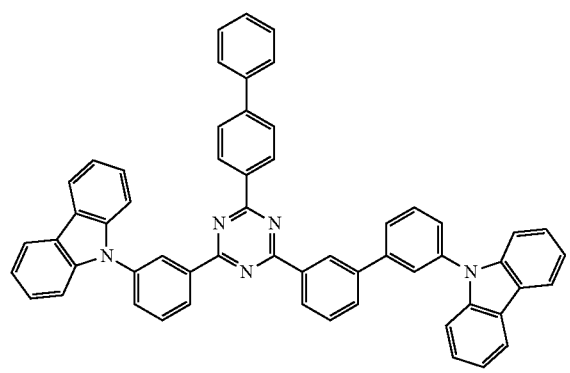
(H-A-30) 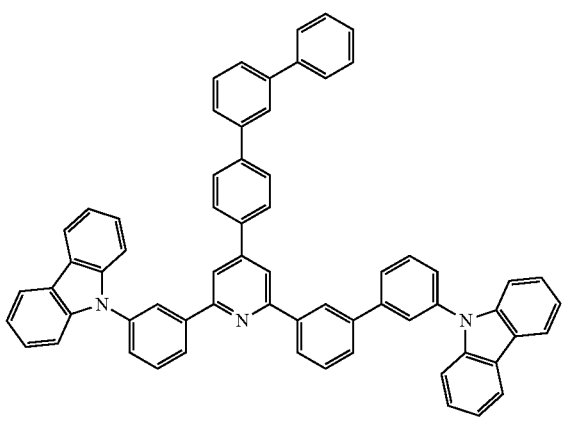
[Chem. 24]
(H-A-31) 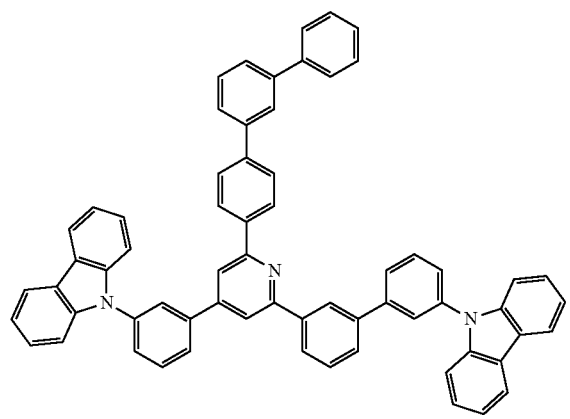
(H-A-32) 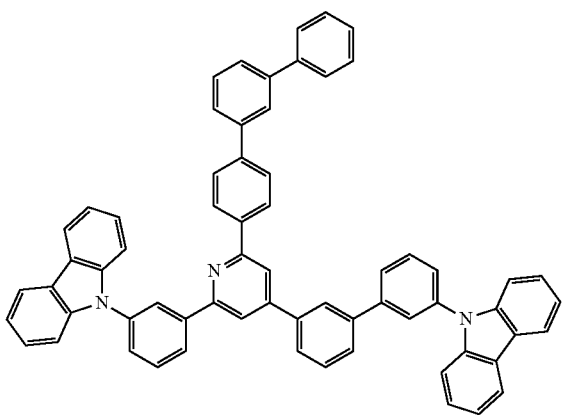

(H-A-33) 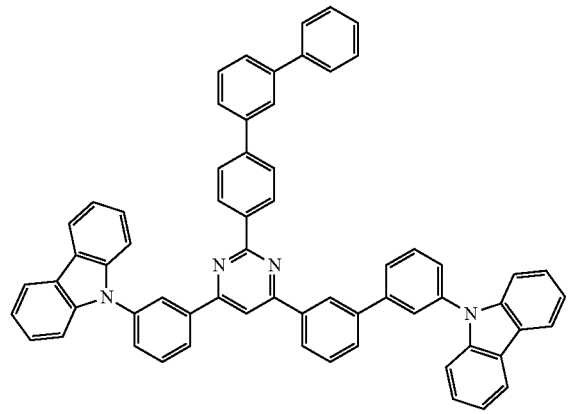
(H-A-34) 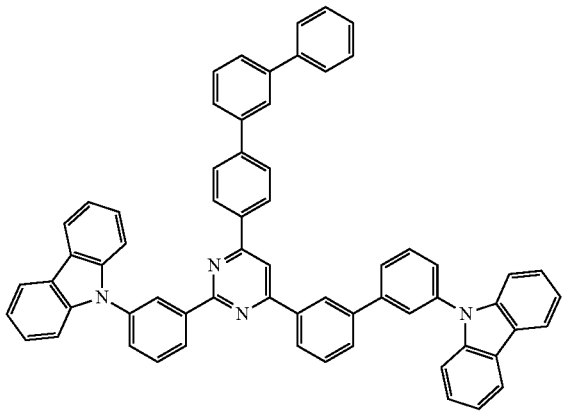
(H-A-35) 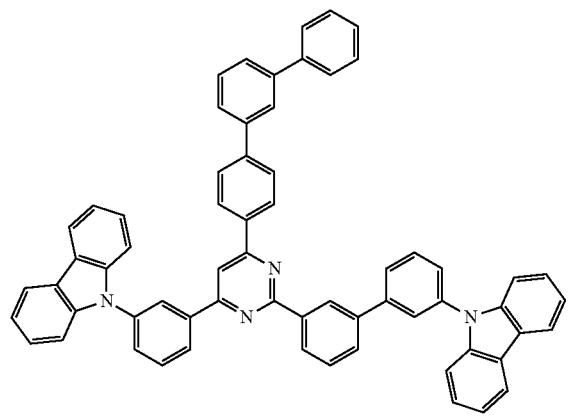
(H-A-36) 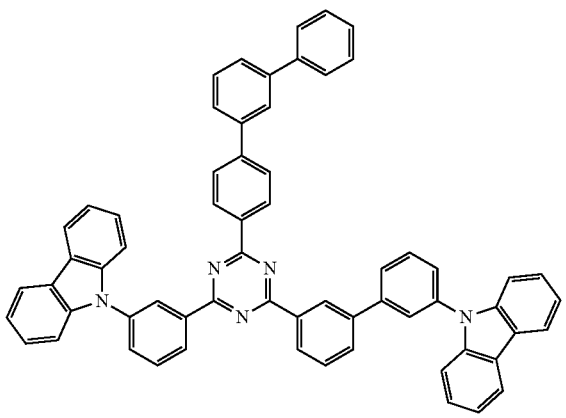
(H-A-37) 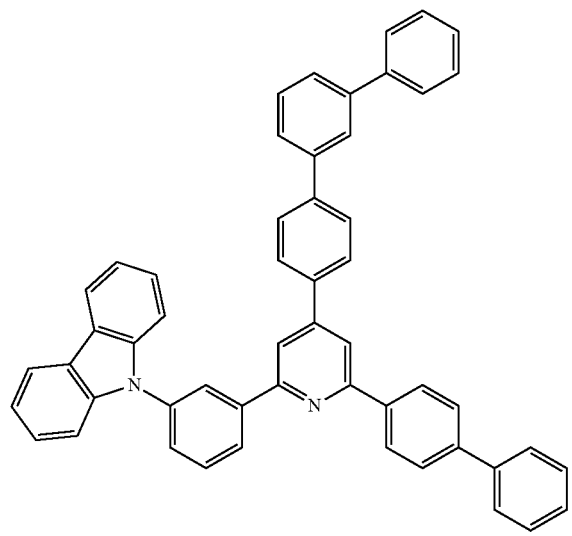
(H-A-38) 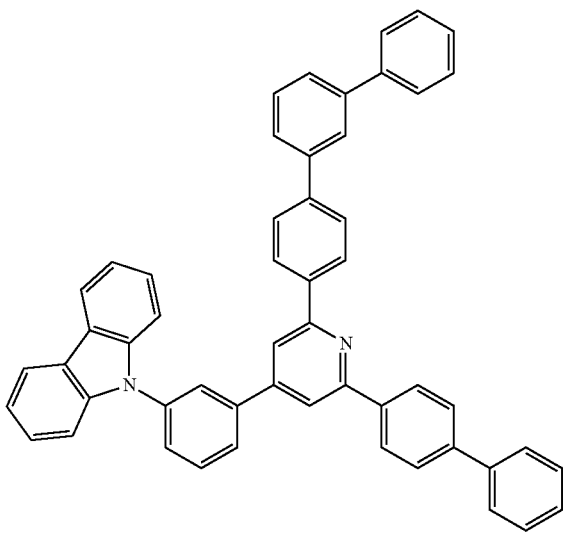

-continued
(H-A-39)
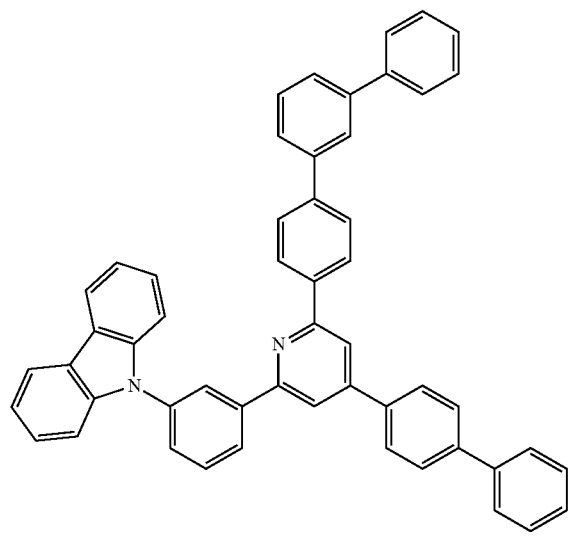
(H-A-40)
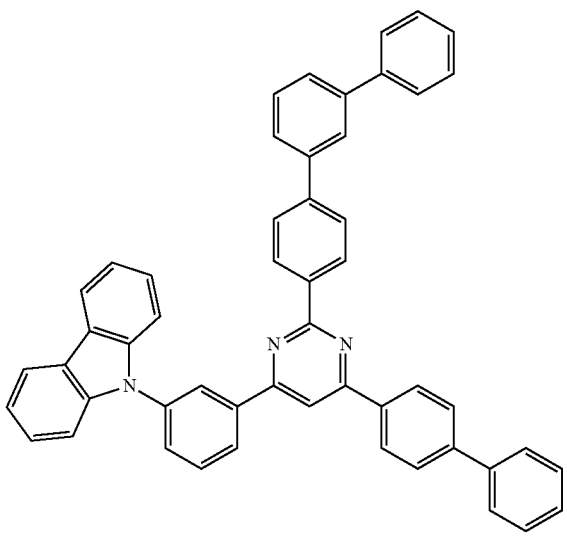
[Chem. 25]
(H-A-41)
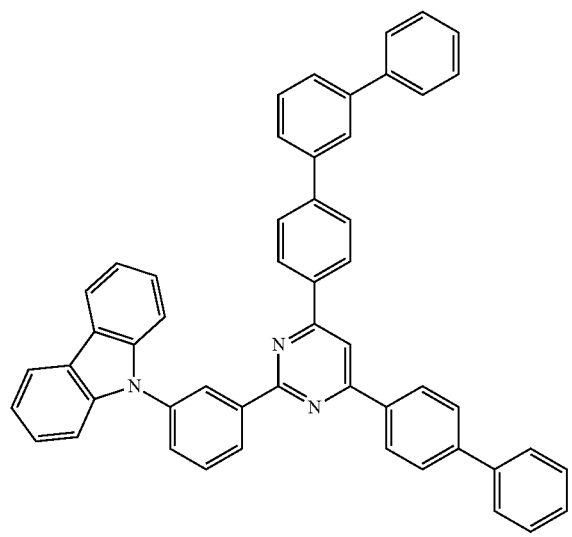
(H-A-42)
(H-A-43)
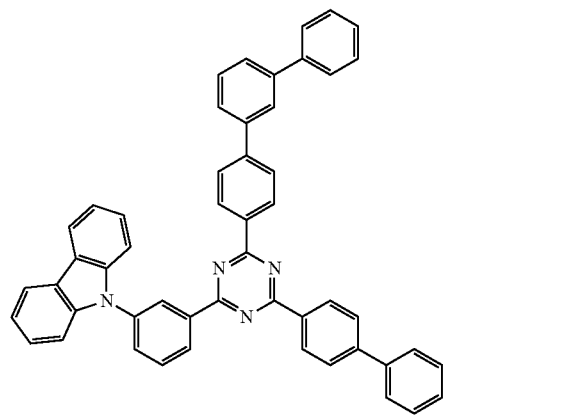
(H-A-44)
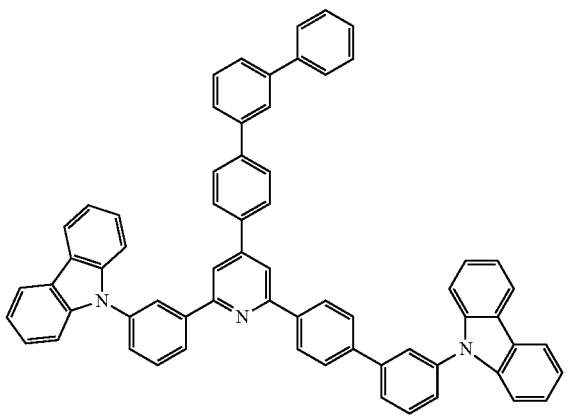

(H-A-45)
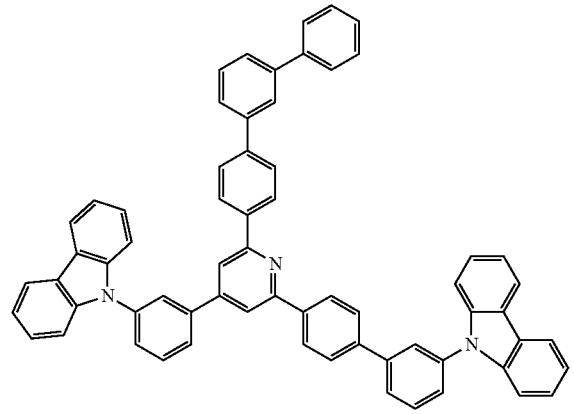
(H-A-46)
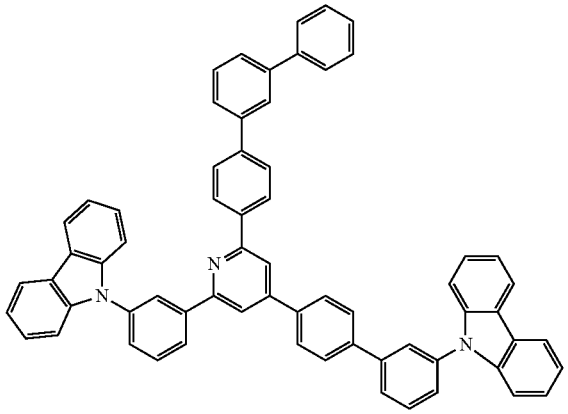
(H-A-47)
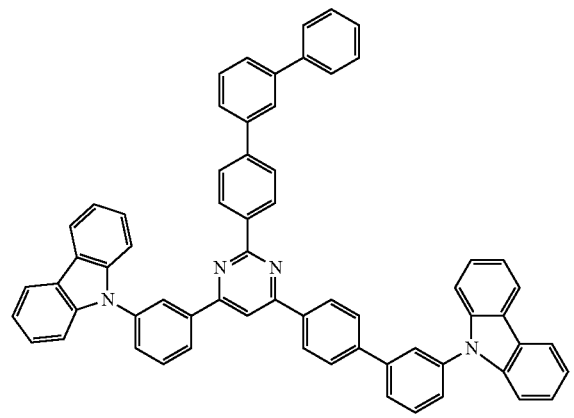
(H-A-48)
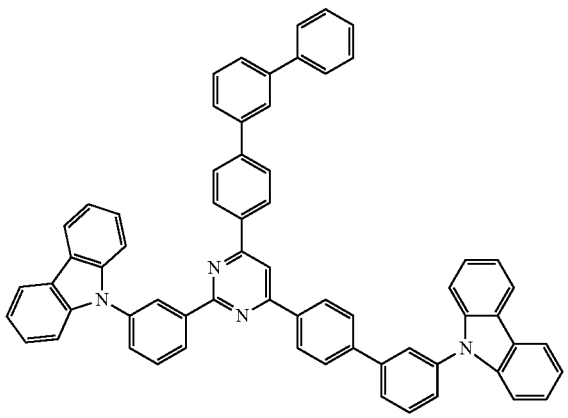
(H-A-49)
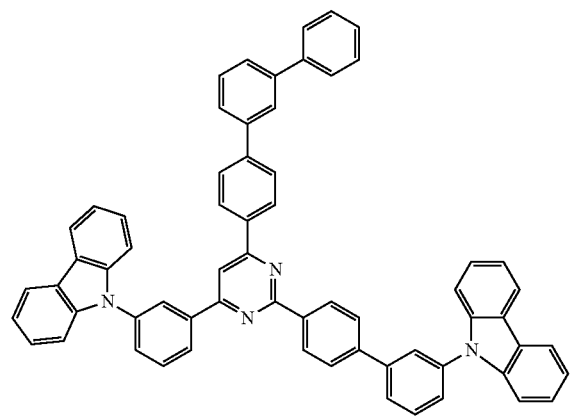
(H-A-50)
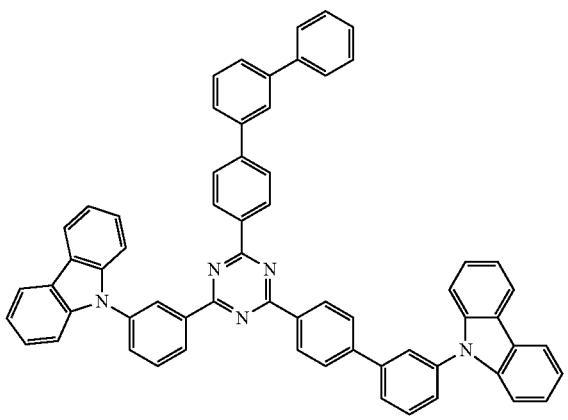

-continued
[Chem. 26]
(H-A-51)
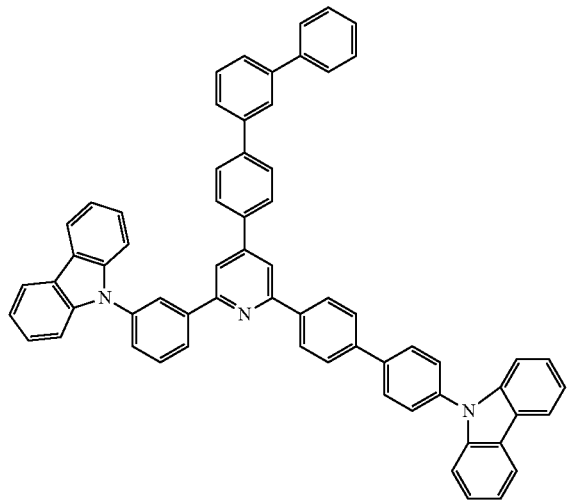
(H-A-52)
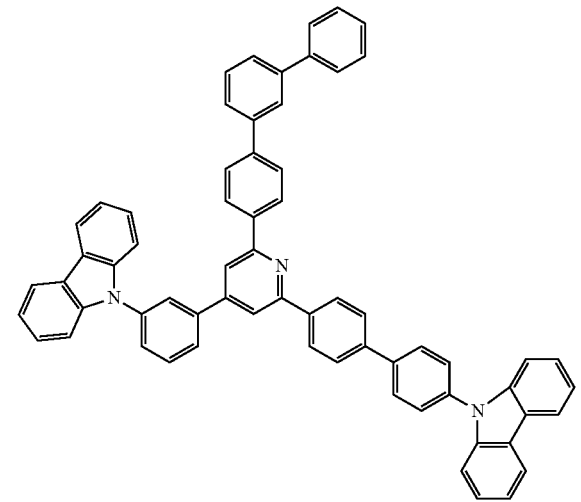
(H-A-53)
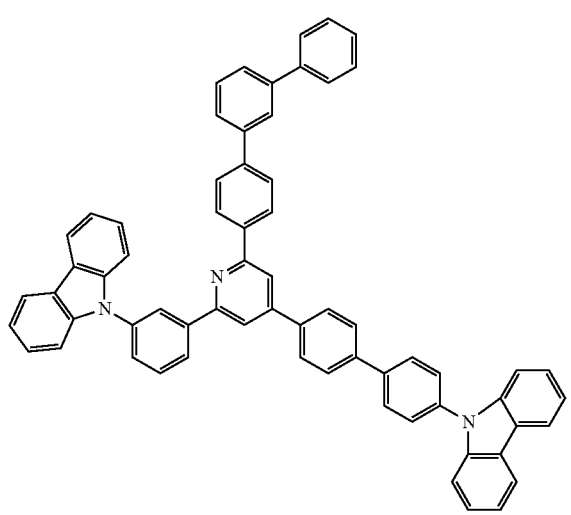
(H-A-54)
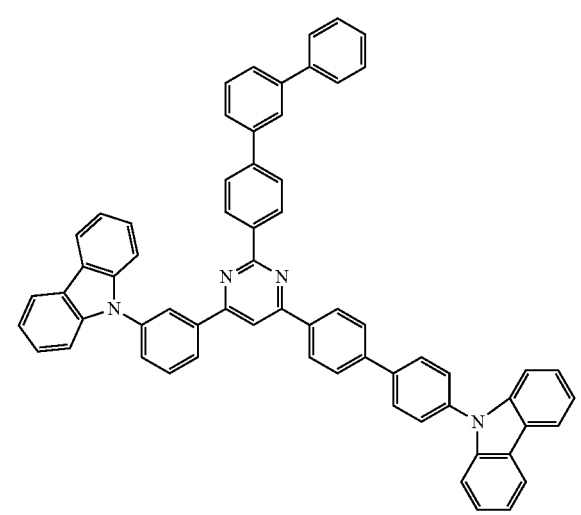
(H-A-55)
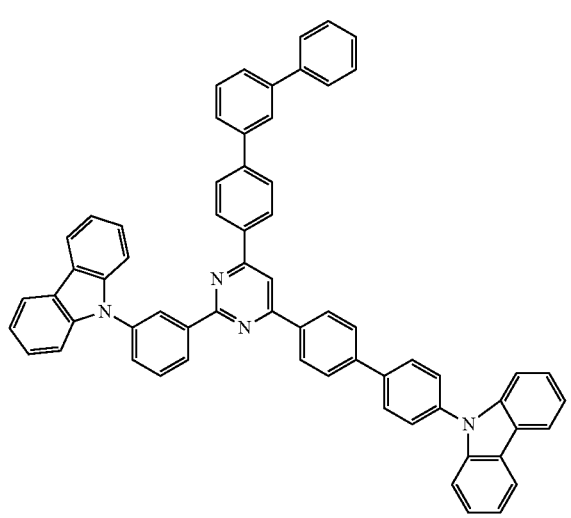
(H-A-56)
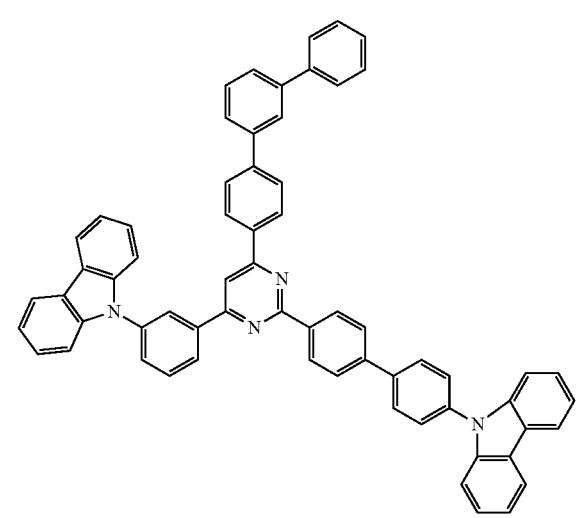

-continued
(H-A-57)
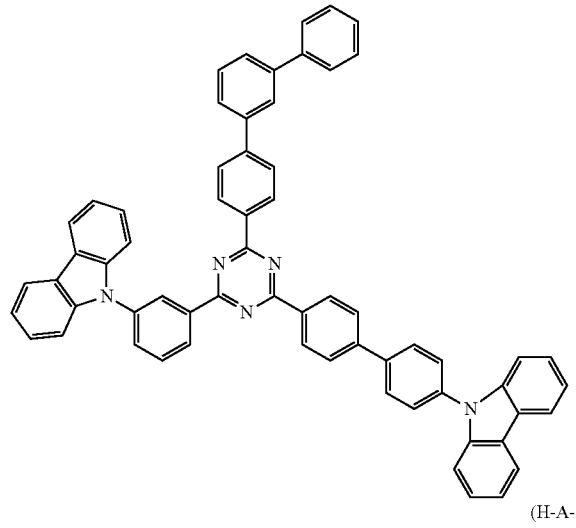
(H-A-58)
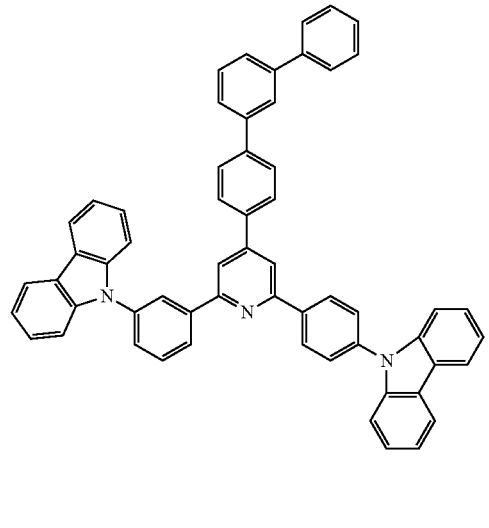
(H-A-59)
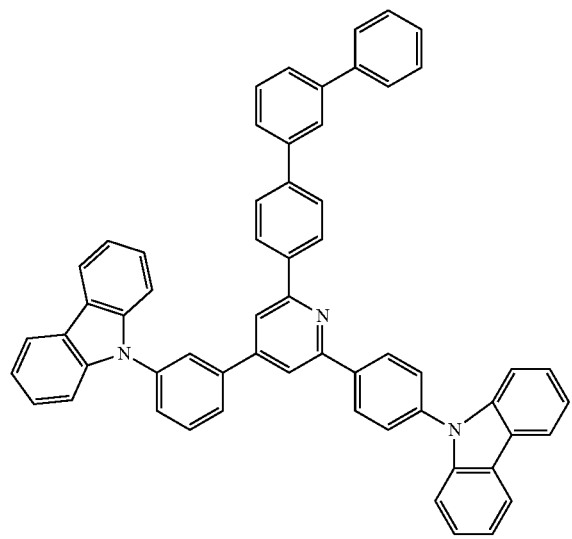
(H-A-60)
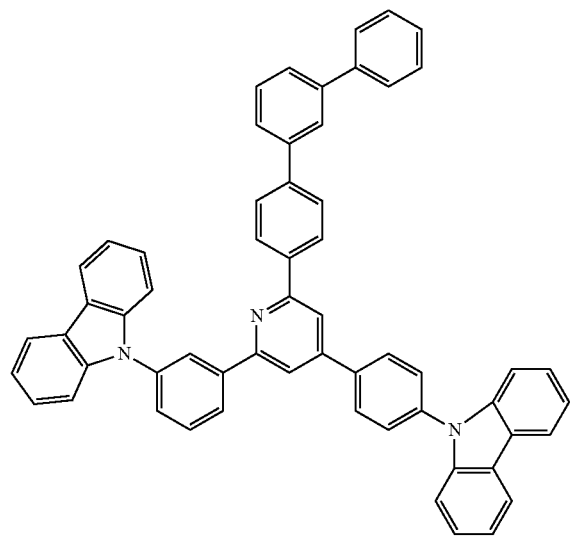
[Chem. 27]
(H-A-61)
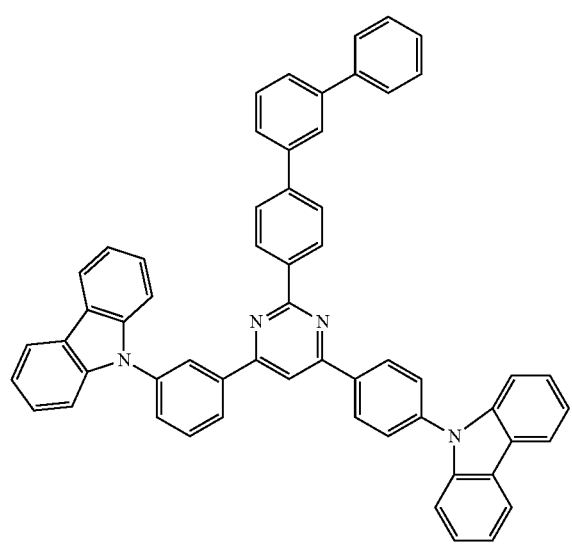
(H-A-62)
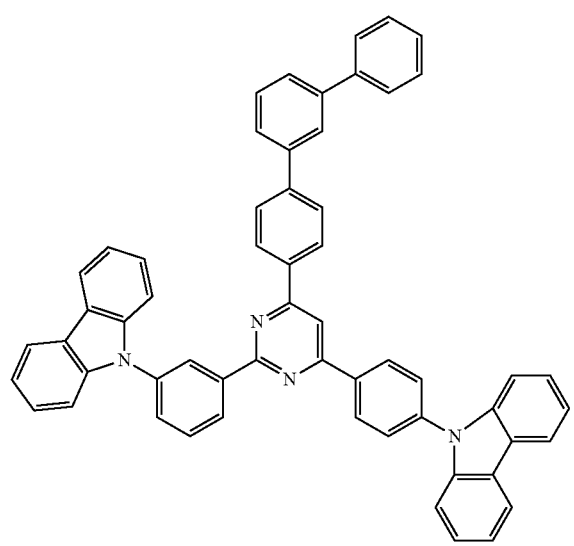

-continued
(H-A-63)
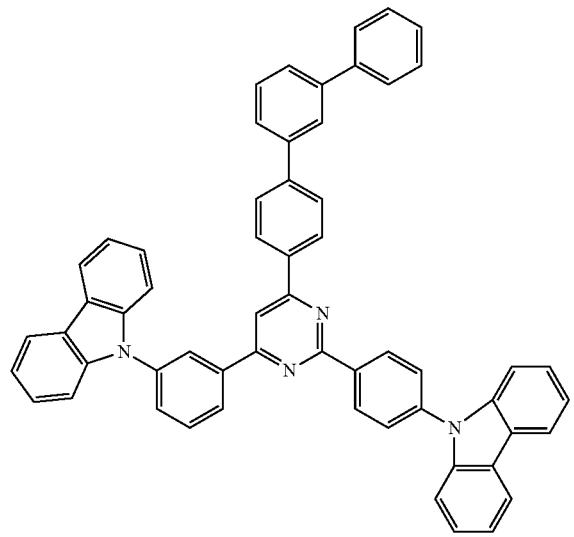
(H-A-64)
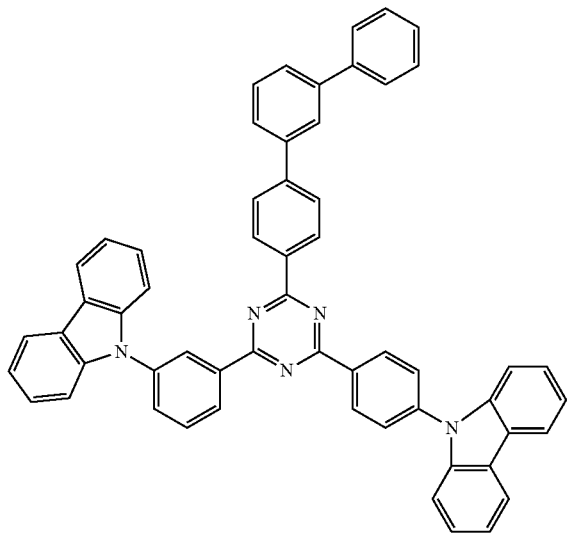
(H-A-65)
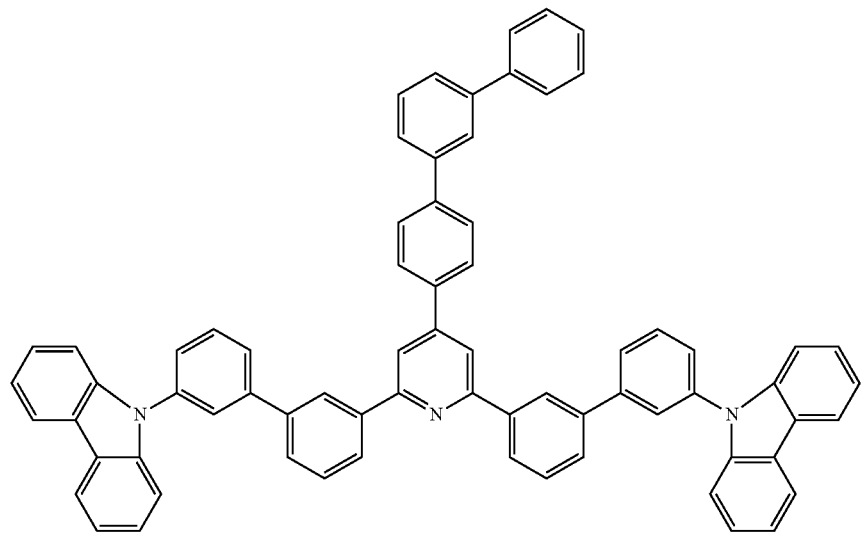
(H-A-66)
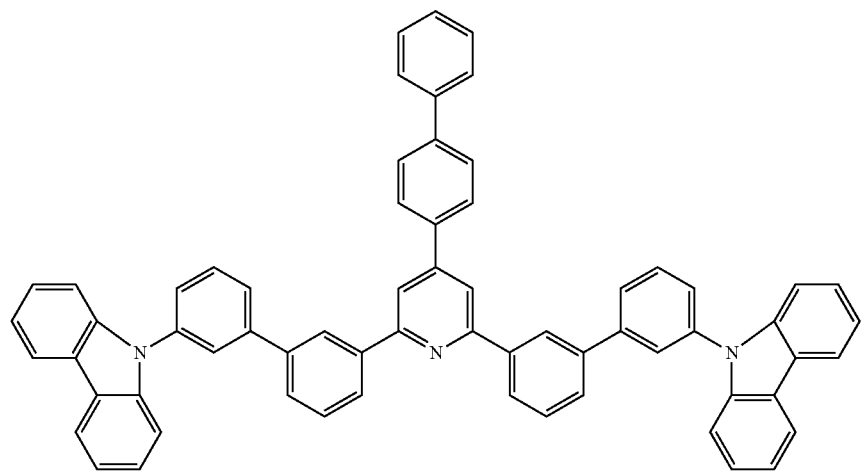

-continued
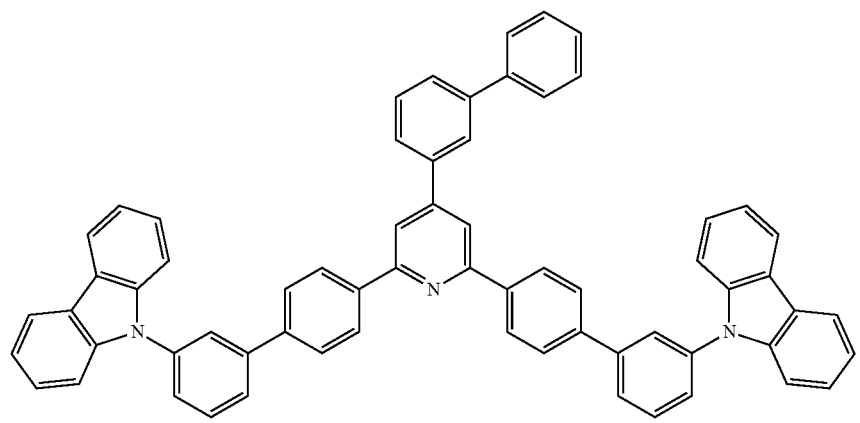
(H-A-67)
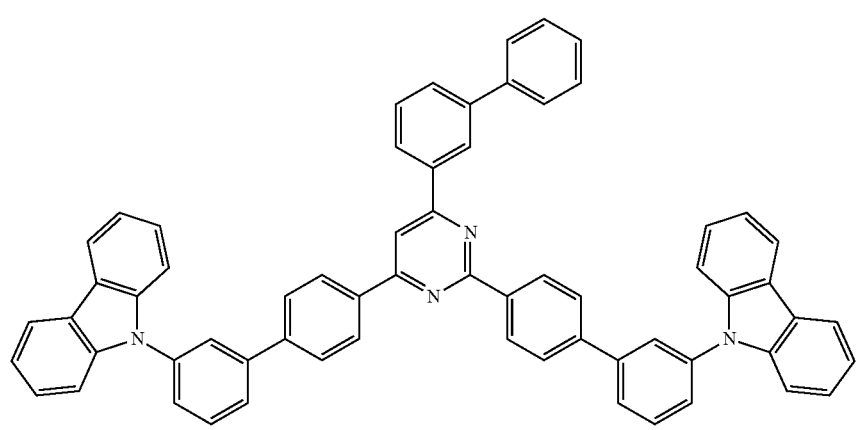
(H-A-68)
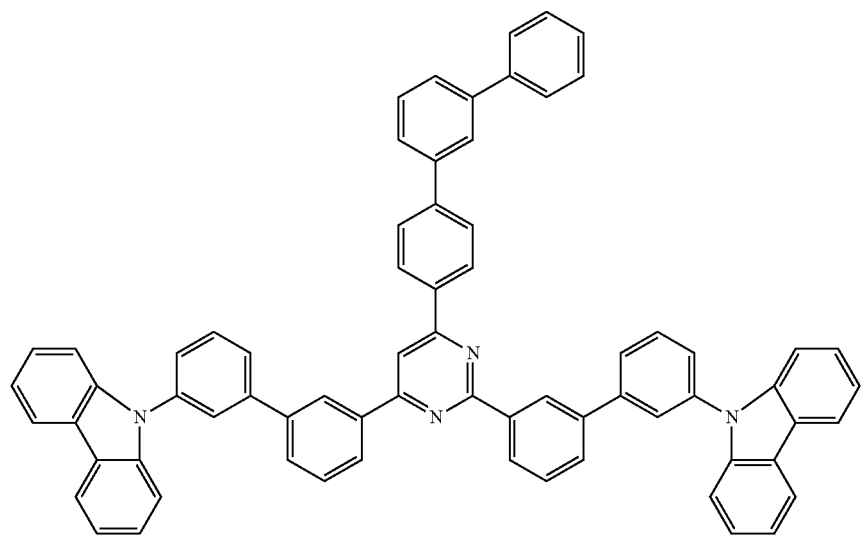
(H-A-69)

(H-A-70)
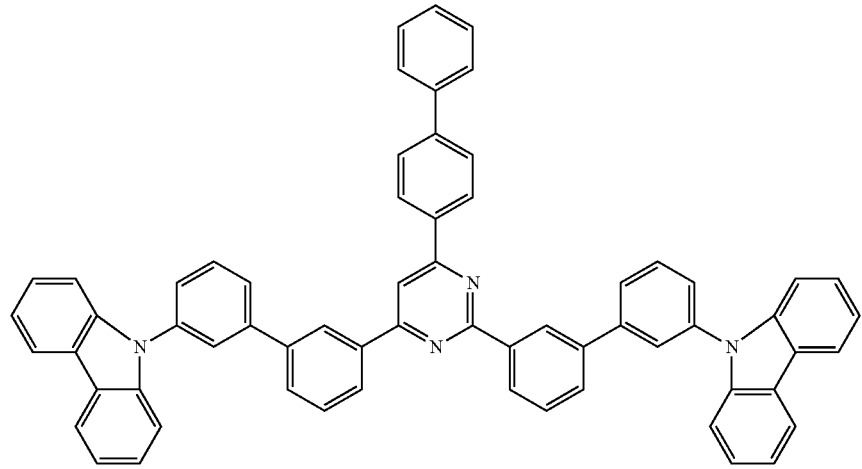
[Chem. 28]
(H-A-71)
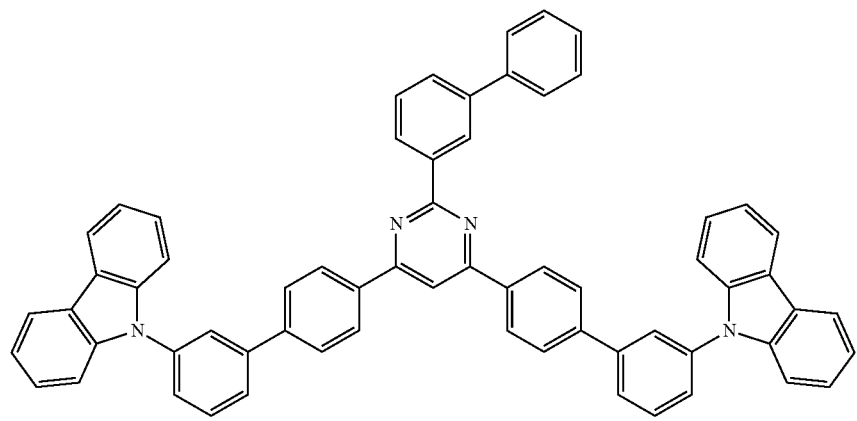
(H-A-72)
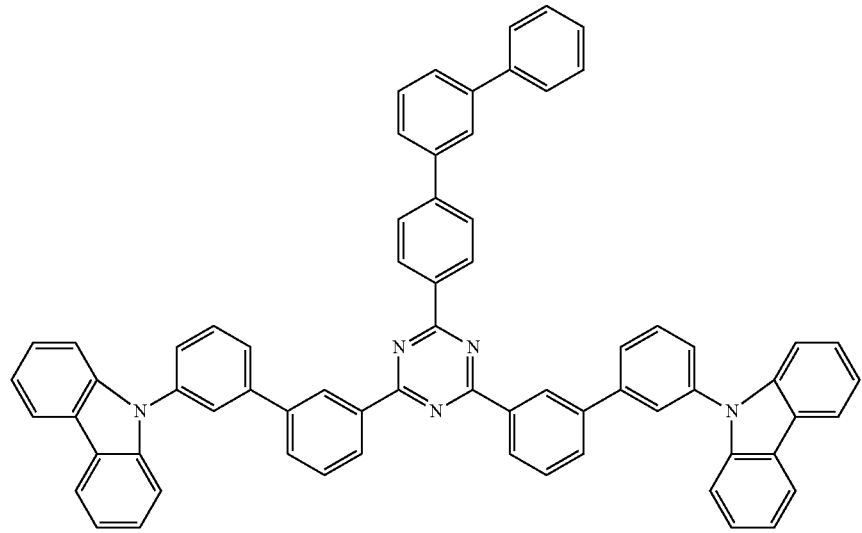

(H-A-73)
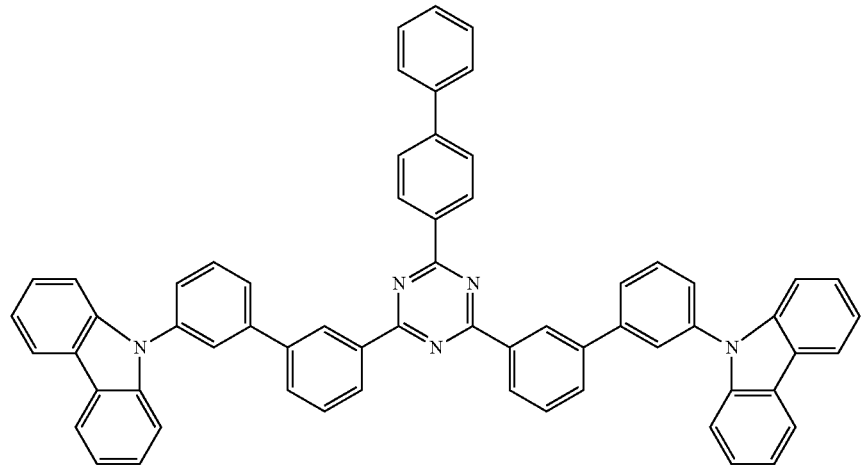
(H-A-74)
(H-A-75)
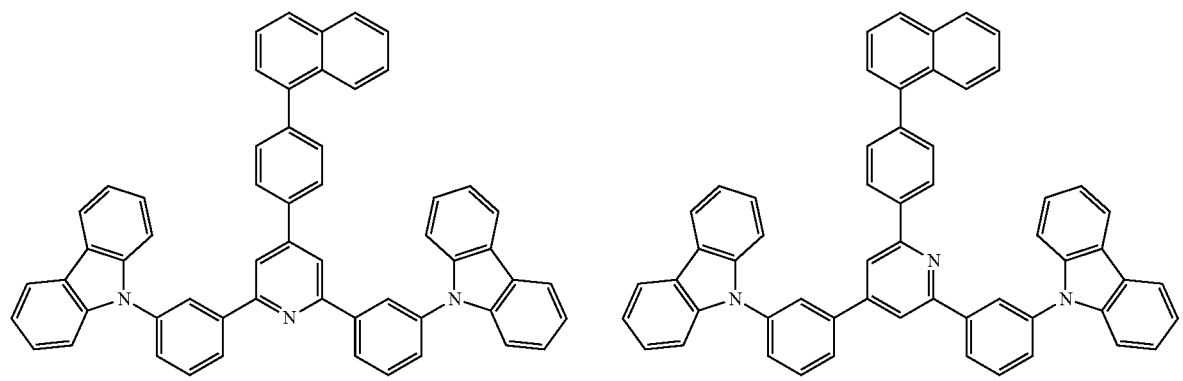
(H-A-76)
(H-A-77)
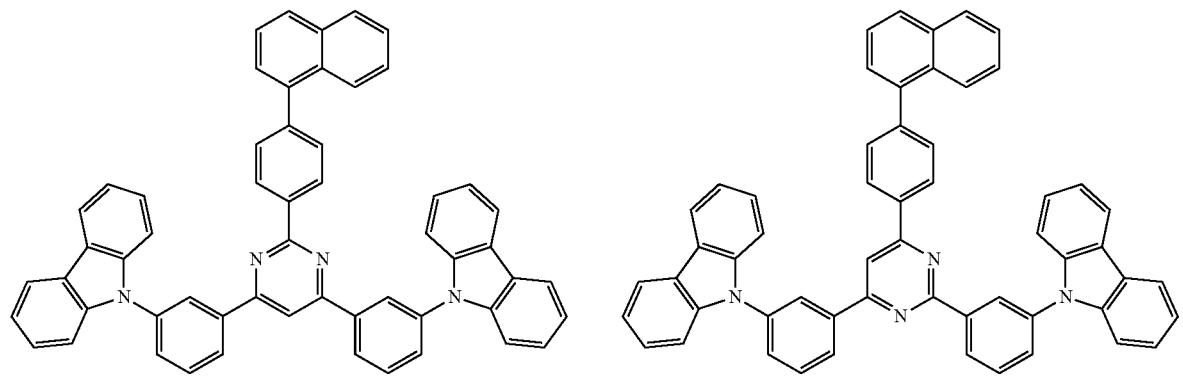

-continued
(H-A-78)
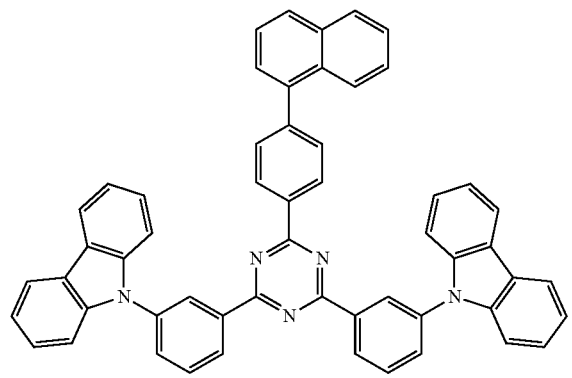
(H-A-79)
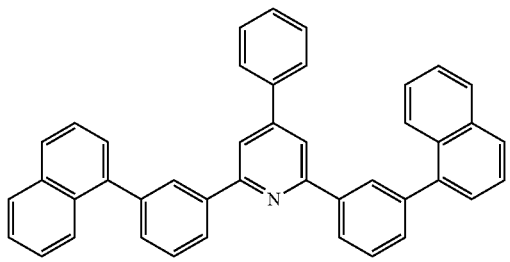
(H-A-80)
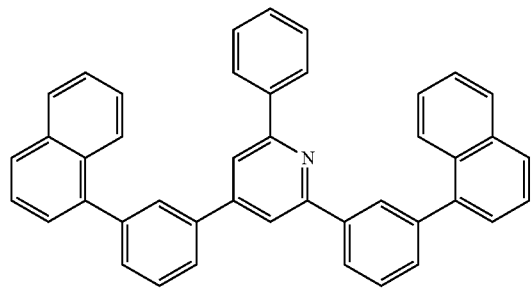
[Chem. 29]
(H-A-81)
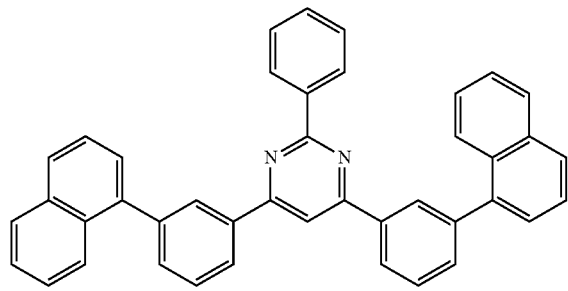
(H-A-82)
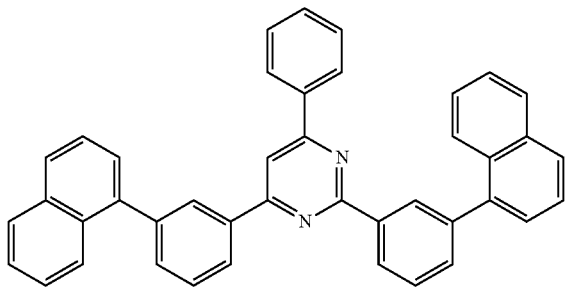
(H-A-83)
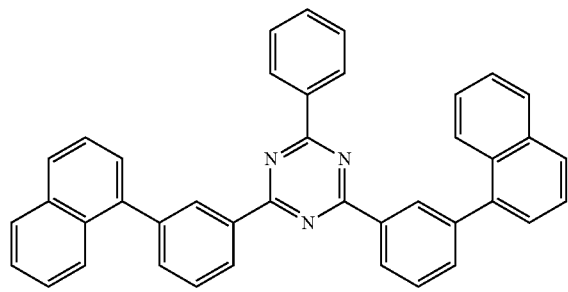
(H-A-84)
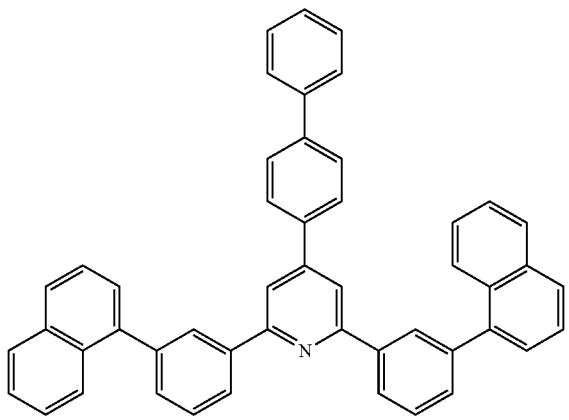

-continued
(H-A-85)
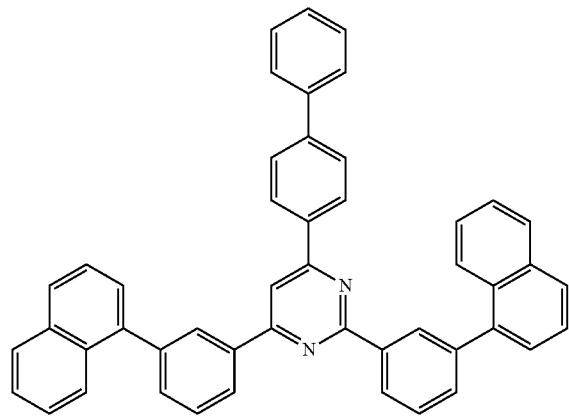
(H-A-86)
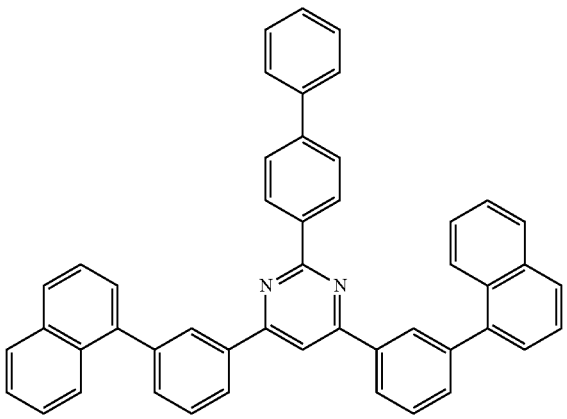
(H-A-87)
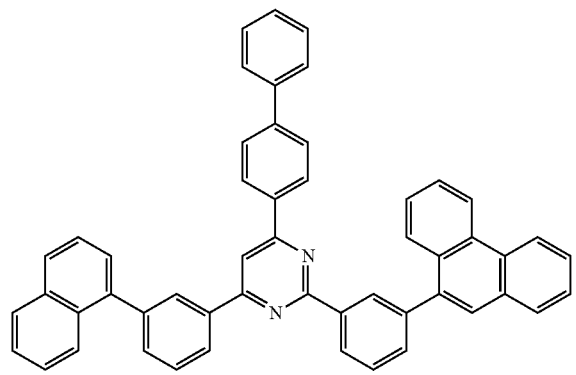
(H-A-88)
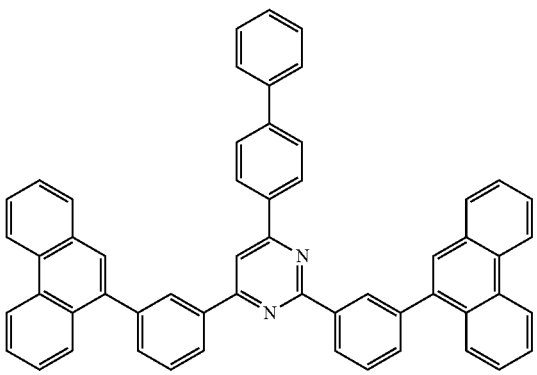
(H-A-89)
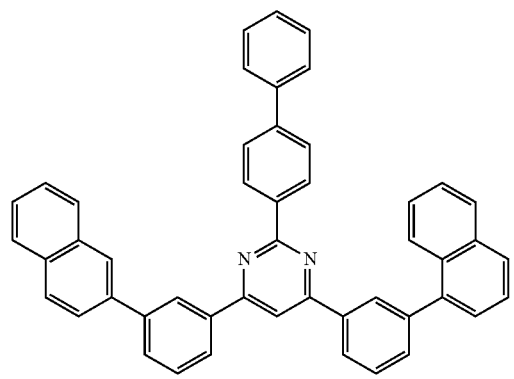
(H-A-90)
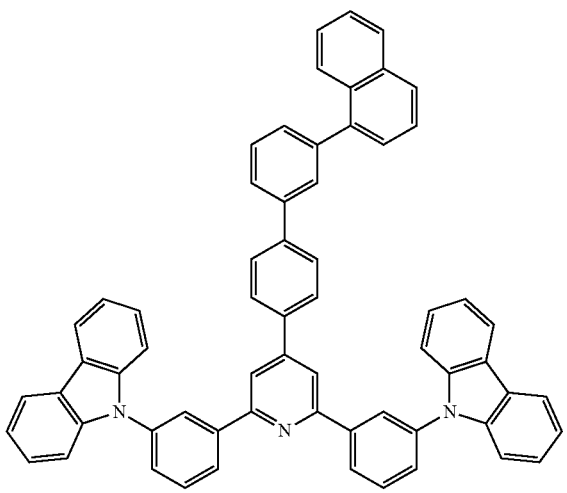

[Chem. 30]
(H-A-91)
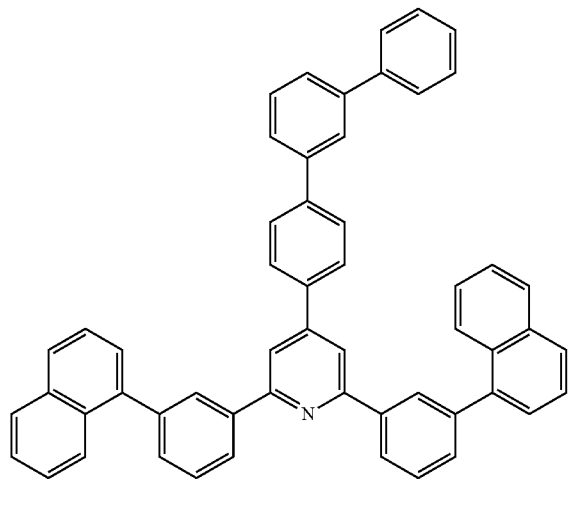
(H-A-92)
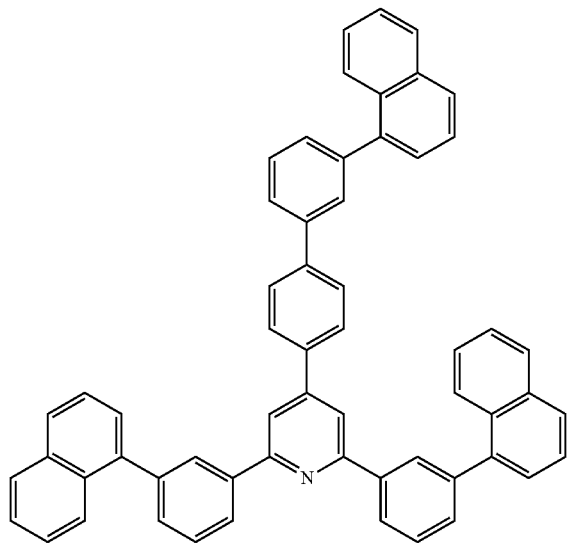
(H-A-93)
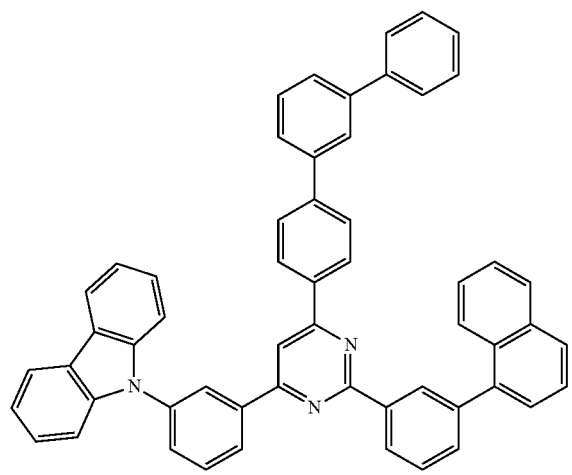
(H-A-94)
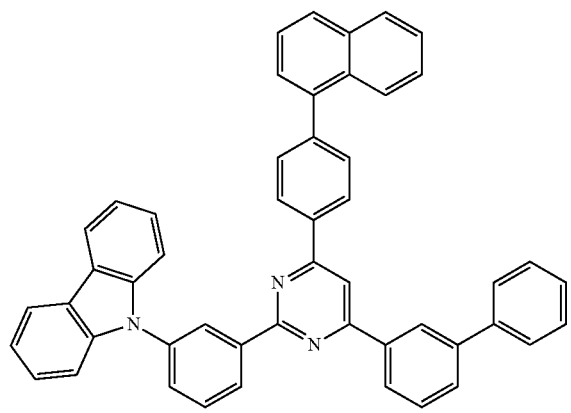
(H-A-95)
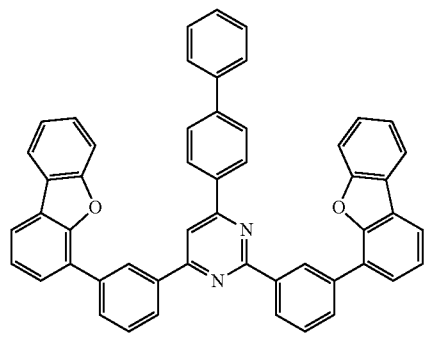
(H-A-96)
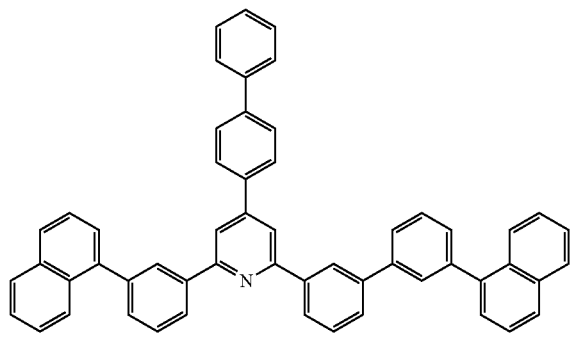

-continued
(H-A-97)
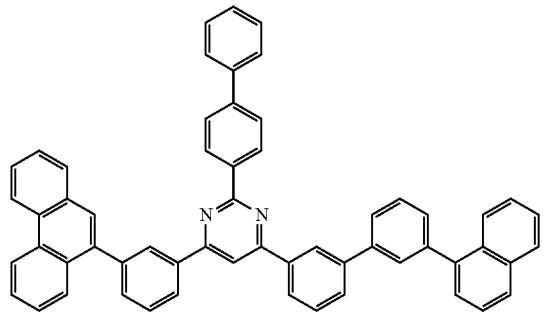
(H-A-98)
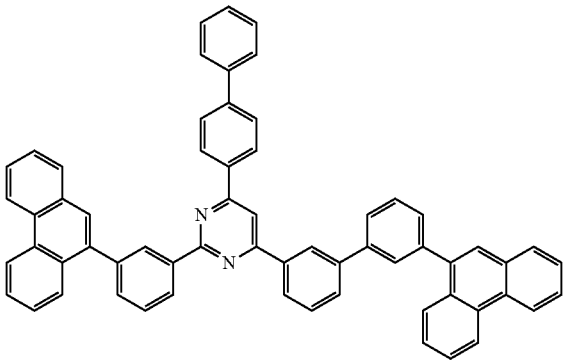
(H-A-99)
[Chem. 31]
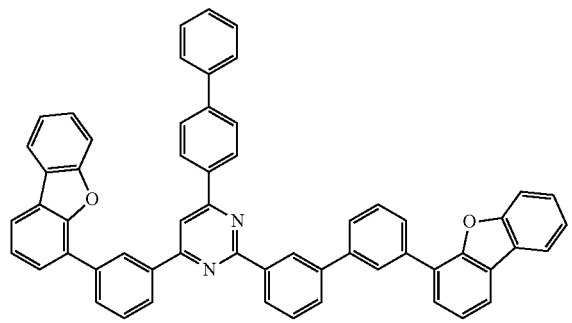
(H-A-100)
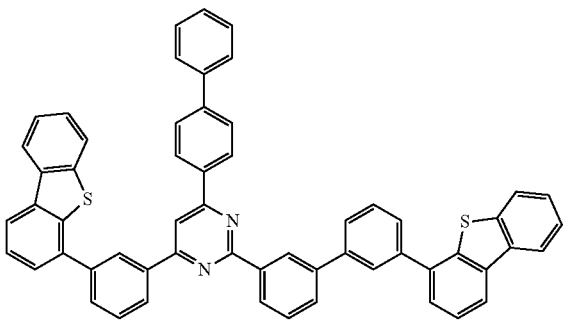
(H-A-101)
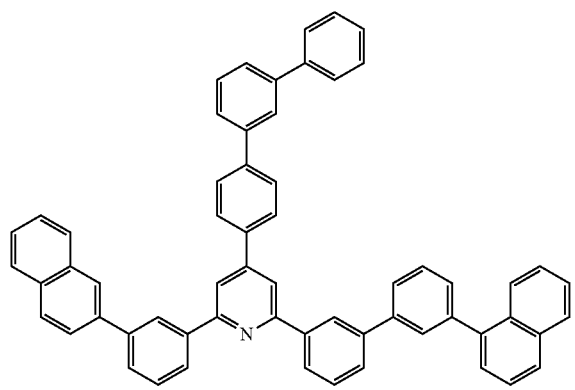
(H-A-102)
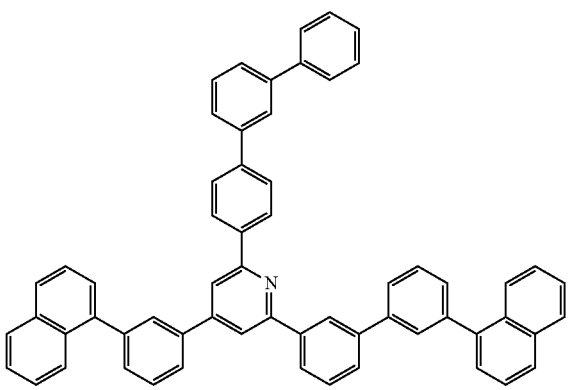
(H-A-103)
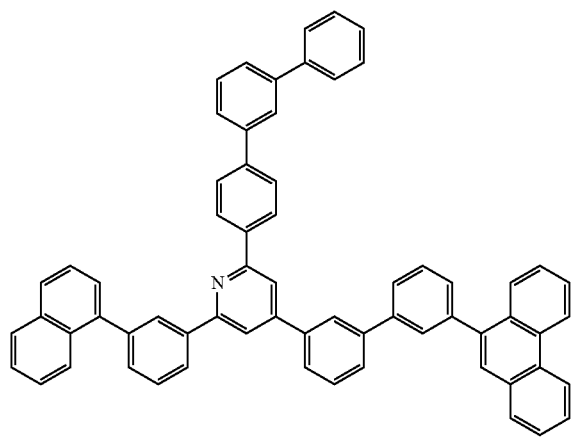
(H-A-104)
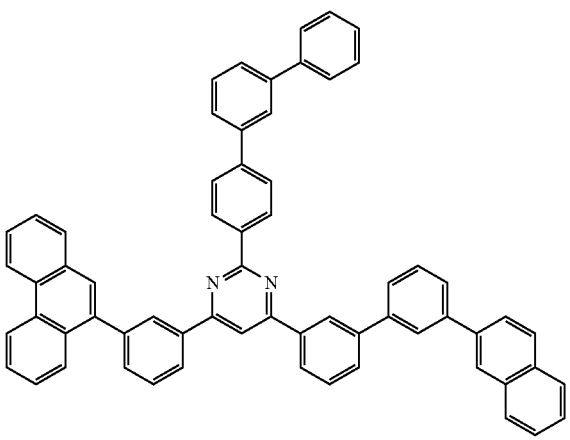

-continued
(H-A-105)
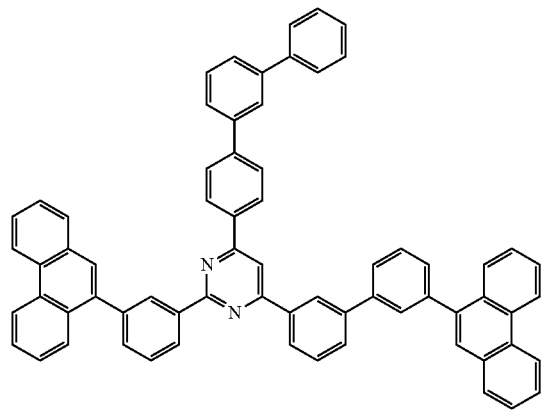
(H-A-106)
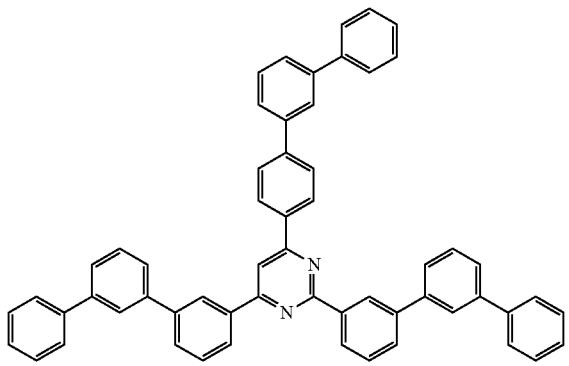
(H-A-107)
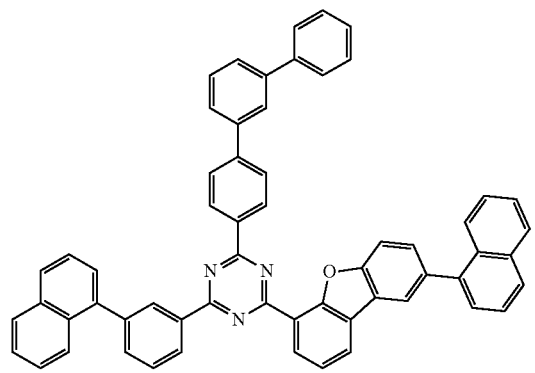
(H-A-108)
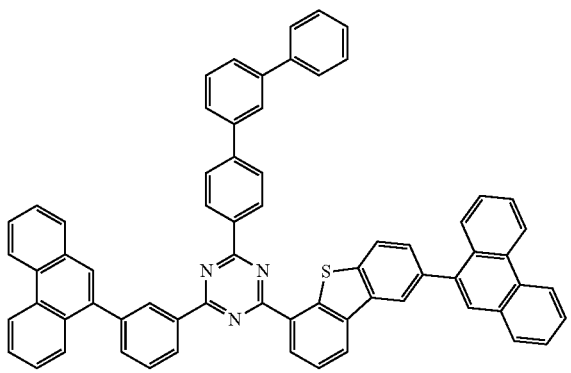
(H-A-109)
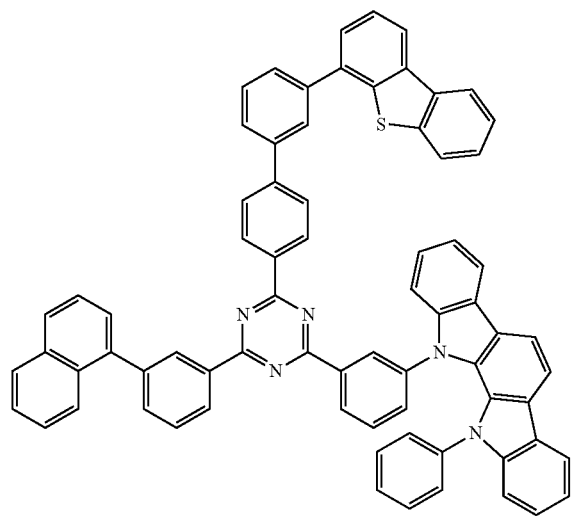
(H-A-110)
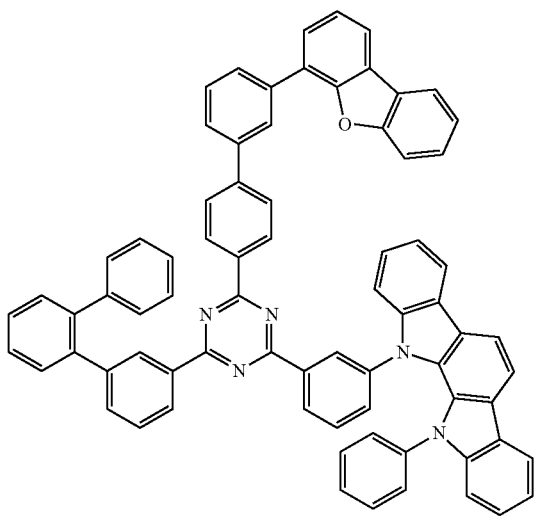

Examples of Compounds Represented by General Formula (B)
[Chem. 32]
(H-B-1)
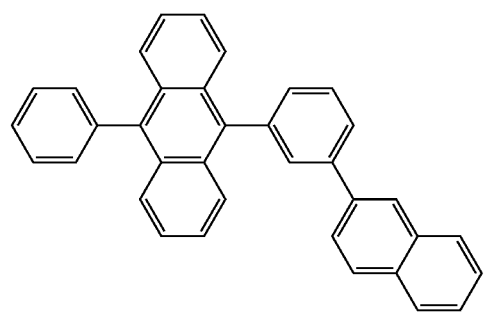
(H-B-2)
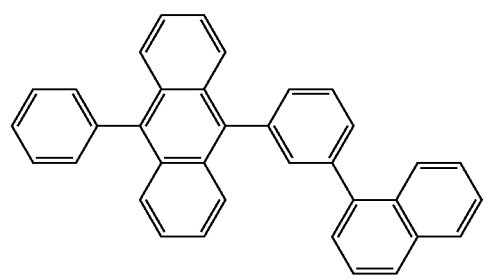
(H-B-3)
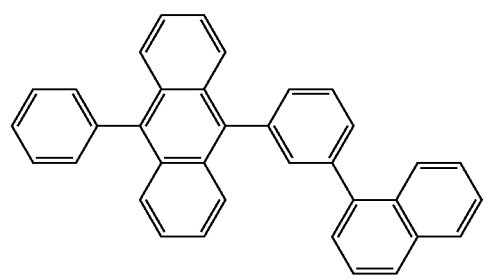
(H-B-4)
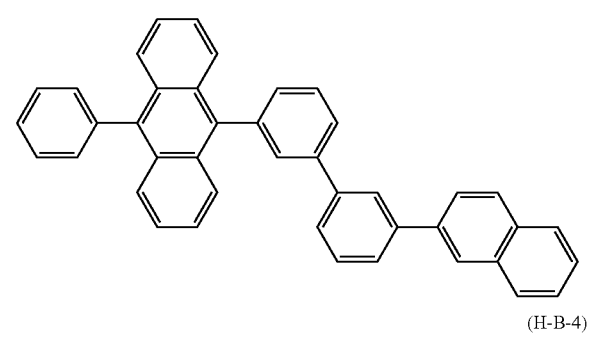
(H-B-5)
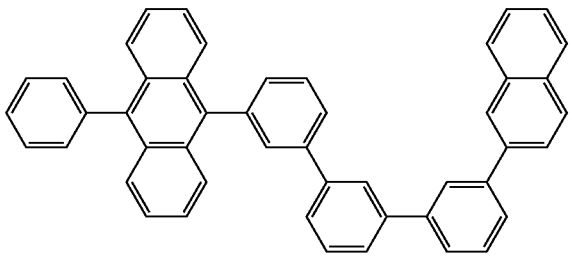
(H-B-6)
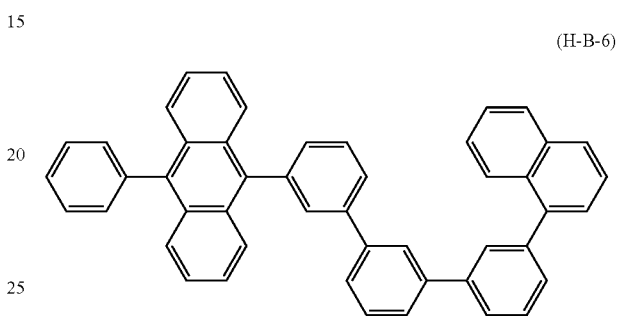
(H-B-7)
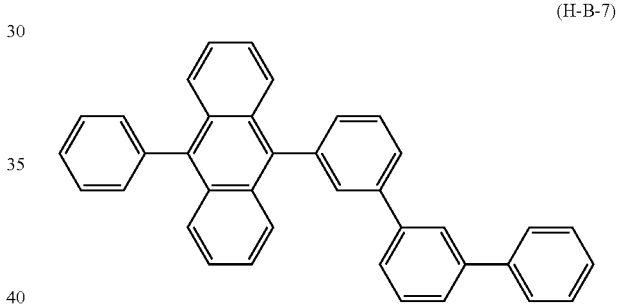
(H-B-8)
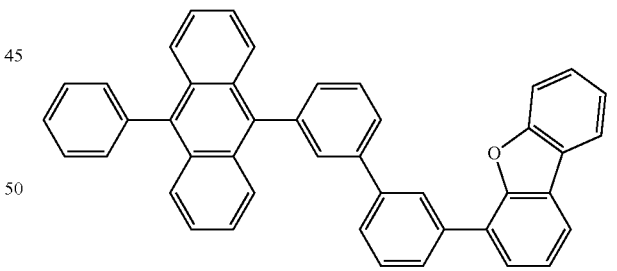
(H-B-9)
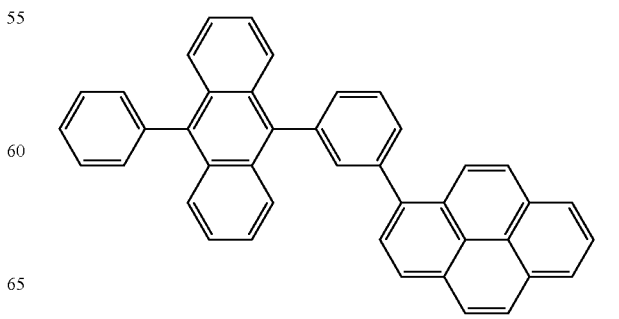

(H-B-10)
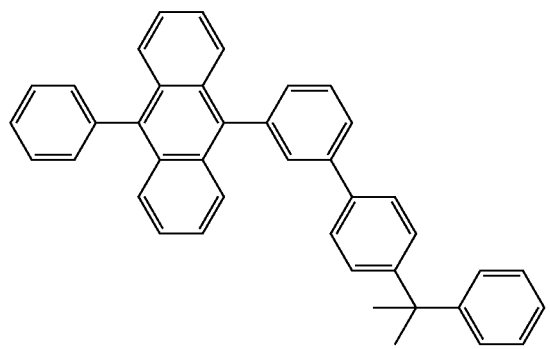
[Chem. 33]
(H-B-11)
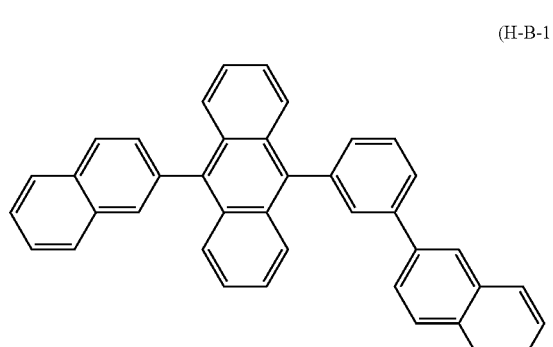
(H-B-12)
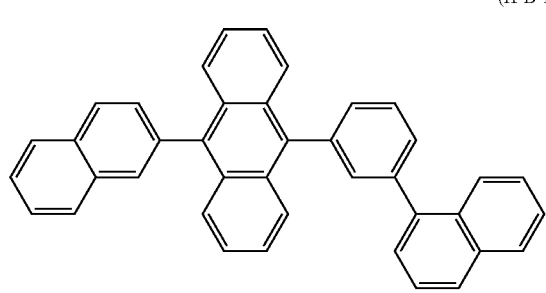
(H-B-13)
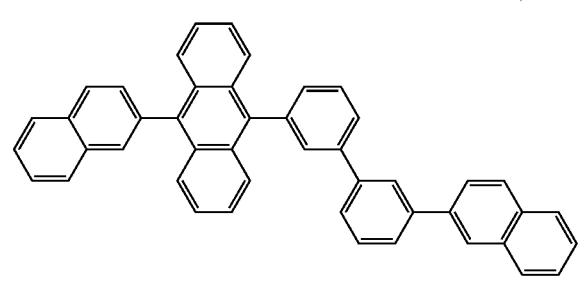
(H-B-14)
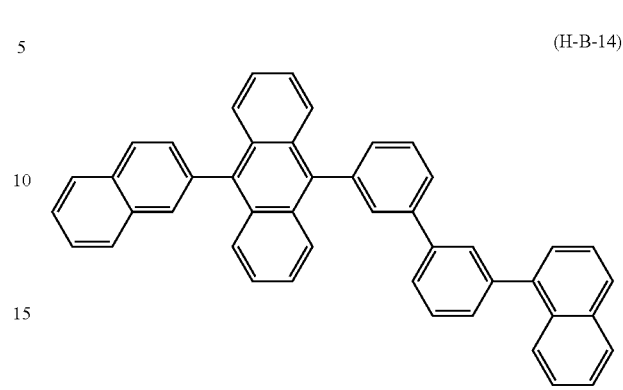
(H-B-15)
(H-B-16)
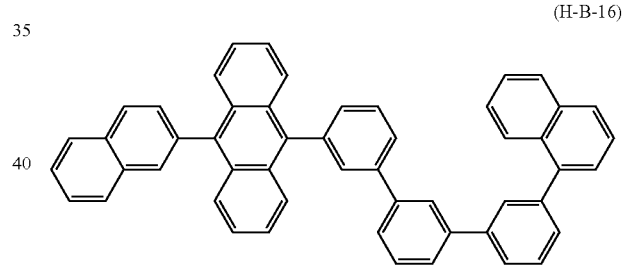
(H-B-17)
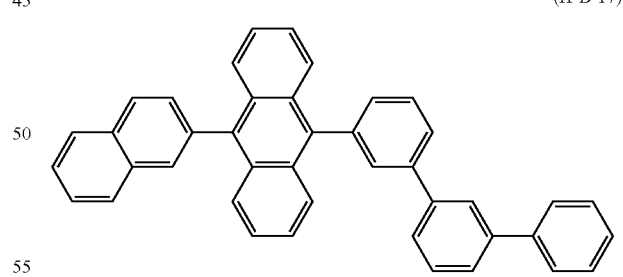
(H-B-18)
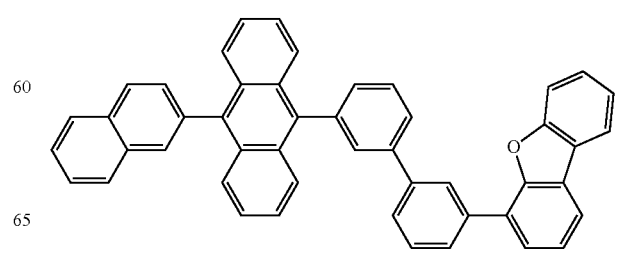

-continued
(H-B-19)
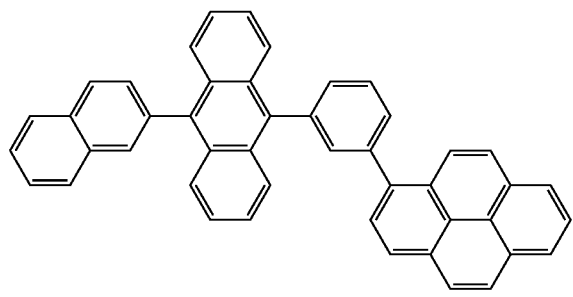
(H-B-20)
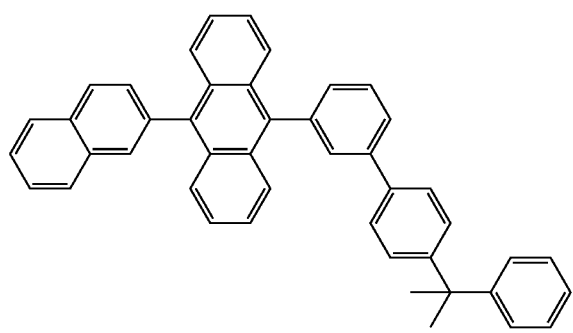
[Chem. 34]
(H-B-21)
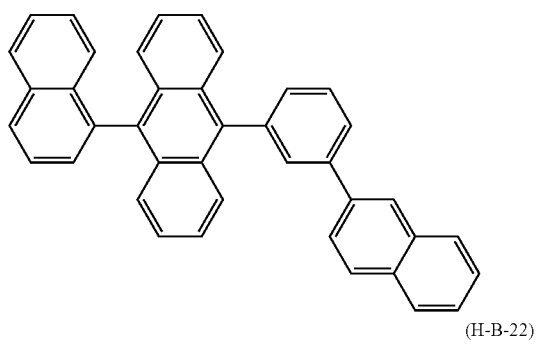
(H-B-22)
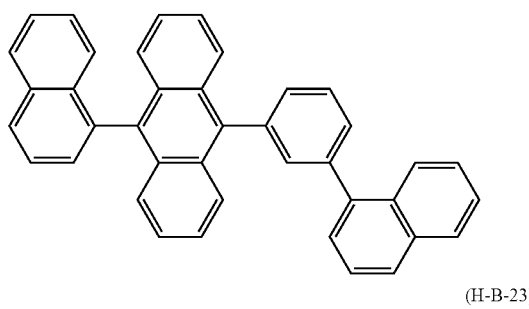
(H-B-23)
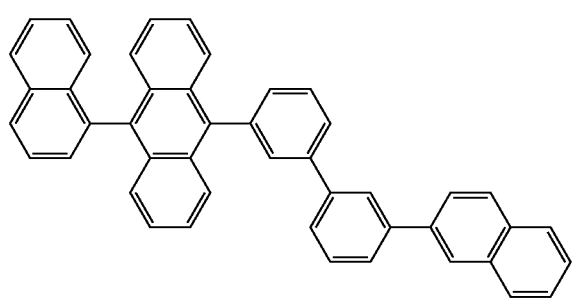
-continued
(H-B-24)
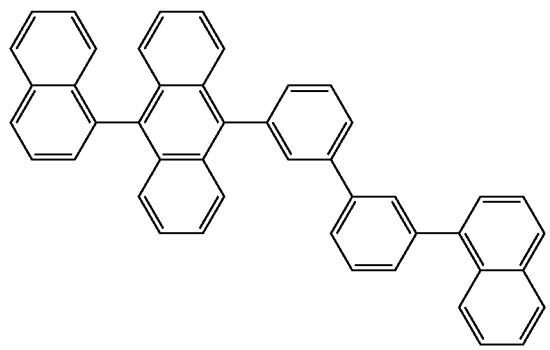
(H-B-25)
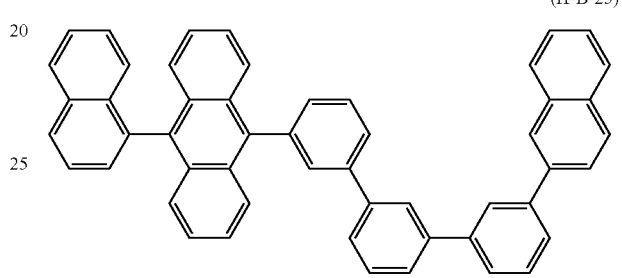
(H-B-26)
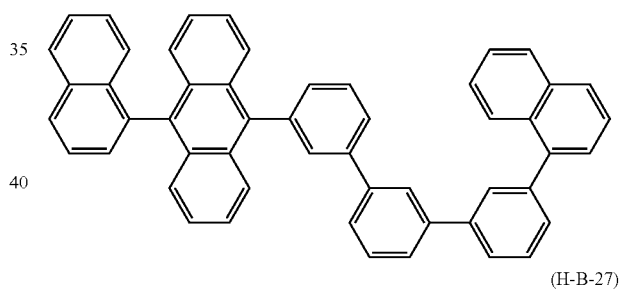
(H-B-27)
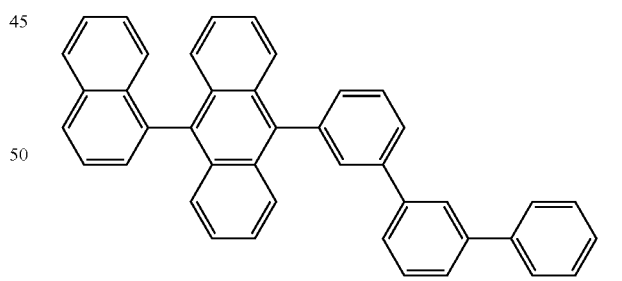
(H-B-28)
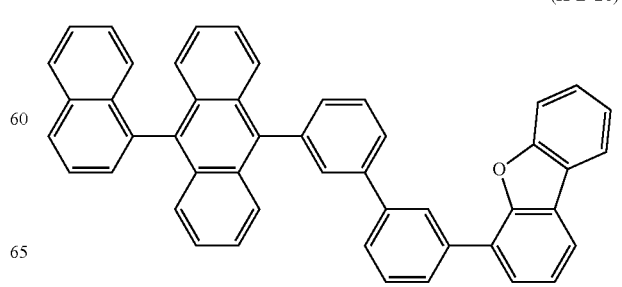

(H-B-29)
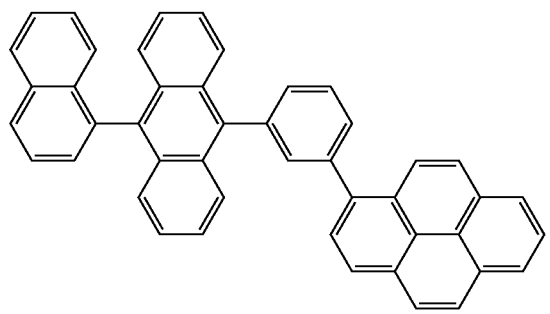
(H-B-30)
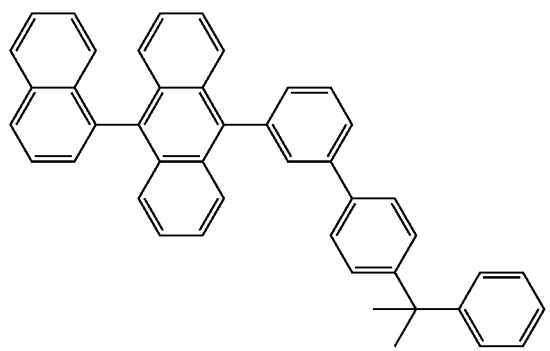
[Chem. 35]
(H-B-31)
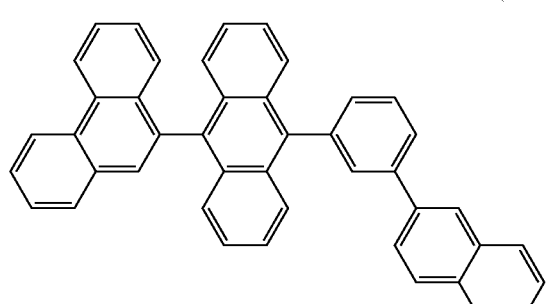
(H-B-32)
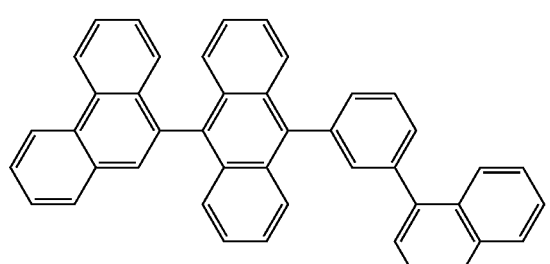
(H-B-33)
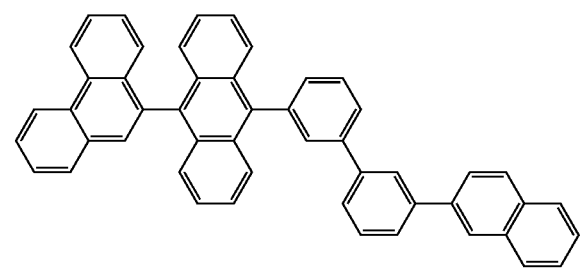
(H-B-34)
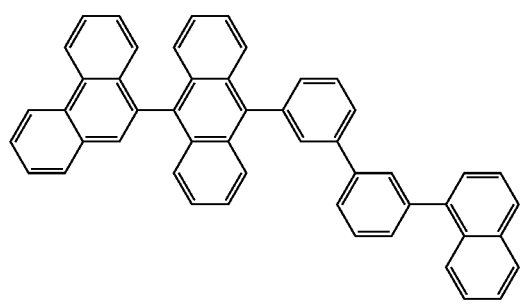
(H-B-35)
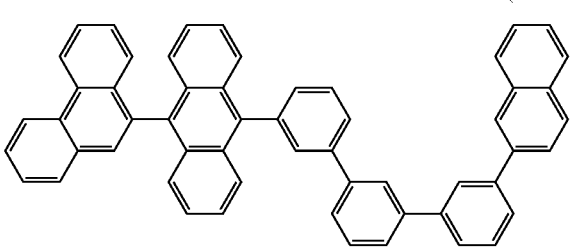
(H-B-36)
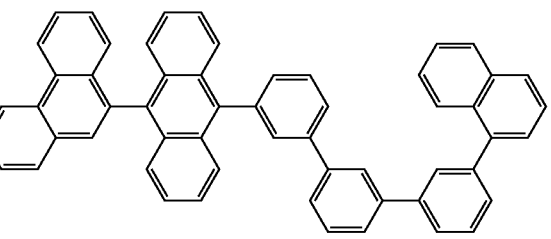
(H-B-37)
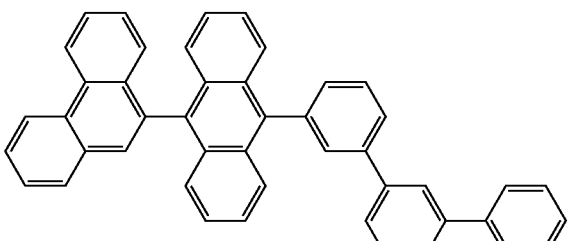
(H-B-38)
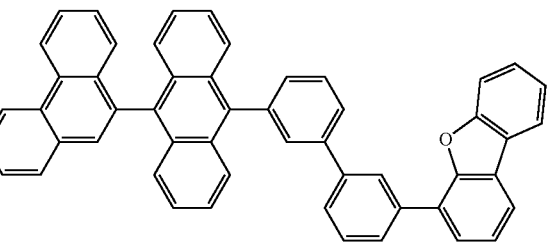

(H-B-39)
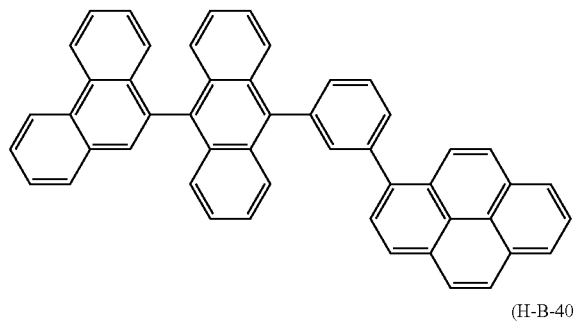
(H-B-44)
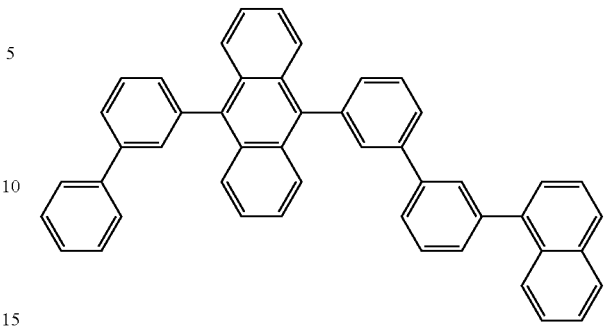
(H-B-40)
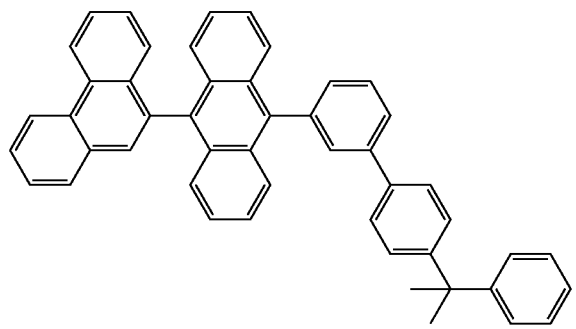
[Chem. 36]
(H-B-45)
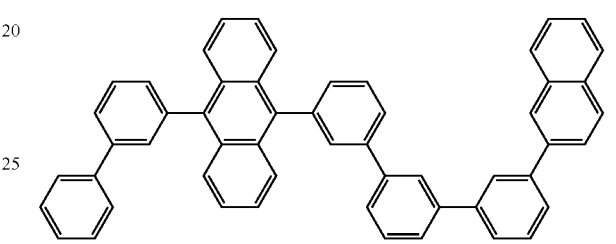
(H-B-41)
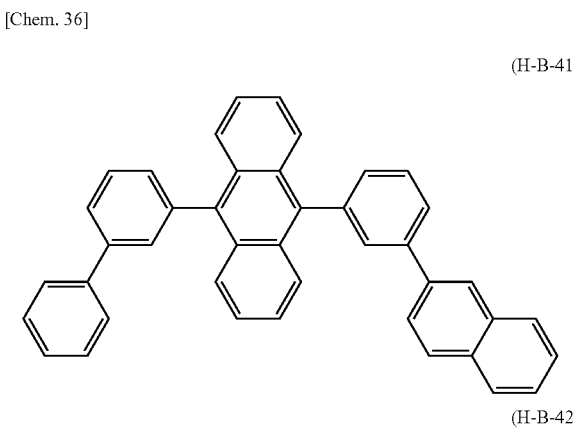
(H-B-46)
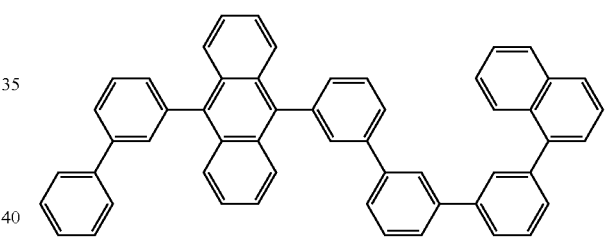
(H-B-42)
(H-B-47)
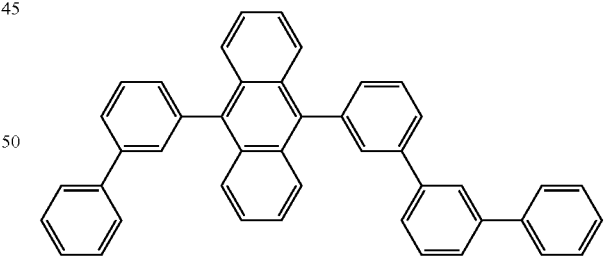
(H-B-43)
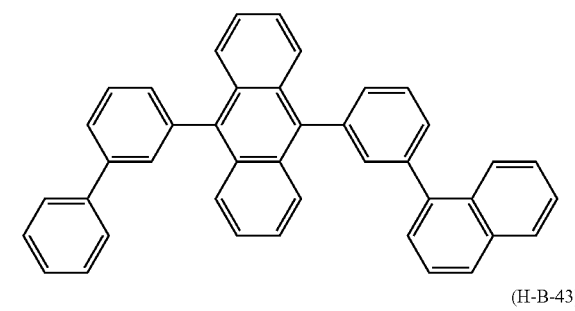
(H-B-48)
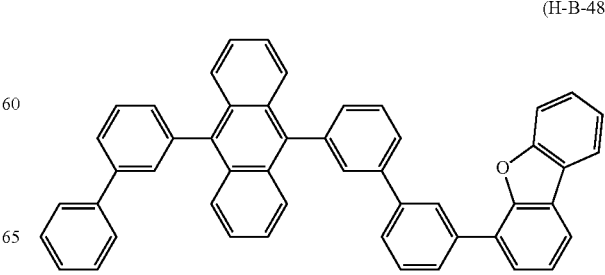

(H-B-49)
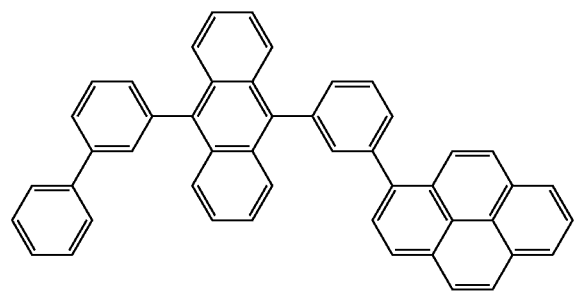
(H-B-50)
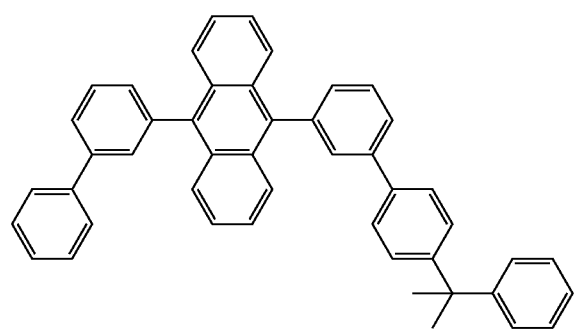
[Chem. 37]
(H-B-51)
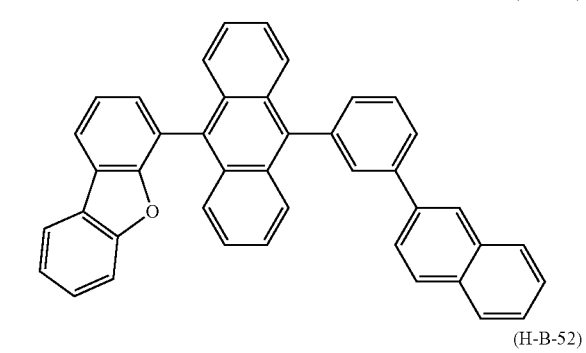
(H-B-52)
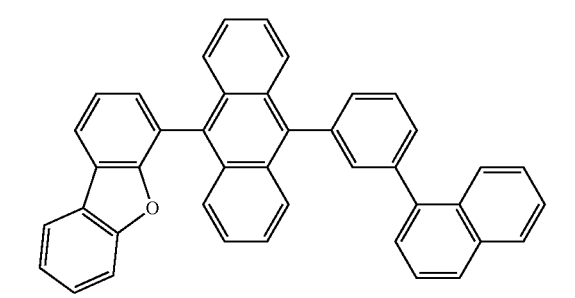
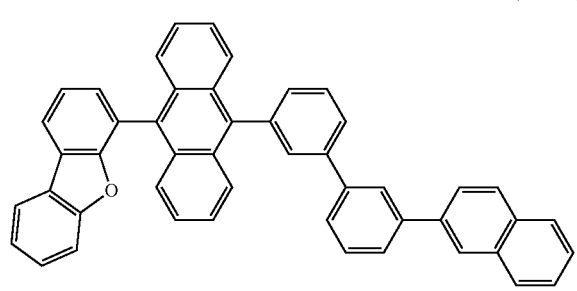
(H-B-54)
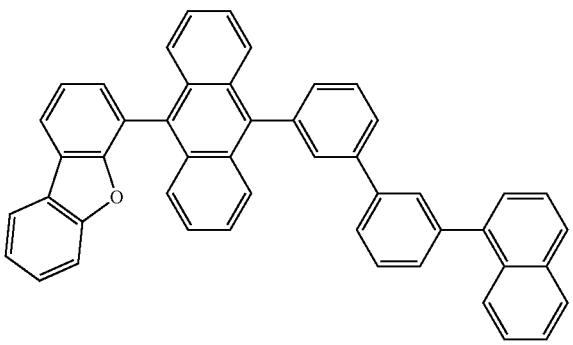
(H-B-55)
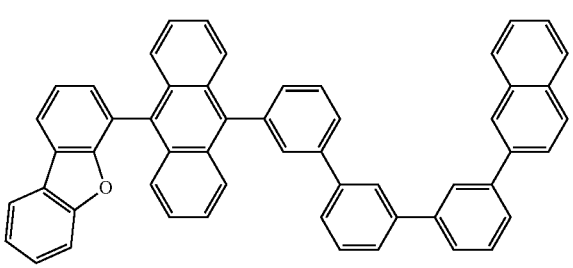
(H-B-56)
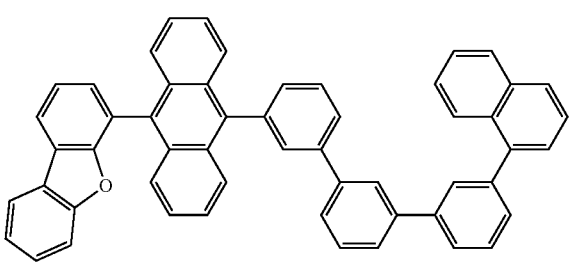
(H-B-57)
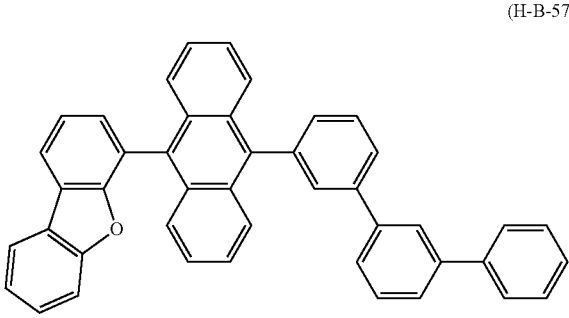
(H-B-58)
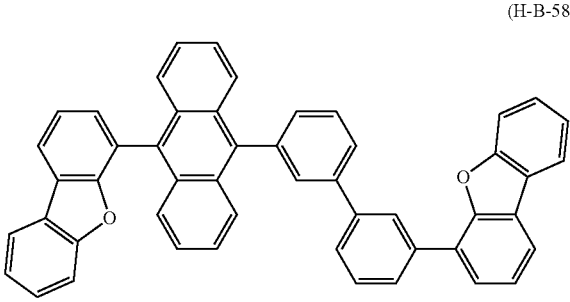

-continued
(H-B-59)
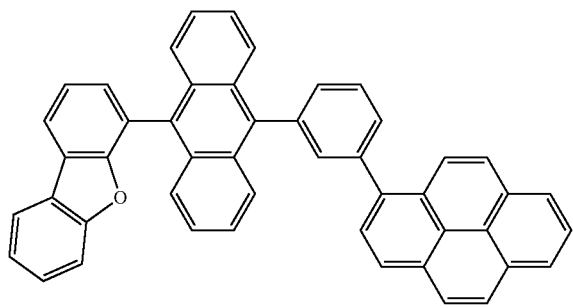
(H-B-60)
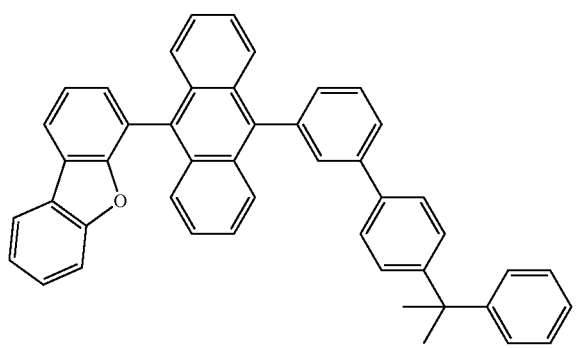
[Chem. 38]
(H-B-61)
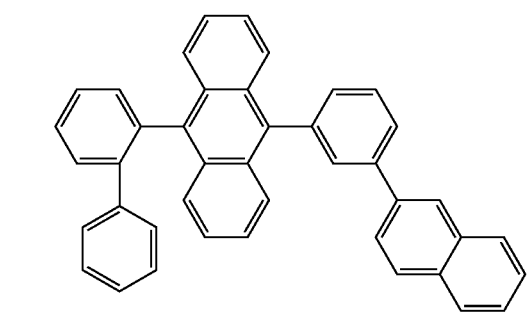
(H-B-62)
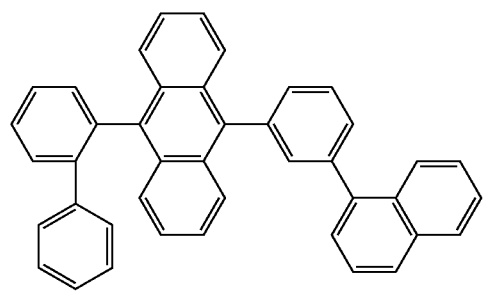
-continued
(H-B-63)
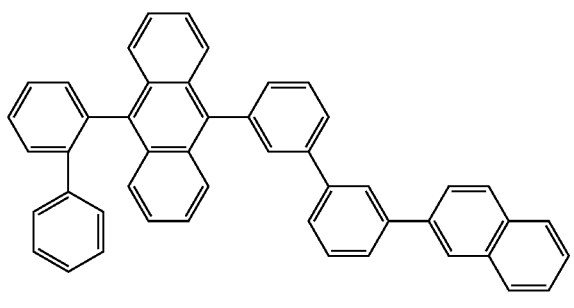
(H-B-64)
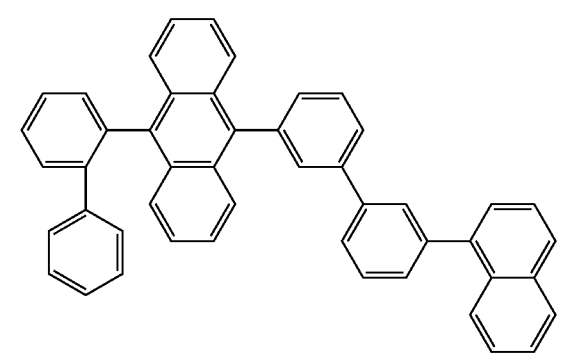
(H-B-65)
(H-B-66)
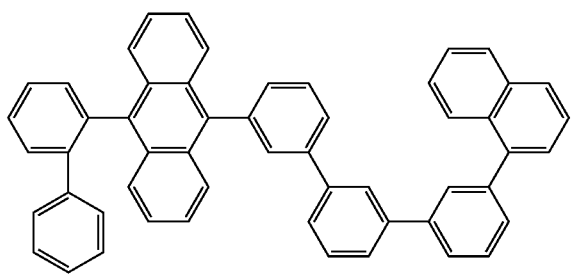
(H-B-67)
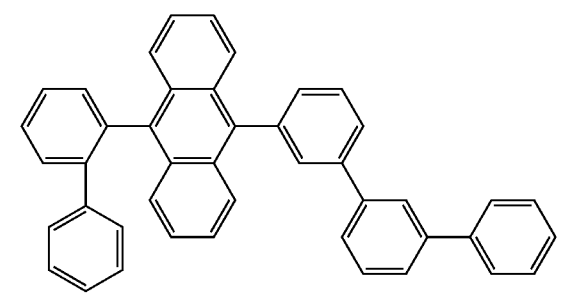

(H-B-68)
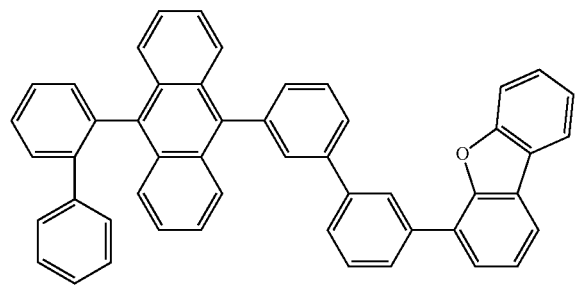
(H-B-69)
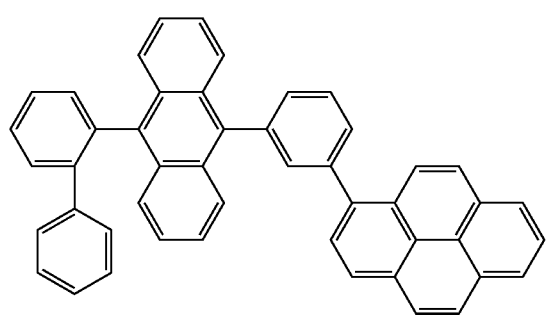
(H-B-70)
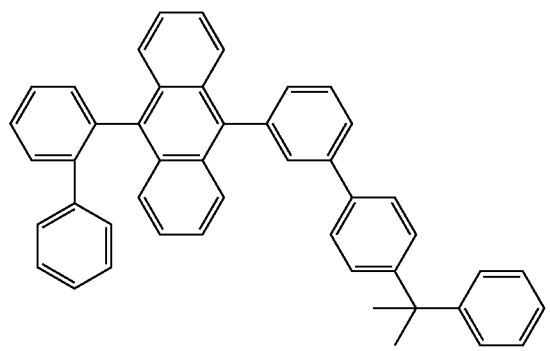
[Chem. 39]
(H-B-71)
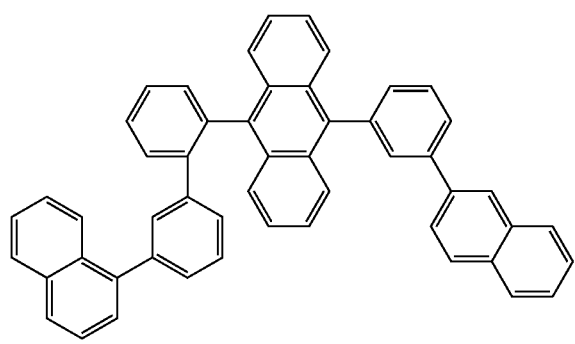
(H-B-72)
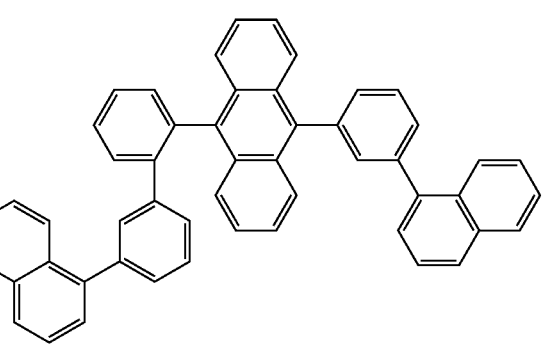
(H-B-73)
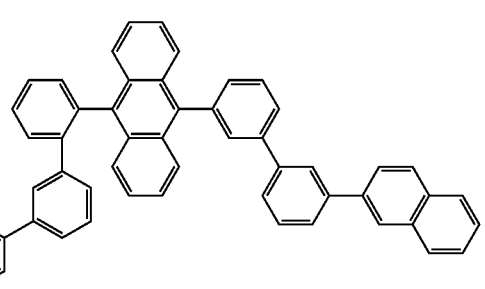
(H-B-74)
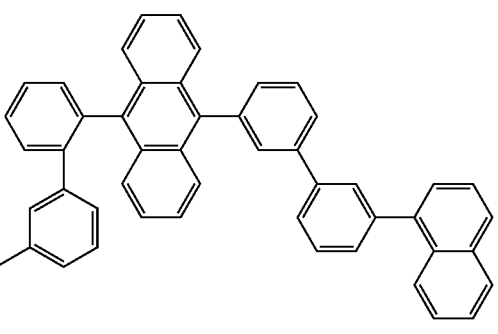
(H-B-75)
(H-B-76)
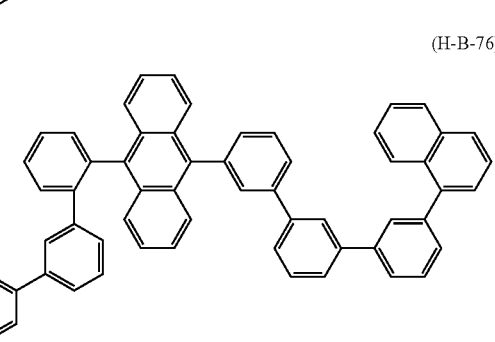

[Chem. 40]
(H-B-77)
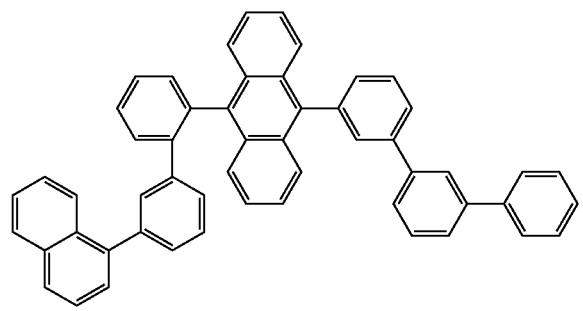
(H-B-78)
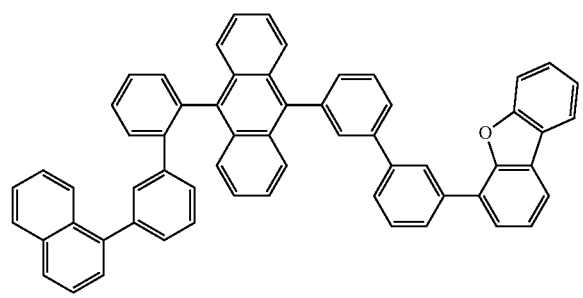
(H-B-79)
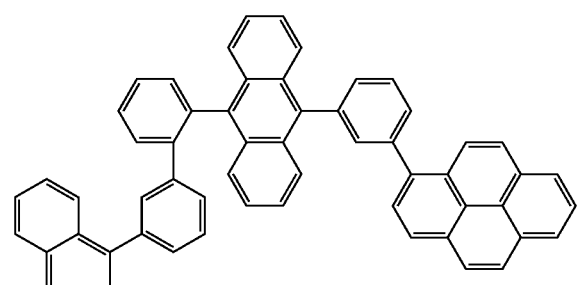
(H-B-80)
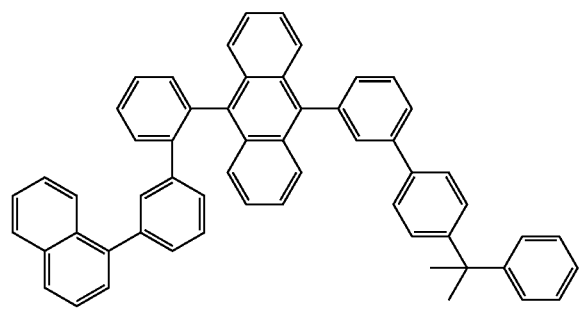
(H-B-81)
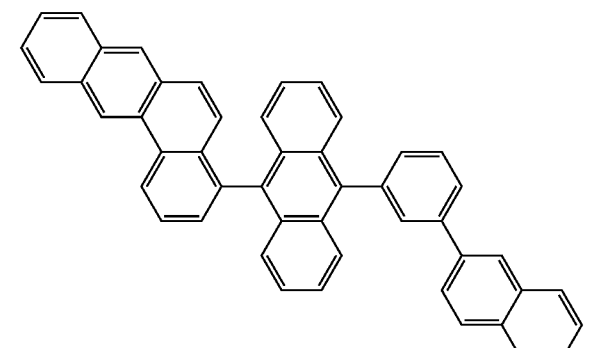
(H-B-82)
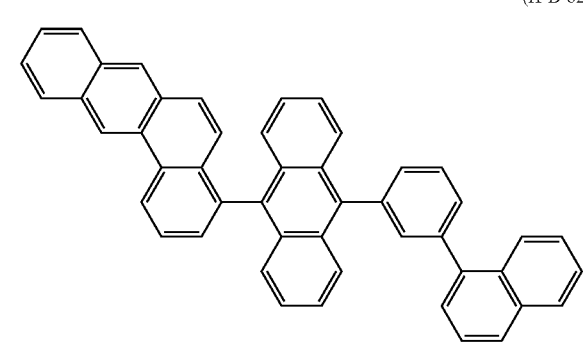
(H-B-83)
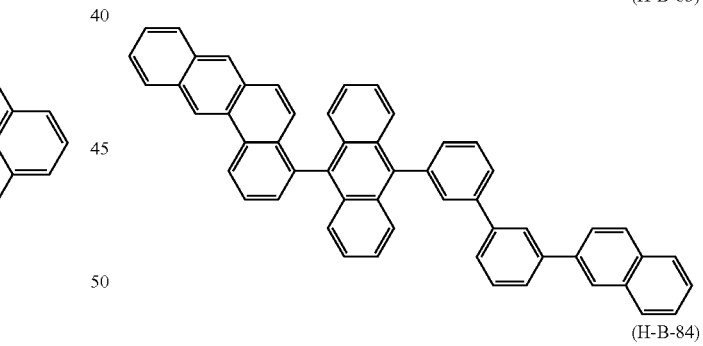
(H-B-84)
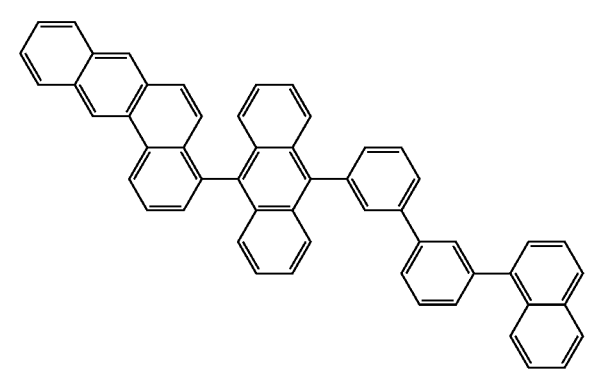

(H-B-85)
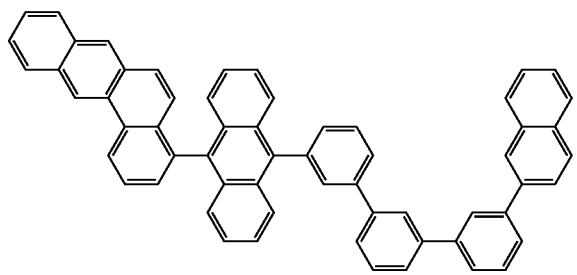
(H-B-86)
(H-B-87)
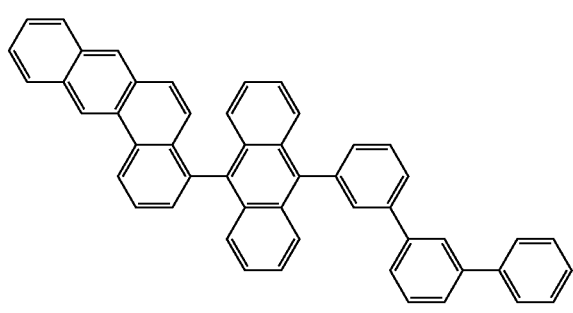
(H-B-88)
(H-B-89)
(H-B-90)
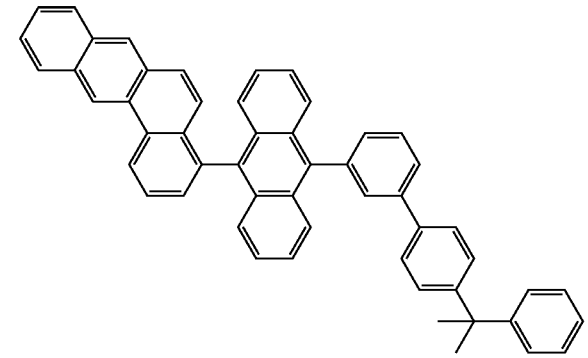
[Chem. 41]
(H-B-91)
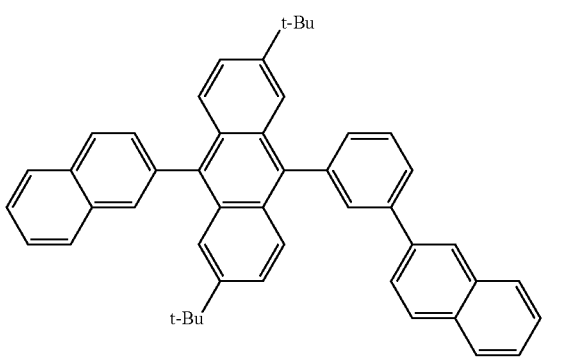
(H-B-92)
(H-B-93)
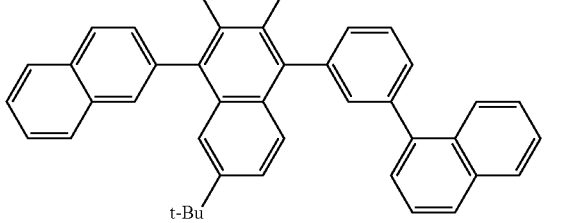

-continued
(H-B-94)
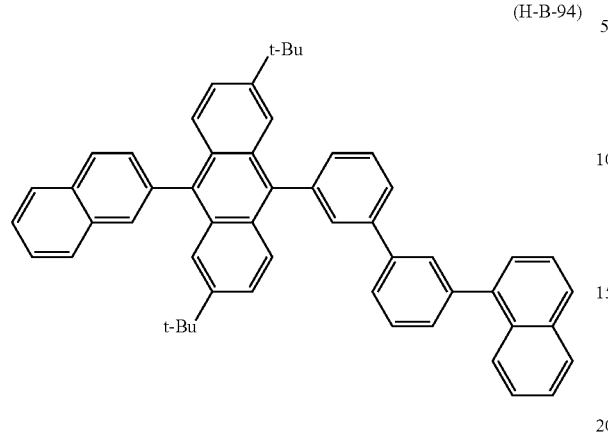
(H-B-95)
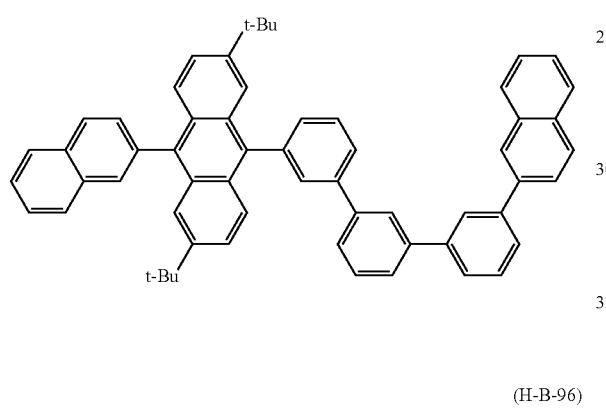
(H-B-96)
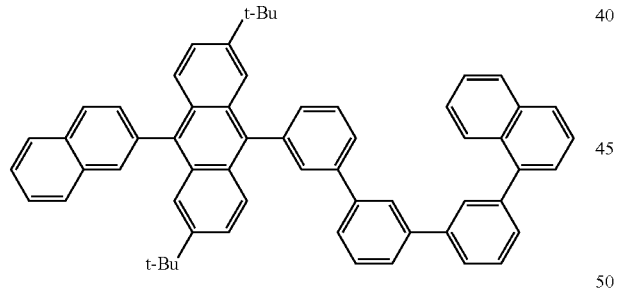
(H-B-97)
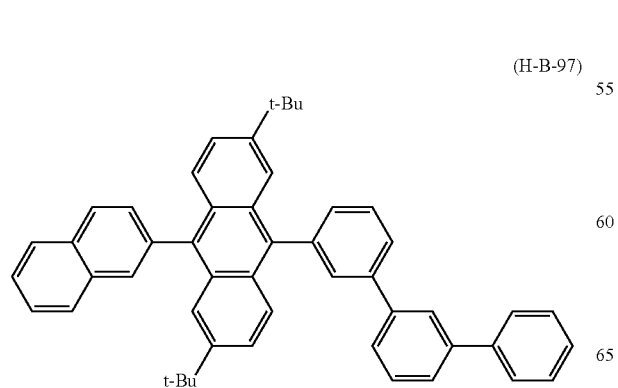
-continued
(H-B-98)
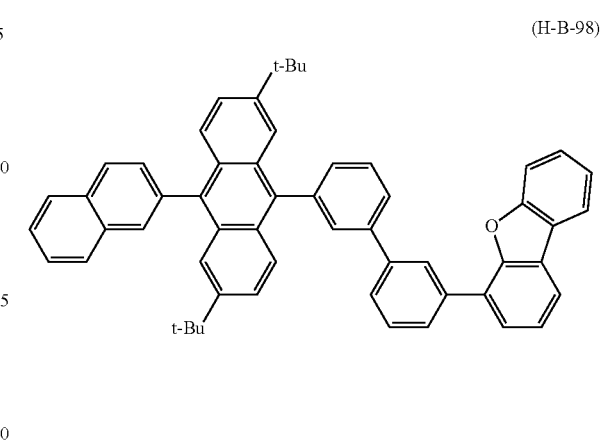
(H-B-99)
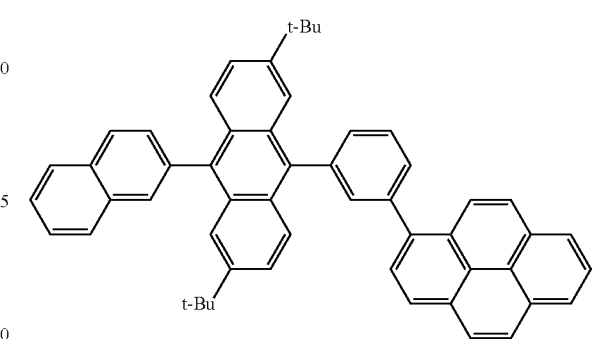
(H-B-100)
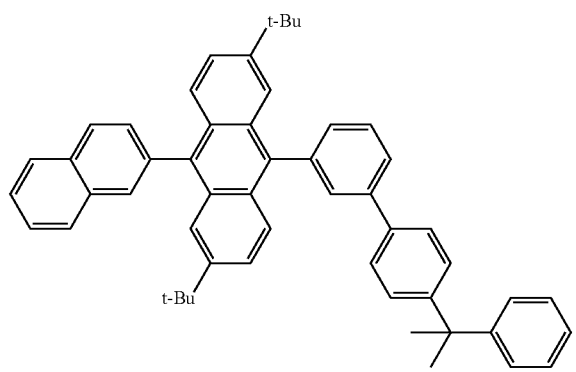

Examples of Compounds Represented by General Formula (C)
[Chem. 42]
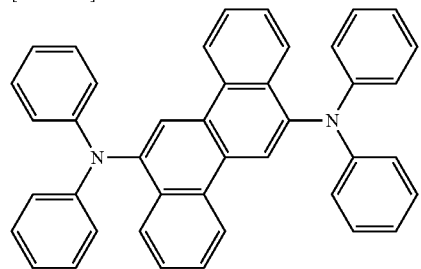 (L-C-1)
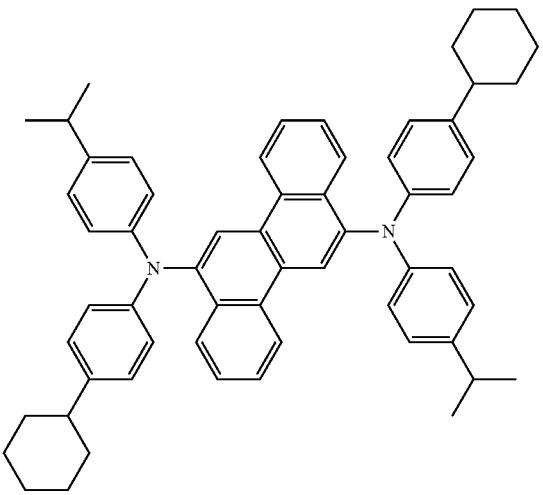 (L-C-2)
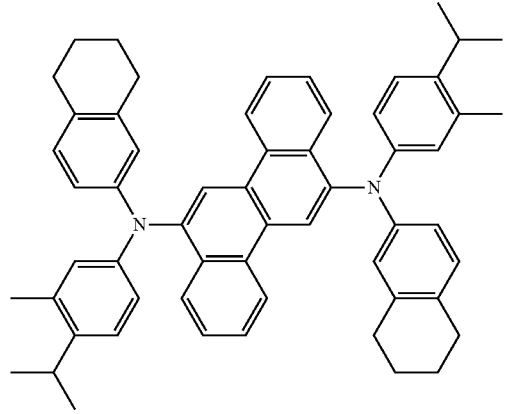 (L-C-3)
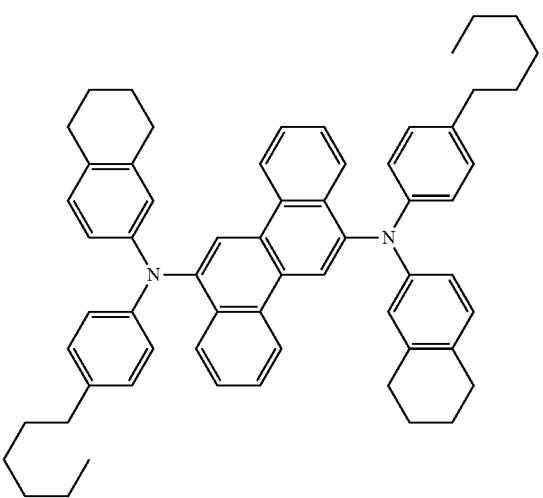 (L-C-4)
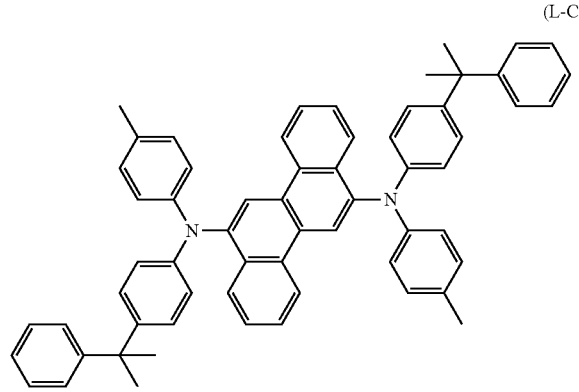 (L-C-5)
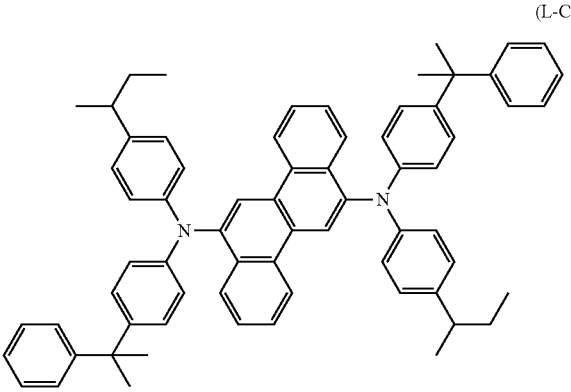 (L-C-6)

(L-C-7)
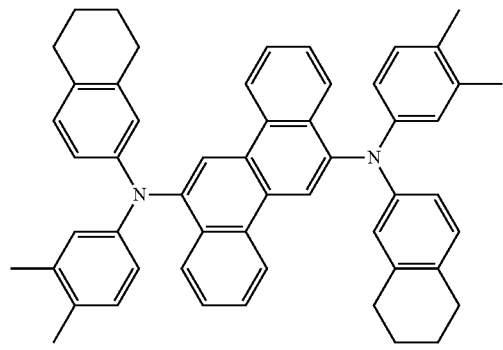
(L-C-8)
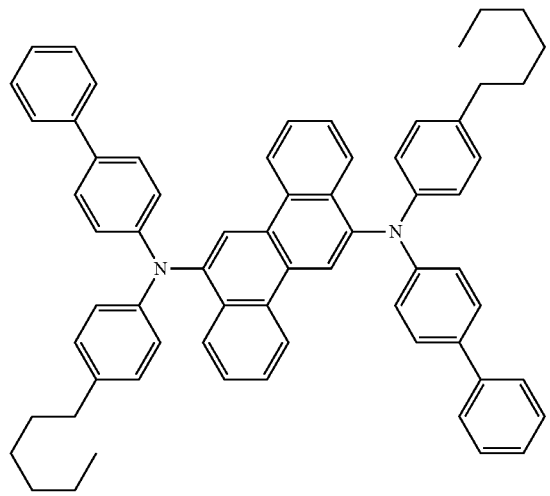
(L-C-9)
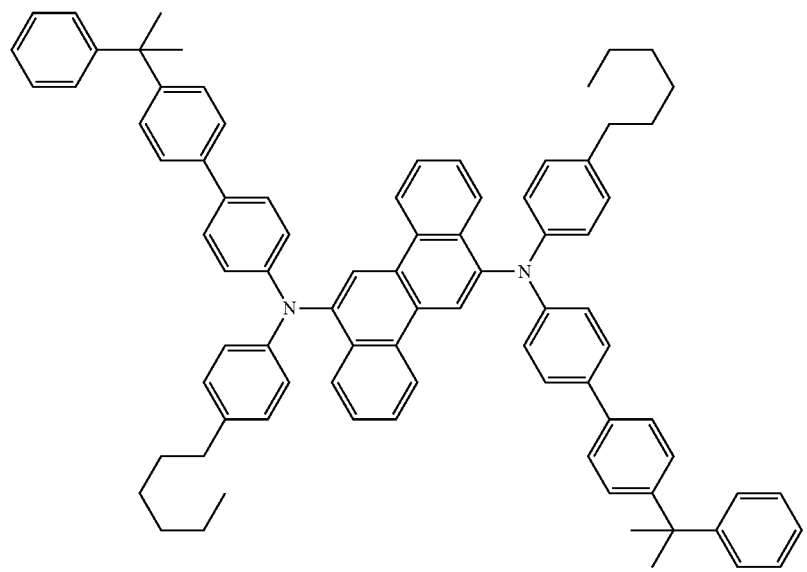
(L-C-10)
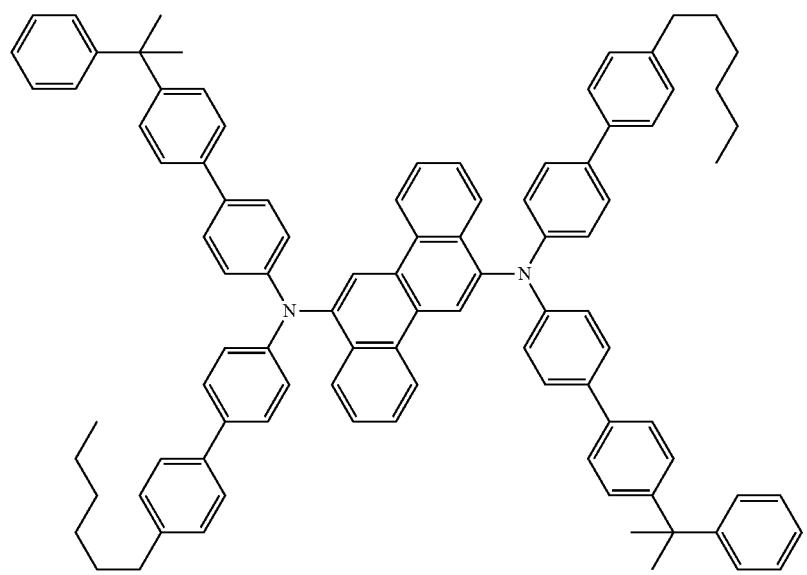

Examples of Compounds Represented by General Formula (D)
[Chem. 43]
(L-D-1)
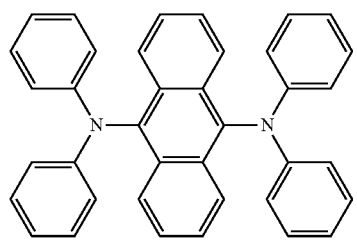
(L-D-2)
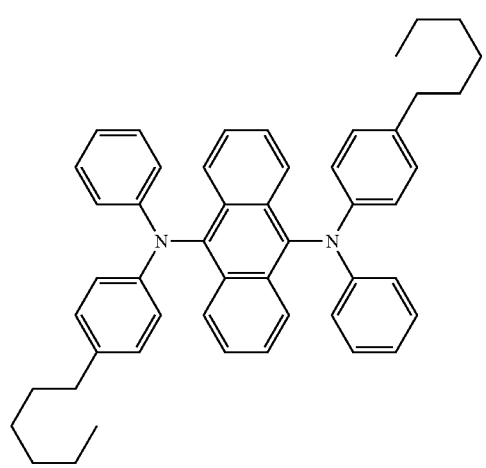
(L-D-3)
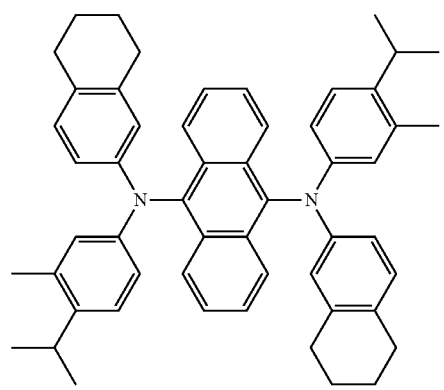
(L-D-4)
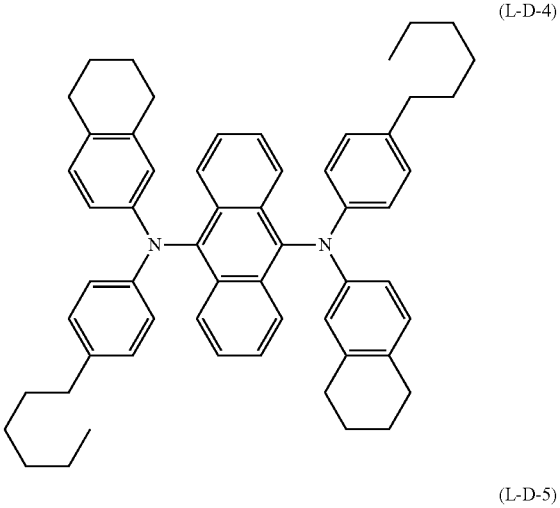
(L-D-5)
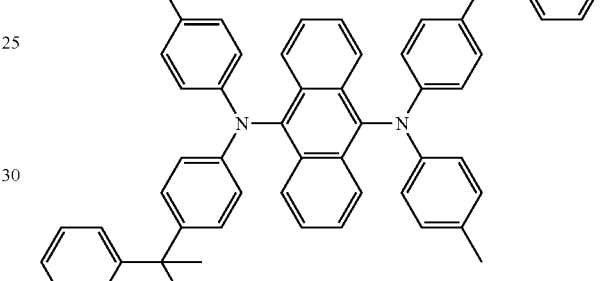
(L-D-6)
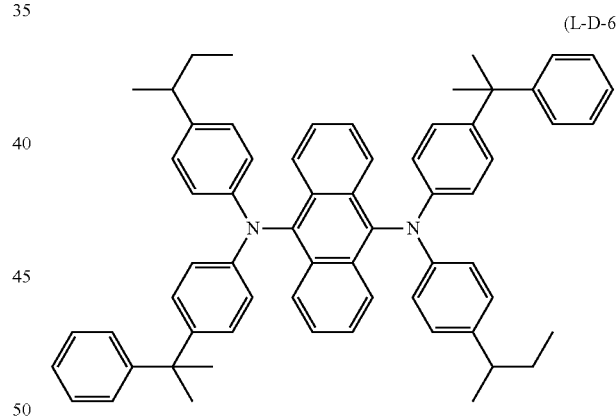
(L-D-7)
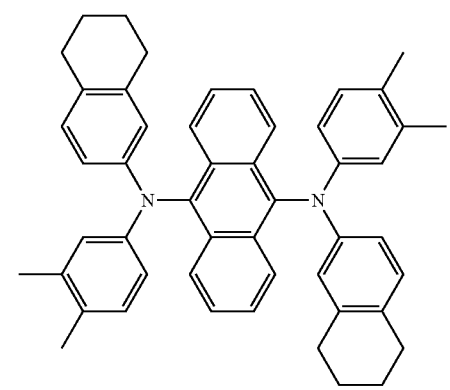

(L-D-8)
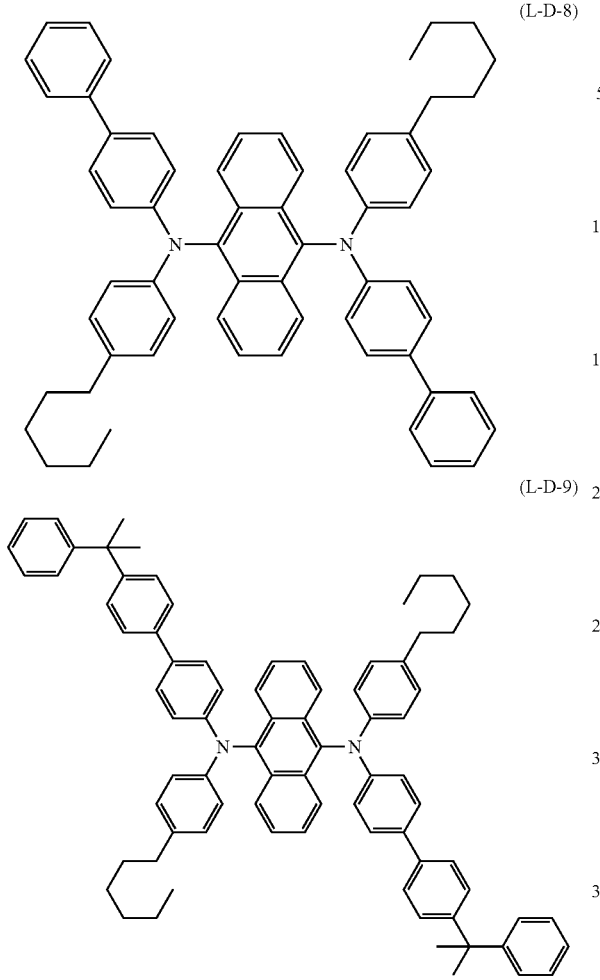
(L-D-9)
(L-D-10)
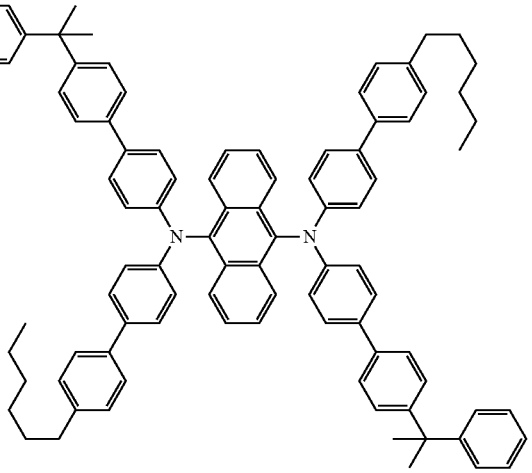
Examples of Compounds Represented by General Formula (E)
[Chem. 44]
(H-E-1)
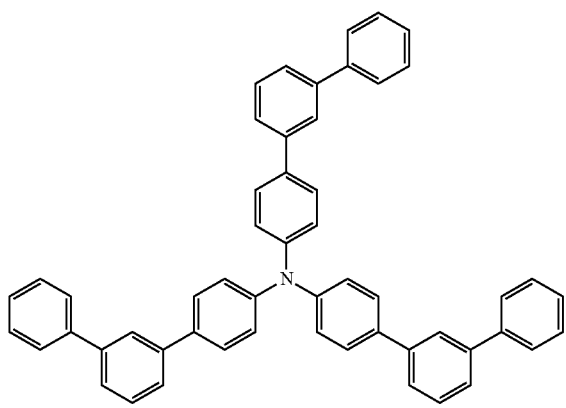
(H-E-2)
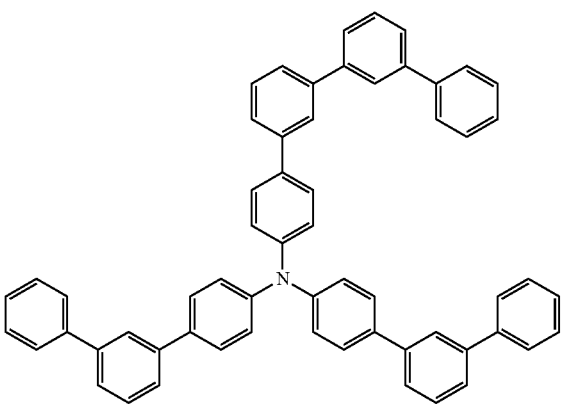

-continued
(H-E-3)
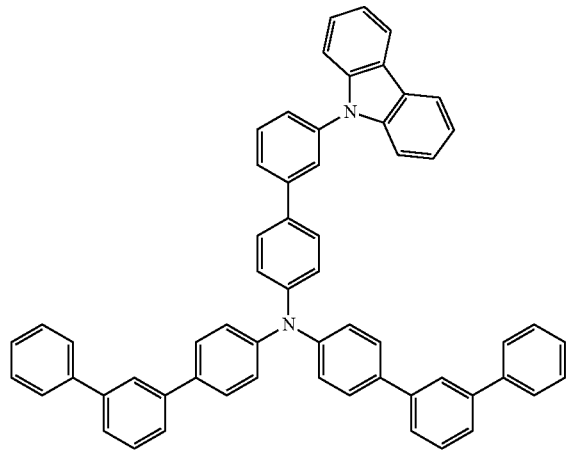
(H-E-4)
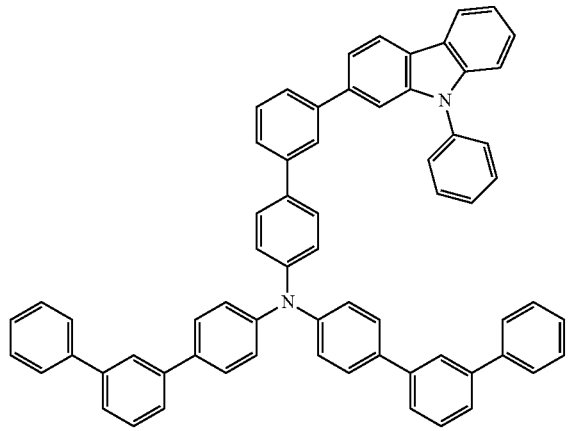
(H-E-5)
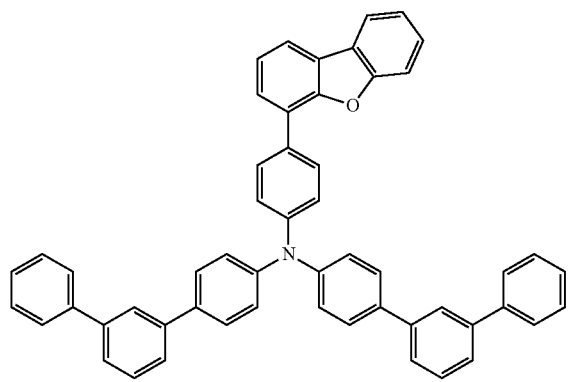
(H-E-6)
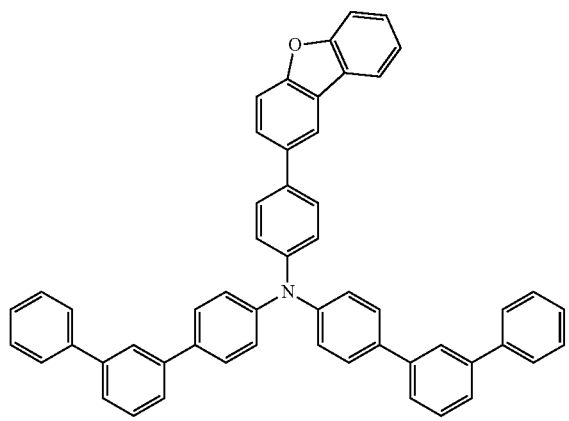
(H-E-7)
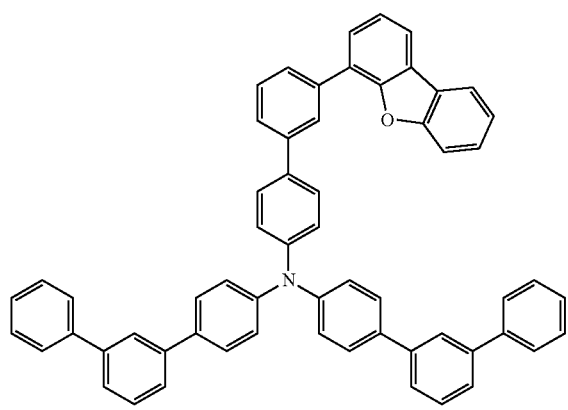
(H-E-8)
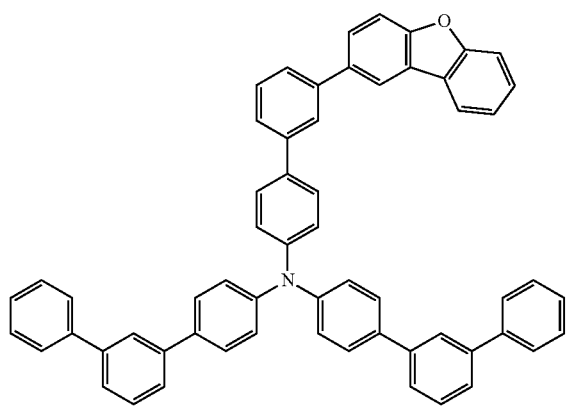

(H-E-9)
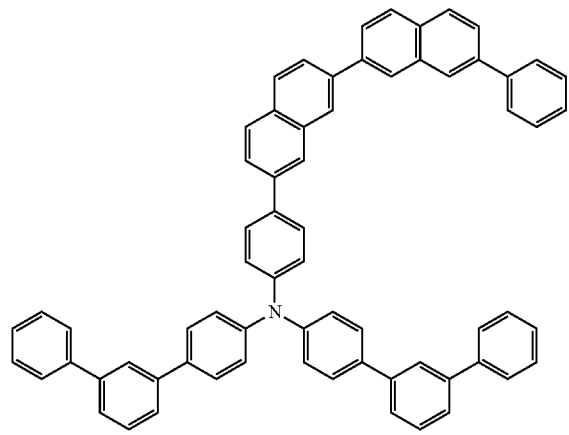
(H-E-10)
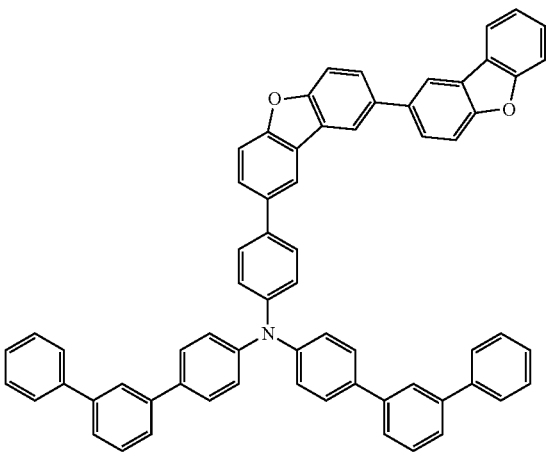
[Chem. 45]
(H-E-11)
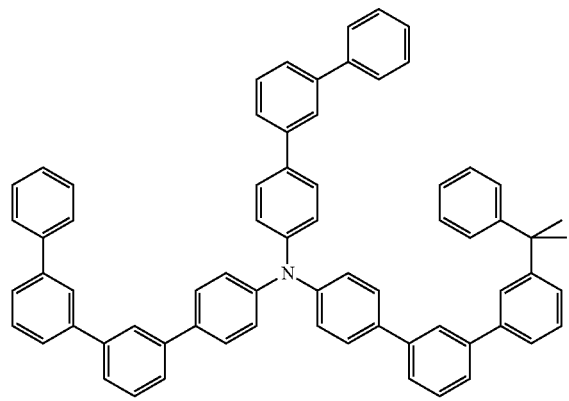
(H-E-12)
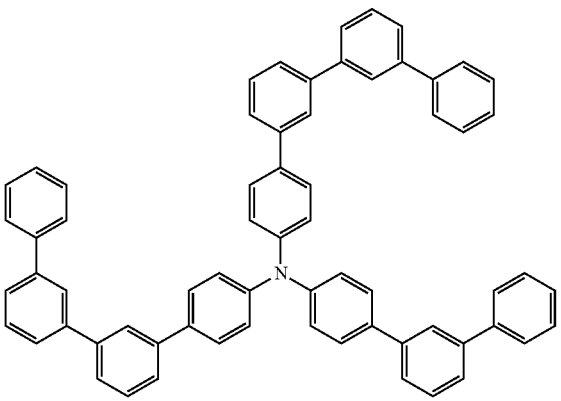
(H-E-13)
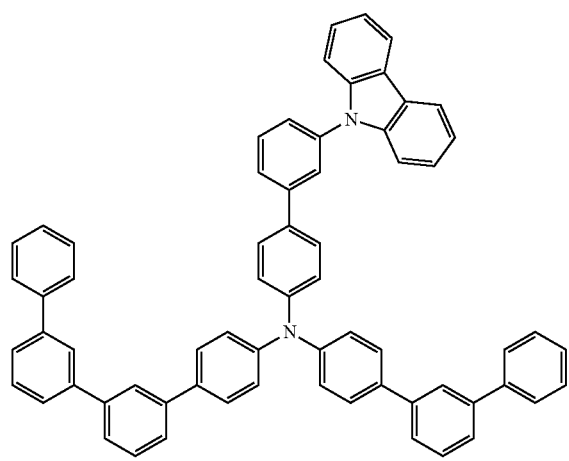
(H-E-14)
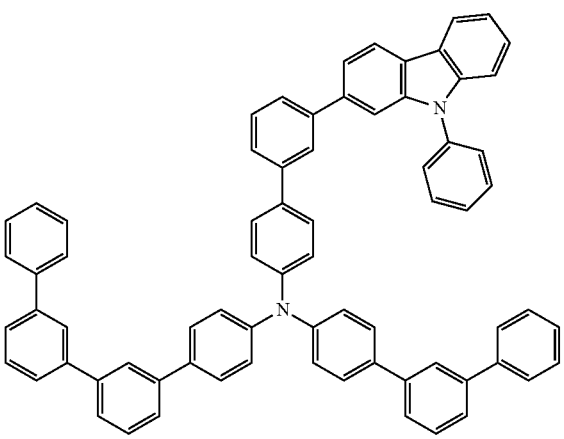

-continued
(H-E-15)
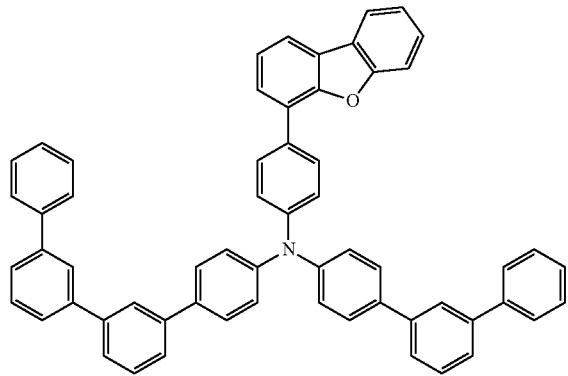
(H-E-16)
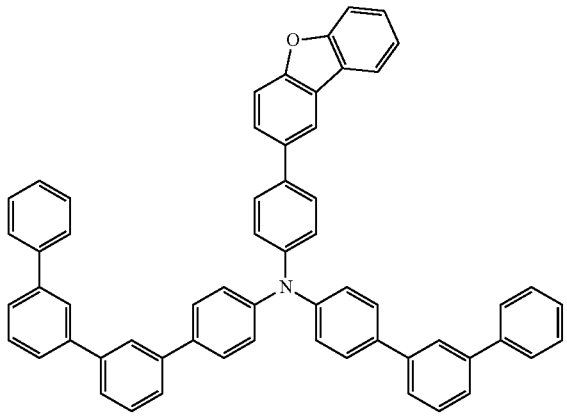
(H-E-17)
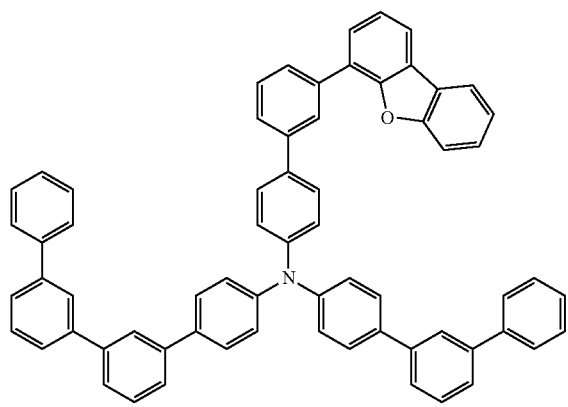
(H-E-18)
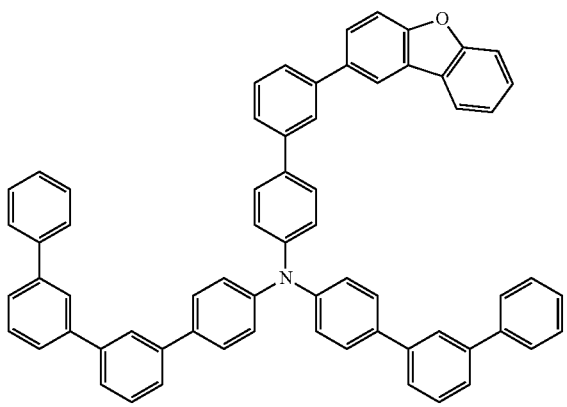
(H-E-19)
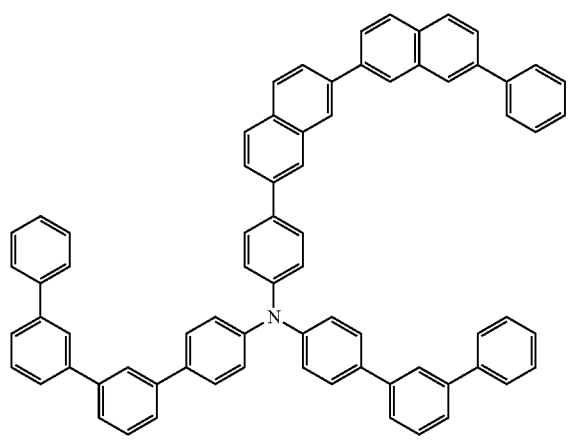
(H-E-20)
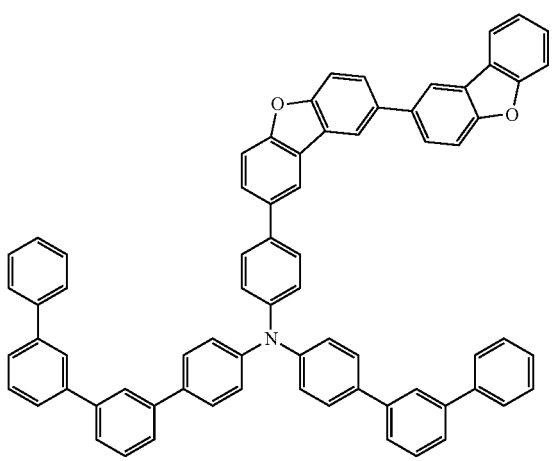

[Chem. 46]
(H-E-21)
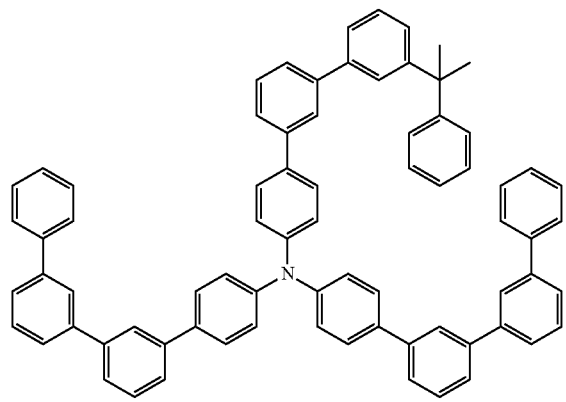
(H-E-22)
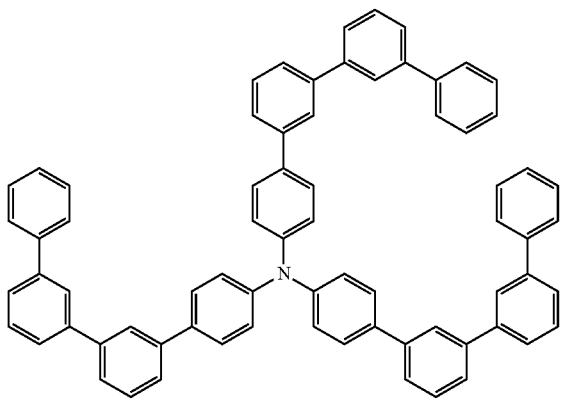
(H-E-23)
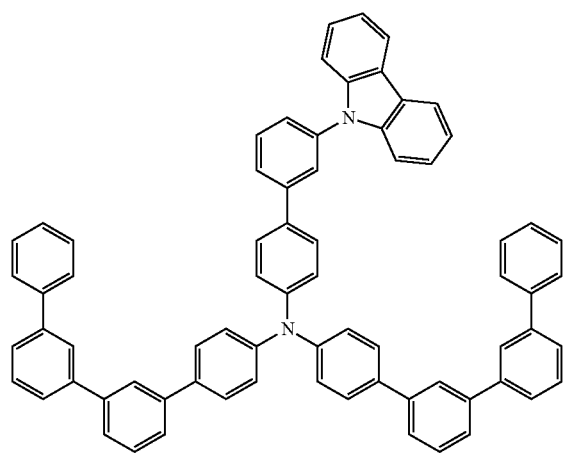
(H-E-24)
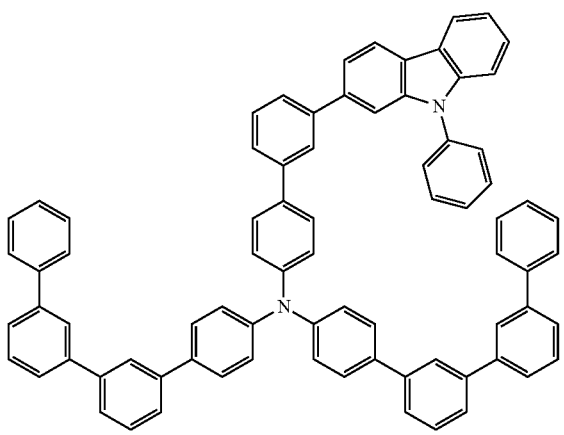
(H-E-25)
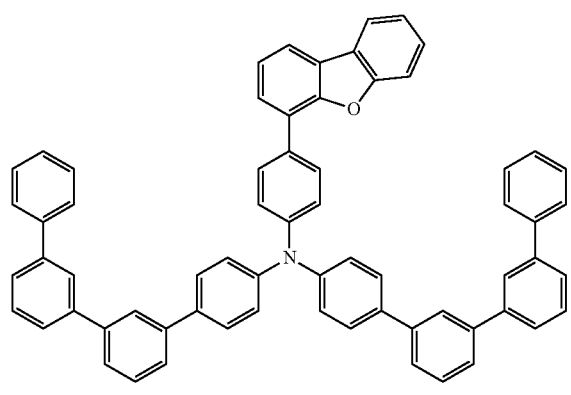
(H-E-26)
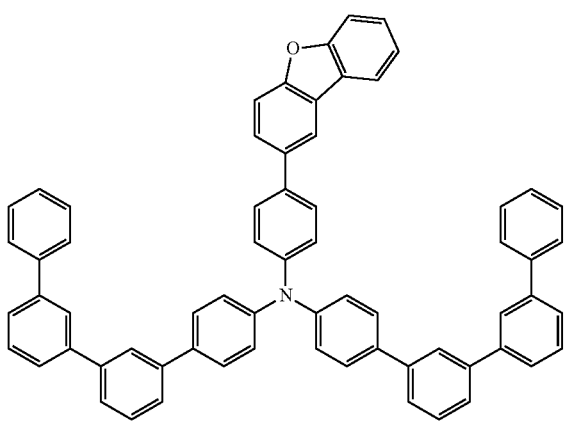

(H-E-27)
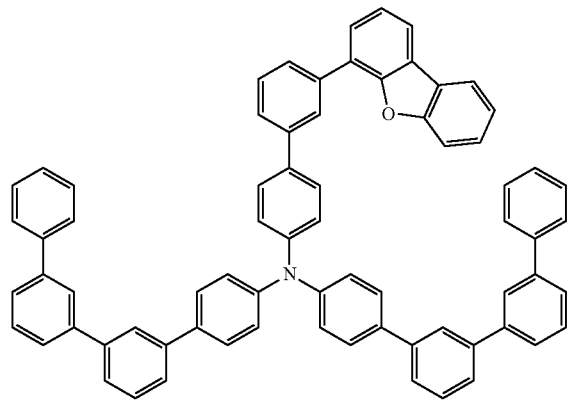
(H-E-28)
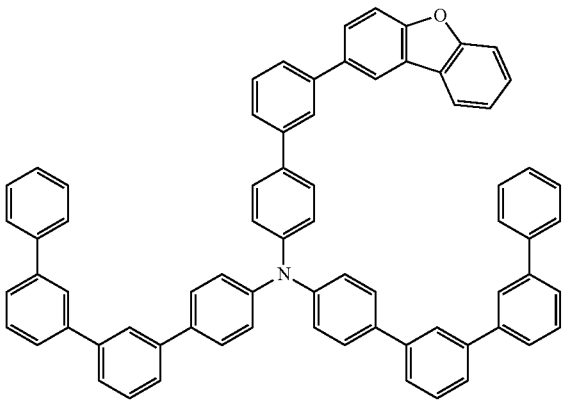
(H-E-29)
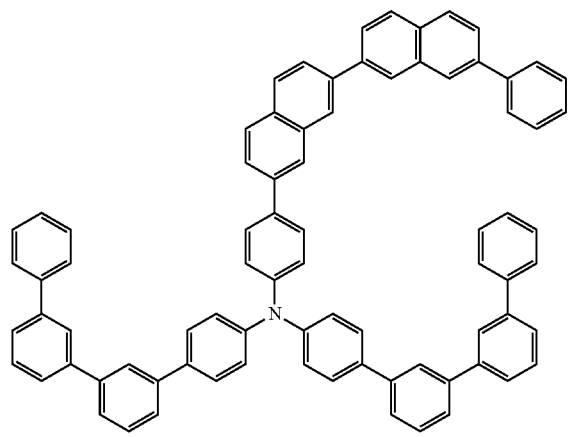
(H-E-30)
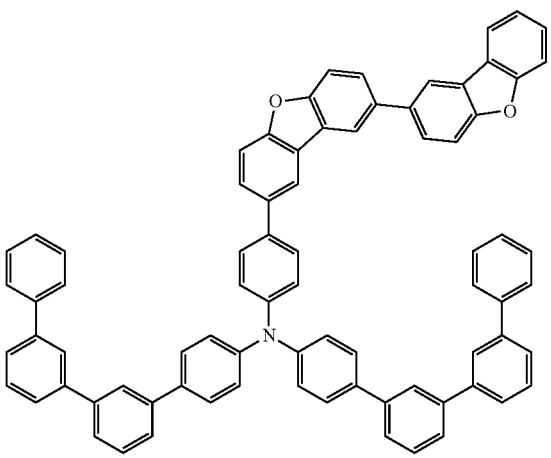
[Chem. 47]
(H-E-31)
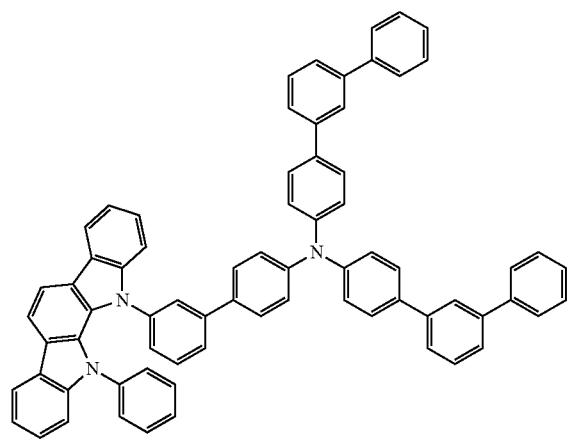
(H-E-32)
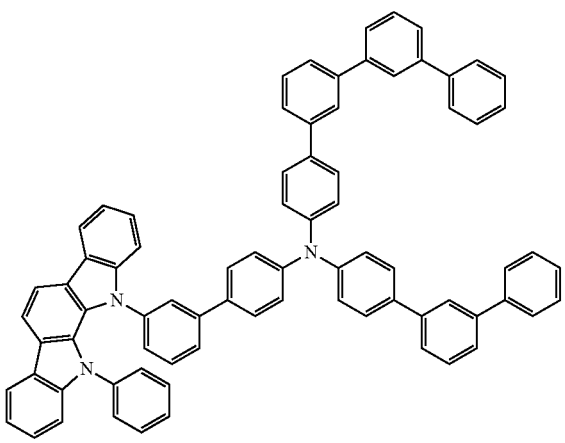

-continued
(H-E-33)
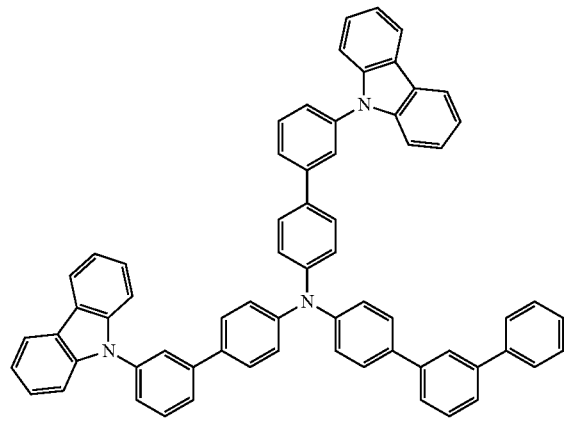
(H-E-34)
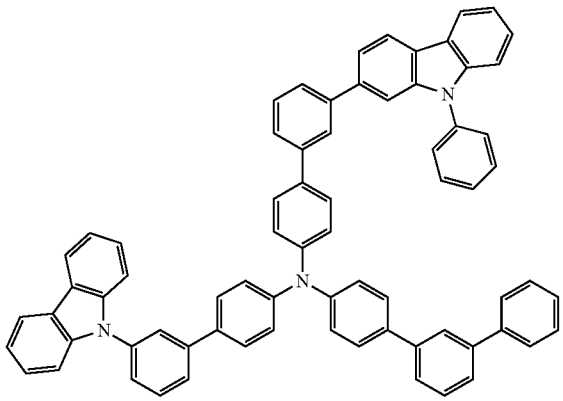
(H-E-35)
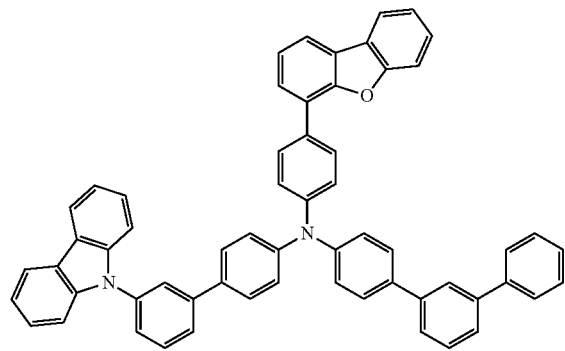
(H-E-36)
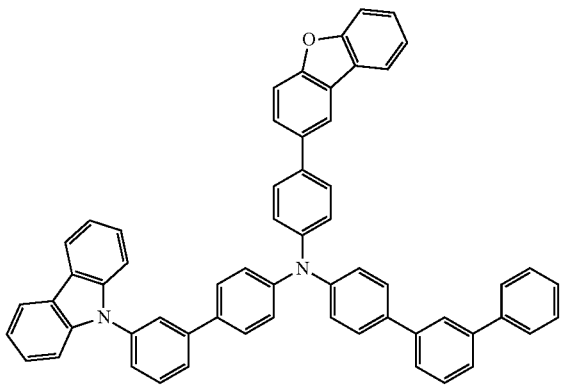
(H-E-37)
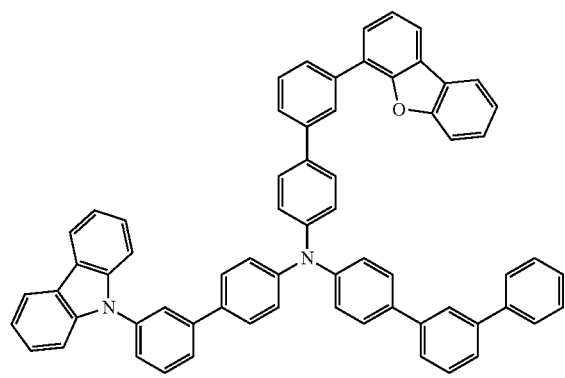
(H-E-38)
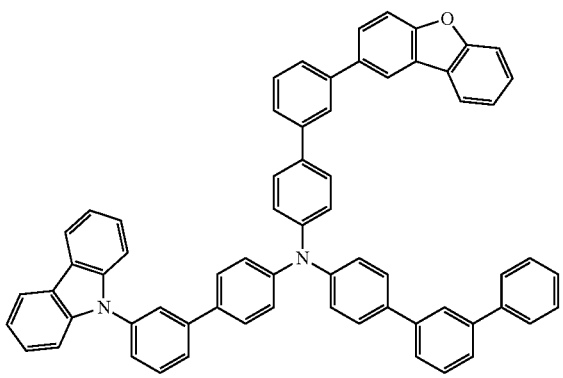

(H-E-39)
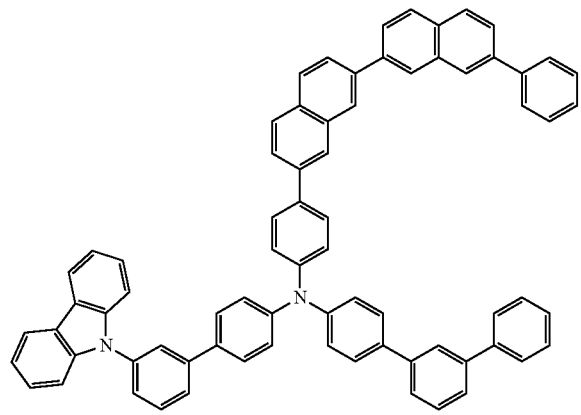
(H-E-40)
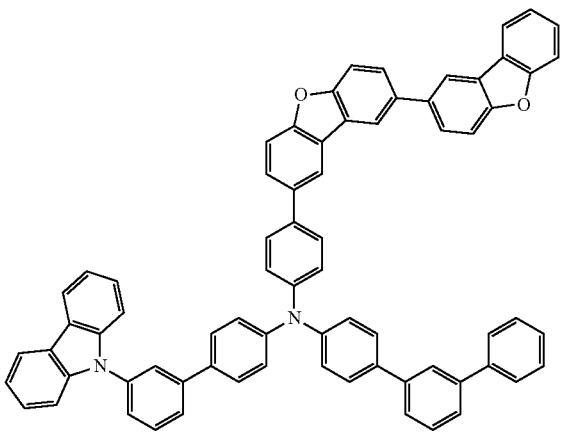
[Chem. 48]
(H-E-41)
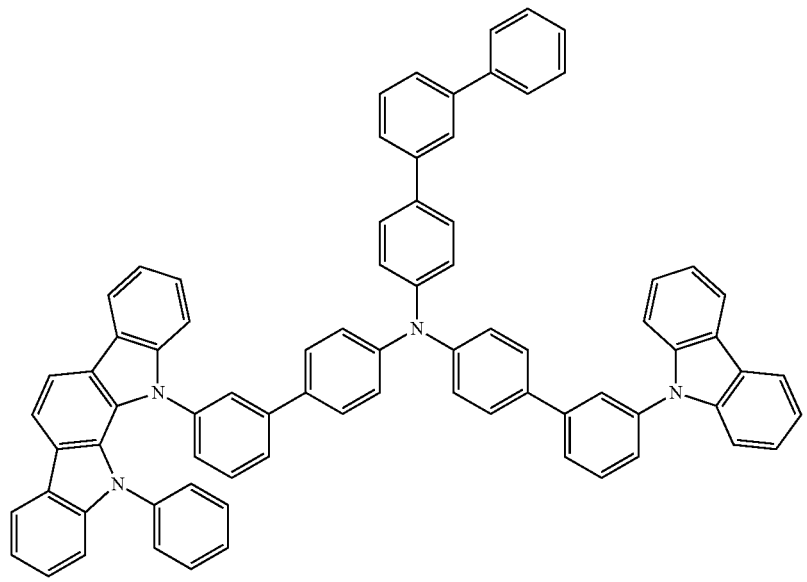
(H-E-42)
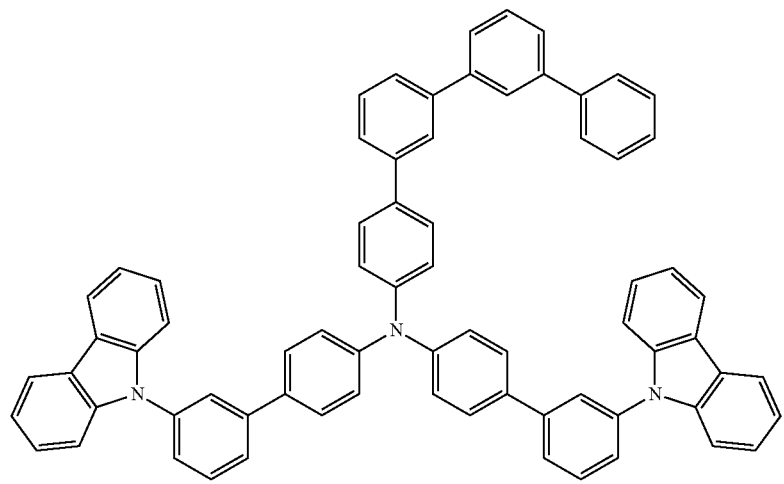

(H-E-43)
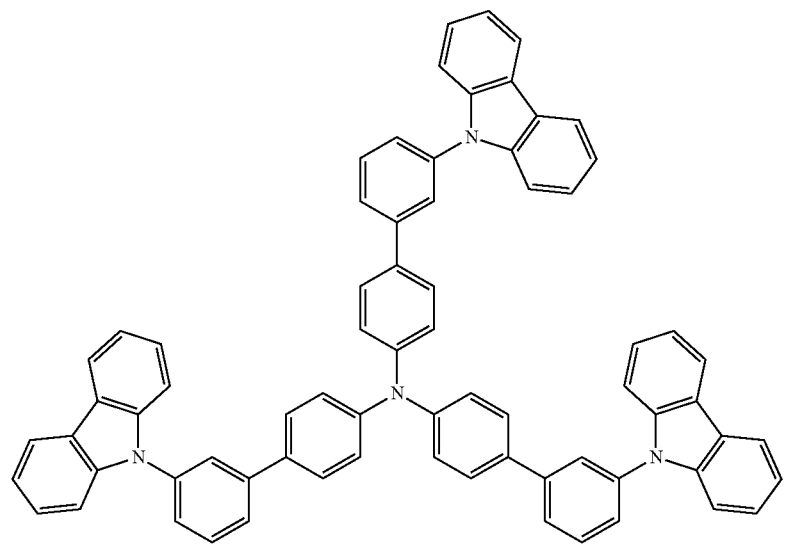
(H-E-44)
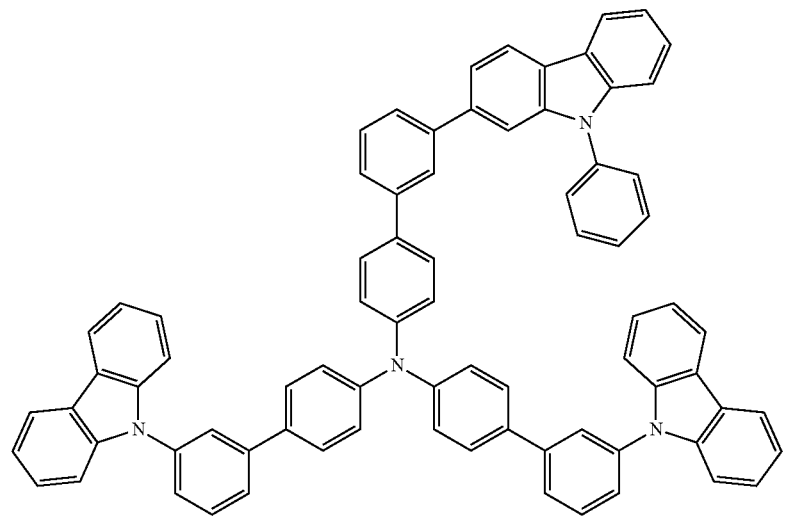
(H-E-45)
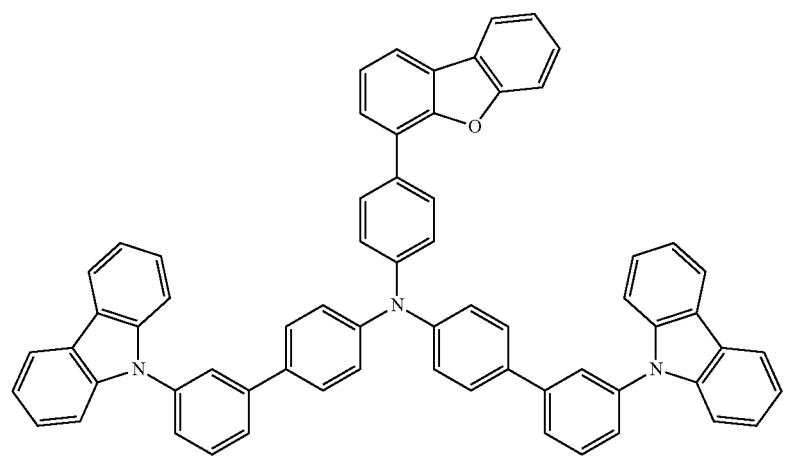

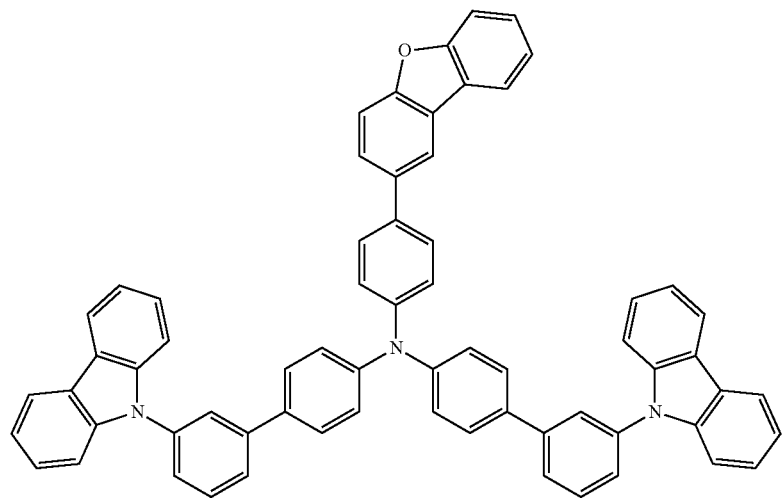
(H-E-46)
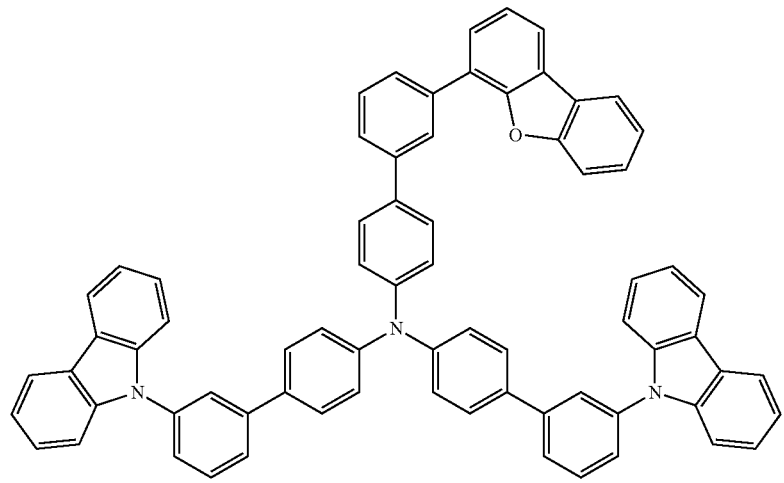
(H-E-47)
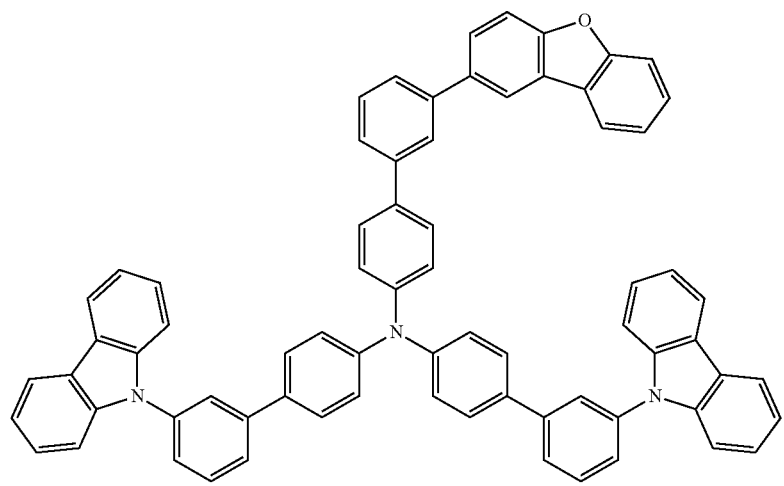
(H-E-48)

-continued
(H-E-49)
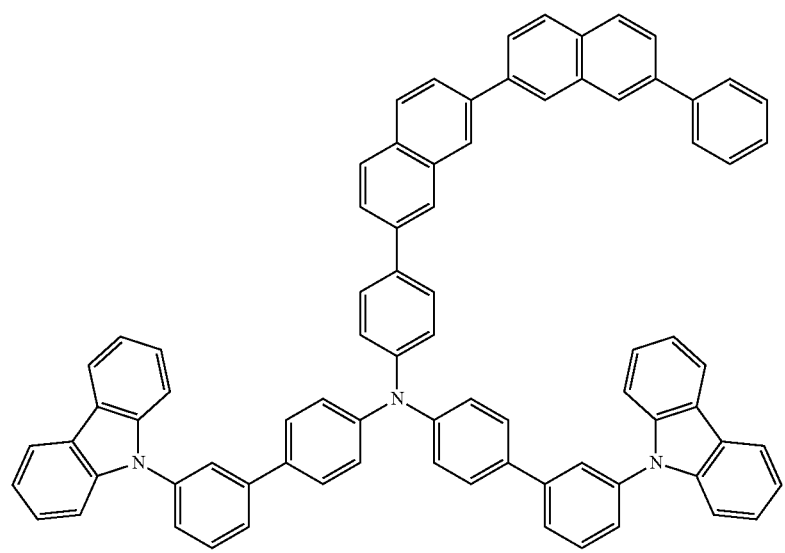
(H-E-50)
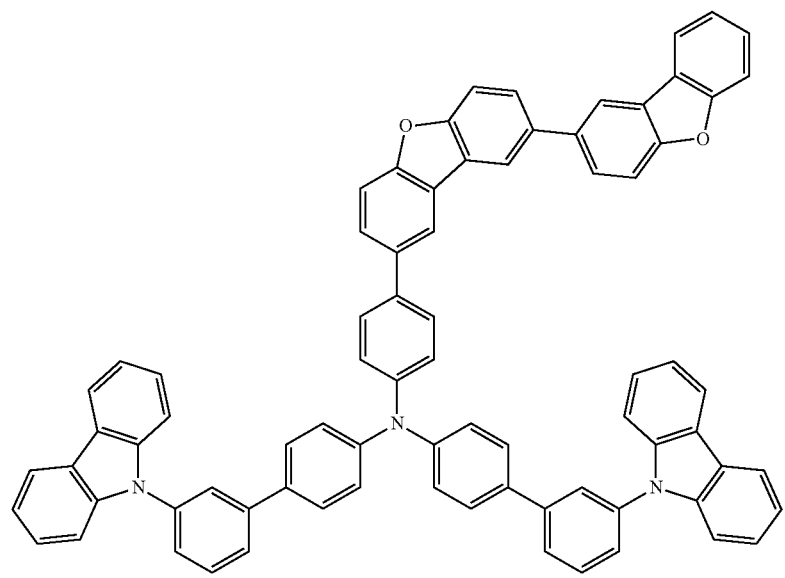
[Chem. 49]
(H-E-51)
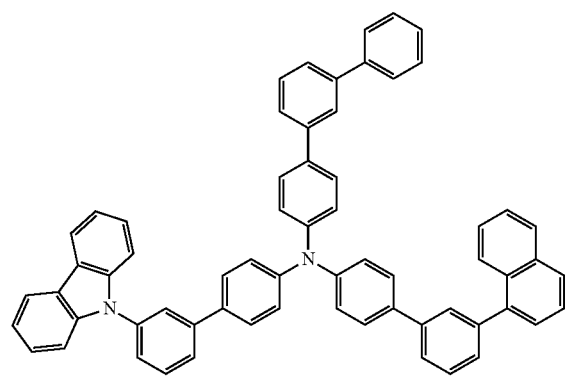
(H-E-52)
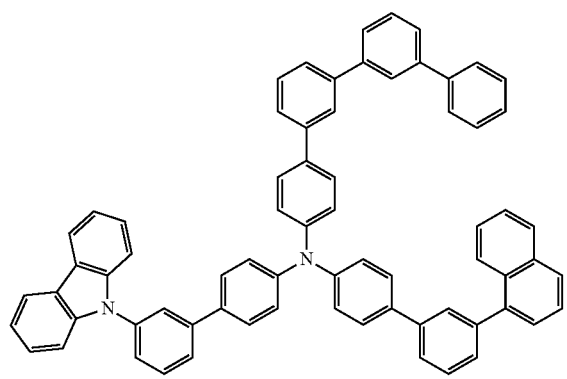

(H-E-53)
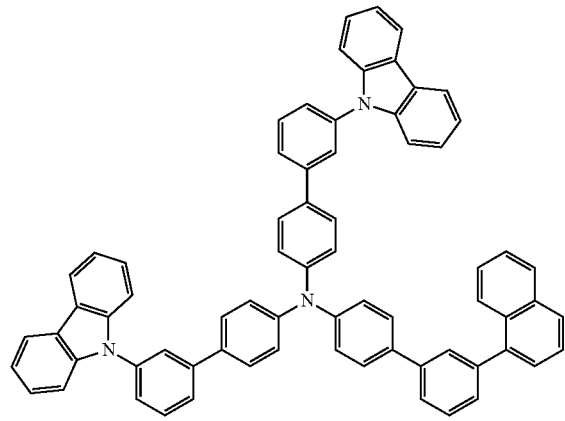
(H-E-54)
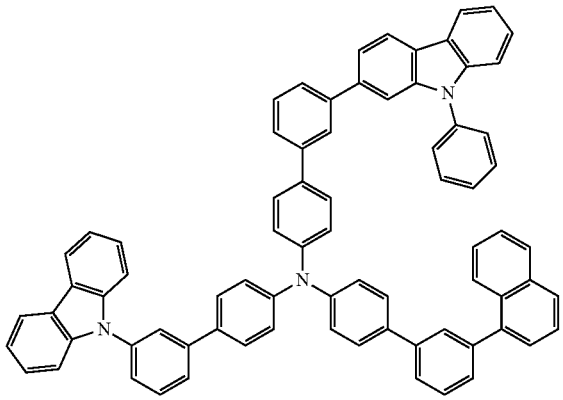
(H-E-55)
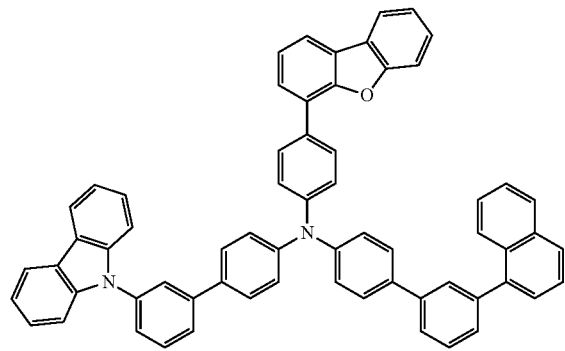
(H-E-56)
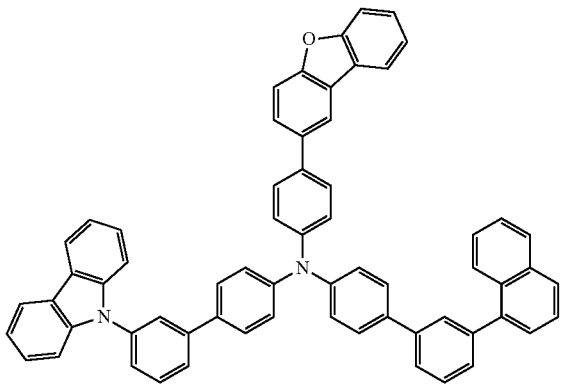
(H-E-57)
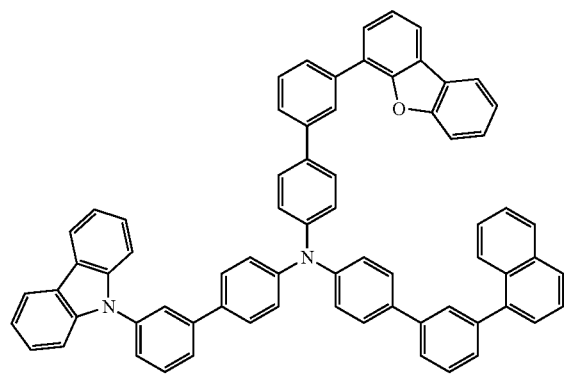
(H-E-58)
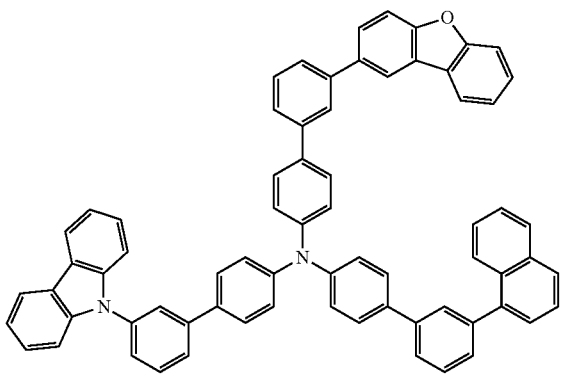

-continued
(H-E-59)
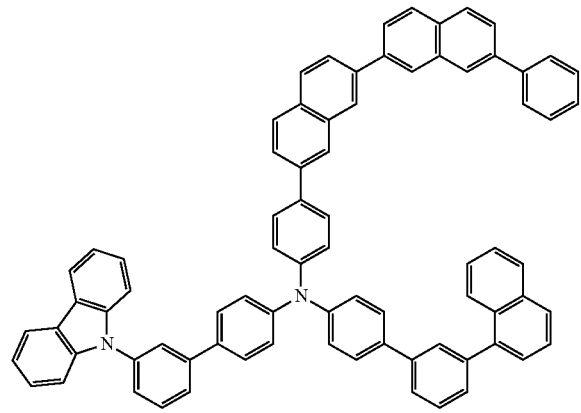
(H-E-60)
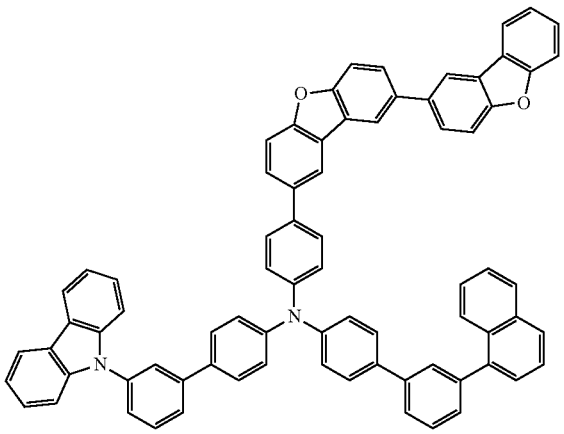
[Chem. 50]
(H-E-61)
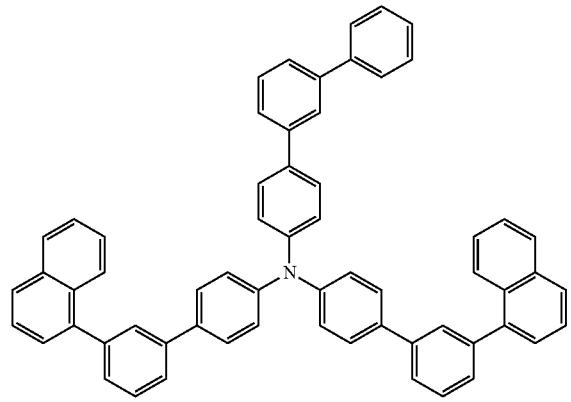
(H-E-62)
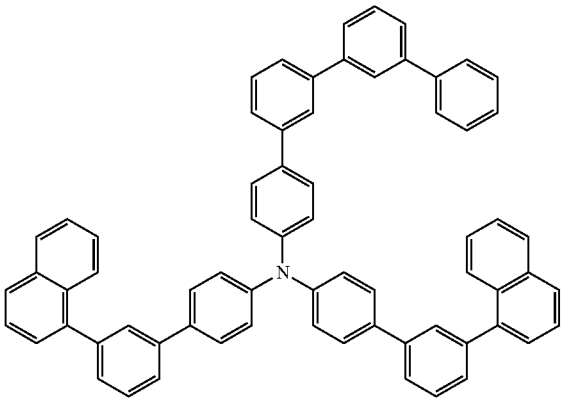
(H-E-63)
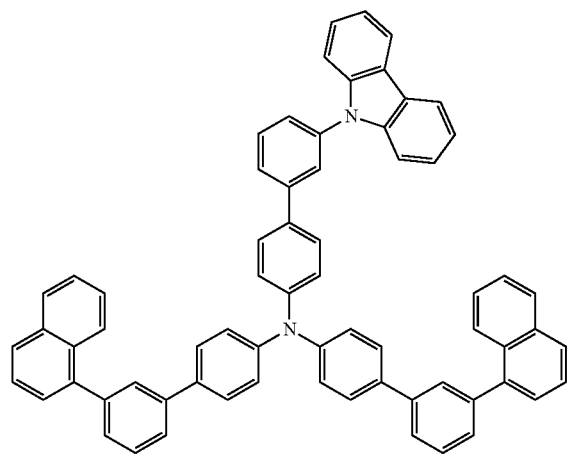
(H-E-64)
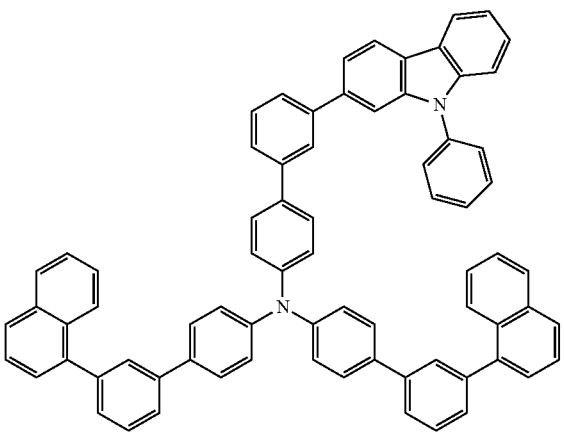

(H-E-65)
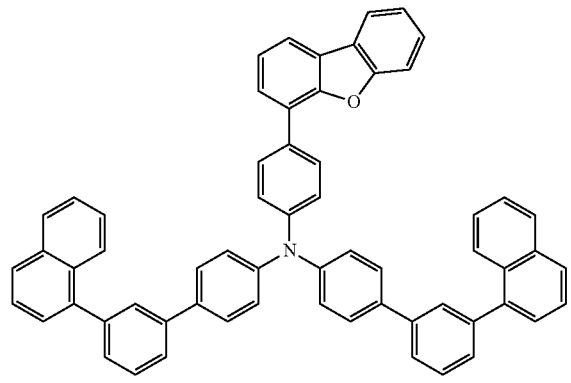
(H-E-66)
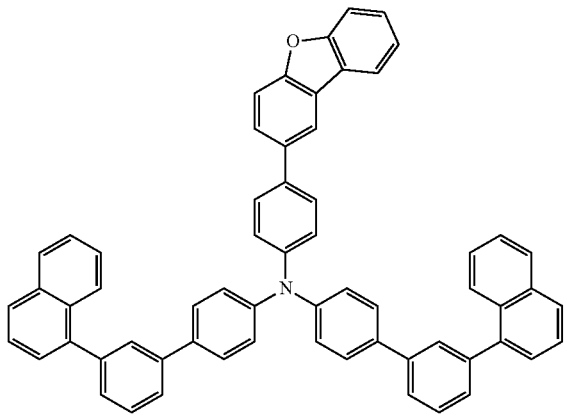
(H-E-67)
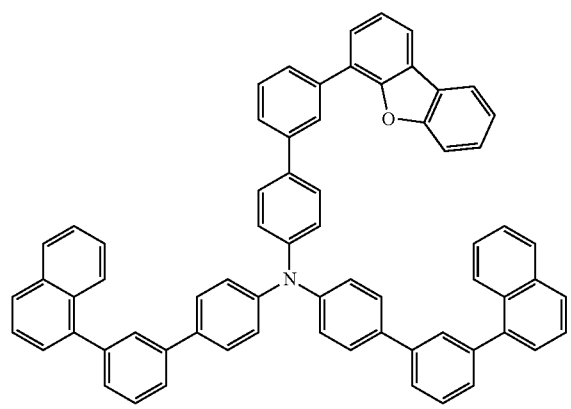
(H-E-68)
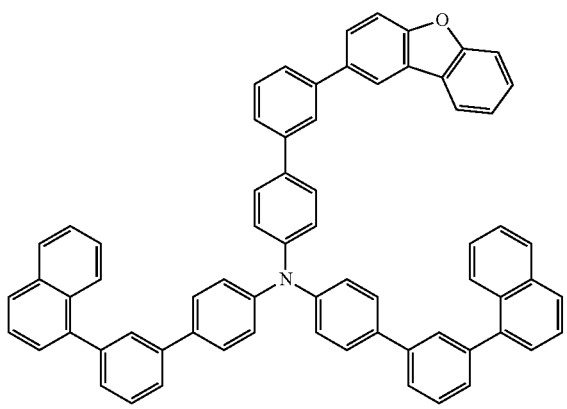
(H-E-69)
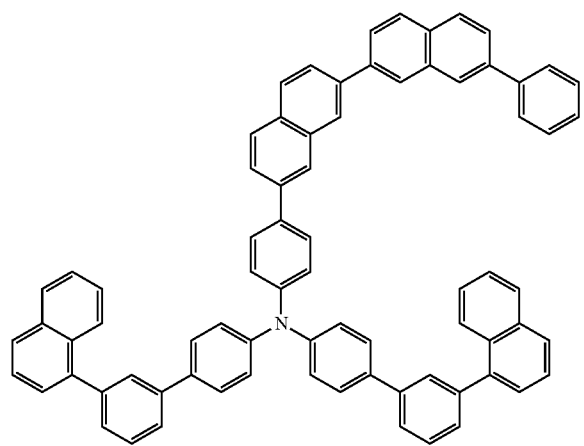
(H-E-70)
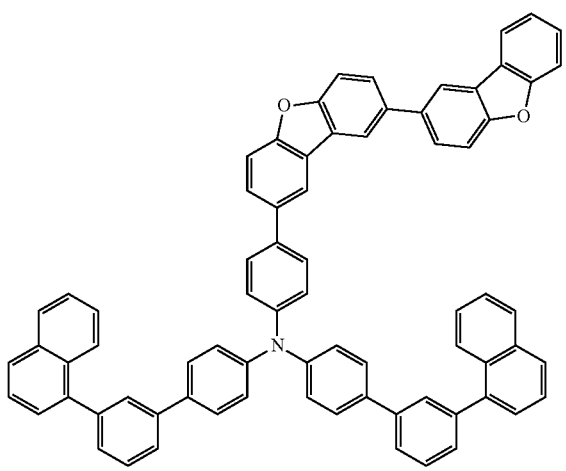

[Chem. 51]
(H-E-71)
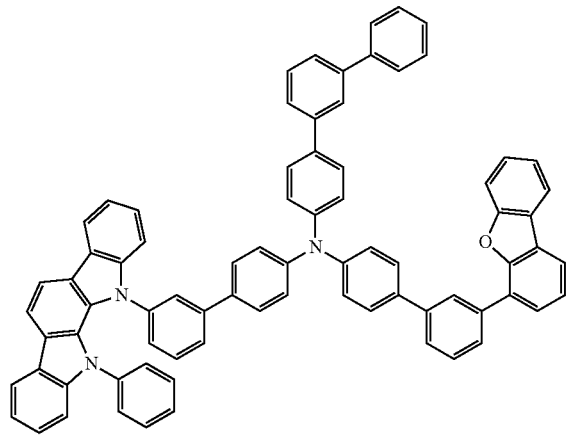
(H-E-72)
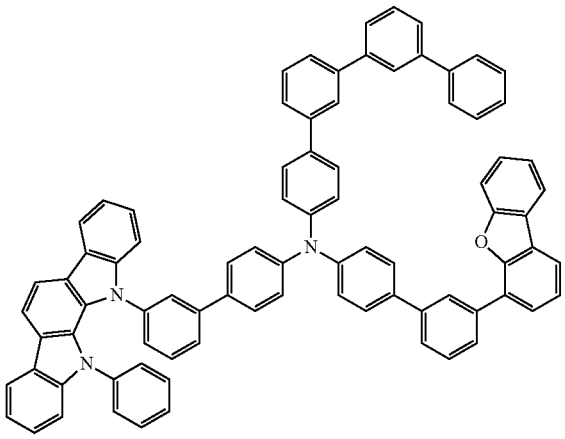
(H-E-73)
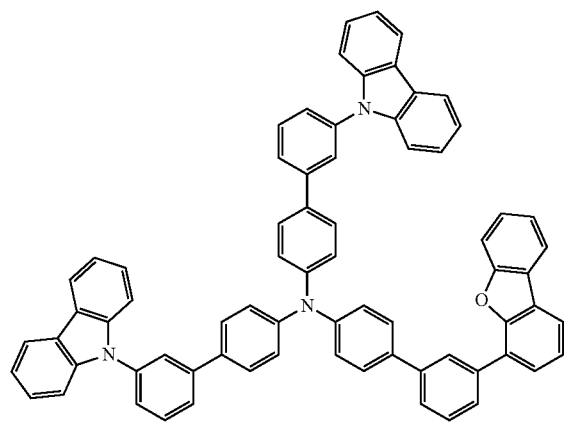
(H-E-74)
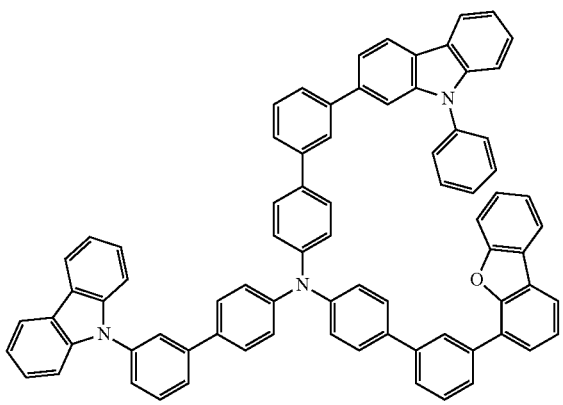
(H-E-75)
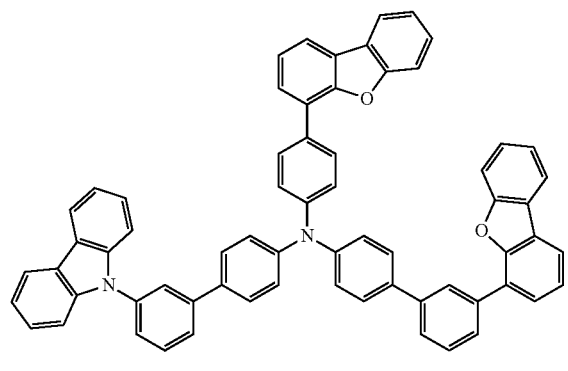
(H-E-76)
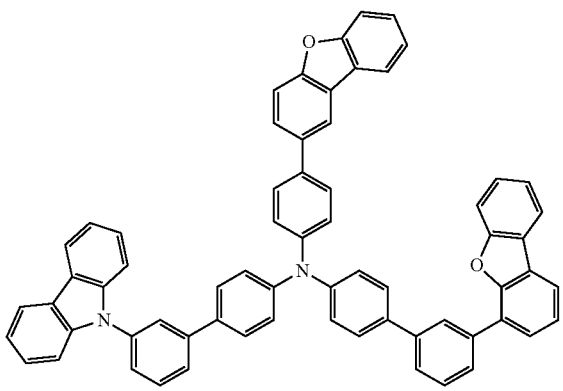

(H-E-77)
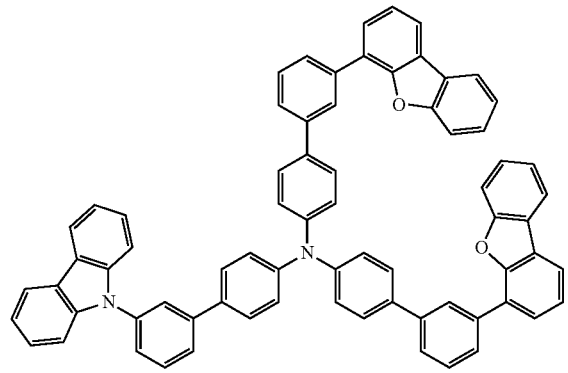
(H-E-78)
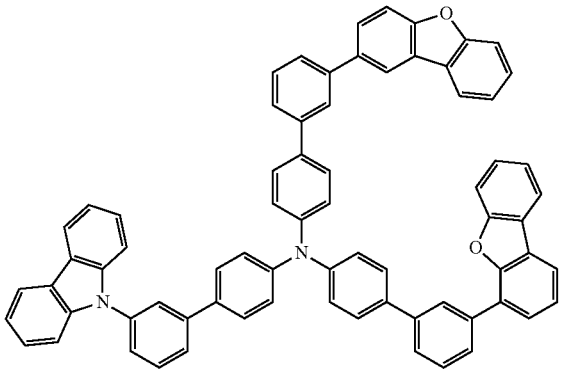
(H-E-79)
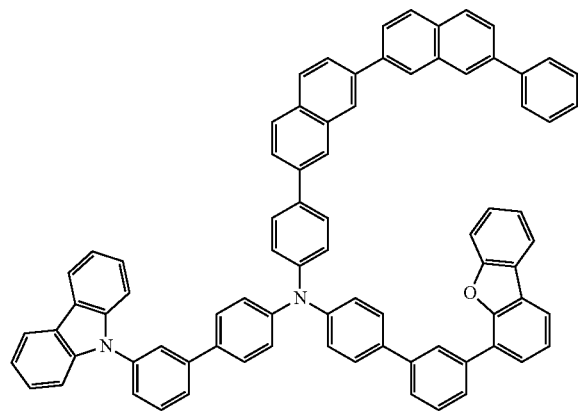
(H-E-80)
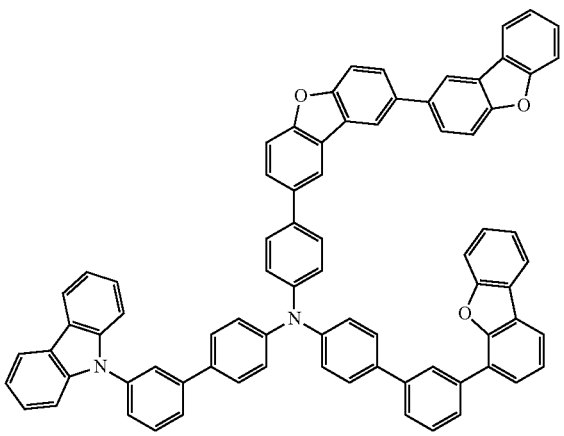
[Chem. 52]
(H-E-81)
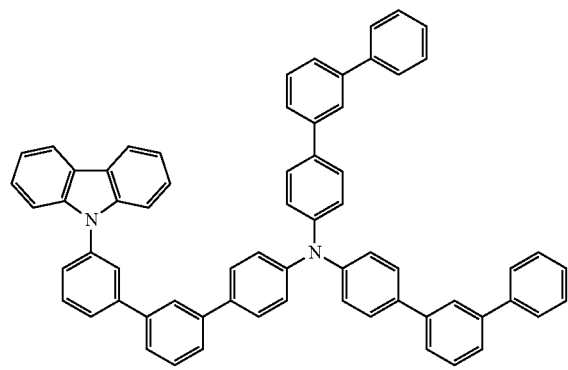
(H-E-82)
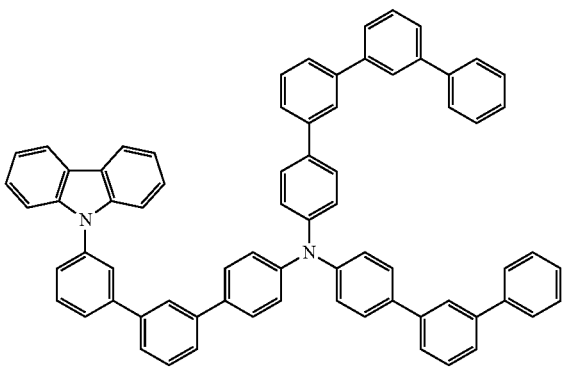

(H-E-83)
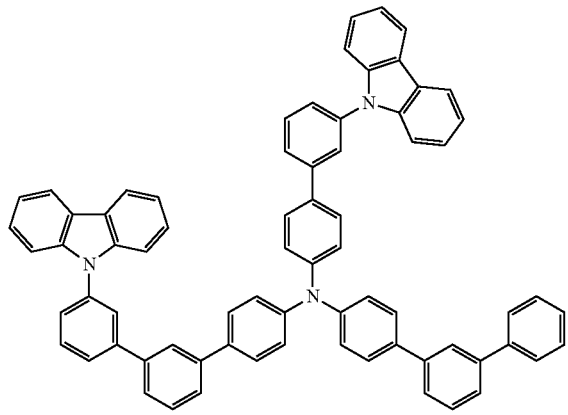
(H-E-84)
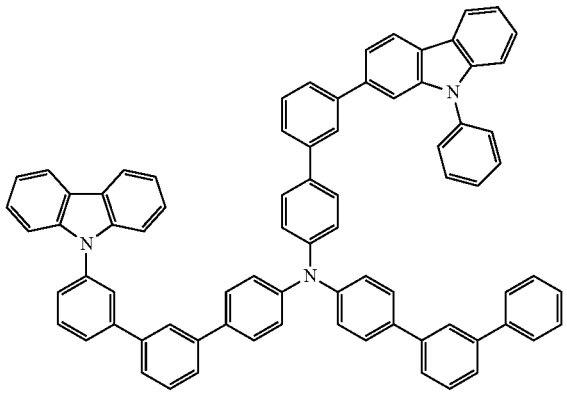
(H-E-85)
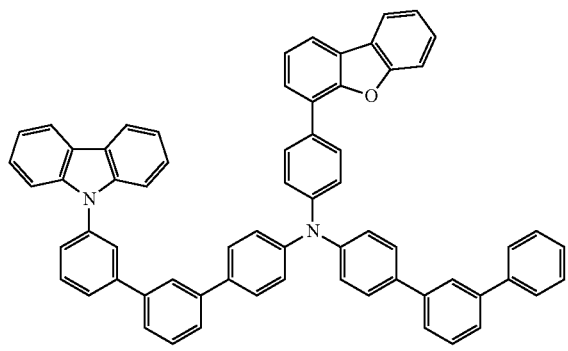
(H-E-86)
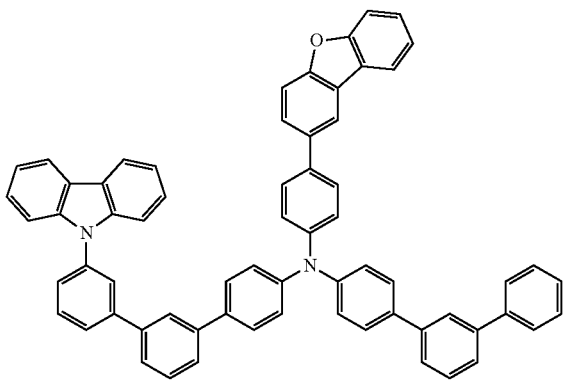
(H-E-87)
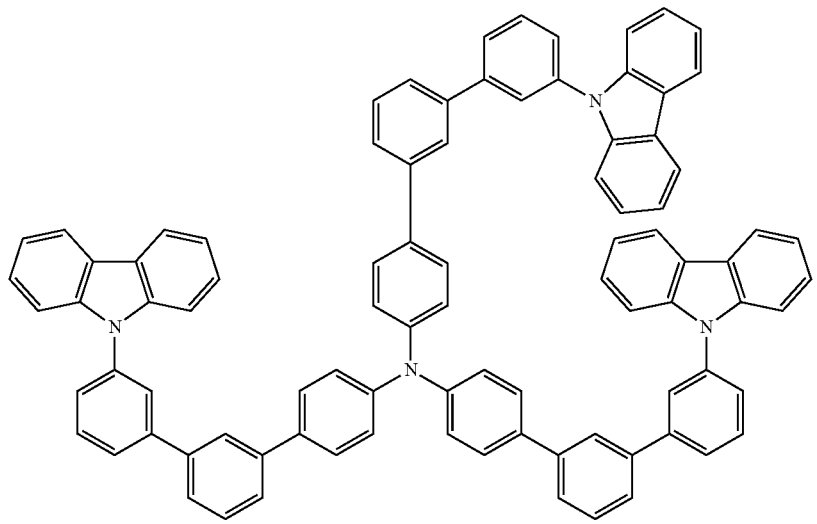

(H-E-88)
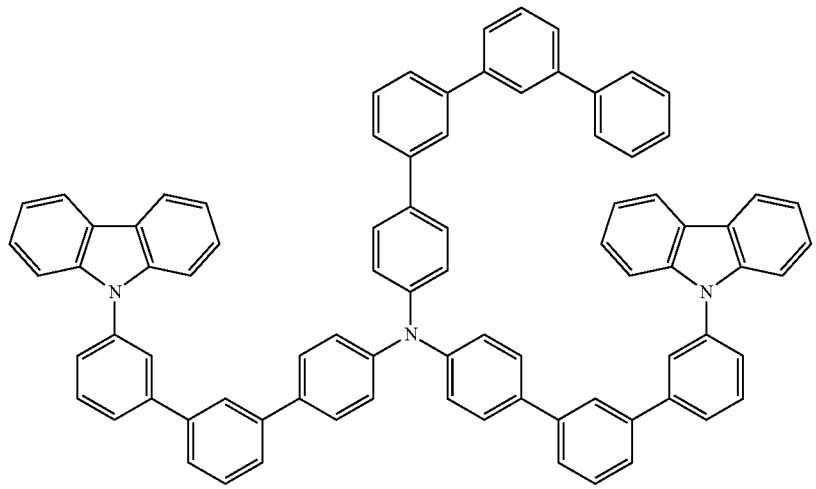
(H-E-89)
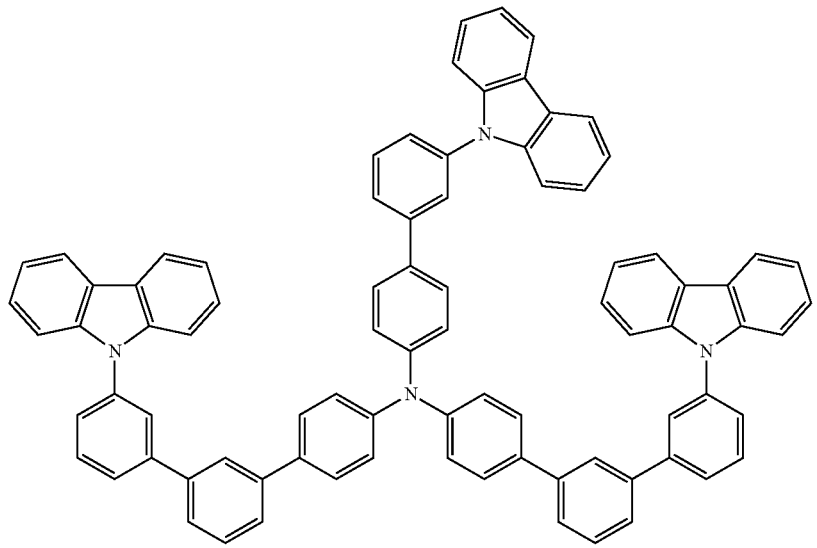
(H-E-90)
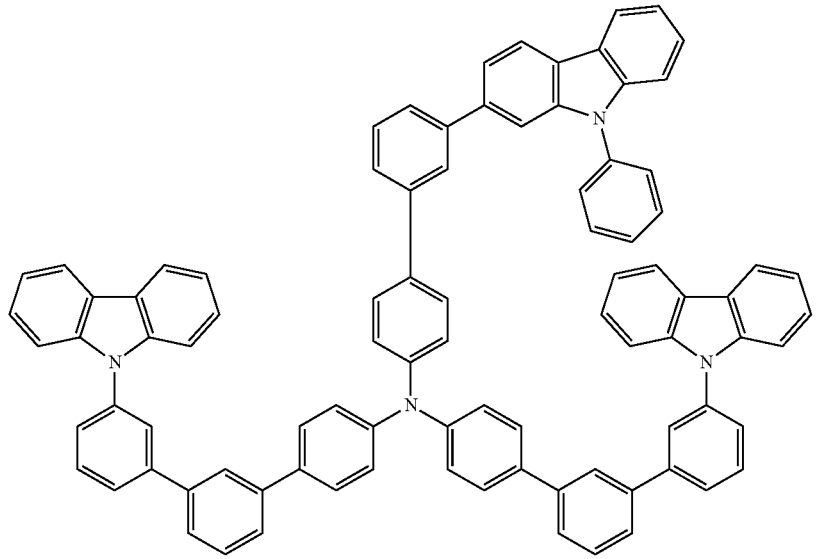

[Chem. 53]
(H-E-91) 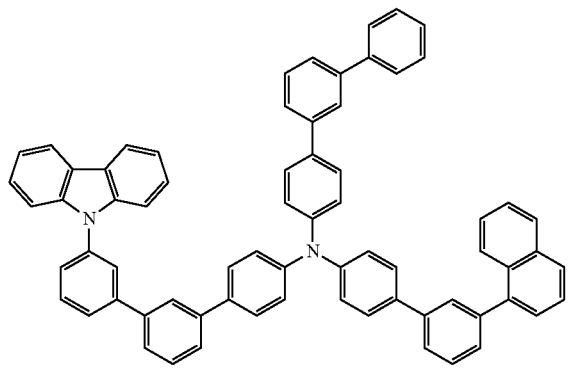
(H-E-92) 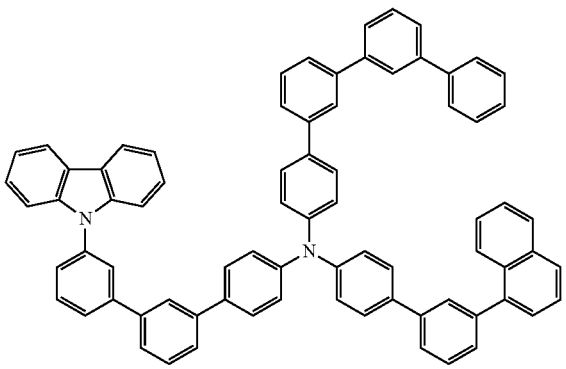
(H-E-93) 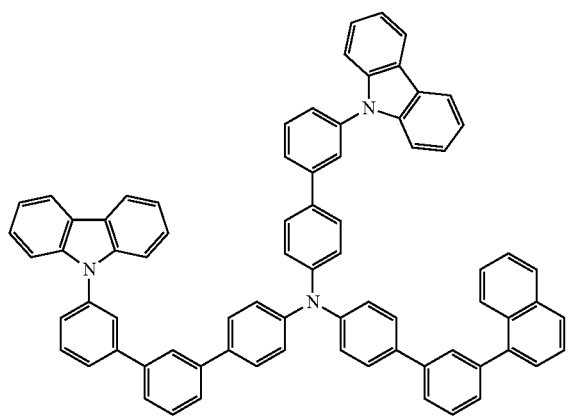
(H-E-94) 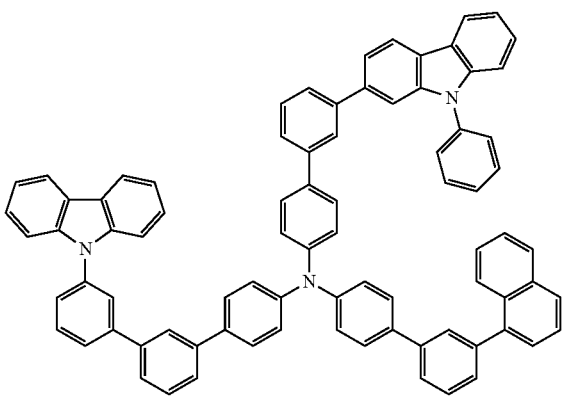
(H-E-95) 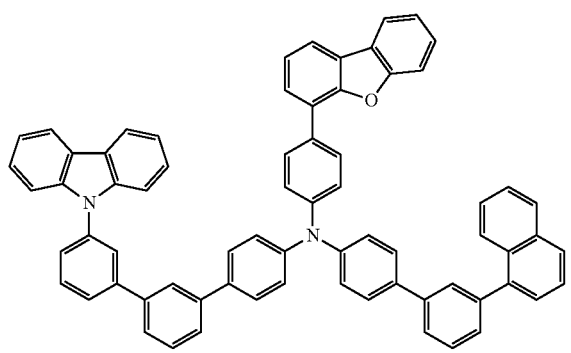
(H-E-96) 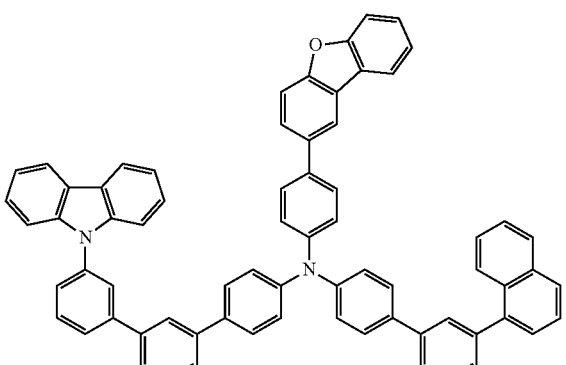
(H-E-97) 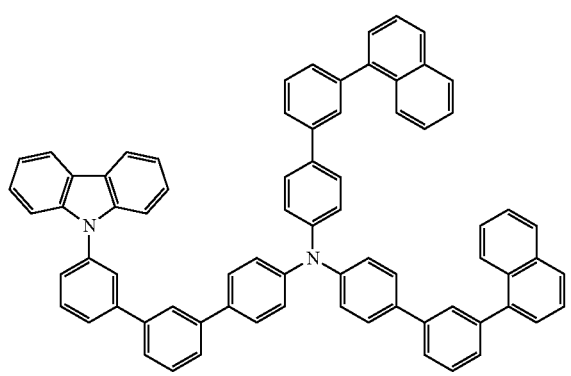
(H-E-98) 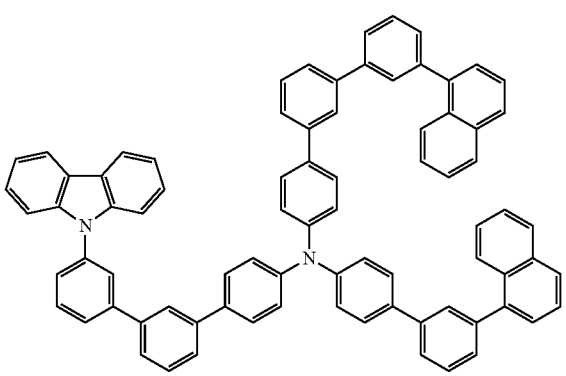

(H-E-99)

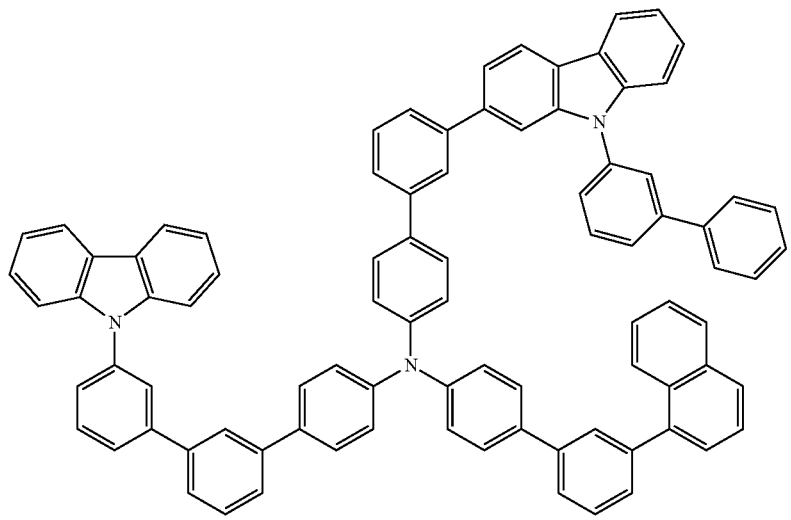

(H-E-100)

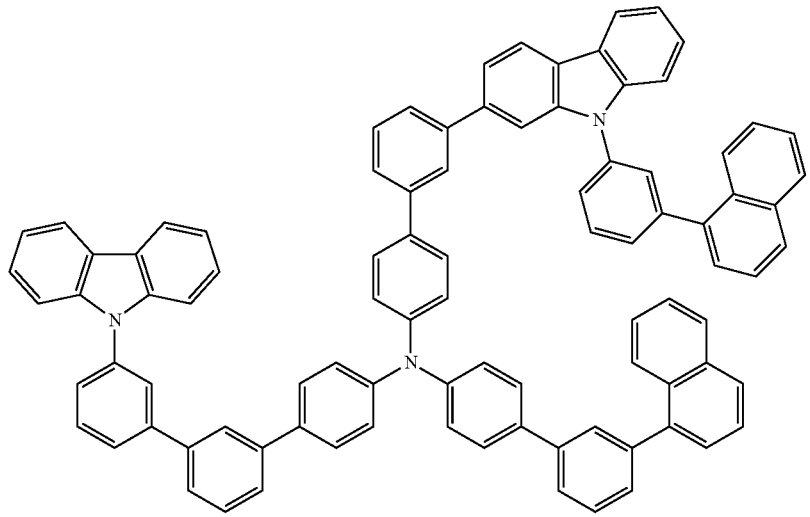

It is preferred that the compound group α should include two or more compounds selected, for example, from the compounds shown above. Examples of combinations of compounds included in the compound group α are shown in the following Table 1, but usable compound combinations in the invention should not be construed as being limited to the following examples.

TABLE 1

| No. | Compound α1 | Compound α2 (degree of identity) | Compound α3 (degree of identity) |
|---|---|---|---|
| Mix-01 | H-A-1 | H-A-2 (100%) | |
| Mix-02 | H-A-1 | H-A-3 (100%) | |
| Mix-03 | H-A-1 | H-A-4 (100%) | |
| Mix-04 | H-A-1 | H-A-5 (100%) | |
| Mix-05 | H-A-1 | H-A-6 (86%) | |
| Mix-06 | H-A-6 | H-A-7 (100%) | |
| Mix-07 | H-A-6 | H-A-8 (100%) | |
| Mix-08 | H-A-6 | H-A-9 (100%) | H-A-10 (100%) |
| Mix-09 | H-A-1 | H-A-11 (86%) | |
| Mix-10 | H-A-6 | H-A-11 (100%) | |
| Mix-11 | H-A-9 | H-A-11 (100%) | |
| Mix-12 | H-A-11 | H-A-12 (100%) | |
| Mix-13 | H-A-11 | H-A-13 (100%) | |

TABLE 1-continued

| No. | Compound α1 | Compound α2 (degree of identity) | Compound α3 (degree of identity) |
|---|---|---|---|
| Mix-14 | H-A-9 | H-A-14 (100%) | |
| Mix-15 | H-A-11 | H-A-14 (100%) | |
| Mix-16 | H-A-6 | H-A-15 (100%) | |
| Mix-17 | H-A-9 | H-A-10 (100%) | H-A-15 (100%) |
| Mix-18 | H-A-11 | H-A-15 (100%) | |
| Mix-19 | H-A-1 | H-A-16 (71%) | |
| Mix-20 | H-A-6 | H-A-16 (71%) | |
| Mix-21 | H-A-16 | H-A-11 (71%) | |
| Mix-22 | H-A-16 | H-A-17 (100%) | |
| Mix-23 | H-A-16 | H-A-18 (100%) | |
| Mix-24 | H-A-16 | H-A-19 (100%) | |
| Mix-25 | H-A-16 | H-A-20 (100%) | |
| Mix-26 | H-A-16 | H-A-21 (100%) | |
| Mix-27 | H-A-16 | H-A-22 (100%) | |
| Mix-28 | H-A-6 | H-A-23 (86%) | |
| Mix-29 | H-A-23 | H-A-11 (75%) | |
| Mix-30 | H-A-23 | H-A-24 (100%) | |
| Mix-31 | H-A-23 | H-A-25 (100%) | |
| Mix-32 | H-A-19 | H-A-26 (100%) | |
| Mix-33 | H-A-23 | H-A-26 (100%) | |
| Mix-34 | H-A-19 | H-A-27 (100%) | |
| Mix-35 | H-A-23 | H-A-27 (100%) | |

TABLE 1-continued

| No. | Compound α1 | Compound α2 (degree of identity) | Compound α3 (degree of identity) |
|---|---|---|---|
| Mix-36 | H-A-23 | H-A-28 (100%) | |
| Mix-37 | H-A-23 | H-A-29 (100%) | |
| Mix-38 | H-A-6 | H-A-30 (86%) | |
| Mix-39 | H-A-11 | H-A-30 (88%) | |
| Mix-40 | H-A-15 | H-A-30 (88%) | |
| Mix-41 | H-A-30 | H-A-31 (100%) | |
| Mix-42 | H-A-30 | H-A-32 (100%) | |
| Mix-43 | H-A-30 | H-A-33 (100%) | |
| Mix-44 | H-A-30 | H-A-34 (100%) | |
| Mix-45 | H-A-30 | H-A-35 (100%) | |
| Mix-46 | H-A-30 | H-A-36 (100%) | |
| Mix-47 | H-A-10 | H-A-15 (100%) | H-A-36 (86%) |
| Mix-48 | H-A-37 | H-A-38 (100%) | |
| Mix-49 | H-A-37 | H-A-39 (100%) | |
| Mix-50 | H-A-37 | H-A-40 (100%) | |
| Mix-51 | H-A-37 | H-A-41 (100%) | |
| Mix-52 | H-A-37 | H-A-42 (100%) | |
| Mix-53 | H-A-3 | H-A-41 (71%) | |
| Mix-54 | H-A-11 | H-A-41 (88%) | |
| Mix-55 | H-A-27 | H-A-41 (75%) | |
| Mix-56 | H-A-15 | H-A-43 (88%) | |
| Mix-57 | H-A-15 | H-A-36 (88%) | H-A-43 (88%) |
| Mix-58 | H-A-44 | H-A-45 (100%) | |
| Mix-59 | H-A-44 | H-A-46 (100%) | |
| Mix-60 | H-A-44 | H-A-47 (100%) | |
| Mix-61 | H-A-44 | H-A-48 (100%) | |
| Mix-62 | H-A-44 | H-A-49 (100%) | |
| Mix-63 | H-A-15 | H-A-48 (88%) | |
| Mix-64 | H-A-41 | H-A-48 (100%) | |
| Mix-65 | H-A-44 | H-A-50 (100%) | |
| Mix-66 | H-A-51 | H-A-52 (100%) | |
| Mix-67 | H-A-51 | H-A-53 (100%) | |
| Mix-68 | H-A-51 | H-A-54 (100%) | |
| Mix-69 | H-A-51 | H-A-55 (100%) | |
| Mix-70 | H-A-51 | H-A-56 (100%) | |
| Mix-71 | H-A-51 | H-A-57 (100%) | |
| Mix-72 | H-A-58 | H-A-59 (100%) | |
| Mix-73 | H-A-58 | H-A-60 (100%) | |
| Mix-74 | H-A-58 | H-A-61 (100%) | |
| Mix-75 | H-A-58 | H-A-62 (100%) | |
| Mix-76 | H-A-58 | H-A-63 (100%) | |
| Mix-77 | H-A-58 | H-A-64 (100%) | |
| Mix-78 | H-A-66 | H-A-65 (100%) | |
| Mix-79 | H-A-66 | H-A-70 (100%) | |
| Mix-80 | H-A-67 | H-A-68 (100%) | |
| Mix-81 | H-A-65 | H-A-69 (100%) | |
| Mix-82 | H-A-70 | H-A-69 (100%) | |
| Mix-83 | H-A-67 | H-A-71 (100%) | |
| Mix-84 | H-A-41 | H-A-71 (75%) | H-A-27 (75%) |
| Mix-85 | H-A-71 | H-A-48 (78%) | |
| Mix-86 | H-A-73 | H-A-72 (100%) | |
| Mix-87 | H-A-74 | H-A-75 (100%) | |
| Mix-88 | H-A-74 | H-A-76 (100%) | |
| Mix-89 | H-A-74 | H-A-77 (100%) | |
| Mix-90 | H-A-74 | H-A-78 (100%) | |
| Mix-91 | H-A-79 | H-A-80 (100%) | |
| Mix-92 | H-A-79 | H-A-81 (100%) | |
| Mix-93 | H-A-79 | H-A-82 (100%) | |
| Mix-94 | H-A-79 | H-A-83 (100%) | |
| Mix-95 | H-A-84 | H-A-85 (100%) | |
| Mix-96 | H-A-84 | H-A-86 (100%) | |
| Mix-97 | H-A-84 | H-A-87 (86%) | |
| Mix-98 | H-A-84 | H-A-88 (71%) | |
| Mix-99 | H-A-84 | H-A-89 (86%) | |
| Mix-100 | H-A-85 | H-A-15 (71%) | |
| Mix-101 | H-A-85 | H-A-41 (71%) | |
| Mix-102 | H-A-90 | H-A-91 (63%) | |
| Mix-103 | H-A-90 | H-A-92 (75%) | |
| Mix-104 | H-A-90 | H-A-93 (75%) | |
| Mix-105 | H-A-92 | H-A-93 (75%) | |
| Mix-106 | H-A-95 | H-A-93 (71%) | |
| Mix-107 | H-A-96 | H-A-97 (88%) | |
| Mix-108 | H-A-96 | H-A-98 (75%) | |
| Mix-109 | H-A-96 | H-A-99 (75%) | |
| Mix-110 | H-A-96 | H-A-100 (75%) | |
| Mix-111 | H-A-96 | H-A-101 (88%) | |
| Mix-112 | H-A-99 | H-A-100 (75%) | |
| Mix-113 | H-A-99 | H-A-106 (75%) | |
| Mix-114 | H-A-100 | H-A-105 (75%) | |
| Mix-115 | H-A-102 | H-A-103 (89%) | |
| Mix-116 | H-A-102 | H-A-104 (78%) | |
| Mix-117 | H-A-102 | H-A-105 (78%) | |
| Mix-118 | H-A-102 | H-A-106 (78%) | |
| Mix-119 | H-A-107 | H-A-102 (75%) | |
| Mix-120 | H-A-108 | H-A-102 (63%) | |
| Mix-121 | H-B-5 | H-B-6 (83%) | |
| Mix-122 | H-B-14 | H-B-6 (60%) | |
| Mix-123 | H-B-49 | H-B-6 (80%) | |
| Mix-124 | H-B-11 | H-B-14 (75%) | |
| Mix-125 | H-B-11 | H-B-13 (75%) | H-B-14 (75%) |
| Mix-126 | H-B-12 | H-B-14 (75%) | |
| Mix-127 | H-B-14 | H-B-18 (80%) | H-B-60 (60%) |
| Mix-128 | H-B-19 | H-B-14 (75%) | |
| Mix-129 | H-B-14 | H-B-44 (80%) | |
| Mix-130 | H-B-14 | H-B-54 (80%) | |
| Mix-131 | H-B-14 | H-B-24 (80%) | |
| Mix-132 | H-B-14 | H-B-84 (80%) | |
| Mix-133 | H-B-14 | H-B-94 (100%) | |
| Mix-134 | H-B-19 | H-B-49 (75%) | |
| Mix-135 | H-B-19 | H-B-69 (75%) | |
| Mix-136 | H-B-19 | H-B-89 (75%) | |
| Mix-137 | H-B-89 | H-B-49 (75%) | |
| Mix-138 | H-B-84 | H-B-44 (80%) | H-B-86 (80%) |
| Mix-139 | H-B-59 | H-B-89 (75%) | |
| Mix-140 | H-B-84 | H-B-86 (80%) | H-B-88 (80%) |
| Mix-141 | L-C-1 | L-C-2 (60%) | |
| Mix-142 | L-C-3 | L-C-4 (60%) | |
| Mix-143 | L-C-3 | L-C-7 (100%) | |
| Mix-144 | L-C-5 | L-C-6 (100%) | |
| Mix-145 | L-C-8 | L-C-9 (71%) | |
| Mix-146 | L-D-1 | L-D-2 (60%) | |
| Mix-147 | L-D-3 | L-D-4 (60%) | |
| Mix-148 | L-D-3 | L-D-7 (100%) | |
| Mix-149 | L-D-5 | L-D-6 (100%) | |
| Mix-150 | L-D-8 | L-D-9 (71%) | |
| Mix-151 | H-E-1 | H-E-3 (89%) | |
| Mix-152 | H-E-3 | H-E-2 (89%) | |
| Mix-153 | H-E-3 | H-E-4 (89%) | |
| Mix-154 | H-E-3 | H-E-13 (100%) | |
| Mix-155 | H-E-3 | H-E-23 (100%) | H-E-77 (78%) |
| Mix-156 | H-E-3 | H-E-33 (89%) | |
| Mix-157 | H-E-3 | H-E-43 (78%) | |
| Mix-158 | H-E-3 | H-E-63 (78%) | |
| Mix-159 | H-E-3 | H-E-77 (78%) | |
| Mix-160 | H-E-3 | H-E-83 (100%) | |
| Mix-161 | H-E-4 | H-E-13 (80%) | |
| Mix-162 | H-E-4 | H-E-23 (80%) | |
| Mix-163 | H-E-4 | H-E-63 (60%) | |
| Mix-164 | H-E-4 | H-E-77 (60%) | |
| Mix-165 | H-E-4 | H-E-83 (80%) | |
| Mix-166 | H-E-1 | H-E-22 (100%) | |
| Mix-167 | H-E-17 | H-E-22 (90%) | |
| Mix-168 | H-E-23 | H-E-22 (91%) | |
| Mix-169 | H-E-63 | H-E-23 (78%) | |
| Mix-170 | H-E-77 | H-E-23 (78%) | |
| Mix-180 | H-E-83 | H-E-23 (90%) | |
| Mix-181 | H-E-32 | H-E-22 (82%) | |
| Mix-182 | H-E-33 | H-E-37 (89%) | |
| Mix-183 | H-E-33 | H-E-42 (100%) | |
| Mix-184 | H-E-33 | H-E-43 (89%) | |
| Mix-185 | H-E-45 | H-E-33 (88%) | |
| Mix-186 | H-E-33 | H-E-22 (78%) | H-E-77 (78%) |
| Mix-187 | H-E-37 | H-E-34 (89%) | |
| Mix-188 | H-E-42 | H-E-34 (80%) | |
| Mix-189 | H-E-45 | H-E-34 (75%) | |
| Mix-190 | H-E-43 | H-E-63 (78%) | |
| Mix-191 | H-E-43 | H-E-77 (78%) | |
| Mix-192 | H-E-43 | H-E-87 (67%) | |
| Mix-193 | H-E-51 | H-E-22 (78%) | |
| Mix-194 | H-E-51 | H-E-77 (78%) | H-E-83 (89%) |
| Mix-195 | H-E-51 | H-E-98 (89%) | H-E-100 (89%) |
| Mix-196 | H-E-63 | H-E-97 (78%) | |
| Mix-197 | H-E-63 | H-E-100 (78%) | |
| Mix-198 | H-E-77 | H-E-84 (67%) | |

TABLE 1-continued

| No. | Compound α1 | Compound α2 (degree of identity) | Compound α3 (degree of identity) |
|---|---|---|---|
| Mix-199 | H-E-92 | H-E-94 (82%) | |
| Mix-200 | H-E-99 | H-E-100 (92%) | |

The compounds included in the compound group α according to the invention can be synthesized by known methods. For example, compounds represented by general formula (A) can be synthesized by the following methods (A-1) to (A-3).

(Method A-1)

[Chem. 54]

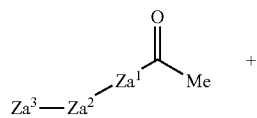

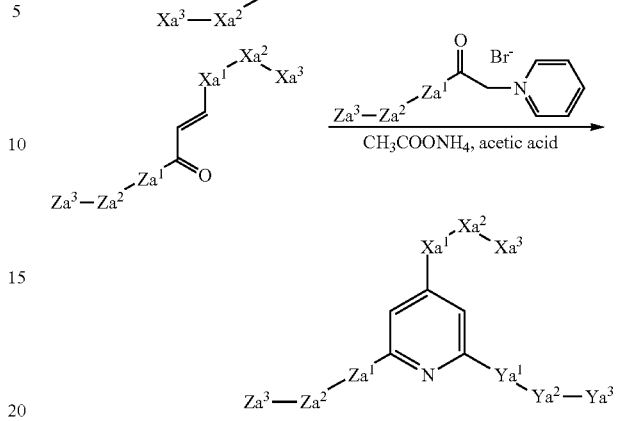

Namely, the compounds can be synthesized by reacting the starting materials in stages using the method described in *Bioorganic and Medicinal Chemistry*, Vol. 18, No. 9, pp. 3066-3077, 2010.

(Method A-2)

[Chem. 55]

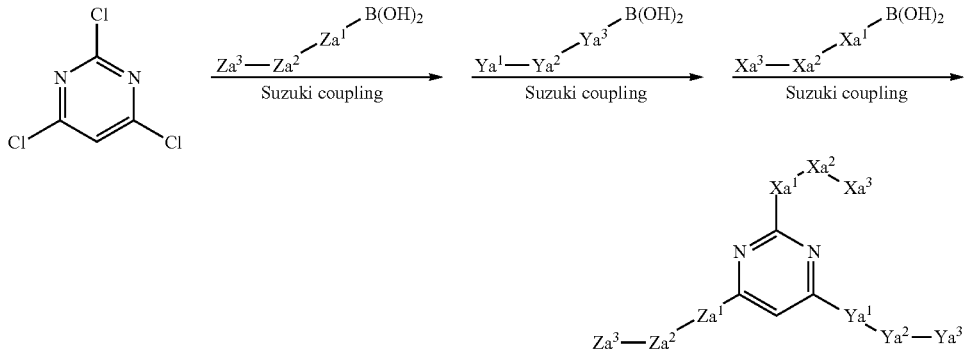

Namely, the compounds can be synthesized by reacting the starting material in stages using the method described in *J. Org. Chem.*, Vol. 66, pp. 7125-7128, 2001.

(Method A-3)

[Chem. 56]

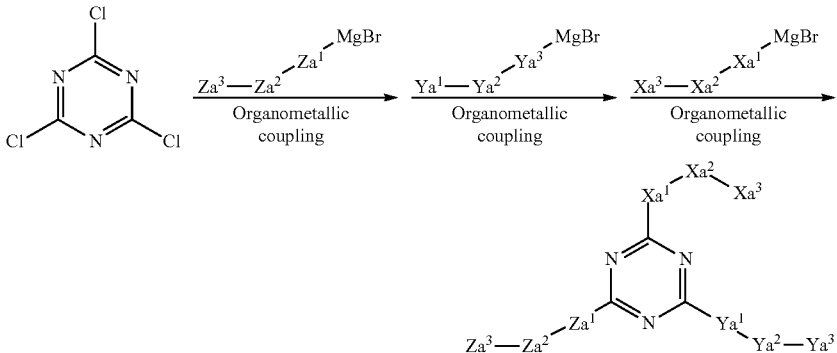

Namely, the compounds can be synthesized by reacting the starting material in stages using the method described in *Organic Letters*, Vol. 10, No. 5, pp. 709-712, 2008.

Compounds represented by general formula (B) can be synthesized by the following method (B-1).
(Method B-1)

[Chem. 57]

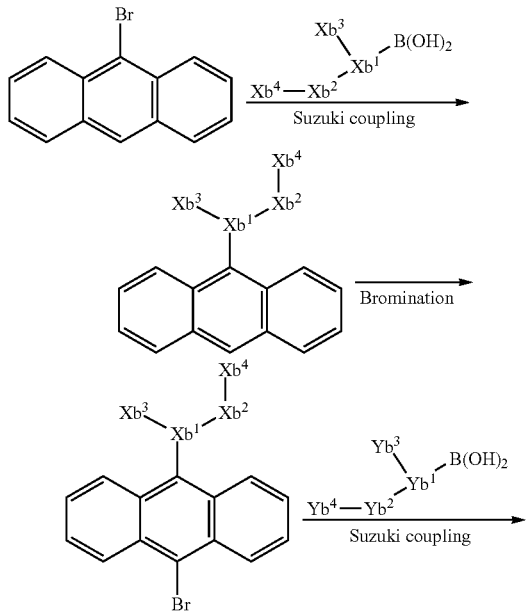

Namely, the compounds can be synthesized by reacting the starting material in stages using the method described in *Chemistry—A European Journal*, Vol. 12, No. 8, pp. 2329-2336, 2006.

Compounds represented by general formula (C) can be synthesized by the following method (C-1).
(Method C-1)

[Chem. 58]

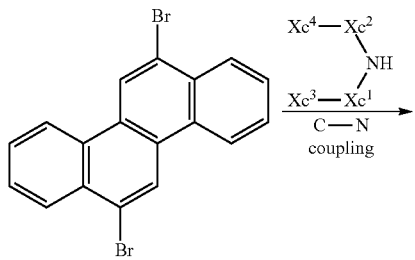

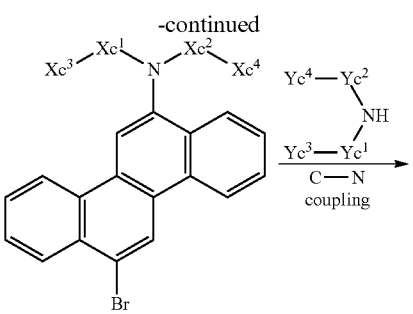

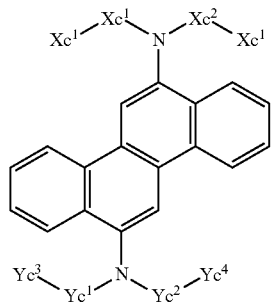

Namely, the compounds can be synthesized by reacting the starting material in stages using the method described in International Publication WO 2006/082705.

Compounds represented by general formula (D) can be synthesized by the following method (D-1).
(Method D-1)

[Chem. 59]

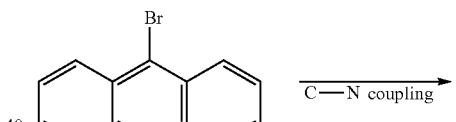

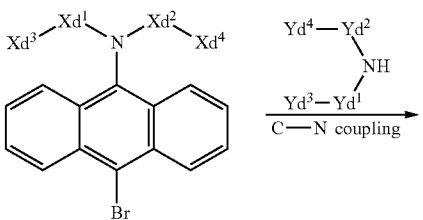

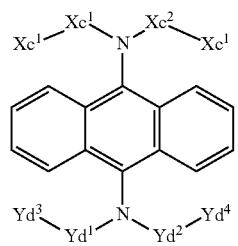

Namely, the compounds can be synthesized by reacting the starting material in stages using the method described in *J. Am. Chem. Soc.*, Vol. 127, No. 23, pp. 8508-8516, 2005.

Compounds represented by general formula (E) can be synthesized by the following method (E-1).
(Method E-1)

[Chem. 60]

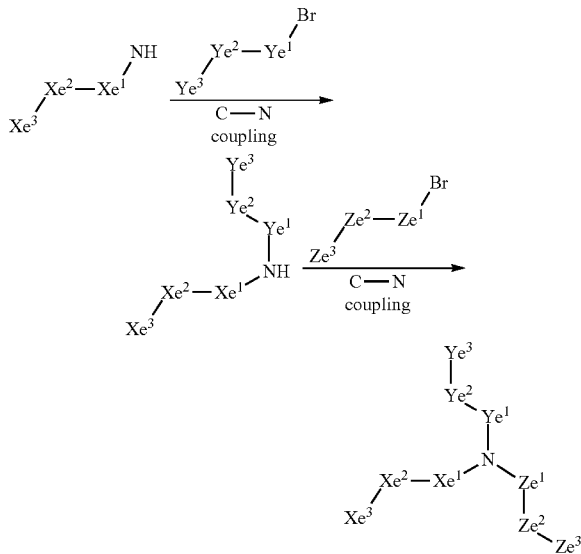

Namely, the compounds can be synthesized by reacting the starting materials in stages using the method described in *Chemische Berichte*, Vol. 57, p. 1434, 1924.

The compound group α includes two or more compounds. There are no particular limitations on the number thereof (kinds of compounds) so long as the requirements described above are satisfied. For example, in the case where an organic electroluminescent element having a layer formed from the composition of the invention is produced, the number of the compounds is generally 8 or less, preferably 4 or less, from the standpoint of keeping the operating voltage low.

The content of each compound included in the compound group α is as follows. The lower limit thereof is generally 1% by weight or higher, preferably 5% by weight or higher, more preferably 10% by weight or higher, and the upper limit thereof is 99% or less, preferably 95% or less, more preferably 90% or less. In the case where the content thereof is less than the lower limit, the properties of the individual compounds, such as, for example, charge-transporting properties, are not sufficiently exhibited. In the case where the content thereof exceeds the upper limit, the composition for organic electroluminescent element, which contains the compound group α and a solvent, has reduced storage stability.

The content of the compound group α in the solid components is as follows. The lower limit thereof is generally 0.1% by weight or higher, preferably 1% by weight or higher, more preferably 5% by weight or higher, and the upper limit thereof is 100% by weight.

In the case where the compound group α is used as a charge transport material, the content of the compound group α in the solid components is as follows. The lower limit thereof is generally 5% by weight or higher, preferably 10% by weight or higher, more preferably 20% by weight or higher, and the upper limit thereof is generally 100% by weight or less. By regulating the content thereof so as to be not less than the lower limit, the operating voltage of the element can be rendered low.

In the case where the compound group α is used as a host material in the emissive layer of an organic electroluminescent element, the content of the compound group α in the solid components is as follows. The lower limit thereof is generally 5% by weight or higher, preferably 10% by weight or higher, more preferably 20% by weight or higher, and the upper limit thereof is generally 99.9% by weight or less because the composition contains a dopant material. By regulating the content thereof so as to be not higher than the upper limit, a higher luminance is obtained. By regulating the content thereof so as to be not less than the lower limit, the operating voltage of the element can be rendered low.

Meanwhile, in the case where the compound group α is used as a dopant material in an emissive layer, the content of the compound group α in the solid components is generally 0.1% by weight or higher, preferably 1% by weight or higher, and is generally 50% by weight or less, preferably 30% by weight or less, more preferably 20% by weight or less. By regulating the content thereof so as to be not higher than the upper limit, concentration quenching can be inhibited to maintain a high luminance. By regulating the content thereof so as to be not less than the lower limit, a high luminescent efficiency can be maintained.

The composition for organic electroluminescent element of the invention may contain two or more compound groups a. For example, the composition for organic electroluminescent element of the invention may contain both a "compound group αA" and a "compound group αE", where the "compound group αA" is a compound group α composed of a plurality of compounds represented by general formula (A) and the "compound group αE" is a compound group α composed of a plurality of compounds represented by general formula (E). The number of compound groups a contained in the composition is not limited unless the effects of the invention are lessened thereby. However, the upper limit thereof is generally 5 or less, preferably 4 or less, more preferably 3 or less. In case where the number of compound groups a exceeds the upper limit, there is a possibility that the properties of the individual compounds, such as, for example, charge-transporting properties, might not be sufficiently exhibited. The proportions of the compound groups a contained in the composition can be set at will unless the effects of the invention are lessened thereby.

[2] Solvent

The composition for organic electroluminescent element of the invention contains a solvent.

The solvent is not particularly limited so long as the compound group α described above and other components contained in the composition dissolve therein. However, preferred solvents include the following.

Examples thereof include: alkanes such as n-decane, cyclohexane, ethylcyclohexane, decalin, and bicyclohexane; aromatic hydrocarbons such as toluene, xylene, mesitylene, cyclohexylbenzene, and tetralin; halogenated aromatic hydrocarbons such as chlorobenzene, dichlorobenzene, and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic esters such as phenyl acetate, phenyl propionate, methyl benzoate, ethyl benzoate, propyl benzoate, and n-butyl benzoate; alicyclic ketones such as cyclohexanone, cyclooctanone, and fenchone; alicyclic alcohols such as cyclohexanol and cyclooctanol; aliphatic ketones such as methyl ethyl ketone and dibutyl ketone; aliphatic alcohols such as butanol and hexanol; and aliphatic ethers such as ethylene glycol dimethyl ether, ethylene glycol diethyl ether, and propylene glycol 1-monomethyl ether acetate (PGMEA). Preferred of these are alkanes and aromatic hydrocarbons.

The solvent has a boiling point of generally 80° C. or higher, preferably 100° C. or higher, more preferably 110° C. or higher. By using a solvent having a boiling point not lower than the lower limit, excessive solvent vaporization from the composition is prevented during wet-process film formation and high film formation stability can be ensured.

From the standpoint of obtaining a more even film, it is preferred that the solvent should vaporize at an appropriate rate from the liquid film just after film formation. Consequently, the boiling point of the solvent is generally 300° C. or lower, preferably 270° C. or lower, more preferably 250° C. or lower.

One of such solvents may be used alone, or any desired two or more thereof may be used in combination in any desired proportion.

In the composition for organic electroluminescent element of the invention, the content of the solvent, based on 100% by weight the composition, is preferably 10% by weight or higher, more preferably 50% by weight or higher, especially preferably 70% by weight or higher, and is preferably 99.99% by weight or less, more preferably 99.8% by weight or less, especially preferably 99.5% by weight or less. By regulating the content of the solvent so as to be not less than the lower limit, the composition can be made to have proper viscosity and hence have satisfactory applicability in film formation. On the other hand, by regulating the content thereof so as to be not higher than the upper limit, a film having a sufficient thickness is obtained through solvent removal after film formation. In addition, such solvent contents are preferred because the composition has satisfactory film-forming properties.

[3] Other Components

The composition for organic electroluminescent element of the invention may contain other components besides the compound group α and solvent described above, according to need. For example, the composition may contain various additives, e.g., a leveling agent and an antifoamer, for the purpose of improving the film-forming properties. The composition may contain a charge transport material other than those included in the compound group α. In the case where the composition of the invention is to be used for forming the emissive layer of an organic electroluminescent element, this composition may contain a luminescent material which produces fluorescence or phosphorescence. In particular, in the case where the composition for organic electroluminescent element of the invention is a composition for luminescent-layer formation and where the compound group α is composed of a plurality of compounds represented by general formula (A) or the compound group α is composed of a plurality of compounds represented by general formula (E), it is preferred that this composition should contain a luminescent material which produces phosphorescence. Examples of the material which produces phosphorescence include the transition metal complexes disclosed in JP-A-2011-256129.

[Organic Electroluminescent Element]

The organic electroluminescent element of the invention includes a substrate and, formed thereover, at least an anode, a cathode, and an emissive layer disposed between the electrodes, and is characterized by having a layer formed from the composition of the invention by a wet film formation method. It is preferred that this layer formed by a wet film formation method should be the luminescent layer.

The FIGURE is a diagrammatic sectional view which shows a structure example suitable for the organic electroluminescent element of the invention. In the FIGURE, numeral 1 denotes a substrate, 2 an anode, 3 a hole injection layer, 4 a hole transport layer, 5 an emissive layer, 6 a hole blocking layer, 7 an electron transport layer, 8 an electron injection layer, and 9 a cathode.

[1] Substrate

The substrate 1 serves as the support of the organic electroluminescent element, and a plate of quartz or glass, a metal plate, a metal foil, a plastic film or sheet, or the like is used. Especially preferred are glass plates and plates of transparent synthetic resins such as polyesters, polymethacrylates, polycarbonates, and polysulfones. In the case of using a synthetic-resin substrate, gas-barrier properties must be taken into account. Use of a substrate having two low gas-barrier properties is undesirable because there are cases where the surrounding air passes through the substrate to deteriorate the organic electroluminescent element. Consequently, one of preferred methods is to form a dense silicon oxide film or the like on at least one surface of the synthetic-resin substrate to ensure gas-barrier properties.

[2] Anode

An anode 2 is disposed on the substrate 1. The anode 2 serves to inject holes into a layer located on the luminescent-layer side (the hole injection layer 3, hole transport layer 4, or luminescent layer 5, etc.).

This anode 2 is usually constituted of a metal such as aluminum, gold, silver, nickel, palladium, or platinum, a metal oxide such as an oxide of indium and/or tin, a metal halide such as copper iodide, carbon black, an electroconductive polymer such as poly(3-methylthiophene), polypyrrole, or polyaniline, or the like.

Usually, the anode 2 is frequently formed by sputtering, vacuum deposition, or the like. In the case where the anode is formed using fine particles of a metal such as silver, fine particles of copper iodide or the like, carbon black, fine particles of an electroconductive metal oxide, fine particles of an electroconductive polymer, or the like, use can be made of a method in which such fine particles are dispersed in an appropriate binder resin solution and this dispersion is applied to a substrate 1 to form an anode 2. In the case of an electroconductive polymer, it is possible to form an anode 2 by directly forming a thin film on a substrate 1 through electrolytic polymerization or by applying the electroconductive polymer to a substrate 1 (*Appl. Phys. Lett.*, Vol. 60, p. 2711, 1992).

Although the anode 2 usually is of a single-layer structure, the anode 2 can be made, if desired, to have a multilayer structure constituted of a plurality of materials.

The thickness of the anode 2 varies depending on the required transparency. When transparency is required, it is desirable to regulate the thickness thereof so as to result in a visible-light transmittance of generally 60% or higher, preferably 80% or higher. In this case, the thickness of the anode is generally 5 nm or larger, preferably 10 nm or larger, and is generally about 1,000 nm or less, preferably about 500 nm or less. In the case where the anode 2 may be opaque, this anode 2 may have any desired thickness and may be identical with the substrate 1. It is also possible to superpose a different electroconductive material on the anode 2.

It is preferred to subject the anode surface to an ultraviolet (UV)/ozone treatment or to a treatment with an oxygen plasma or argon plasma for the purpose of removing impurities adherent to the anode and regulating the ionization potential to improve the hole-injecting properties.

[3] Hole Injection Layer

The hole injection layer 3 is a layer which transports holes from the anode 2 to the luminescent layer 5, and is usually formed on the anode 2. For forming the hole injection layer 3 according to the invention, either a vacuum deposition method or a wet film formation method may be used without particular limitations. However, from the standpoint of diminishing dark spots, it is preferred to form the hole injection layer 3 by a wet film formation method. The thickness of the hole injection layer 3 is generally 5 nm or larger, preferably 10 nm or larger, and is generally 1,000 nm or less, preferably 500 nm or less.

<Formation of Hole Injection Layer by Wet Film Formation Method>

In the case where the hole injection layer 3 is formed by a wet film formation method, the hole injection layer 3 is usually formed by mixing materials for constituting the hole injection layer 3 with an appropriate solvent (solvent for hole injection layer formation) to prepare a composition for film formation (composition for hole injection layer formation), applying this composition for hole injection layer formation, by an appropriate technique, to the layer (usually the anode) which is to underlie the hole injection layer 3, and drying the resultant coating film.

(Hole-Transporting Compound)

The composition for hole injection layer formation usually contains a hole-transporting compound, as a material for constituting the hole injection layer, and a solvent. Usually, a hole-transporting compound is used in the hole injection layer of the organic electroluminescent element. The hole-transporting compound may be either a high-molecular compound such as a polymer or a low-molecular compound such as a monomer, so long as these compounds have hole-transporting properties. It is, however, preferred that the charge-transporting compound should be a high-molecular compound.

Preferred as the hole-transporting compound is a compound having an ionization potential of 4.5-6.0 eV, from the standpoint of barrier to charge injection from the anode 2 to the hole injection layer 3. Examples of the hole-transporting compound include aromatic amine derivatives, phthalocyanine derivatives, porphyrin derivatives, oligothiophene derivatives, polythiophene derivatives, benzylphenyl derivatives, compounds including tertiary amines linked by a fluorene group, hydrazone derivatives, silazane derivatives, silanamine derivatives, phosphamine derivatives, quinacridone derivatives, polyaniline derivatives, polypyrrole derivatives, polyphenylenevinylene derivatives, polythienylenevinylene derivatives, polyquinoline derivatives, polyquinoxaline derivatives, and carbon.

In the invention, the term "derivatives" has the following meaning. In the case of aromatic amine derivatives, for example, the "derivatives" include both aromatic amines themselves and compounds each including an aromatic amine as the main framework, and the derivatives may be either polymers or monomers.

Any one of such compounds may be contained alone as a hole-transporting compound for use as a material for the hole injection layer 3, or two or more of such compounds may be contained as hole-transporting compounds for use as the material. In the case where two or more hole-transporting compounds are contained, the combination thereof is not limited. It is, however, preferred to use one or more aromatic tertiary amine high-molecular compounds in combination with one or more other hole-transporting compounds.

From the standpoints of amorphousness and visible-light transmittance, aromatic amine compounds are preferred of the examples shown above, and aromatic tertiary amine compounds are especially preferred. The term "aromatic tertiary amine compounds" means compounds having an aromatic tertiary amine structure, and includes compounds which have a group derived from an aromatic tertiary amine.

The aromatic tertiary amine compounds are not particularly limited in the kind thereof. However, from the standpoint of even luminescence brought about by surface-smoothing effect, high-molecular compounds having a weight-average molecular weight of 1,000-1,000,000 (polymeric compounds made up of repeating units connected in a row) are more preferred. Preferred examples of the aromatic tertiary amine high-molecular compounds include high-molecular compounds having a repeating unit represented by the following formula (IV).

[Chem. 61]

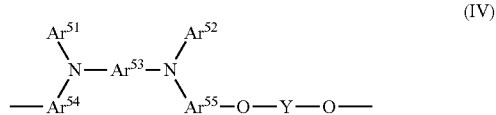

(IV)

(In formula (IV), $Ar^{51}$ and $Ar^{52}$ each independently represent an aromatic hydrocarbon group which may have a substituent or an aromatic heterocyclic group which may have a substituent. $Ar^{53}$ to $Ar^{55}$ each independently represent an aromatic hydrocarbon group which may have a substituent or an aromatic heterocyclic group which may have a substituent. Y represents a linking group selected from the following linking groups. Of the $Ar^{51}$ to $Ar^{55}$, the two groups bonded to the same nitrogen atom may be bonded to each other to form a ring.)

(Linking Groups)

[Chem. 62]

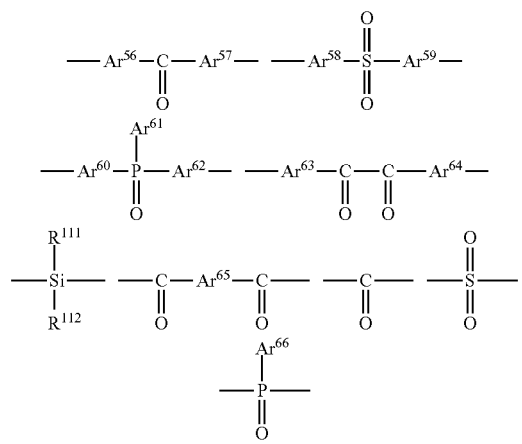

(In the formulae, $Ar^{56}$ to $Ar^{66}$ each independently represent an aromatic hydrocarbon group which may have a substituent or an aromatic heterocyclic group which may have a substituent. $R^{111}$ and $R^{112}$ each independently represent a hydrogen atom or any substituent.)

Preferred examples of the aromatic hydrocarbon groups and aromatic heterocyclic groups represented by $Ar^{51}$ to $Ar^{66}$ are a benzene ring, naphthalene ring, phenanthrene ring, thiophene ring, and pyridine ring which each have a free valence of 2, from the standpoints of the solubility, heat resistance, and hole-injecting/transporting properties of the high-molecular compounds. More preferred examples thereof are a benzene ring and a naphthalene ring which each have a free valence of 2.

The aromatic hydrocarbon groups and aromatic heterocyclic groups represented by $Ar^{51}$ to $Ar^{66}$ may further have a substituent. It is preferred that the substituent should have a molecular weight of generally 400 or less, in particular, about 250 or less. Preferred examples of the substituent are alkyl groups, alkenyl groups, alkoxy groups, aromatic hydrocarbon groups, aromatic heterocyclic groups, and the like.

In the case where $R^{111}$ and $R^{112}$ are any substituents, examples of the substituents include alkyl groups, alkenyl groups, alkoxy groups, silyl, siloxy, aromatic hydrocarbon groups, and aromatic heterocyclic groups.

Also preferred as the hole-transporting compound is an electroconductive polymer (PEDOT/PSS) obtained by polymerizing 3,4-ethylenedioxythiophene in poly(styrenesulfonic acid) having a high molecular weight, the electroconductive polymer being a derivative of polythiophene. This polymer may have been modified by capping each end thereof with, for example, a methacrylate.

Furthermore, the compound having an insolubilizing group that is described in the section "Hole Transport Layer", which will be given later, may be used as the hole-transporting compound. In the case where the compound having an insolubilizing group is used, the same methods may be used for film formation, etc.

The concentration of the hole-transporting compound in the composition for hole injection layer formation is not limited unless the effects of the invention are considerably lessened thereby. From the standpoint of the evenness of film thickness, however, the concentration thereof is generally 0.01% by weight or higher, preferably 0.1% by weight or higher, more preferably 0.5% by weight or higher, and is generally 70% by weight or less, preferably 60% by weight or less, more preferably 50% by weight or less. In case where the concentration thereof is too high, there is the possibility of resulting in unevenness in film thickness. In case where the concentration thereof is too low, there is a possibility that the hole injection layer formed might have defects.

(Electron-Accepting Compound)

It is preferred that the composition for hole injection layer formation should contain an electron-accepting compound as a constituent material for the hole injection layer.

It is preferred that the electron-accepting compound should be a compound which has oxidizing ability and has the ability to accept one electron from the hole-transporting compound described above. Specifically, compounds having an electron affinity of 4 eV or higher are preferred, and compounds having an electron affinity of 5 eV or higher are more preferred.

Examples of such electron-accepting compounds include one or more compounds selected from the group consisting of triarylboron compounds, metal halides, Lewis acids, organic acids, onium salts, salts of arylamines with metal halides, and salts of arylamines with Lewis acids. More specific examples thereof include: inorganic compounds having a high valence, such as iron(III) chloride (JP-A-11-251067) and ammonium peroxodisulfate; cyano compounds such as tetracyanoethylene; aromatic boron compounds such as tris(pentafluorophenyl)borane (JP-A-2003-31365); onium salts substituted with organic groups (International Publication WO 2005/089024); fullerene derivatives; iodine; and sulfonic acid ions such as poly(styrenesulfonic acid) ions, alkylbenzenesulfonic acid ions, and camphorsulfonic acid ions.

These electron-accepting compounds oxidize the hole-transporting compound and can thereby improve the electrical conductivity of the hole injection layer.

The content of the electron-accepting compound in the hole injection layer or in the composition for hole injection layer formation is generally 0.1% by mole or higher, preferably 1% by mole or higher, but is generally 100% by mole or less, preferably 40% by mole or less, based on the hole-transporting compound.

(Solvent)

It is preferred that the solvent contained in the composition for hole injection layer formation which is to be used in a wet film formation method should include at least one compound in which the constituent materials for the hole injection layer which were described above can dissolve. It is preferred that this solvent should have a boiling point which is generally 110° C. or higher, preferably 140° C. or higher, in particular 200° C. or higher, and is generally 400° C. or lower, in particular 300° C. or lower. In the case where the solvent has too low a boiling point, there is a possibility that this composition might have too high a drying rate, resulting in impaired film quality. In the case where the solvent has too high a boiling point, it is necessary to employ an elevated temperature in the drying step and this drying may exert an adverse influence on the other layers and substrate.

Examples of the solvent include ether solvents, ester solvents, aromatic hydrocarbon solvents, and amide solvents.

Examples of the ether solvents include aliphatic ethers such as ethylene glycol dimethyl ether, ethylene glycol diethyl ether, and propylene glycol 1-monomethyl ether acetate (PGMEA) and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of the ester solvents include aromatic esters such as phenyl acetate, phenyl propionate, methyl benzoate, ethyl benzoate, propyl benzoate, and n-butyl benzoate.

Examples of the aromatic hydrocarbon solvents include toluene, xylene, cyclohexylbenzene, 3-isopropylbiphenyl, 1,2,3,4-tetramethylbenzene, 1,4-diisopropylbenzene, cyclohexylbenzene, and methylnaphthalene. Examples of the amide solvents include N,N-dimethylformamide and N,N-dimethylacetamide.

Also usable besides these are dimethyl sulfoxide and the like. One of those solvents may be used alone, or any desired two or more thereof may be used in combination in any desired proportion.

(Methods for Film Formation)

After preparation of the composition for hole injection layer formation, this composition is applied, by a wet process, to the layer (usually, the anode 2) which is to underlie the hole injection layer 3. The resultant coating film is dried. Thus, a hole injection layer 3 is formed.

The temperature to be used in the application step is preferably 10° C. or higher but preferably 50° C. or lower, from the standpoint of preventing the composition from generating crystals therein and from thus causing film defects.

The relative humidity to be used in the application step is not limited unless the effects of the invention are considerably lessened thereby. However, the relative humidity is generally 0.01 ppm or higher but is generally 80% or less.

After the application, the film of the composition for hole injection layer formation is dried usually by heating, etc. Examples of means for heating usable in the heating step include a clean oven and a hot plate.

With respect to the heating temperature to be used in the heating step, it is preferred to heat the coating film at a temperature not lower than the boiling point of the solvent used in the composition for hole injection layer formation, unless the effects of the invention are considerably lessened thereby. In the case where the solvent used for the hole injection layer is a mixed solvent composed of two or more solvents, it is preferred that the coating film should be heated at a temperature not lower than the boiling point of at least one of these solvents. When an increase in the boiling point of the solvent(s) is taken into account, it is preferred that the coating film in the heating step should be heated preferably at 120-410° C.

In the heating step, the period of heating is not limited so long as the heating temperature is not lower than the boiling point of the solvent contained in the composition for hole injection layer formation and as the coating film does not undergo sufficient insolubilization. However, the heating period is preferably 10 seconds or longer but is generally 180 minutes or shorter. Too long heating periods tend to result in diffusion of components of other layers. Too short heating periods tend to give an inhomogeneous hole injection layer. The heating may be conducted in two installments.

<Formation of Hole Injection Layer by Vacuum Deposition Method>

In the case where the hole injection layer 3 is to be formed by vacuum deposition, the hole injection layer 3 can be formed in the following manner. One or more constituent materials for the hole injection layer 3 (e.g., the hole-transporting compound and electron-accepting compound described above) are placed in one or more crucibles disposed in a vacuum vessel (when two or more materials are used, the materials are placed in respective crucibles), and the vacuum vessel is evacuated to about $10^{-4}$ Pa with an appropriate vacuum pump. Thereafter, the crucible is heated (when two or more materials are used, each crucible is heated) to vaporize the material while regulating the rate of vaporization (when two or more materials are used, the materials are vaporized while independently regulating the rates of vaporization of the respective materials) to form a hole injection layer 3 on the anode 2 of the substrate which has been placed so as to face the crucible(s). Incidentally, in the case where two or more materials are used, it is possible to use a method in which a mixture of these materials is placed in a crucible and is heated and vaporized to form a hole injection layer 3.

The degree of vacuum during the deposition is not limited unless the effects of the invention are considerably lessened thereby. However, the pressure during the deposition is generally $0.1 \times 10^{-6}$ Torr ($0.13 \times 10^{-4}$ Pa) or higher but is generally $9.0 \times 10^{-6}$ Torr ($12.0 \times 10^{-4}$ Pa) or lower. The rate of deposition is not limited unless the effects of the invention are considerably lessened thereby. However, the rate of deposition is generally 0.1 Å/sec or higher but is generally 5.0 Å/sec or less.

[4] Hole Transport Layer

When there is a hole injection layer, the hole transport layer 4 is formed on the hole injection layer 3. When there is no hole injection layer 3, the hole transport layer 4 can be formed on the anode 2. The organic electroluminescent element of the invention may have a configuration in which the hole transport layer has been omitted.

For forming the hole transport layer 4, either a vacuum deposition method or a wet film formation method may be used without particular limitations. However, from the standpoint of diminishing dark spots, it is preferred to from the hole transport layer 4 by a wet film formation method.

It is preferred that a material which has high hole-transporting properties and is capable of efficiently transporting injected holes should be used for forming the hole transport layer 4. From this standpoint, it is preferred that the material to be used should have a low ionization potential, be highly transparent to visible light, have a high hole mobility and excellent stability, and be less apt to generate, during production or use, impurities that serve as traps. Furthermore, since this hole transport layer 4 is in contact with the luminescent layer 5 in many cases, it is preferred that the material should neither quench the luminescence of the luminescent layer 5 nor form an exciplex with the luminescent layer 5 to reduce the efficiency.

As such a material for the hole transport layer 4, any material which has hitherto been used as a constituent material for hole transport layers may be employed. Examples thereof include the compounds shown above as examples of the hole-transporting compound for use in the hole injection layer 3 described above. Examples thereof further include arylamine derivatives, fluorene derivatives, Spiro derivatives, carbazole derivatives, pyridine derivatives, pyrazine derivatives, pyrimidine derivatives, triazine derivatives, quinoline derivatives, phenanthroline derivatives, phthalocyanine derivatives, porphyrin derivatives, silole derivatives, oligothiophene derivatives, fused-ring aromatic derivatives, and metal complexes.

Other examples thereof include polyvinylcarbazole derivatives, polyarylamine derivatives, polyvinyltriphenylamine derivatives, polyfluorene derivatives, polyarylene derivatives, poly(arylene ether sulfone) derivatives having tetraphenylbenzidine, polyarylenevinylene derivatives, polysiloxane derivatives, polythiophene derivatives, and poly(p-phenylenevinylene) derivatives. These derivatives may be any of alternating copolymers, random copolymers, block copolymers, and graft copolymers. Furthermore, the derivatives each may be a polymer in which the main chain has one or more branches and which has three or more ends, or may be a so-called dendrimer.

Preferred of those are polyarylamine derivatives and polyarylene derivatives.

It is preferred that the polyarylamine derivatives should be polymers which contain a repeating unit represented by the following formula (V). It is especially preferred that the derivatives should be polymers each made up of repeating units represented by the following formula (V). In this case, the polymer may be one in which the repeating units differ from each other in $Ar^a$ or $Ar^b$.

[Chem. 63]

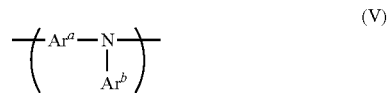

(V)

(In formula (V), $Ar^a$ and $Ar^b$ each independently represent an aromatic hydrocarbon group or an aromatic heterocyclic group which each may have a substituent.)

Examples of the aromatic hydrocarbon group which may have a substituent include the following groups each having a free valence of 1 or 2: 6-membered monocycles, fused rings each composed of two to five such monocycles fused together, and groups each made up of two or more such rings linked together through one or more direct bonds. Specific examples thereof include a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, and fluorene ring which each have a free valence of 1 or 2.

Examples of the aromatic heterocyclic group which may have a substituent include the following groups each having a free valence of 1 or 2: 5- or 6-membered monocycles, fused rings each composed of two to four such monocycles, and groups each made up of two or more such rings linked together through one or more direct bonds. Specific examples thereof include a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, and azulene ring which each have a free valence of 1 or 2.

From the standpoints of solubility in organic solvents and heat resistance, it is preferred that $Ar^a$ and $Ar^b$ should each independently be a ring selected from the group consisting of a benzene ring, naphthalene ring, anthracene ring, phenanthrene ring, triphenylene ring, pyrene ring, thiophene ring, pyridine ring, and fluorene ring which each have a free valence of 1 or 2 or be a group which is made up of two or more benzene rings linked together and which has a free valence of 1 or 2 (e.g., biphenyl(biphenylene) or terphenyl (terphenylene)).

Preferred of these are benzene, biphenyl, and fluorene which each have a free valence of 1 or 2.

Examples of the substituents which may be possessed by the aromatic hydrocarbon group and aromatic heterocyclic group represented by $Ar^a$ and $Ar^b$ include alkyl groups, alkenyl groups, alkynyl groups, alkoxy groups, aryloxy groups, alkoxycarbonyl groups, dialkylamino groups, diarylamino groups, acyl groups, halogen atoms, haloalkyl groups, alkylthio groups, arylthio groups, silyl, siloxy, cyano, aromatic hydrocarbon ring groups, and aromatic heterocyclic groups.

Examples of the polyarylene derivatives include polymers having as a repeating unit, an arylene group, such as an aromatic hydrocarbon group or an aromatic heterocyclic group, that may have any of the substituents shown above as examples of the $Ar^a$ and $Ar^b$ contained in formula (V). It is preferred that the polyarylene derivatives should be polymers which have repeating units represented by the following formula (VI) and/or the following formula (VII).

[Chem. 64]

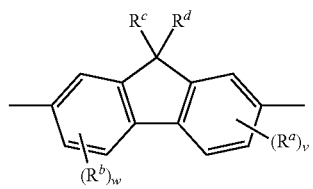

(VI)

(In formula (VI), $R^a$, $R^b$, $R^c$, and $R^d$ each independently represent an alkyl group, alkoxy group, phenylalkyl group, phenylalkoxy group, phenyl, phenoxy, alkylphenyl group, alkoxyphenyl group, alkylcarbonyl group, alkoxycarbonyl group, or carboxy. Symbols v and w each independently represent an integer of 0-3. When v or w is 2 or larger, the multiple $R^a$ or $R^b$ groups contained in the molecule may be the same or different, and any adjoining $R^a$ or $R^b$ groups may have been bonded to each other to form a ring.)

[Chem. 65]

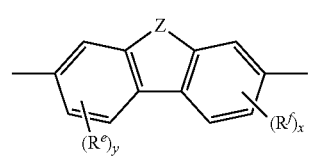

(VII)

(In formula (VII), $R^e$ and $R^f$ each independently have the same meaning as the $R^a$, $R^b$, $R^c$, or $R^d$ contained in formula (VI). Symbols x and y each independently represent an integer of 0-3. When x or y is 2 or larger, the multiple $R^e$ or $R^f$ groups contained in the molecule may be the same or different, and any adjoining $R^e$ or $R^f$ groups may have been bonded to each other to form a ring. Z represents an atom or a group of atoms, the atom or the group constituting a 5- or 6-membered ring.)

Examples of Z include —O—, —BR—, —NR—, —SiR$_2$—, —PR—, —SR—, —CR$_2$—, or a group constituted of such atoms or groups bonded to each other. R represents a hydrogen atom or any organic group. The term "organic group" in the invention means a group which contains at least one carbon atom.

It is preferred that the polyarylene derivatives should further have a repeating unit represented by the following formula (VIII), besides the repeating units represented by formula (VI) and/or formula (VII).

[Chem. 66]

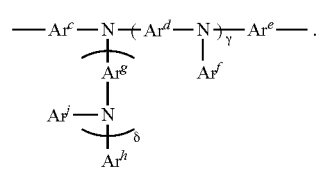

(VIII)

(In formula (VIII), $Ar^c$ to $Ar^j$ each independently represent an aromatic hydrocarbon group or an aromatic heterocyclic group which each may have a substituent. Symbols γ and δ each independently represent 0 or 1.)

Examples of $Ar^c$ to $Ar^j$ are the same as those of the $Ar^a$ and $Ar^b$ contained in formula (V).

Specific examples of formulae (VI) to (VIII) and specific examples of the polyarylene derivatives include the same examples as those shown in JP-A-2008-98619.

In the case where the hole transport layer 4 is formed by a wet film formation method, a composition for hole transport layer formation is prepared and thereafter applied to form a film thereof by a wet process and the coating film is dried by heating, in the same manner as for the formation of the hole injection layer 3.

The composition for hole transport layer formation contains a solvent besides the hole-transporting compound described above. The solvent to be used may be the same as the solvent used in the composition for hole injection layer formation. Other conditions including conditions for film formation and conditions for drying by heating may also be the same as in the formation of the hole injection layer 3. Also in the case where the hole transport layer is formed by a vacuum deposition method, the conditions for film deposition, etc. may be the same as in the formation of the hole injection layer 3. The hole transport layer 4 may contain various luminescent materials, electron-transporting compounds, binder resins, applicability improvers, etc., besides the hole-transporting compound.

It is also preferred that the hole transport layer 4 should be a layer formed by insolubilizing a compound having an insolubilizing group (hereinafter referred to as "insolubilizable compound"), from the standpoint of heat resistance or film-forming properties. The insolubilizable compound is a compound having an insolubilizing group, and is insolubilized to thereby form an insoluble polymer.

The insolubilizing group is a group which reacts by the action of heat and/or irradiation with actinic energy rays and which has the effect of making the reacted compound have reduced solubility in organic solvents or water as compared with the solubility of the unreacted compound. In the invention, it is preferred that the insolubilizing group should be a leaving group or a crosslinkable group.

The term "leaving group" means a group that is eliminated at a temperature of 70° C. or higher from the aromatic hydrocarbon ring to which the group has been bonded and that renders the compound soluble in solvents. The expression "soluble in solvents" means that the compound, in the state of having not reacted by the action of heat and/or irradiation with actinic energy rays, dissolves in toluene at ordinary temperature in an amount of 0.1% by weight or more. The solubility of the compound in toluene is preferably 0.5% by weight or higher, more preferably 1% by weight or higher.

This leaving group preferably is a group which is thermally eliminated without leaving a polar group on the aromatic hydrocarbon ring, and more preferably is a group which is thermally eliminated by means of the reverse Diels-Alder reaction. It is also preferred that the leaving group should be a group which is thermally eliminated at 100° C. or higher, and that the leaving group should be a group which is thermally eliminated at 300° C. or lower.

Examples of the crosslinkable group include: groups derived from cyclic ethers such as oxetane and epoxies; groups derived from an unsaturated double bond, such as vinyl, trifluorovinyl, styryl, acryl, methacryloyl, and cinnamoyl; and groups derived from benzocyclobutene.

The insolubilizable compound may be either a monomer, oligomer, or polymer. One insolubilizable compound may be contained alone, or any desired two or more insolubilizable compounds may be contained in combination in any desired proportion.

It is preferred to use, as the insolubilizable compound, a hole-transporting compound having a crosslinkable group. Examples of the hole-transporting compound include: nitrogen-containing aromatic compound derivatives such as pyridine derivatives, pyrazine derivatives, pyrimidine derivatives, triazine derivatives, quinoline derivatives, phenanthroline derivatives, carbazole derivatives, phthalocyanine derivatives, and porphyrin derivatives; triphenylamine derivatives; silole derivatives; and oligothiophene derivatives, fused-ring aromatic derivatives, and metal complexes. Preferred of these are: nitrogen-containing aromatic derivatives such as pyridine derivatives, pyrazine derivatives, pyrimidine derivatives, triazine derivatives, quinoline derivatives, phenanthroline derivatives, and carbazole derivatives; and triphenylamine derivatives, silole derivatives, fused-ring aromatic derivatives, metal complexes, and the like. In particular, triphenylamine derivatives are more preferred.

For forming a hole transport layer 4 by insolubilizing the insolubilizable compound, use is usually made of a method in which the insolubilizable compound is dissolved or dispersed in a solvent to prepare a composition for hole transport layer formation and this composition is applied to form a film thereof by a wet process and insolubilized.

The composition for hole transport layer formation may further contain an applicability improver, such as a leaving agent or an antifoamer, an electron-accepting compound, a binder resin, etc.

The composition for hole transport layer formation contains the insolubilizable compound in a concentration which is generally 0.01% by weight or higher, preferably 0.05% by weight or higher, more preferably 0.1% by weight or higher, and is generally 50% by weight or less, preferably 20% by weight or less, more preferably 10% by weight or less.

The composition for hole transport layer formation which contains the insolubilizable compound in such a concentration is applied on the underlying layer (usually, the hole injection layer 3) to form a film thereof, and the insolubilizable compound is insolubilized by heating and/or irradiation with actinic energy such as light.

Conditions for the film formation, including temperature and humidity, may be the same as in the wet-process film formation for forming the hole injection layer 3. Techniques for heating after the film formation are not particularly limited. With respect to heating temperature conditions, the temperature is generally 120° C. or higher but is preferably 400° C. or lower. The period of heating is generally 1 minute or longer but is preferably 24 hours or less. Although means for heating are not particularly limited, use may be made of a method in which the multilayer structure having the layer formed above is placed on a hot plate or heated in an oven. For example, use can be made of conditions under which the multilayer structure is heated on a hot plate at 120° C. or higher for 1 minute or longer.

In the case of insolubilization by irradiation with electromagnetic energy such as light, examples of methods therefor include: a method in which the multilayer structure is irradiated using an ultrahigh-pressure mercury lamp, high-pressure mercury lamp, or the like; or a method in which the multilayer structure is irradiated using a mask aligner or conveyor-type light irradiator which includes any of those light sources built therein.

The thickness of the hole transport layer 4 thus formed is generally 5 nm or larger, preferably 10 nm or larger, and is generally 300 nm or less, preferably 100 nm or less.

[5] Luminescent Layer

An emissive layer 5 is usually disposed on the hole transport layer 4. The luminescent layer 5 is a layer which, between the electrodes placed in an electric field, is excited by the recombination of holes injected from the anode 2 through the hole injection layer 3 with electrons injected from the cathode 9 through the electron transport layer 7 and which thus serves as the main light-emitting source. It is preferred that the luminescent layer 5 should contain a luminescent material (dopant) and one or more host materials. It is more preferred that the luminescent layer 5 should contain the compound group α according to the invention.

Although the luminescent layer 5 may be formed by a vacuum deposition method, it is especially preferred that the luminescent layer 5 should be a layer formed by a wet film formation method from the composition for organic electroluminescent element of the invention.

The wet film formation method is a method in which, as described above, a composition containing a solvent is applied and formed into a film by a wet process such as, for example, spin coating, dip coating, die coating, bar coating, blade coating, roll coating, spray coating, capillary coating, ink-jet printing, screen printing, gravure printing, or flexographic printing.

The luminescent layer 5 may contain other materials and components so long as the performance of the invention is not impaired thereby. In general, in the case of organic electroluminescent element employing the same materials, a smaller thickness of the layers interposed between the electrodes results in an increase in the intensity of effective electric field and hence in an increase in the quantity of electric current which flows, resulting in a decrease in operating voltage. Consequently, a smaller total thickness of the layers interposed between the electrodes results in a decrease in the operating voltage of the organic electroluminescent element. However, when the total thickness thereof is too small, short-circuiting due to projections of an electrode, e.g., ITO, occurs. Some degree of thickness is therefore necessary.

In the invention, when the organic electroluminescent element has organic layers, such as the hole injection layer 3 and the electron transport layer 7 which will be described later, besides the luminescent layer 5, the total thickness of the luminescent layer 5 and the other organic layers, e.g., the hole injection layer 3 and the electron transport layer 7, is generally 30 nm or larger, preferably 50 nm or larger, more preferably 100 nm or larger, and is generally 1,000 nm or less, preferably 500 nm or less, more preferably 300 nm or less. In the case where layers other than the luminescent layer 5, such as the hole injection layer 3 and the electron injection layer 8 which will be described later, have high electrical conductivity, an increased amount of charges are injected into the luminescent layer 5. In this case, it is possible to use a method in which the operating voltage is lowered while maintaining some degree of total thickness, for example, by increasing the thickness of the hole injection layer 3 and reducing the thickness of the luminescent layer 5.

Consequently, the thickness of the luminescent layer 5 is generally 10 nm or larger, preferably 20 nm or larger, and is generally 300 nm or less, preferably 200 nm or less. In the case where the element of the invention has the luminescent layer 5 as the only layer interposed between the anode and the cathode, the thickness of this luminescent layer 5 is generally 30 nm or larger, preferably 50 nm or larger, and is generally 500 nm or less, preferably 300 nm or less.

[6] Hole Blocking Layer

A hole blocking layer 6 is superposed and formed on the luminescent layer 5 so that the hole blocking layer 6 is in contact with the cathode-side boundary of the luminescent layer 5. Especially when a phosphorescent material is used as a luminescent substance or a blue luminescent material is used, the disposition of a hole blocking layer 6 is effective. The hole blocking layer 6 has the function of confining holes and electrons in the luminescent layer 5 to improve the luminescent efficiency. Namely, the hole blocking layer 6 not only serves to prevent the holes which have moved from the luminescent layer 5 from reaching the electron transport layer 7 and to thereby increase the probability of recombination with electrons within the luminescent layer 5 and confine the resultant excitons in the luminescent layer 5, but also serves to efficiently transport, toward the luminescent layer 5, the electrons which have been injected from the electron transport layer 7.

Examples of the properties required of the material which constitutes the hole blocking layer 6 include: to have a high electron mobility and a low hole mobility; to have a large energy gap (difference between HOMO and LUMO); and to have a high excited triplet energy level (T1).

Examples of materials for the hole blocking layer which satisfy such requirements include metal complexes such as mixed-ligand complexes, e.g., bis(2-methyl-8-quinolinolato)(phenolato)aluminum and bis(2-methyl-8-quinolinolato)(triphenylsilanolato)aluminum, and dinuclear metal complexes, e.g., bis(2-methyl-8-quinolato)aluminum-μ-oxobis(2-methyl-8-quinolilato)aluminum, styryl compounds such as distyrylbiphenyl derivatives (JP-A-11-242996), triazole derivatives such as 3-(4-biphenylyl)-4-phenyl-5-(4-tert-butylphenyl)-1,2,4-triazole (JP-A-7-41759), and phenanthroline derivatives such as bathocuproine (JP-A-10-79297).

Furthermore, the compound having at least one pyridine ring substituted at the 2-, 4-, and 6-positions which is described in International Publication WO 2005/022962 is also preferred as a hole blocking material. The thickness of the hole blocking layer 6 is generally 0.3 nm or larger, preferably 0.5 nm or larger, and is generally 100 nm or less, preferably 50 nm or less. Although the hole blocking layer 6 also can be formed by the same method as for the hole injection layer 3, a vacuum deposition method is usually used.

[7] Electron Transport Layer

An electron transport layer 7 is disposed between the hole injection layer 6 and the electron injection layer 8 for the purpose of further improving the luminescent efficiency of the element. The electron transport layer 7 is constituted of a compound which, between the electrodes placed in an electric field, is capable of efficiently transporting, toward the luminescent layer 5, the electrons that have been injected from the cathode 9. It is necessary that the electron-transporting compound to be used for constituting the electron transport layer 7 should be a compound into which electrons can be injected at a high efficiency from the cathode 9 or electron injection layer 8 and which has a high electron mobility and is capable of efficiently transporting injected electrons.

Examples of materials which satisfy such requirements include metal complexes such as an aluminum complex of 8-hydroxyquinoline (JP-A-59-194393), metal complexes of 10-hydroxybenzo[h]quinoline, oxadiazole derivatives, distyrylbiphenyl derivatives, silole derivatives, 3- or 5-hydroxyflavone metal complexes, benzoxazole metal complexes, benzthiazole metal complexes, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N'-dicyanoanthraquinonediimine, n-type hydrogenated amorphous silicon carbide, n-type zinc sulfide, and n-type zinc selenide.

The thickness of the electron transport layer 7 is as follows. The lower limit thereof is generally about 1 nm, preferably about 5 nm, and the upper limit thereof is generally about 300 nm, preferably about 100 nm.

Although the electron transport layer 7 may be formed by a wet film formation method or a vacuum deposition method in the same manner as for the hole injection layer 3, a vacuum deposition method is usually used.

[8] Electron Injection Layer

The electron injection layer 8 serves to efficiently inject, into the luminescent layer 5, the electrons injected from the cathode 9. From the standpoint of efficient electron injection, it is preferred that the material to be used for forming the electron injection layer 8 should be a metal having a low work function, and use is made of an alkali metal such as sodium or cesium or an alkaline earth metal such as barium or calcium. It is preferred that the thickness of the electron injection layer 8 should be 0.1-5 nm.

To interpose an ultrathin insulating film (0.1-5 nm) of LiF, $MgF_2$, $Li_2O$, $Cs_2CO_3$, or the like between the cathode 9 and the electron transport layer 7 is also an effective method for improving the efficiency of the element (*Appl. Phys. Lett.*, Vol. 70, p. 152, 1997; JP-A-10-74586; *IEEE Trans. Electron. Devices*, Vol. 44, p. 1245, 1997; *SID* 04 *Digest*, p. 154).

Furthermore, to dope an organic electron transport material represented by a nitrogen-containing heterocyclic compound, such as bathophenanthroline, or by a metal complex, such as an aluminum complex of 8-hydroxyquinoline, with an alkali metal such as sodium, potassium, cesium, lithium, or rubidium (described in JP-A-10-270171, JP-A-2002-100478, JP-A-2002-100482, etc.) is preferred because this doped material has improved electron-injecting/transporting properties and is capable of combining these properties and excellent film quality. The thickness of the layer in this case is generally 5 nm or larger, preferably 10 nm or larger, and is generally 200 nm or less, preferably 100 nm or less.

The electron injection layer 8 may be formed by a wet film formation method or a vacuum deposition method in the same manner as for the luminescent layer 5. In the case of a vacuum deposition method, an evaporation source is placed in a crucible or metallic boat disposed in a vacuum vessel, and this vacuum vessel is evacuated to about $10^{-4}$ Pa with an appropriate vacuum pump. Thereafter, the crucible or the metallic boat is heated to vaporize the evaporation source to form an electron injection layer on the substrate placed so as to face the crucible or metallic boat.

For vacuum-depositing an alkali metal, use is made of an alkali metal dispenser obtained by filling nichrome with an alkali metal chromate and with a reducing agent. By heating this dispenser in a vacuum vessel, the alkali metal chromate is reduced and the alkali metal is vaporized. In the case where an organic electron transport material and an alkali metal are co-deposited, the procedure is as follows. The organic electron transport material is placed in a crucible disposed in a vacuum vessel, and this vacuum vessel is evacuated to about $10^{-4}$ Pa with an appropriate vacuum pump. Thereafter, each crucible and the dispenser are simultaneously heated to vaporize the materials and form an electron injection layer on the substrate disposed so as to face the crucible and the dispenser.

In this operation, the materials are co-deposited evenly along the thickness direction of the electron injection layer 8. However, there may be a concentration distribution in the film thickness direction.

[9] Cathode

The cathode 9 serves to inject electrons into a layer located on the luminescent-layer side (the electron injection layer 8 or the luminescent layer 5, etc.). The material used as the anode 2 can be used as the cathode 9. However, from the standpoint of efficient electron injection, a metal having a low work function is preferred, and use is made of an appropriate metal such as, for example, tin, magnesium, indium, calcium, aluminum, or silver or an alloy thereof. Specific examples thereof include alloy electrodes having a low work function, such as magnesium-silver alloys, magnesium-indium alloys, and aluminum-lithium alloys.

The thickness of the cathode 9 is usually the same as the anode 2. To further superpose thereon a layer of a metal having a high work function and stable to the air for the purpose of protecting the cathode constituted of a metal having a low work function enhances the stability of the element. Metals usable for this purpose are aluminum, silver, copper, nickel, chromium, gold, platinum, etc.

[10] Other Constituent Layers

The explanations given above were mainly on elements having the layer configuration shown in the FIGURE. However, the organic electroluminescent element of the invention may have any desired layers, besides the layers explained above, between the anode 2 and the luminescent layer 5 and between the cathode 9 and the luminescent layer 5 unless the performance of the element is impaired thereby. Furthermore, any layer other than the luminescent layer 5 may be omitted.

To dispose an electron blocking layer between the hole transport layer 4 and the luminescent layer 5 for the same purpose as the hole blocking layer 8 is also effective. The electron blocking layer not only serves to prevent the electrons which have moved from the luminescent layer 5 from reaching the hole transport layer 4 and to thereby increase the probability of recombination with holes within the luminescent layer 5 and confine the resultant excitons in the luminescent layer 5, but also serves to efficiently transport, toward the luminescent layer 5, the holes which have been injected from the hole transport layer 4.

Examples of the properties required of the electron blocking layer include: to have high hole-transporting properties; to have a large energy gap (difference between HOMO and LUMO); and to have a high excited triplet energy level (T1). In the case where the luminescent layer 5 is formed by a wet film formation method, it is preferred that the electron blocking layer also should be formed by a wet film formation method, because this process facilitates the element production.

Consequently, it is preferred that the electron blocking layer also should have suitability for wet-process film formation. Examples of materials usable for such an electron blocking layer include copolymers of dioctylfluorene and triphenylamine which are represented by F8-TFB (International Publication WO 2004/084260).

Incidentally, the structure which is the reverse of the structure shown in the FIGURE is possible. Namely, it possible to superpose a cathode 9, electron injection layer 8, electron transport layer 7, hole blocking layer 6, luminescent layer 5, hole transport layer 4, hole injection layer 3, and anode 2 in this order on a substrate 1. It is also possible to dispose an organic electroluminescent element of the invention between two substrates, at least one of which is highly transparent.

Furthermore, a structure constituted of a stack of stages each having the layer configuration shown in the FIGURE (i.e., a structure composed of a plurality of stacked luminescent units) is also possible. In this case, when a charge generation layer made of, for example, $V_2O_5$ is used in place of the interfacial layers located between the stages (i.e., between the luminescent units) (when the anode is ITO and the cathode is aluminum, the interfacial layers are these two layers), then the barrier between the stages is reduced. This configuration is more preferred from the standpoints of luminescent efficiency and operating voltage.

The organic electroluminescent element of the invention is applicable to either single elements, or elements of a structure in which the elements have been disposed in an array arrangement, or a structure in which anodes and cathodes have been disposed in an X-Y matrix arrangement.

<Display and Lighting>

The display and lighting of the invention employ the organic electroluminescent element of the invention described above. The display and lighting of the invention are not particularly limited in the type and structure thereof, and can be assembled using the organic electroluminescent element of the invention in accordance with ordinary methods.

For example, the display and lighting of the invention can be produced by methods such as those described in *Yuki EL Disupurei* (Ohmsha, Ltd., published on Aug. 20, 2004, written by TOKITO Shizuo, ADACHI Chihaya, and MURATA Hideyuki).

EXAMPLES

The invention will be explained below in more detail by reference to Examples. However, the invention should not be construed as being limited to the following Examples, and the invention can be modified at will unless the modifications depart from the spirit of the invention.

Synthesis Example for Compound (H-A-3)

Synthesis of Intermediate 1

[Chem. 67]

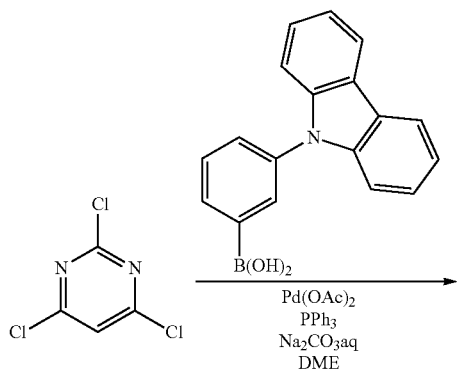

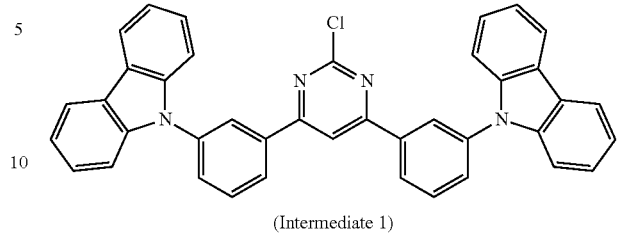

(Intermediate 1)

Trichloropyrimidine (9.34 g, 51.2 mmol), carbazolylphenylboronic acid (14.7 g, 51.2 mmol), DME (256 mL), and an aqueous sodium carbonate solution (2.0 M, 100 mL) were introduced in this order. Thereafter, nitrogen bubbling was conducted for 15 minutes. Thereto were added Pd(OAc)$_2$ (575 mg, 2.56 mmol) and PPh$_3$ (1.34 g, 5.12 mmol) in this order. The temperature of the oil bath was gradually elevated to 100° C., and the reaction mixture solution was heated with refluxing for 1 hour. After the reaction mixture was returned to room temperature, distilled water was added thereto and the resultant mixture was extracted with ethyl acetate. The organic layer was washed with saturated aqueous sodium chloride solution and dried with magnesium sulfate, and the solvent was thereafter distilled off under reduced pressure. The residue was subjected to silica gel column chromatography to obtain intermediate 1 (4.40 g, 14%).

Synthesis of Compound H-A-3

[Chem. 68]

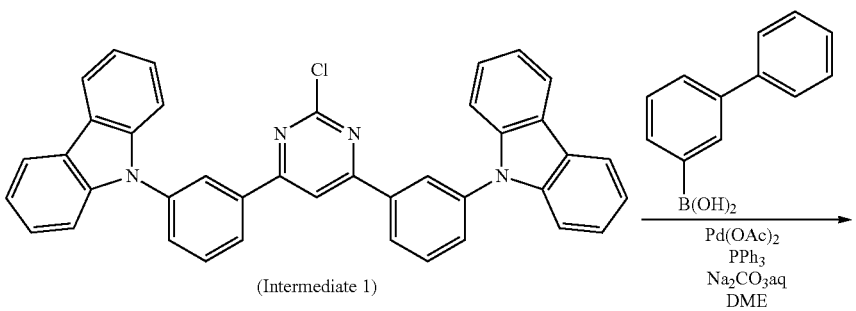

(Intermediate 1)

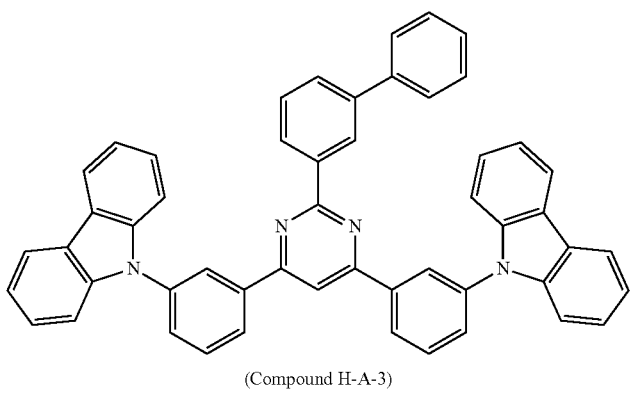

(Compound H-A-3)

Intermediate 1 (3.00 g, 5.02 mmol), biphenylboronic acid (1.20 g, 6.03 mmol), DME (50 mL), and an aqueous sodium carbonate solution (2.0 M, 10 mL) were introduced in this order. Thereafter, nitrogen bubbling was conducted for 15 minutes. Thereto were added Pd(OAc)$_2$ (56 mg, 0.25 mmol) and PPh$_3$ (132 mg, 0.50 mmol) in this order. The reaction mixture solution was heated with refluxing for 3 hours. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain compound H-A-3 (4.20 g, 79%).

Synthesis Example for Compound (H-A-15)

Synthesis of Intermediate 2

[Chem. 69]

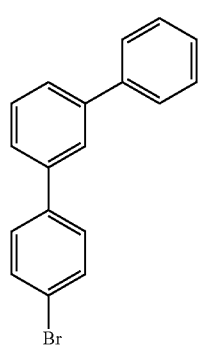 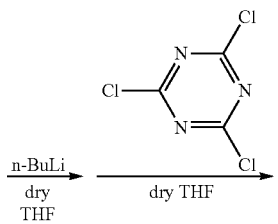

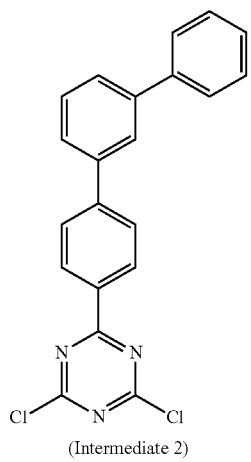

(Intermediate 2)

A solution of bromoterphenyl (21.0 g, 67.9 mmol) in dry THF (210 mL) was cooled to −78° C. Thereafter, a hexane solution of n-butyllithium (1.6 M, 42 mL) was added dropwise thereto, and this mixture was stirred for 1 hour to obtain a lithium reagent. To a solution of cyanuric chloride (25.0 g, 136 mmol) in dry THF (250 mL) was dropwise added the lithium reagent prepared previously. This mixture was stirred for 3 hours. The resultant reaction mixture solution was poured into ice water (300 mL), and the pH thereof was regulated to below 4 with 1-N hydrochloric acid. This mixture was extracted twice with methylene chloride (100 mL). The organic layer was washed twice with saturated aqueous sodium chloride solution (100 mL) and dried with magnesium sulfate. Thereafter, the solvent was distilled off under reduced pressure. The residue was subjected to silica gel column chromatography using a developer composed of hexane/methylene chloride=3/1. Thus, intermediate 2 (12.5 g, 49%) was obtained.

Synthesis of Intermediate 3

[Chem. 70]

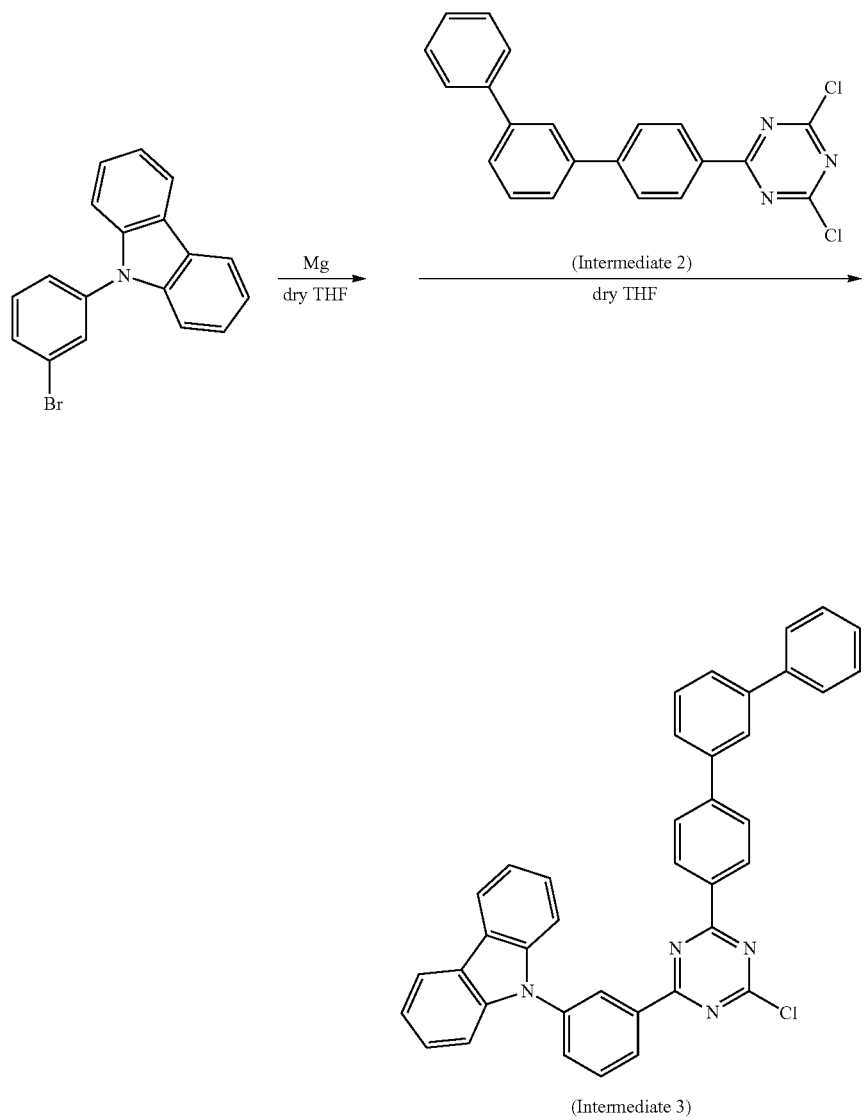

A solution of carbazolylphenyl bromide (21.0 g, 65.2 mmol) in dry THF (45 mL) was added dropwise to magnesium pieces so that gentle refluxing occurred. This mixture was stirred at 60° C. for 1 hour to obtain Grignard reagent. To a solution of intermediate 2 (11.9 g, 32.0 mmol) in dry THF (120 mL) was dropwise added the Grignard reagent prepared previously. This mixture was stirred at 45° C. for 6 hours. The resultant reaction mixture solution was poured into ice water (200 mL), and this mixture was extracted with methylene chloride (400 mL). The organic layer was washed twice with saturated aqueous sodium chloride solution (100 mL) and dried with magnesium sulfate. Thereafter, the solvent was distilled off under reduced pressure. The residue was subjected to silica gel column chromatography using a developer composed of hexane/methylene chloride=2/1. Thus, intermediate 3 (13.4 g, 73%) was obtained.

Synthesis of Compound H-A-15

[Chem. 71]

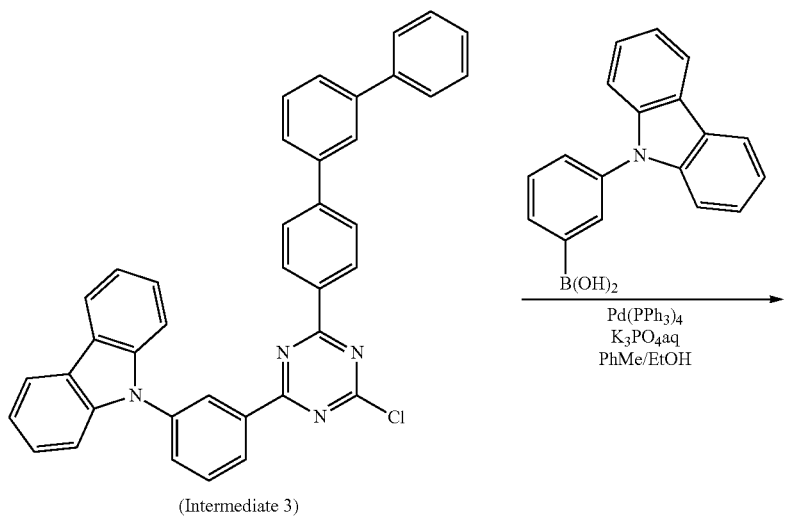

(Intermediate 3)

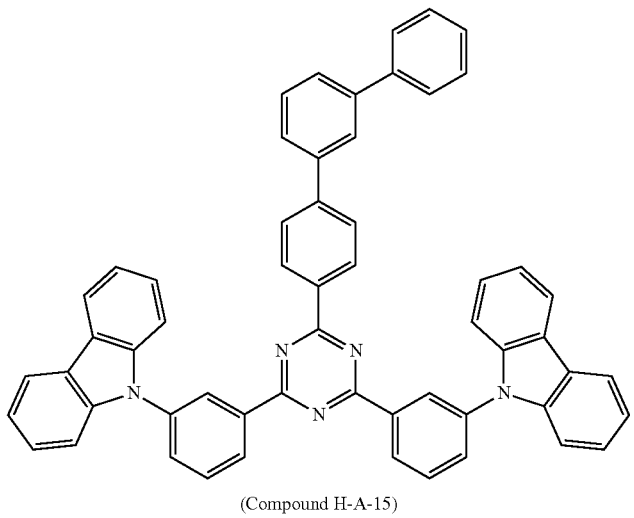

(Compound H-A-15)

A toluene/ethanol mixture solution (2:1, 297 mL) which had undergone nitrogen bubbling was added to intermediate 3 (21.5 g, 36.7 mmol) and carbazolylphenylboronic acid (11.4 g, 44.0 mmol). Thereto were further added Pd(PPh$_3$)$_4$ (1.00 g, 0.865 mmol) and an aqueous tripotassium phosphate solution (2.0 M, 50 mL) which had undergone nitrogen bubbling, in this order. Thereafter, the resultant mixture was stirred for 6 hours while heating the mixture with refluxing. After the mixture was returned to room temperature, suction filtration was conducted. The solid matter taken out by the filtration was dissolved in methylene chloride, and suction filtration was conducted again. The filtrate was distilled under reduced pressure to remove the solvent, and the residue was subjected to silica gel column chromatography using a developer composed of hexane/methylene chloride=1/1 to 1/2. Thus, compound H-A-15 (18.6 g, 71%) was obtained.

Synthesis Example for Compound (H-A-36)

[Chem. 72]

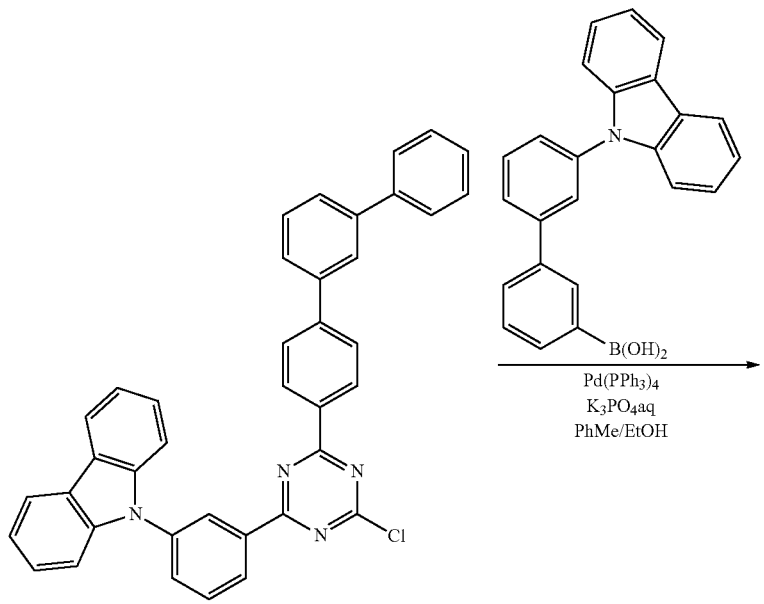

(Intermediate 3)

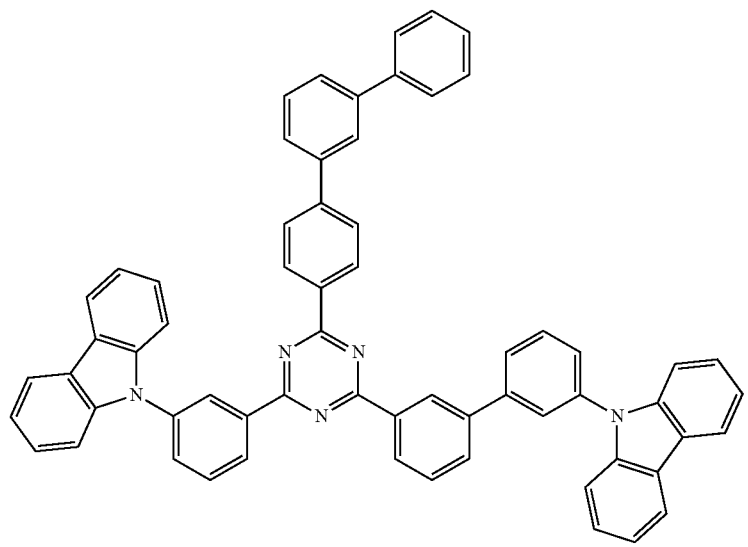

(Compound H-A-36)

A toluene/ethanol mixture solution (2:1, 38.4 mL) which had undergone nitrogen bubbling was added to intermediate 3 (3.00 g, 5.13 mmol) and carbazolylbiphenylboronic acid (2.24 g, 6.16 mmol). Thereto were further added $Pd(PPh_3)_4$ (0.17 g, 0.15 mmol) and an aqueous tripotassium phosphate solution (2.0 M, 6.4 mL) which had undergone nitrogen bubbling, in this order. Thereafter, the resultant mixture was stirred for 3 hours while heating the mixture with refluxing. After the mixture was returned to room temperature, suction filtration was conducted. The solid matter taken out by the filtration was dissolved in methylene chloride, and suction filtration was conducted again. The filtrate was distilled under reduced pressure to remove the solvent, and the residue was subjected to silica gel column chromatography. Thus, compound H-A-36 (2.41 g, 54%) was obtained.

Synthesis Example for Compound (H-A-43)

[Chem. 73]

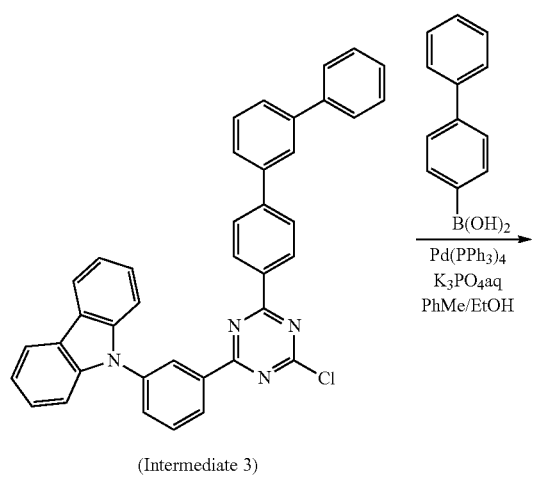

(Intermediate 3)

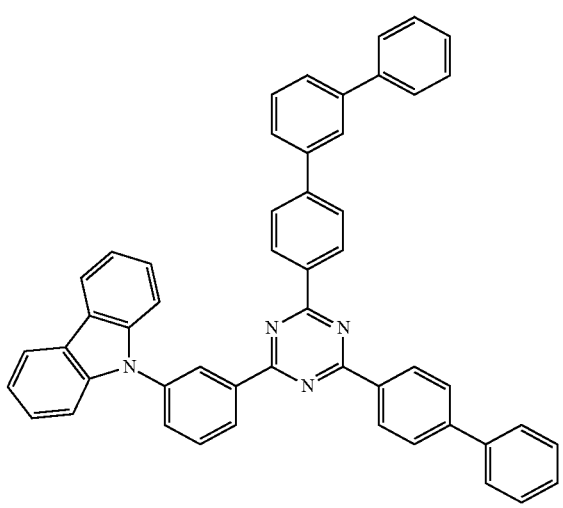

(Compound H-A-43)

A toluene/ethanol mixture solution (2:1, 72 mL) was added to intermediate 3 (5.40 g, 9.23 mmol) and biphenylboronic acid (1.9 g, 9.59 mmol), and nitrogen bubbling was conducted for 30 minutes. Thereto were further added Pd(PPh$_3$)$_4$ (0.28 g, 0.27 mmol) and an aqueous tripotassium phosphate solution (2.0 M, 20 mL) which had undergone nitrogen bubbling, in this order. Thereafter, the resultant mixture was stirred for 4 hours while heating the mixture with refluxing. After the mixture was returned to room temperature, suction filtration was conducted. The solid matter taken out by the filtration was dissolved in methylene chloride, and suction filtration was conducted again. The filtrate was distilled under reduced pressure to remove the solvent, and the residue was subjected to silica gel column chromatography. Thus, compound H-A-43 (1.8 g, 32%) was obtained.

Synthesis Example for Compound (H-A-27)

Synthesis of Intermediate 4

[Chem. 74]

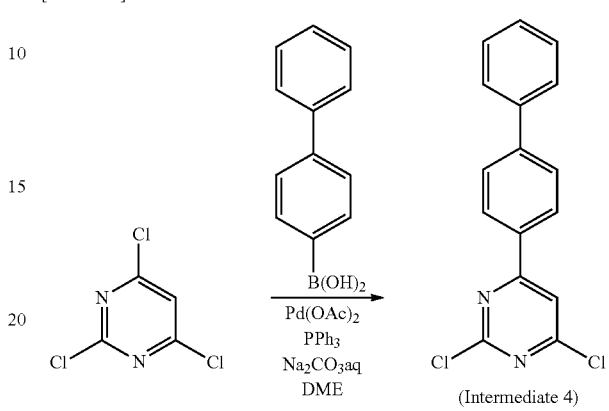

(Intermediate 4)

Trichloropyrimidine (8.00 g, 43.6 mmol), biphenylboronic acid (4.32 g, 21.8 mmol), DME (109 mL), and an aqueous sodium carbonate solution (2.0 M, 32 mL) were introduced in this order. Thereafter, nitrogen bubbling was conducted for 20 minutes. Thereto were added Pd(OAc)$_2$ (245 mg, 1.09 mmol) and PPh$_3$ (0.57 g, 2.18 mmol) in this order. This mixture was heated with refluxing for 3.5 hours. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain intermediate 4 (4.8 g, 37%).

Synthesis of Intermediate 5

[Chem. 75]

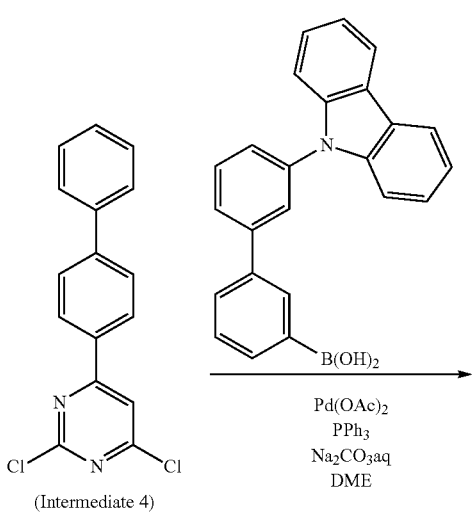

(Intermediate 4)

-continued

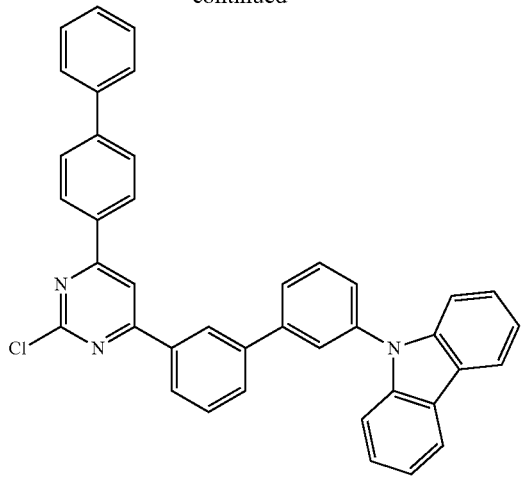
(Intermediate 5)

Intermediate 4 (3.18 g, 10.6 mmol), the arylboronic acid (3.20 g, 8.81 mmol), DME (44 mL), and an aqueous sodium carbonate solution (2.0 M, 13 mL) were introduced in this order. Thereafter, nitrogen bubbling was conducted for 25 minutes. Thereto were added Pd(OAc)$_2$ (99 mg, 0.44 mmol) and PPh$_3$ (0.23 g, 0.88 mmol) in this order. This mixture was heated with refluxing for 5 hours. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain intermediate 5 (3.06 g, 59%).

Synthesis of Compound H-A-27

[Chem. 76]

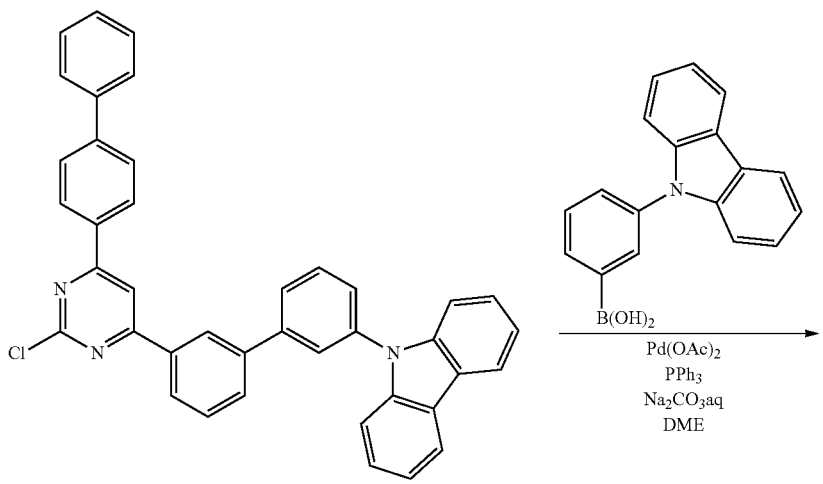

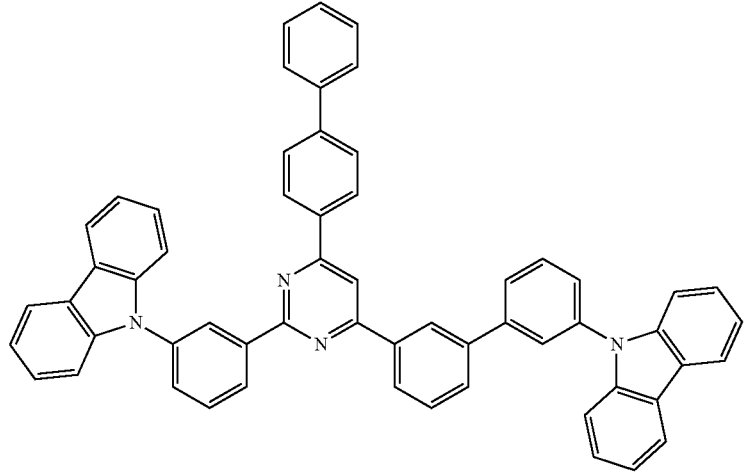
(Compound H-A-27)

Intermediate 5 (3.06 g, 5.23 mmol), carbazolylphenylboronic acid (2.98 g, 10.4 mmol), DME (43 mL), and an aqueous sodium carbonate solution (2.0 M, 13 mL) were introduced in this order. Thereafter, nitrogen bubbling was conducted for 30 minutes. Thereto were added Pd(OAc)$_2$ (97 mg, 0.43 mmol) and PPh$_3$ (0.23 g, 0.87 mmol) in this order. This mixture was heated with refluxing for 2.5 hours. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain compound H-A-27 (3.7 g, 90%).

Synthesis Example for Compound (H-A-41)

Synthesis of Intermediate 6

[Chem. 77]

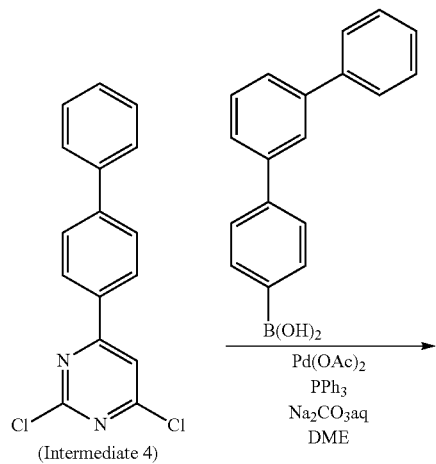
(Intermediate 4)

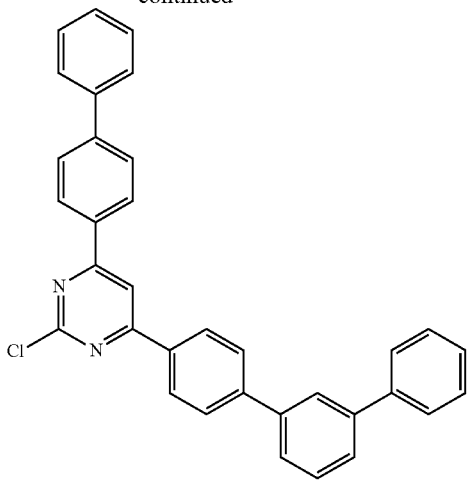
(Intermediate 6)

Intermediate 4 (3.65 g, 12.1 mmol), terphenylboronic acid (2.77 g, 10.1 mmol), DME (61 mL), and an aqueous sodium carbonate solution (2.0 M, 15 mL) were introduced in this order. Thereafter, nitrogen bubbling was conducted for 30 minutes. Thereto were added Pd(OAc)$_2$ (113 mg, 0.51 mmol) and PPh$_3$ (0.27 g, 1.01 mmol) in this order. This mixture was heated with refluxing for 7 hours. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain intermediate 6 (3.16 g, 63%).

Synthesis of Compound H-A-41

[Chem. 78]

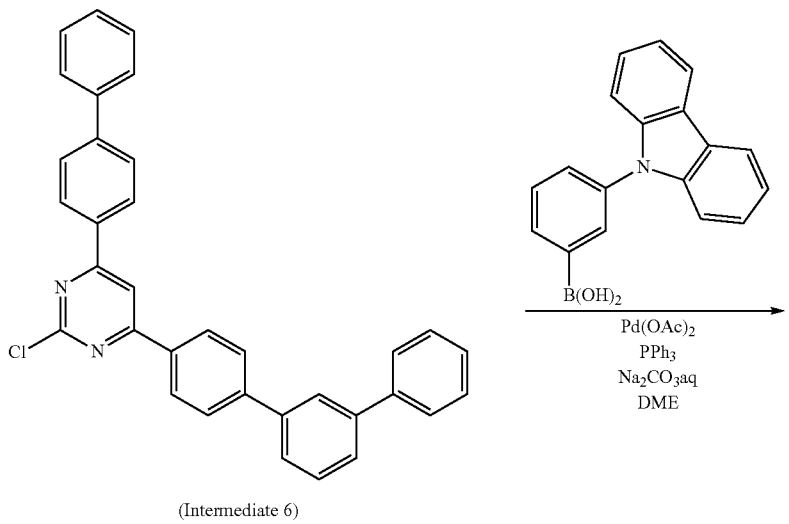
(Intermediate 6)

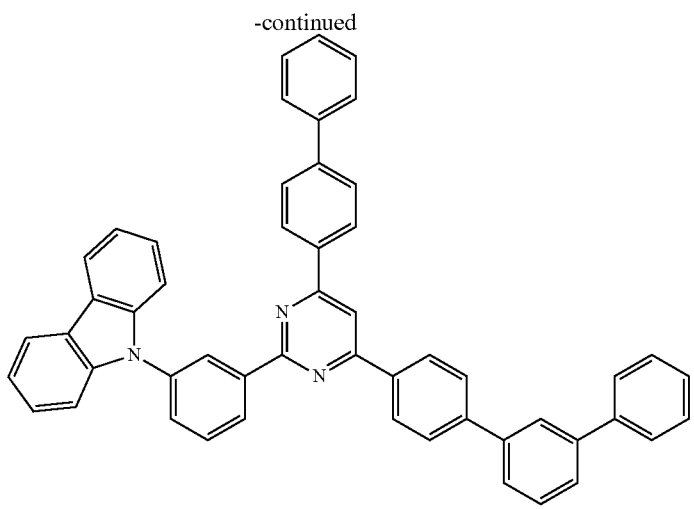

(Compound H-A-41)

Intermediate 6 (3.16 g, 6.39 mmol), carbazolylphenylboronic acid (2.20 g, 7.67 mmol), DME (32 mL), and an aqueous sodium carbonate solution (2.0 M, 10 mL) were introduced in this order. Thereafter, nitrogen bubbling was conducted for 30 minutes. Thereto were added Pd(OAc)$_2$ (72 mg, 0.32 mmol) and PPh$_3$ (0.17 g, 0.64 mmol) in this order. This mixture was heated with refluxing for 3 hours. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain compound H-A-41 (4.1 g, 91%).

Synthesis Example for Compound (H-A-48)

Synthesis of Intermediate 7

[Chem. 79]

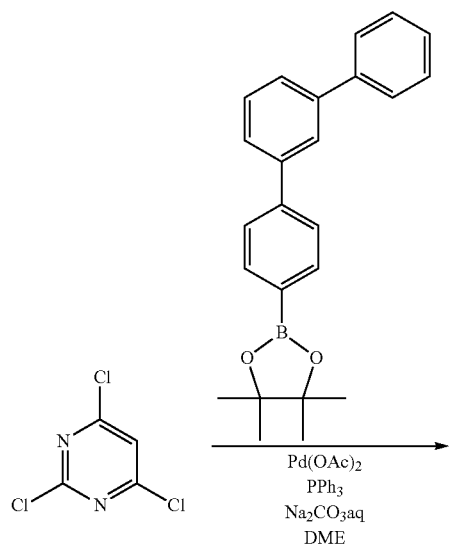

-continued

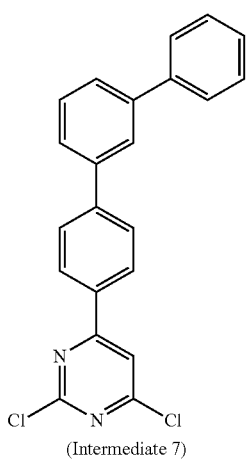

(Intermediate 7)

Trichloropyrimidine (3.21 g, 17.5 mmol), the arylboronic acid pinacolate ester (5.19 g, 14.6 mmol), DME (75 mL), and an aqueous sodium carbonate solution (2.0 M, 30 mL) were introduced in this order. Thereafter, nitrogen bubbling was conducted for 15 minutes. Thereto were added Pd(OAc)$_2$ (33 mg, 0.15 mmol) and PPh$_3$ (115 mg, 0.44 mmol) in this order. This mixture was heated with refluxing for 3.5 hours. After the reaction mixture was returned to room temperature, distilled water was added thereto and the resultant mixture was extracted with ethyl acetate. The organic layer was washed with saturated aqueous sodium chloride solution and dried with magnesium sulfate, and the solvent was thereafter distilled off under reduced pressure. The residue was subjected to silica gel column chromatography to obtain intermediate 7 (3.02 g, 55%).

Synthesis of Intermediate 8

[Chem. 80]

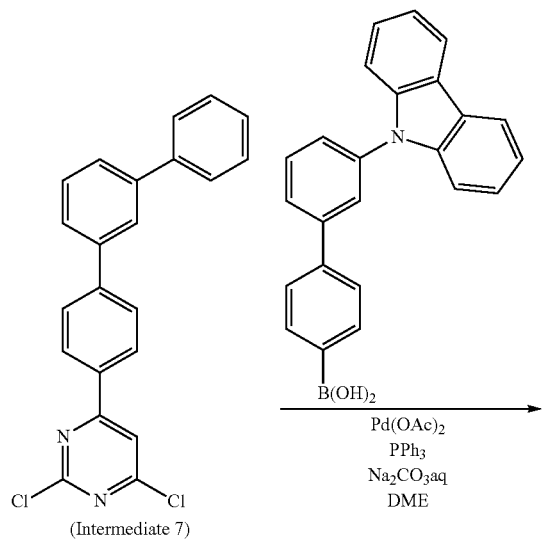

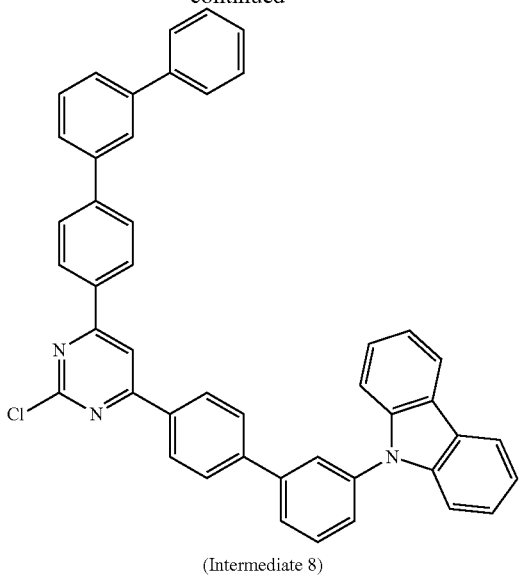

(Intermediate 8)

Intermediate 7 (3.02 g, 8.00 mmol), the arylboronic acid (2.90 g, 8.00 mmol), DME (40 mL), and an aqueous sodium carbonate solution (2.0 M, 20 mL) were introduced in this order. Thereafter, nitrogen bubbling was conducted for 15 minutes. Thereto were added Pd(OAc)$_2$ (180 mg, 0.80 mmol) and PPh$_3$ (630 mg, 2.4 mmol) in this order. This mixture was heated with refluxing for 2 hours. After the reaction mixture was returned to room temperature, the arylboronic acid (2.0 g) was added thereto and this mixture was heated with refluxing for further 4 hours. After the reaction mixture was returned to room temperature, the precipitate was taken out by suction filtration. This precipitate was subjected to silica gel column chromatography and then to recrystallization (ethyl acetate/hexane) to obtain intermediate 8 (3.20 g, 61%).

Synthesis of Compound H-A-48

[Chem. 81]

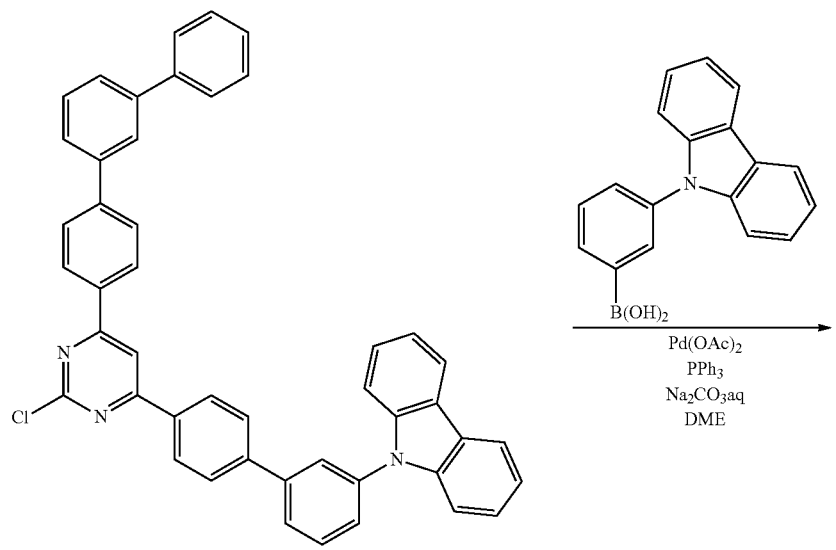

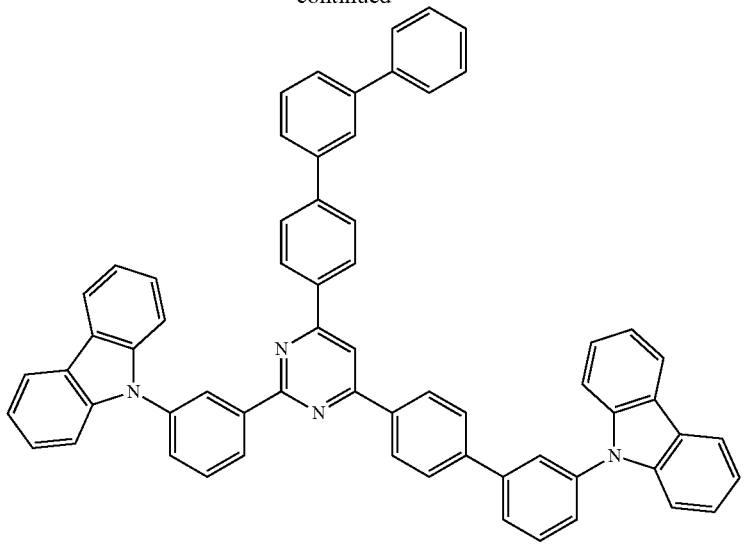

(Compound H-A-48)

Intermediate 8 (3.00 g, 4.54 mmol), carbazolylphenylboronic acid (1.56 g, 5.94 mmol), DME (22 mL), and an aqueous sodium carbonate solution (2.0 M, 11 mL) were introduced in this order. Thereafter, nitrogen bubbling was conducted for 15 minutes. Thereto were added Pd(OAc)$_2$ (180 mg, 0.80 mmol) and PPh$_3$ (630 mg, 2.4 mmol) in this order. This mixture was heated with refluxing for 3 hours. After the reaction mixture was returned to room temperature, Pd(PPh$_3$)$_4$ (50 mg) was added thereto and this mixture was heated with refluxing for further 2 hours. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain compound H-A-48 (2.63 g, 67%).

Synthesis Example for Compound (H-A-71)

Synthesis of Intermediate 9

[Chem. 82]

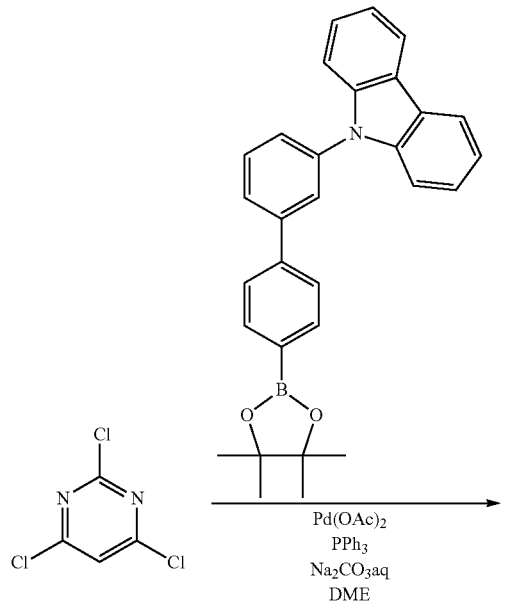

-continued

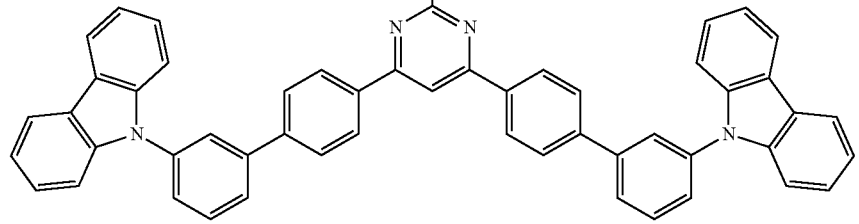

(Intermediate 9)

Trichloropyrimidine (4.58 g, 25.0 mmol), the arylboronic acid pinacolate ester (17.8 g, 40.0 mmol), DME (125 mL), and an aqueous sodium carbonate solution (2.0 M, 70 mL) were introduced in this order. Thereafter, nitrogen bubbling was conducted for 15 minutes. Thereto were added Pd(OAc)$_2$ (56 mg, 0.25 mmol) and PPh$_3$ (196 mg, 0.75 mmol) in this order. This mixture was heated with refluxing for 1 hour and 15 minutes. Thereto was added Pd(PPh$_3$)$_4$ (50 mg). This mixture was reacted for further 1 hour and 20 minutes. Thereafter, the arylboronic acid pinacolate ester (4.0 g) was additionally added thereto, and this mixture was heated with refluxing for further 2 hours. After the reaction mixture was returned to room temperature, suction filtration was conducted to take out the precipitate. This residue was subjected to silica gel column chromatography to obtain 7.3 g of a colorless solid. An examination by NMR spectroscopy revealed that the colorless solid was the compound in which only one (carbazolylphenyl)phenyl group had reacted (yield, 63%). In order to obtain intermediate 9, the following operation was further performed. That solid (3.5 g, 9.27 mmol), the arylboronic acid pinacolate ester (3.70 g, 10.2 mmol), DME (45 mL), and an aqueous sodium carbonate solution (2.0 M, 20 mL) were added in this order. Thereafter, nitrogen bubbling was conducted at 50° C. for 10 minutes. Thereto were added Pd(OAc)$_2$ (62 mg, 0.28 mmol) and PPh$_3$ (146 mg, 0.56 mmol) in this order. This mixture was heated with refluxing for 1.5 hours. The arylboronic acid pinacolate ester (1.80 g) was additionally added thereto, and this mixture was heated with refluxing for further 1.5 hours. Thereafter the arylboronic acid pinacolate ester (0.40 g) was further added additionally, and this mixture was heated with refluxing for further 30 minutes. After the reaction mixture was returned to room temperature, suction filtration was conducted to take out the precipitate. Thus, intermediate 9 was obtained as a crude reaction product (9.33 g).

Synthesis of Compound H-A-71

[Chem. 83]

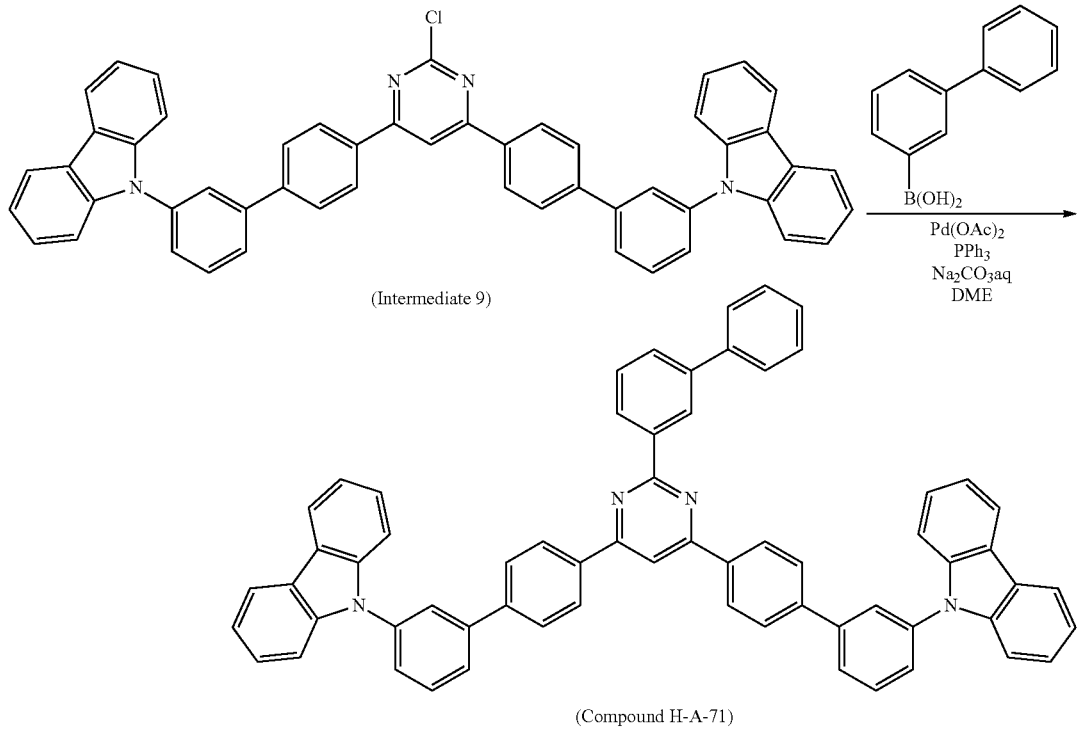

(Compound H-A-71)

Intermediate 9 (3.00 g, 4.03 mmol), biphenylboronic acid (0.96 g, 4.84 mmol), THF (40 mL), and an aqueous sodium carbonate solution (2.0 M, 20 mL) were introduced in this order. Thereafter, nitrogen bubbling was conducted for 15 minutes. Thereto were added Pd(OAc)$_2$ (45 mg, 0.20 mmol) and PPh$_3$ (105 mg, 0.4 mmol) in this order. This mixture was heated with refluxing for 3 hours. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain compound H-A-71 (2.90 g, 83%).

Synthesis of Compound H-A-85

Synthesis of Intermediate 10

[Chem. 84]

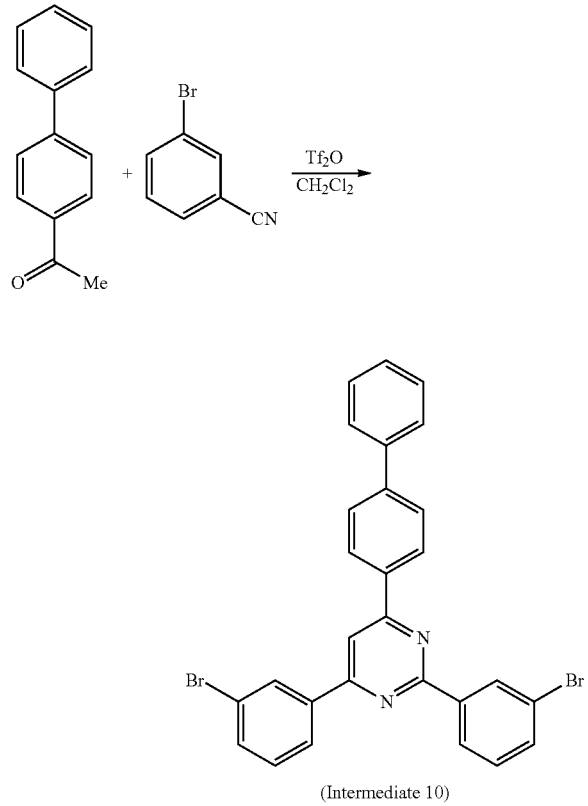

(Intermediate 10)

A solution in methylene chloride (30 mL) of 4-phenylacetophenone (3.89 g, 19.8 mmol), 3-bromobenzonitrile (7.58 g, 41.6 mmol), and trifluoromethanesulfonic acid anhydride (3.9 mL) was stirred for 3 hours. An aqueous sodium hydrogen carbonate solution was added to the reaction mixture solution to neutralize the solution. Thereafter, this reaction mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain intermediate 10 (3.4 g, 31%).

Synthesis of Compound H-A-85

[Chem. 85]

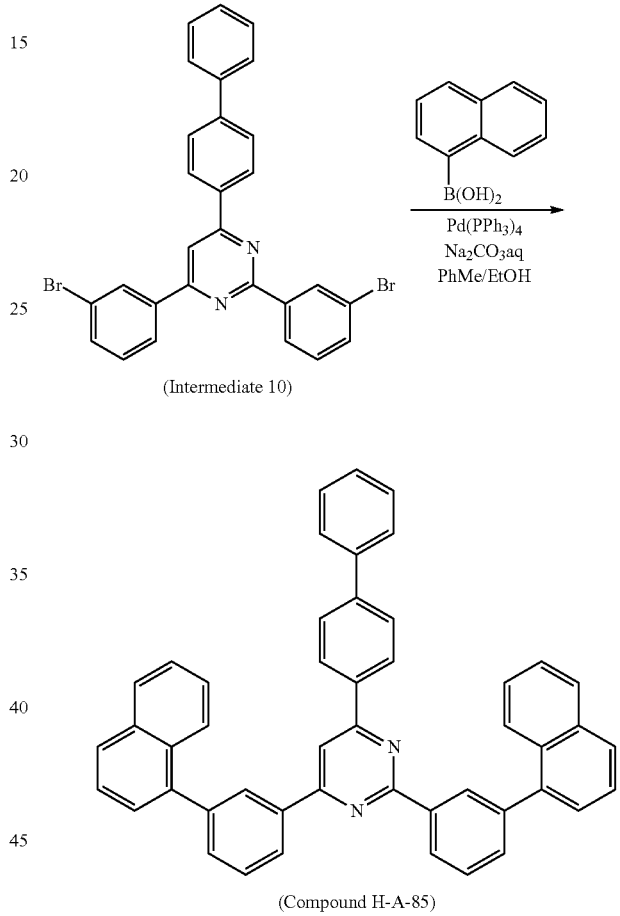

(Compound H-A-85)

A toluene/ethanol mixture solution (2:1, 78 mL) was added to intermediate 10 (2.8 g, 5.16 mmol) and α-naphthylboronic acid (2.04 g, 11.9 mmol). Nitrogen bubbling was conducted for 30 minutes. Thereto were further added Pd(PPh$_3$)$_4$ (0.30 g, 0.26 mmol) and an aqueous sodium carbonate solution (2.0 M, 13 mL) which had undergone nitrogen bubbling, in this order. Thereafter, this mixture was stirred for 6 hours while heating the mixture with refluxing. After the reaction mixture was returned to room temperature, distilled water was added thereto and the resultant mixture was extracted with methylene chloride. The organic layer was washed with saturated aqueous sodium chloride solution and dried with magnesium sulfate, and the solvent was thereafter distilled off under reduced pressure. The residue was subjected to silica gel column chromatography to obtain compound H-A-85 (1.14 g, 35%).

Synthesis Example for Compound H-B-14

Synthesis of Compound H-B-14

[Chem. 86]

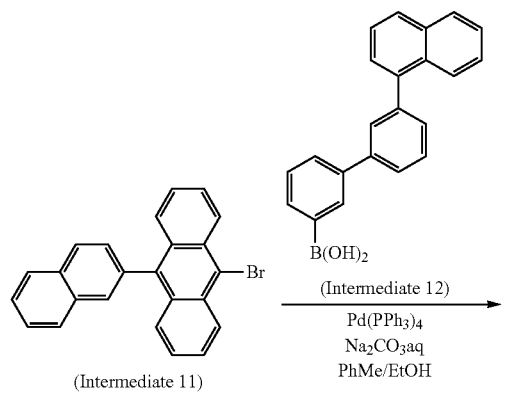

(Compound H-B-14)

To intermediate 11 (3.00 g, 7.83 mmol) and intermediate 12 (3.00 g, 9.39 mmol) were added a toluene/ethanol mixture solution (2:1, 150 mL) and an aqueous sodium carbonate solution (2.0 M, 40 mL) in this order. Thereafter, nitrogen bubbling was conducted at 65° C. for 60 minutes. Thereto was further added Pd(PPh$_3$)$_4$ (0.45 g, 0.39 mmol). This mixture was stirred for 5 hours while heating the mixture with refluxing. Intermediate 12 (0.76 g) was added thereto, and this mixture was heated with refluxing for further 3.5 hours. After the reaction mixture was returned to room temperature, the mixture was extracted with toluene. The organic phase was washed with water and dried with anhydrous magnesium sulfate, and the solvent was distilled off under reduced pressure. The residue was subjected to silica gel column chromatography to obtain compound H-B-14 (2.4 g, 53%). Incidentally, the intermediates 11 and 12 were synthesized according to the methods disclosed in Chem. Commun., pp. 2143-2145, 2008 and JP-A-2011-100942, respectively.

Synthesis Example for Compound H-B-18

Synthesis of Intermediate 14

[Chem. 87]

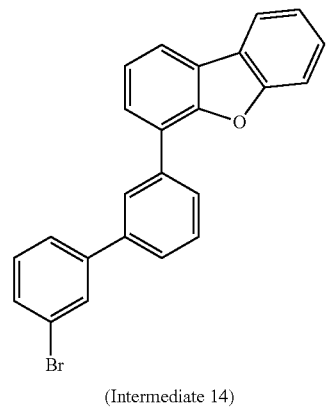

(Intermediate 14)

A toluene/ethanol mixture solution (2:1, 150 mL) was added to 3-(1-dibenzofuranyl)phenylboronic acid pinacolate ester (6.8 g, 18.5 mmol) and m-bromoiodobenzene (5.8 g, 20.4 mmol). Nitrogen bubbling was conducted for 30 minutes. Thereto were added Pd(PPh$_3$)$_4$ (640 mg, 0.55 mmol) and an aqueous sodium carbonate solution (2.0 M, 25 mL) which had undergone 30-minute nitrogen bubbling, in this order. Thereafter, this mixture was stirred for 18 hours while heating the mixture with refluxing. After the reaction mixture was returned to room temperature, the mixture was extracted with toluene. The organic phase was washed with water and dried with anhydrous magnesium sulfate, and the solvent was distilled off under reduced pressure. The residue was subjected to silica gel column chromatography to obtain intermediate 14 (7.2 g, 98%). Incidentally, the 3-(1-dibenzofuranyl)phenylboronic acid pinacolate ester was synthesized according to the method disclosed in JP-A-2011-051936.

Synthesis of Compound H-B-18

[Chem. 88]

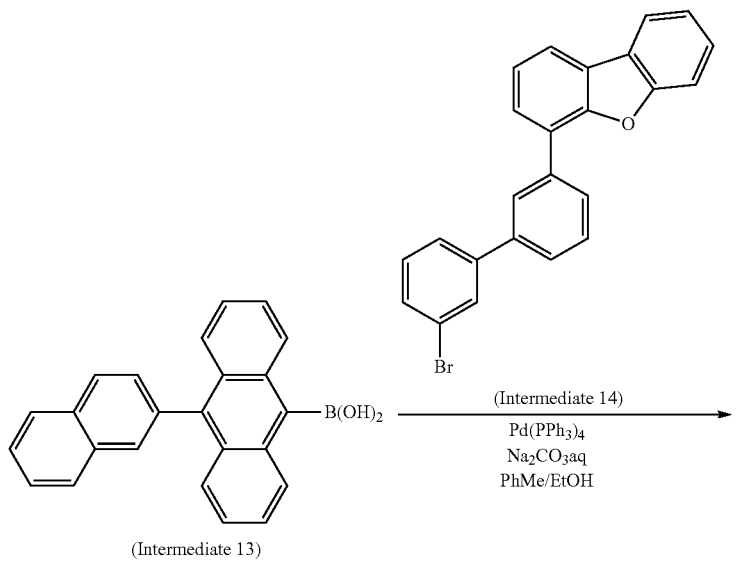

A toluene/ethanol mixture solution (2:1, 50 mL) was added to intermediate 13 (2.77 g, 8.00 mmol) and intermediate 14 (2.63 g, 6.7 mmol). Nitrogen bubbling was conducted for 30 minutes. Thereto were added Pd(PPh$_3$)$_4$ (370 mg, 0.32 mmol) and an aqueous sodium carbonate solution (2.0 M, 10 mL) which had undergone 30-minute nitrogen bubbling, in this order. Thereafter, this mixture was stirred for 6.5 hours while heating the mixture with refluxing. Dichloromethane was added thereto, and the resultant mixture was separated into an organic phase and an aqueous phase. The organic phase was concentrated, and methanol was added to the concentrate. The crystals which had separated out were taken out by suction filtration to obtain compound H-B-18 (3.9 g, 93%). Incidentally, the intermediate 13 was synthesized according to the method disclosed in *Chem. Commun.*, pp. 2143-2145, 2008.

Synthesis Example for Compound H-B-60

Synthesis of Intermediate 16

[Chem. 89]

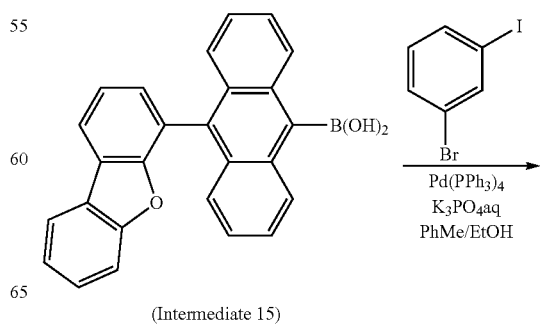

(Intermediate 15)

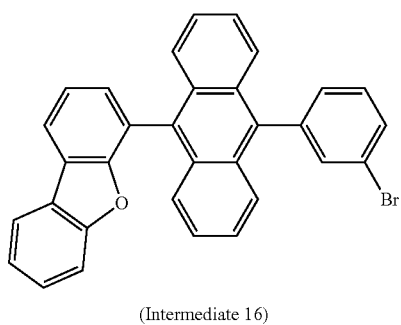

(Intermediate 16)

A toluene/ethanol mixture solution (3:1, 40 mL) was added to intermediate 15 (6.06 g, 15.6 mmol) and m-bromoiodobenzene (4.32 g, 15.3 mmol). Nitrogen bubbling was conducted for 30 minutes. Thereto were further added Pd(PPh$_3$)$_4$ (903 mg, 0.78 mmol) and an aqueous tripotassium phosphate solution (2.0 M, 20 mL) which had undergone nitrogen bubbling, in this order. Thereafter, this mixture was stirred for 6 hours while heating the mixture with refluxing. After the reaction mixture was returned to room temperature, the mixture was extracted with methylene chloride. The organic phase was dried with MgSO$_4$, and the solvent was distilled off under reduced pressure. The residue was subjected to silica gel column chromatography to obtain intermediate 16 (4.70 g, 62%). Incidentally, the intermediate 15 was synthesized according to the method disclosed in JP-A-2011-100942.

Synthesis Example of Compound H-B-60

[Chem. 90]

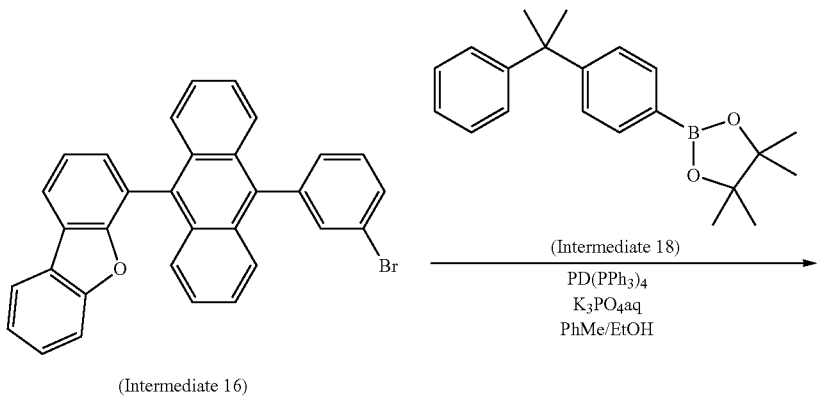

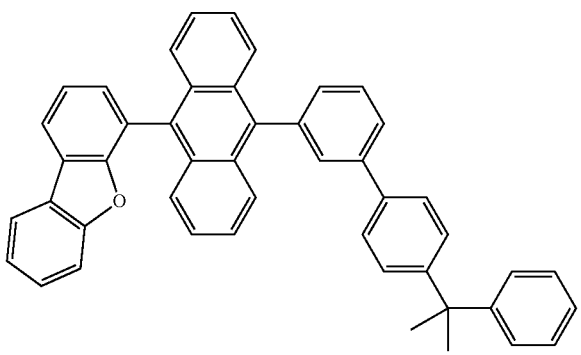

(Compound H-B-60)

A toluene/ethanol mixture solution (3:1, 40 mL) was added to intermediate 16 (4.49 g, 8.99 mmol) and intermediate 18 (3.69 g, 11.5 mmol). Nitrogen bubbling was conducted for 30 minutes. Thereto were added Pd(PPh$_3$)$_4$ (550 mg, 0.48 mmol) and an aqueous tripotassium phosphate solution (2.0 M, 11 mL) which had undergone nitrogen bubbling, in this order. Thereafter, this mixture was stirred for 3 hours while heating the mixture with refluxing. After the reaction mixture was returned to room temperature, the mixture was extracted with methylene chloride. The organic phase was dried with MgSO$_4$, and the solvent was distilled off under reduced pressure. The residue was subjected to silica gel column chromatography to obtain compound H-B-60 (3.77 g, 68%). Incidentally, the intermediate 18 was synthesized according to the method disclosed in JP-A-2011-195462.

Synthesis Example for Compound L-C-3

Synthesis of Intermediate 19

[Chem. 91]

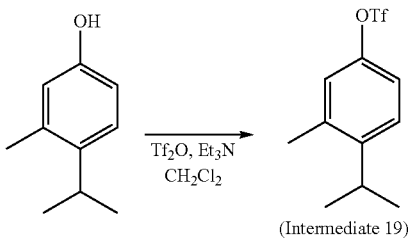

(Intermediate 19)

A solution of trifluoromethanesulfonic acid anhydride (42.3 g, 150 mmol) in methylene chloride (50 mL) was added dropwise over 30 minutes to a solution in methylene chloride (250 mL) of both 4-isopropyl-3-methylphenol (15.0 g, 100 mmol) and triethylamine (15.2 g, 150 mmol), and this mixture was successively stirred for 1 hour. Water was gradually added to the reaction mixture solution, and the organic phase was thereafter separated. This organic phase was further washed with water twice, washed with an aqueous sodium chloride solution, and then dried with anhydrous sodium sulfate. The solvent was distilled off under reduced pressure. The residue was subjected to silica gel column chromatography to obtain intermediate 19 (26.6 g, 94%).

Synthesis of Intermediate 20

[Chem. 92]

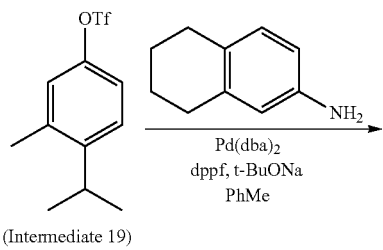

(Intermediate 19)

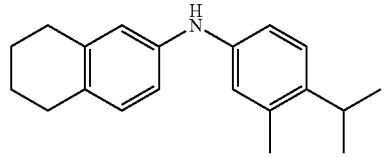

(Intermediate 20)

In a nitrogen atmosphere, toluene (20 mL) was added to Pd(dba)$_2$ (1.05 g, 1.82 mmol), 1,1'-bis(diphenylphosphino)ferrocene (2.02 g, 3.65 mmol), and t-BuONa (5.26 g, 54.7 mmol). Thereto were added intermediate 19 (10.3 g, 36.5 mmol) and 5,6,7,8-tetrahydro-2-naphlylamine (8.06 g, 54.7 mmol) which both had been dissolved in toluene (20 mL). This mixture was heated to 85° C. and stirred for 4.5 hours. After the reaction mixture was returned to room temperature, the solid which had separated out was taken out by suction filtration. This solid was subjected to silica gel column chromatography to obtain intermediate 20 (6.1 g, 60%).

Synthesis of Compound L-C-3

[Chem. 93]

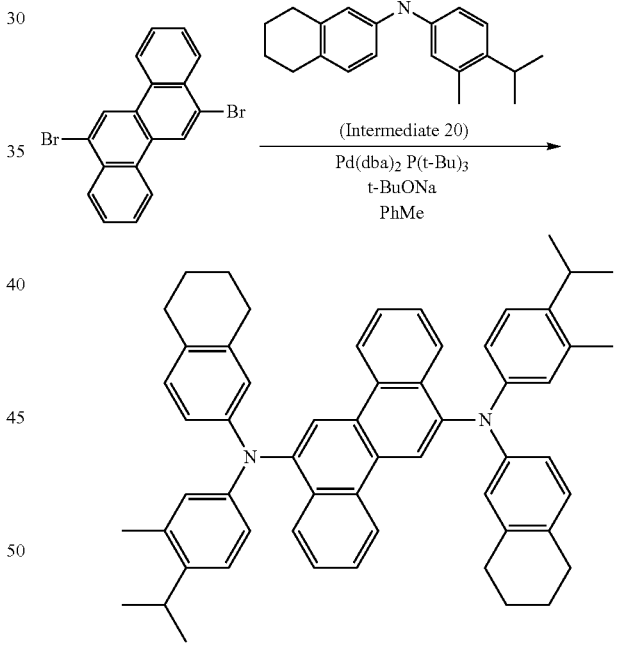

(Compound L-C-3)

In a nitrogen atmosphere, toluene (40 mL) was added to dibromochrysene (3.20 g, 8.29 mmol), intermediate 20 (5.09 g, 18.2 mmol), and t-BuONa (5.25 g, 54.68 mmol). In a nitrogen atmosphere, a solution of Pd(dba)$_2$CHCl$_3$ (258 mg, 0.25 mmol) in toluene (10 mL) was introduced into another vessel, tri-t-butylphosphine (0.30 g, 1.49 mmol) was added thereto, and this mixture was heated to 50° C. and successively stirred for 40 minutes. This solution was added to the toluene solution prepared previously, and the resultant mixture was stirred for 2 hours while heating the mixture with refluxing. After the reaction mixture was returned to room temperature, the mixture was extracted with methylene chloride. The organic phase was washed with saturated aqueous sodium chloride solution and dried with anhydrous magnesium sulfate, and the solvent was distilled off under reduced pressure. The residue was subjected to silica gel column chromatography to obtain compound L-C-3 (0.46 g, 7%).

Synthesis Example for Compound L-C-7

Synthesis of Intermediate 21

[Chem. 94]

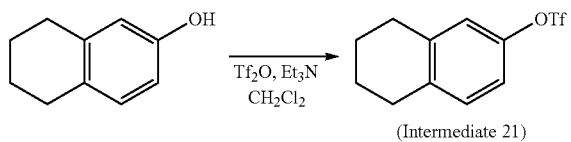

(Intermediate 21)

A solution of trifluoromethanesulfonic acid anhydride (71.4 g, 253 mmol) in methylene chloride (10 mL) was added dropwise over 2.5 hours to a solution in methylene chloride (500 mL) of both 5,6,7,8-tetrahydro-2-naphthol (25 g, 169 mmol) and triethylamine (25.6 g, 253 mmol), and this mixture was successively stirred for 4 hours. Water was gradually added to the reaction mixture solution, and the organic phase was thereafter separated. This organic phase was further washed with water twice and dried with anhydrous sodium sulfate. The solvent was distilled off under reduced pressure. The residue was subjected to silica gel column chromatography to obtain intermediate 21 (45.8 g, 97%).

Synthesis of Intermediate 22

[Chem. 95]

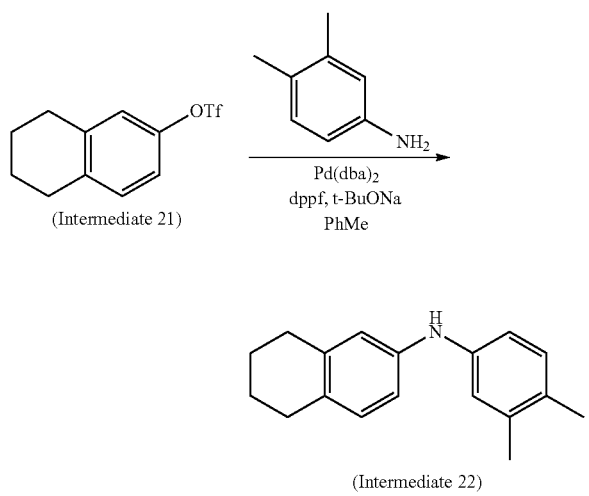

(Intermediate 22)

Toluene (75 mL) was added to intermediate 21 (15.0 g, 53.5 mmol), 3,4-dimethylaniline (9.73 g, 80.3 mmol), and t-BuONa (7.72 g, 80.3 mmol). Nitrogen displacement was conducted three times. Thereto were added Pd(dba)$_2$CHCl$_3$ (2.45 g, 2.68 mmol) and dppf (2.97 g, 5.35 mmol). This mixture was stirred for 3 hours while gently heating the mixture with refluxing. After the reaction mixture was returned to room temperature, the mixture was filtered with a Celite. The filtrate was distilled under reduced pressure to remove the solvent. The residue was subjected to silica gel column chromatography to obtain intermediate 22 (10.9 g, 81%).

Synthesis of Compound L-C-7

[Chem. 96]

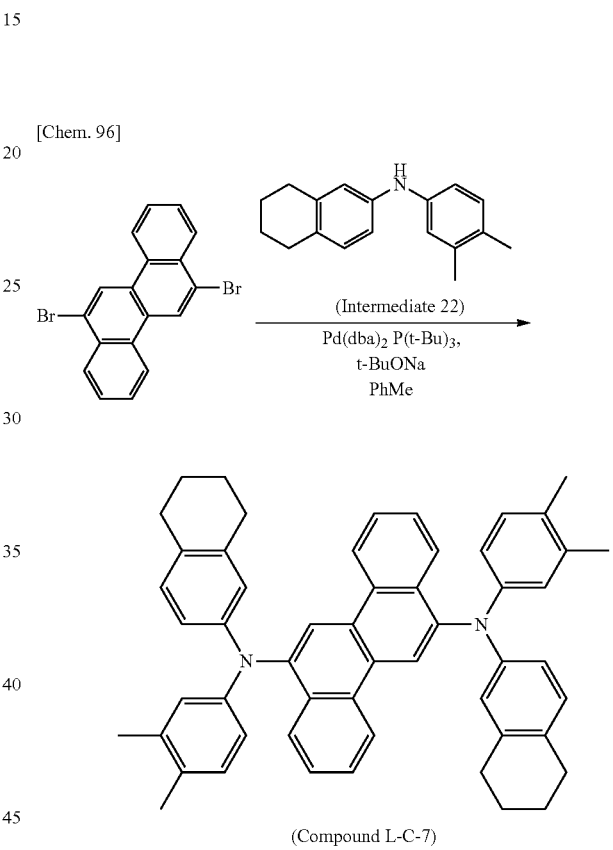

(Compound L-C-7)

Toluene (450 mL) was added to dibromochrysene (8.79 g, 22.8 mmol), intermediate 22 (10.9 g, 43.4 mmol), and t-BuONa (12.5 g, 130 mmol). Nitrogen displacement was conducted three times. A solution of Pd(dba)$_2$CHCl$_3$ (449 mg, 0.43 mmol) in toluene (10 mL) was introduced into another vessel, and nitrogen displacement was conducted three times. Thereafter, tri-t-butylphosphine (702 mg, 3.47 mmol) was added thereto, and this mixture was heated to 60° C. and successively stirred for 30 minutes. This solution was added to the toluene solution prepared previously, and the resultant mixture was stirred for 3 hours while heating the mixture with refluxing. After the reaction mixture was returned to room temperature, the mixture was filtered with a Celite, and the filtrate was distilled under reduced pressure to remove the solvent. The residue was subjected to silica gel column chromatography to obtain compound L-C-7 (7.17 g, 43%).

Synthesis Example for Compounds H-E-33 and H-E-42

Synthesis of Intermediate 23

[Chem. 97]

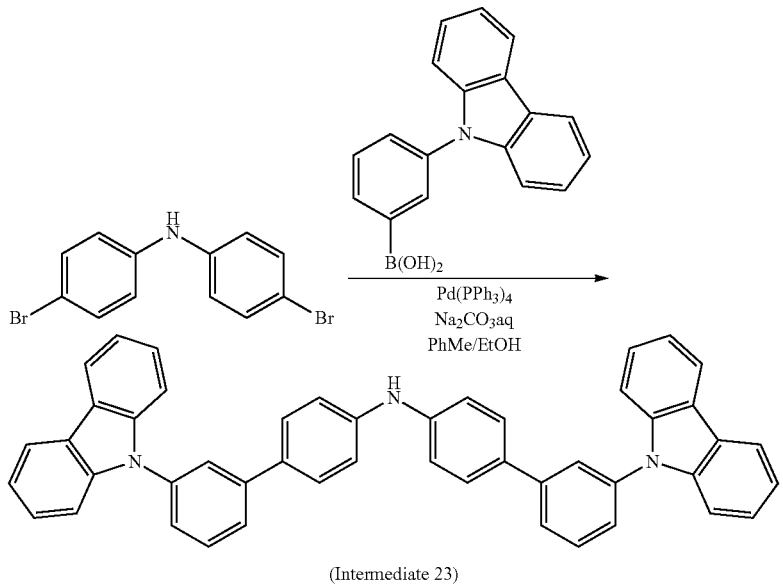

(Intermediate 23)

A toluene/ethanol mixture solution (2:1, 300 mL) and an aqueous sodium carbonate solution (2.0 M, 100 mL) were added to bis(4-bromophenyl)amine (25.0 g, 75.5 mmol) and carbazolylphenylboronic acid (46.1 g, 161 mmol). Nitrogen bubbling was conducted at 60° C. for 15 minutes. Thereto was added Pd(PPh$_3$)$_4$ (880 mg, 0.77 mmol). Thereafter, this mixture was stirred for 3.5 hours while heating the mixture with refluxing. After the reaction mixture was returned to room temperature, carbazolylphenylboronic acid (5.0 g) and Pd(PPh$_3$)$_4$ (440 mg, 0.38 mmol) were added thereto. This mixture was heated for further 6 hours with refluxing. After the reaction mixture was returned to room temperature, the mixture was extracted with toluene. The organic phase was washed with saturated aqueous sodium chloride solution and dried with anhydrous magnesium sulfate, and the solvent was distilled off under reduced pressure. To the crude reaction product (41.5 g) were added carbazolylphenylboronic acid (1.0 g), a toluene/ethanol mixture solution (2:1, 300 mL), and an aqueous sodium carbonate solution (2.0 M, 100 mL). Nitrogen bubbling was conducted at 60° C. for 15 minutes. Thereto was added Pd(PPh$_3$)$_4$ (880 mg, 0.77 mmol). Thereafter, this mixture was stirred for 2 hours while heating the mixture with refluxing. After the reaction mixture was returned to room temperature, the mixture was extracted with toluene. The organic phase was washed with saturated aqueous sodium chloride solution and dried with anhydrous magnesium sulfate, and the solvent was distilled off under reduced pressure. The residue was subjected to reprecipitation (THF/methanol) to obtain intermediate 23 (37.6 g, 76%).

Synthesis of Compound H-E-33

[Chem. 98]

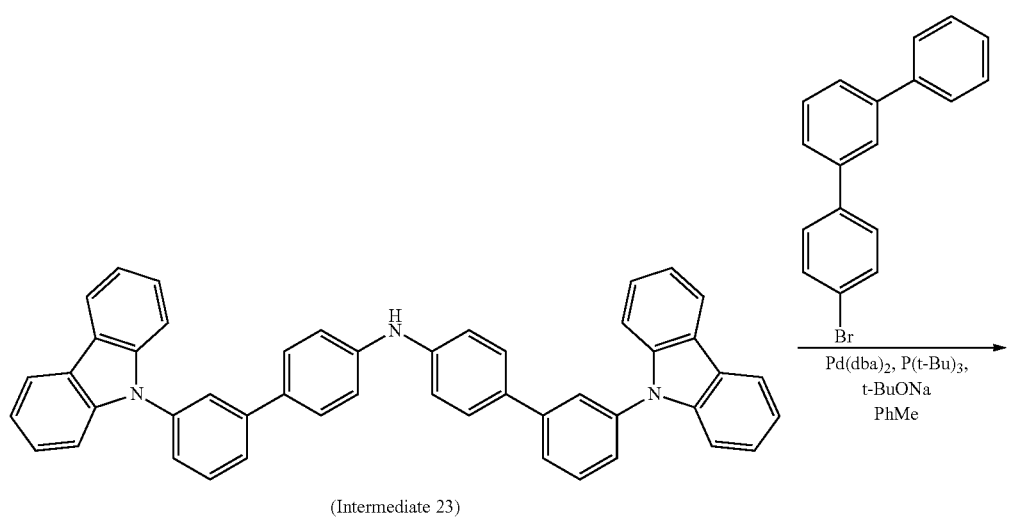

(Intermediate 23)

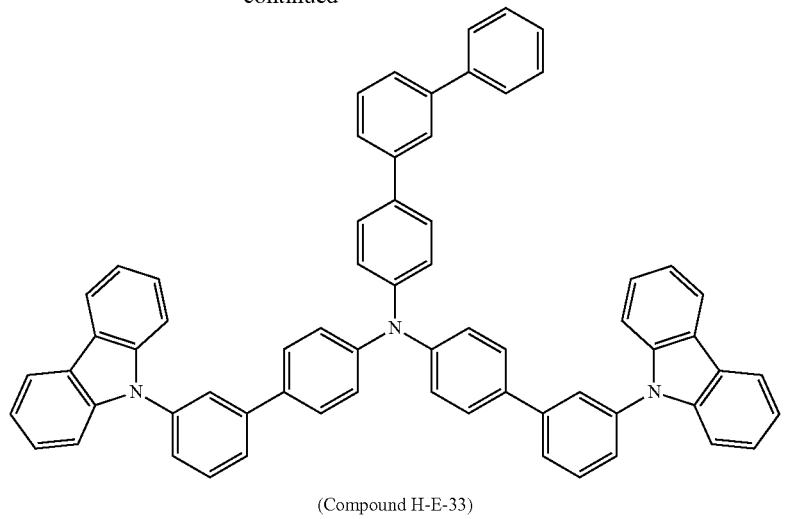

(Compound H-E-33)

Toluene (170 mL) was added to intermediate 23 (18.5 g, 28.4 mmol), bromoterphenyl (9.21 g, 29.8 mmol), and t-BuONa (17.9 g, 187 mmol). Nitrogen bubbling was conducted for 20 minutes. A solution of Pd(dba)$_2$CHCl$_3$ (780 mg, 0.85 mmol) in toluene (50 mL) was introduced into another vessel, and nitrogen bubbling was conducted for 10 minutes. Thereafter, tri-t-butylphosphine (1.0 g, 5.1 mmol) was added thereto, and this mixture was heated to 50° C. with nitrogen bubbling and successively stirred for 40 minutes. This solution was added to the toluene solution prepared previously, and the resultant mixture was stirred for 3 hours while heating the mixture with refluxing. After the reaction mixture was returned to room temperature, the mixture was extracted with methylene chloride. The organic phase was washed with saturated aqueous sodium chloride solution and dried with anhydrous magnesium sulfate, and the solvent was distilled off under reduced pressure. Methanol was added to the residue, and the solid which separated out was taken out by suction filtration and dried. Thus, compound H-E-33 (18.1 g, 73%) was obtained.

Synthesis of Compound H-E-42

[Chem. 99]

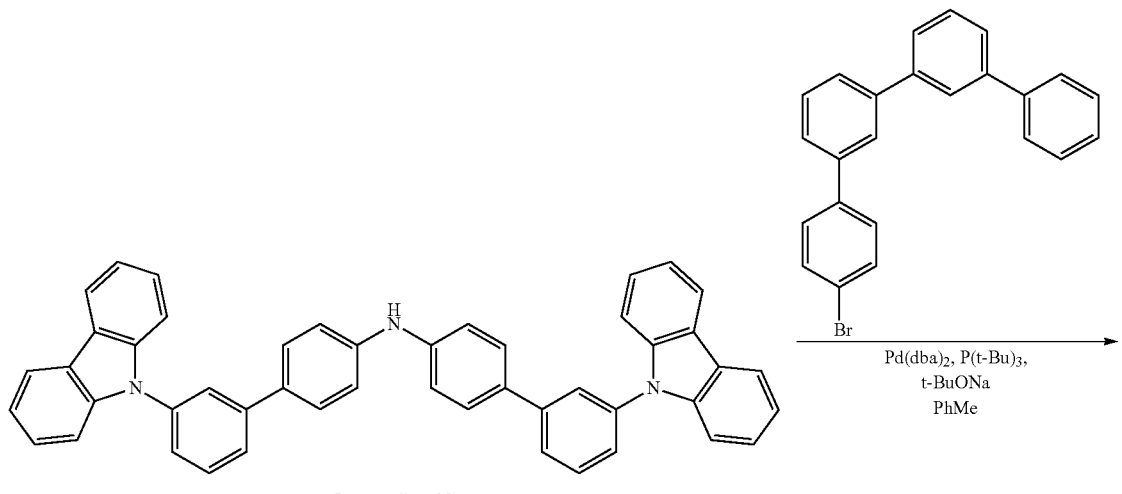

(Intermediate 23)

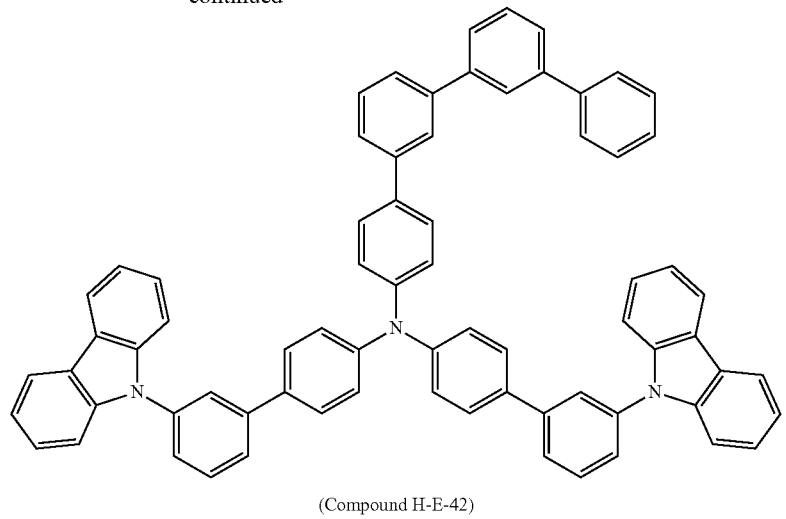

(Compound H-E-42)

Toluene (30 mL) was added to intermediate 23 (2.0 g, 3.07 mmol), bromoquaterphenyl (1.25 g, 3.22 mmol), and t-BuONa (0.84 g, 8.70 mmol). Nitrogen bubbling was conducted for 20 minutes. A solution of $Pd(dba)_2CHCl_3$ (16 mg, 0.015 mmol) in toluene (4 mL) was introduced into another vessel, and nitrogen bubbling was conducted for 10 minutes. Thereafter, tri-t-butylphosphine (24 mg, 0.12 mmol) was added thereto, and this mixture was heated to 50° C. with nitrogen bubbling and successively stirred for 10 minutes. This solution was added to the toluene solution prepared previously, and the resultant mixture was stirred for 2 hours while heating the mixture with refluxing. After the reaction mixture was returned to room temperature, the mixture was extracted with toluene. The organic phase was washed with saturated aqueous sodium chloride solution and dried with anhydrous magnesium sulfate, and the solvent was distilled off under reduced pressure. The residue was subjected to silica gel column chromatography to obtain compound H-E-42 (1.79 g, 61%).

<Storage Stability Test of Compositions>

The following materials, which are included in the compounds shown above as examples, were dissolved in an organic solvent to prepare compositions by the following methods.

Example 1

A 2.5-mg portion of compound (H-A-3) and 2.5 mg of compound (H-A-41) were weighed out and introduced into a brown sample bottle. Cyclohexylbenzene was added thereto to adjust the total amount to 415 mg. Thereafter, the mixture was heated to 120° C. with a hot plate to completely dissolve the compound (H-A-3) and the compound (H-A-41). Thus, a composition (solid concentration, 1.2% by weight) which contained a 1:1 mixture of compound (H-A-3) and compound (H-A-41) (compound group α) was prepared. In this case, compound (H-A-3), which is the smaller in the number of aromatic ring groups, is taken as compound α1. The composition prepared was placed in the dark having a room temperature of about 15-20° C., and the period required for a solid to separate out therein was measured. Whether a solid had separated out was visually ascertained using a 10-power magnifying lens. The results thereof are summarized in Table 2.

Examples 2 to 13 and Comparative Examples 1 to 7

Compositions having the same solid concentration as in Example 1 were prepared in the same manner as in Example 1, except that the compound (H-A-3) and the compound (H-A-41) were replaced by the compounds shown in Table 2 and the proportion was changed as shown in the table. The period required for a solid to separate out therein was measured in the same manner. Whether a solid had separated out was visually ascertained using a 10-power magnifying lens. The results thereof are summarized in Table 2. Incidentally, the H-A-6 and the H-A-11 were obtained by reference to the method disclosed in JP-A-2006-188493.

TABLE 2

|  | Compound α1 | Compound α2 (degree of identity) | Compound α3 (degree of identity) | Proportion | Number of days to solid separating-out |
|---|---|---|---|---|---|
| Example 1 | H-A-3 | H-A-41 (71%) |  | 1:1 | >60 days |
| Example 2 | H-A-11 | H-A-41 (88%) |  | 1:3 | 18 days |
| Example 3 | H-A-27 | H-A-41 (75%) |  | 1:1 | >60 days |
| Example 4 | H-A-41 | H-A-48 (100%) |  | 4:1 | 17 days |
| Example 5 | H-A-27 | H-A-41 (75%) | H-A-71 (75%) | 1:2:1 | 32 days |
| Example 6 | H-A-85 | H-A-41 (71%) |  | 1:4 | 5 days |
| Example 7 | H-A-48 | H-A-71 (78%) |  | 1:1 | 9 days |
| Example 8 | H-A-6 | H-A-11 (100%) |  | 1:4 | >60 days |
| Example 9 | H-A-11 | H-A-15 (100%) |  | 2:1 | 18 days |
| Example 10 | H-A-15 | H-A-43 (88%) |  | 1:1 | 32 days |

TABLE 2-continued

| | Compound α1 | Compound α2 (degree of identity) | Compound α3 (degree of identity) | Proportion | Number of days to solid separating-out |
|---|---|---|---|---|---|
| Example 11 | H-A-15 | H-A-48 (88%) | | 1:1 | >60 days |
| Example 12 | H-A-85 | H-A-15 (71%) | | 1:1 | 56 days |
| Example 13 | H-A-15 | H-A-36 (88%) | H-A-43 (88%) | 1:1:1 | >60 days |
| Comparative Example 1 | H-A-41 | | | | 2 days |
| Comparative Example 2 | H-A-27 | | | | 3 days |
| Comparative Example 3 | H-A-48 | | | | 5 days |
| Comparative Example 4 | H-A-71 | | | | residual solid |
| Comparative Example 5 | H-A-6 | | | | 1 day |
| Comparative Example 6 | H-A-15 | | | | 1 day |
| Comparative Example 7 | H-A-43 | | | | 1 day |

Example 14

A composition which contained a compound group α (1:1 mixture of compound (H-A-3) and compound (H-A-41)), compound (H-E-23), and the following compound (L-1) was prepared in a brown sample bottle. This composition can be used as a coating fluid for forming green-light-emitting layers in the production of organic electroluminescent element. This composition was stored for 1 week and was then used to produce an organic electroluminescent element. Incidentally, the H-E-23 and the L-1 were prepared respectively by the methods disclosed in JP-A-2010-206191 and JP-A-2010-202644.

<Conditions for Preparing the Composition>

| Solvent | cyclohexylbenzene | |
|---|---|---|
| Solid concentrations | compound group α | 1.2 wt % |
| | H-E-23 | 3.6 wt % |
| | L-1 | 0.48 wt % |

[Chem.100]

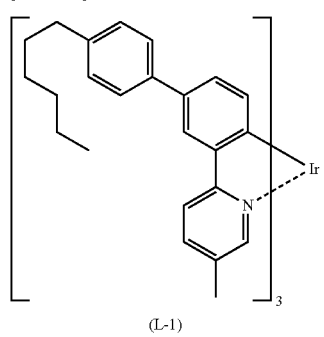

(L-1)

The organic electroluminescent element was produced by the following method.

<Production of Organic Electroluminescent Element>

A coated substrate obtained by depositing a transparent conductive film of indium-tin oxide (ITO) on a glass substrate 1 in a thickness of 70 nm (sputtering-coated product; manufactured by Geomatec Co., Ltd.) was subjected to patterning into stripes having a width of 2 mm using ordinary photolithography and etching with hydrochloric acid to form an anode 2. The patterned ITO substrate was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and finally subjected to ultraviolet/ozone cleaning. This ITO functions as a transparent electrode 2.

Next, a coating fluid for hole injection layer formation was prepared, the coating fluid containing the arylamine polymer represented by the following structural formula (P-1), 4-isopropyl-4'-methyldiphenyliodonium tetrakis(pentafluorophenyl)borate, which is represented by the following structural formula (A-10), and ethyl benzoate. This coating fluid was applied on the anode by spin coating under the following conditions to form a hole injection layer 3 having a thickness of 40 nm.

[Chem. 101]

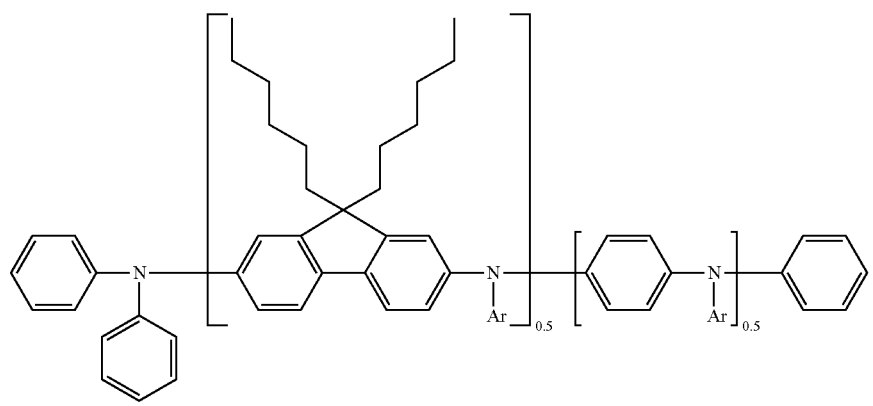

(P-1)

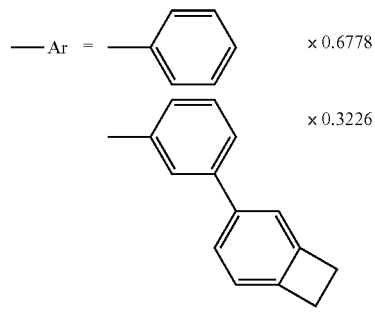

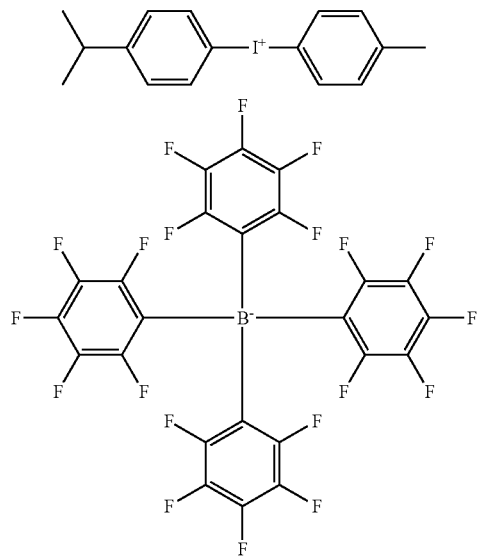

(A-10)

<Coating Fluid for Hole Injection Layer Formation>

| Solvent | ethyl benzoate | |
|---|---|---|
| Coating fluid concentrations | P-1 | 2.5 wt % |
| | A-10 | 0.5 wt % |

<Conditions for Forming Hole Injection Layer 3>

| Spin coating atmosphere | in the air |
|---|---|
| Heating conditions | in the air; 230° C.; 1 hr |

Subsequently, a coating fluid for hole transport layer formation which contained compound (P-2) having the structure shown below was prepared, and was applied by spin coating and heated under the following conditions to thereby polymerize the compound. Thus, a hole transport layer 4 having a thickness of 10 nm was formed.

[Chem. 102]

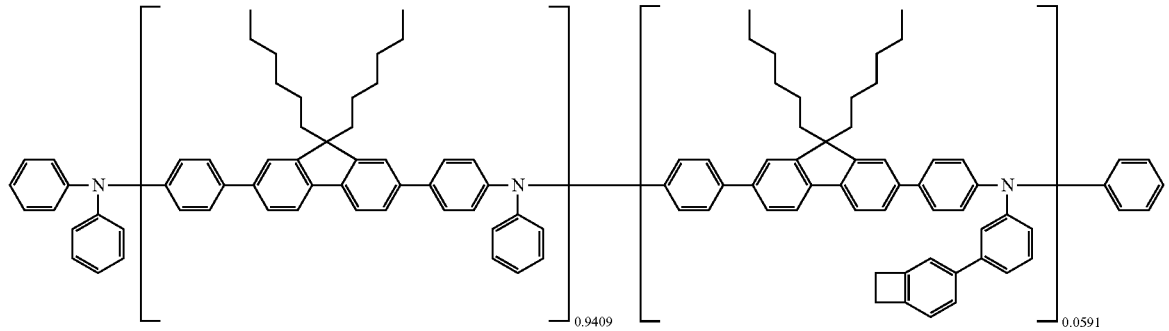

(P-2)

<Coating Fluid for Hole Transport Layer Formation>

| Solvent | cyclohexylbenzene |
|---|---|
| Coating fluid concentration | 1.0 wt % |

<Conditions for Film Formation>

| Spin coating atmosphere | in nitrogen atmosphere |
|---|---|
| Heating conditions | 230° C.; 1 hr |
|  | (in nitrogen atmosphere) |

Next, a coating fluid for luminescent-layer formation which had been prepared by the method described above and which had been stored for 1 week was applied by spin coating and heated under the following conditions to thereby form an emissive layer 5 having a thickness of 50 nm.

<Conditions for Forming Luminescent Layer 5>

| Spin coating atmosphere | in nitrogen atmosphere |
|---|---|
| Heating conditions | 120° C.; 20 min; in nitrogen atmosphere |

Here, the substrate on which up to the luminescent layer had been formed was transferred to a vacuum deposition apparatus, which was evacuated until the degree of vacuum within the apparatus became at least $2.0 \times 10^{-4}$ Pa. Thereafter, compound (H-A-6) was deposited on the luminescent layer by vacuum deposition while regulating the deposition rate so as to be in the range of 0.8-1.2 Å/sec. Thus, a hole blocking layer 6 having a thickness of 10 nm was obtained.

Subsequently, the organic compound (Alq$_3$) having the structure shown below was deposited on the hole blocking layer 6 by vacuum deposition while regulating the deposition rate so as to be in the range of 0.8-1.2 Å/sec. Thus, an electron transport layer 7 having a thickness of 20 nm was formed.

[Chem. 103]

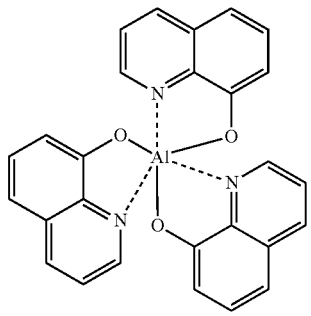

(Alq$_3$)

Here, the element in which up to the electron transport layer 7 had been vacuum-deposited was taken out temporarily and disposed in another deposition apparatus. A shadow mask in the form of stripes with a width of 2 mm was disposed, as a mask for cathode deposition, so that the mask was in close contact with the element and that these stripes were perpendicular to the ITO stripes of the anode 2. This apparatus was evacuated until the degree of vacuum therein became at least $2.3 \times 10^{-4}$ Pa.

First, using a molybdenum boat, lithium fluoride (LiF) was deposited at a deposition rate of 0.1 Å/sec to form a film having a thickness of 0.5 nm as an electron injection layer 8 on the electron transport layer 7. The degree of vacuum during the deposition was $2.6 \times 10^{-4}$ Pa. Next, aluminum was heated in the same manner using a molybdenum boat to form an aluminum layer having a thickness of 80 nm, as a cathode 9, while regulating the deposition rate so as to be in the range of 1.0-4.9 Å/sec. The degree of vacuum during the deposition was $2.6 \times 10^{-4}$ Pa. During the deposition of these two layers, the substrate temperature was kept at room temperature.

Subsequently, sealing was conducted in the following manner in order to prevent the element from being deteriorated by the action of atmospheric moisture, etc. during storage.

In a gloved nitrogen box, photocurable resin 30Y-437 (manufactured by ThreeBond Co., Ltd.) was applied in a width of about 1 mm to the periphery of a glass plate having a size of 23 mm×23 mm, and a moisture getter sheet (manufactured by Dynic Corp.) was disposed in a central part. The substrate on which the cathode had been formed was laminated thereto so that the side having the deposited layers faced the desiccant sheet. Thereafter, only the region where the photocurable resin had been applied was irradiated with ultraviolet light to cure the resin.

Thus, an organic electroluminescent element which had a luminescent area having a size of 2 mm×2 mm was obtained. This element emitted green light upon voltage application thereto, and had the properties shown in Table 3.

Examples 15 and 16

Compositions were prepared in the same manner as in Example 14, except that the compound (H-A-3) and compound (H-A-41) which constituted the compound group α were replaced by the compounds shown in Table 3, the proportion thereof being shown in the table. After 1 week, these compositions were used to produce organic electroluminescent element. These elements emitted green light upon voltage application thereto, and had the properties shown in Table 3.

Comparative Example 8

A composition was prepared in the same manner as in Example 14, except that the compound group α was replaced by compound (H-A-41). On the day when the composition was prepared, this composition was used to produce an organic electroluminescent element. This element emitted green light upon voltage application thereto, and had the properties shown in Table 3.

<Conditions for Preparing the Composition>

| Solvent | cyclohexylbenzene | |
|---|---|---|
| Solid concentrations | compound group α | 1.2 wt % |
| | H-E-63 | 3.6 wt % |
| | L-2 | 0.48 wt % |

[Chem. 104]

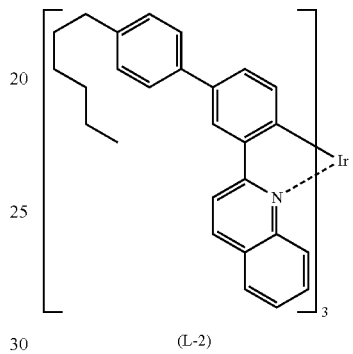

(L-2)

TABLE 3

| | Compound α1 | Compound α2 (degree of identity) | Proportion | Composition used for element production | Luminous efficacy (lm/W at 10 mA/cm$^2$; value relative to Comparative Example 8, taken as 100) |
|---|---|---|---|---|---|
| Example 14 | H-A-3 | H-A-41 (71%) | 1:1 | stored for 1 week | 100 |
| Example 15 | H-A-11 | H-A-41 (88%) | 1:3 | stored for 1 week | 105 |
| Example 16 | H-A-27 | H-A-41 (75%) | 1:1 | stored for 1 week | 105 |
| Comparative Example 8 | H-A-41 | | | prepared on the day | 100 |

Example 17

A composition which contained a compound group α (1:1 mixture of compound (H-A-15) and compound (H-A-48)), compound (H-E-63), and the following compound (L-2) was prepared in a brown sample bottle. This composition can be used as a coating fluid for forming red-light-emitting layers in the production of organic electroluminescent element. This composition was stored for 1 week and was then used to produce an organic electroluminescent element by the method shown in Example 14. This element emitted red light upon voltage application thereto, and had the properties shown in Table 4. Incidentally, the H-E-63 was prepared by the method disclosed in JP-A-2011-026237, and the L-2 was prepared by the following method.

Synthesis of Compound L-2

Synthesis of Intermediate 25

[Chem. 105]

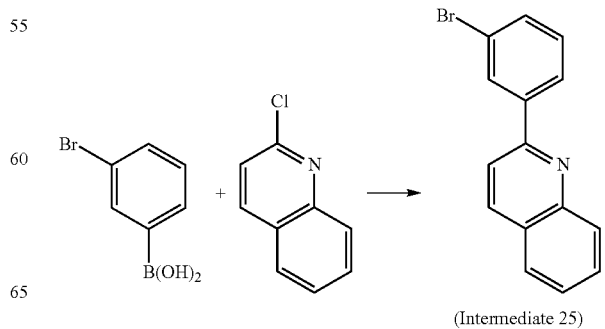

(Intermediate 25)

Sodium carbonate (43.5 g, 411 mmol) was added to a mixture of 3-bromophenylboronic acid (25.0 g, 124 mmol), 1-chloroquinoline (20.3 g, 124 mmol), and toluene (250 mL). Nitrogen bubbling was conducted for 30 minutes while stirring the resultant mixture. Thereto was added Pd(PPh$_3$)$_4$ (4.31 g, 3.73 mmol). This mixture was stirred at 130° C. for 3.5 hours. After the disappearance of the starting materials was ascertained by TLC, the reaction mixture was extracted with toluene twice. The organic layer was washed with saturated aqueous sodium chloride solution and concentrated under reduced pressure. The residue was subjected to silica gel column chromatography to obtain intermediate 25 (28.4 g; yield, 80%).

Synthesis of Intermediate 26

[Chem. 106]

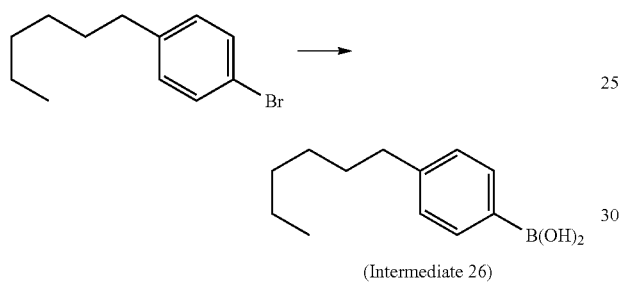

(Intermediate 26)

In a nitrogen atmosphere, an n-hexane solution of n-butyllithium (1.67 M, 131 mL, 218 mmol) was added dropwise at −75° C. to a solution in dry THF (300 mL) of 4-bromohexylbenzene (50.0 g, 207 mmol), and the mixture was stirred. After 2 hours, trimethoxyborane (64.6 g, 622 mmol) was added dropwise thereto. This mixture was stirred for further 2 hours. Thereafter, 1-N diluted hydrochloric acid (300 mL) was added dropwise thereto, and this mixture was stirred for 30 minutes. The reaction mixture was extracted with ethyl acetate. The organic layer was washed with saturated aqueous sodium chloride solution, dried with sodium sulfate, and then concentrated under reduced pressure. Thus, intermediate 26 (42.5 g; yield, 99%) was obtained as a colorless solid.

[Chem. 108]

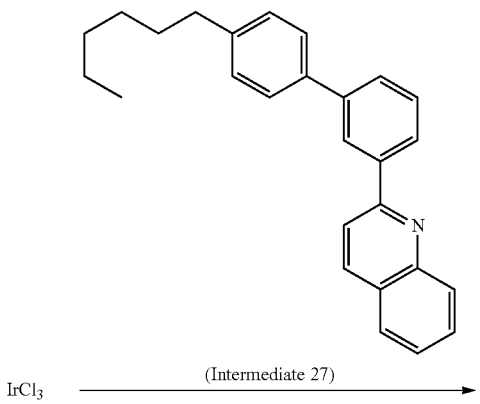

Synthesis of Intermediate 27

[Chem. 107]

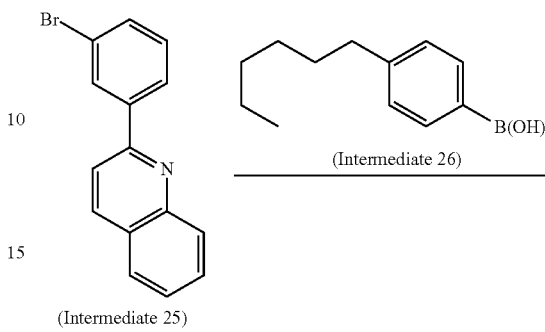

(Intermediate 27)

In a nitrogen atmosphere, a solution of intermediate 25 (13.5 g, 47.5 mmol) and intermediate 26 (10.8 g, 52.8 mmol) in a toluene/ethanol mixture (2:1, 360 mL) was introduced together with water (120 mL) and tripotassium phosphate (33.5 g, 158 mmol). Nitrogen bubbling was conducted for 30 minutes while stirring the mixture. Thereto was added Pd(PPh$_3$)$_4$ (2.5 g, 2.18 mmol). This mixture was stirred at 130° C. for 3.5 hours. After the disappearance of the starting materials was ascertained by TLC, the reaction mixture was extracted with toluene twice. The organic layer was washed once with saturated aqueous sodium chloride solution and concentrated under reduced pressure. The concentrate was purified by silica gel column chromatography to obtain intermediate 27 (17.2 g; yield, 98%).

Synthesis of Intermediate 28

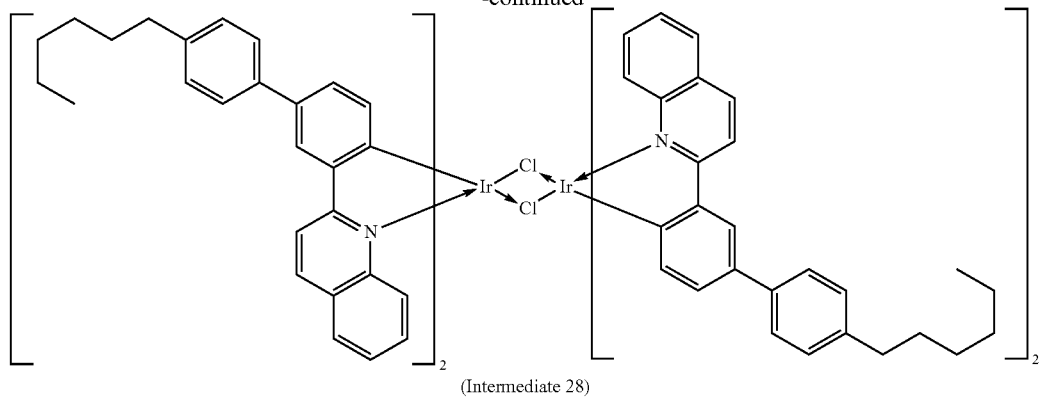

(Intermediate 28)

In a nitrogen atmosphere, 2-ethoxyethanol (200 mL) and water (66 mL) were added to intermediate 27 (13.5 g, 36.9 mmol) and IrCl$_3$ n-hydrate (6.85 g, 18.5 mmol). This mixture was stirred at 135° C. for 10 hours. Thereafter, the reaction mixture was extracted with dichloromethane. The organic layer was washed with saturated aqueous sodium chloride solution, dried with sodium sulfate, and then concentrated under reduced pressure. Thus, intermediate 28 (11.9 g; yield, 66%) was obtained as a red solid.

Synthesis of Intermediate 29

In a nitrogen atmosphere, intermediate 28 (11.9 g, 6.22 mmol), sodium acetylacetonate (3.80 g, 31.0 mmol), and 2-ethoxyethanol (100 mL) were introduced in this order, and the mixture was stirred at 135° C. for 9 hours. Thereafter, the reaction mixture was extracted with dichloromethane. The organic layer was washed with saturated aqueous sodium chloride solution, dried with sodium sulfate, and then concentrated under reduced pressure. The residue was dissolved in dichloromethane, and this solution was subjected to basic-silica-gel column chromatography. Thus, intermediate 29 (7.75 g; yield, 61%) was obtained as a red solid.

[Chem. 109]

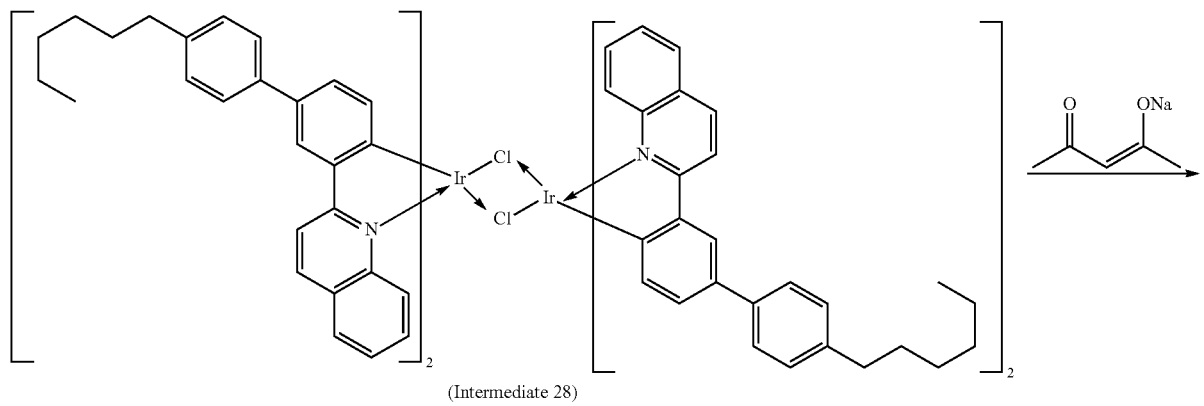

(Intermediate 28)

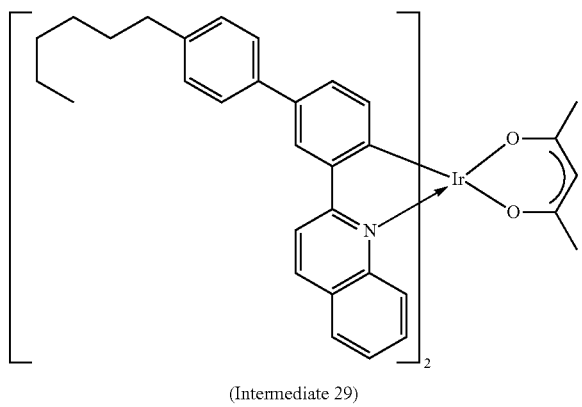

(Intermediate 29)

Synthesis of Compound L-2

[Chem. 110]

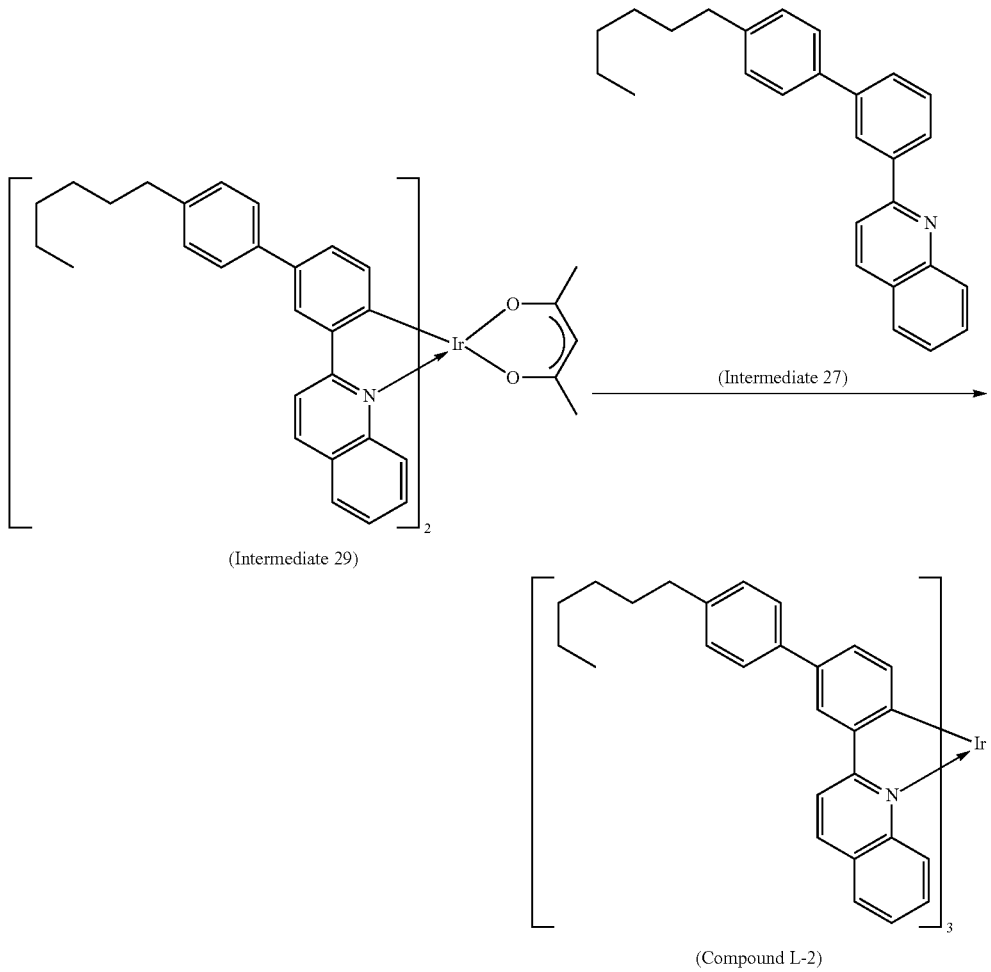

In a nitrogen atmosphere, glycerol (230 mL) was added to intermediate 29 (7.00 g, 3.56 mmol) and intermediate 27 (13.6 g, 37.2 mmol), and this mixture was stirred at 190° C. for 17 hours. Thereafter, the reaction mixture was extracted with dichloromethane. The organic layer was washed with saturated aqueous sodium chloride solution, dried with sodium sulfate, and then concentrated under vacuum. The residue was dissolved in dichloromethane, and this solution was subjected twice to basic-silica-gel column chromatography. The residue was dissolved in toluene, and this solution was subjected to suspension washing with methanol. The precipitate was taken out by suction filtration. Thus, compound L-2 (2.93 g; yield, 69%) was obtained as a red solid.

Example 18

A composition was prepared in the same manner as in Example 17, except that the compound (H-A-15) and compound (H-A-48) which constituted the compound group α were replaced by the compounds shown in Table 4, the proportion thereof being shown in the table. After 1 week, this composition was used to produce an organic electroluminescent element. This element emitted red light upon voltage application thereto, and had the properties shown in Table 4.

Comparative Example 9

A composition was prepared in the same manner as in Example 17, except that the compound group α was replaced by compound (H-A-15). On the day when the composition was prepared, this composition was used to produce an organic electroluminescent element. This element emitted red light upon voltage application thereto, and had the properties shown in Table 4.

Comparative Example 10

A composition was prepared in the same manner as in Example 17, except that the compound group α was replaced by a 1:1 mixture of compound (H-A-15) and the following compound (H-1). After 1 week, this composition was used to produce an organic electroluminescent element. This element emitted red light upon voltage application thereto, and had the properties shown in Table 4.

[Chem. 111]

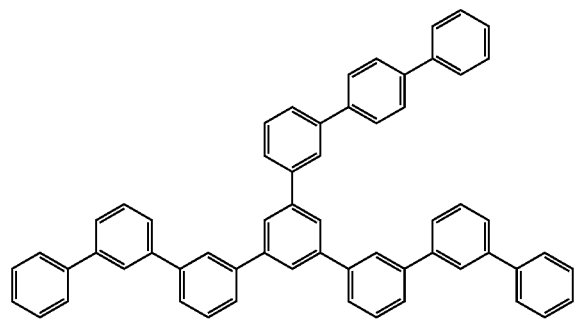

(H-1)

a brown sample bottle. Diethylbenzene was added thereto to adjust the total amount to 860 mg. Thereafter, the mixture was heated to 120° C. with a hot plate to completely dissolve the compound (H-B-14) and the compound (H-B-54). Thus, a composition (solid concentration, 3.5% by weight) which contained a 1:2 mixture of compound (H-B-14) and compound (H-B-54) (compound group α) was prepared. In this case, since the two compounds are equal in the number of aromatic ring groups, compound (H-B-14) was taken as compound α1 here. The composition prepared was placed in the dark having a room temperature of about 15-20° C., and the period required for a solid to separate out therein was measured. Whether a solid had separated out was visually ascertained using a 10-power magnifying lens. The results thereof are summarized in Table 5.

TABLE 4

| | Compound α1 | Compound α2 (degree of identity) | Compound α3 (degree of identity) | Proportion | Composition used for element production | Luminous efficacy (lm/W at 10 mA/cm$^2$; value relative to Comparative Example 9, taken as 100) |
|---|---|---|---|---|---|---|
| Example 17 | H-A-15 | H-A-48 (78%) | | 1:1 | stored for 1 week | 100 |
| Example 18 | H-A-15 | H-A-36 (88%) | H-A-43 (88%) | 1:1:1 | stored for 1 week | 100 |
| Comparative Example 9 | H-A-15 | | | | prepared on the day | 100 |
| Comparative Example 10 | H-A-15 | H-1 | | 1:1 | stored for 1 week | 70 |

As apparent from Tables 2, 3, and 4, the compositions prepared according to the invention were inhibited from suffering crystallizing-out and hence had improved storage stability. It was also found that even when these compositions were stored for 1 week and then used to produce organic electroluminescent element, these organic electroluminescent elements differed little in electric-power efficiency from the organic electroluminescent element produced using a composition on the day when the composition was prepared.

Example 19

A 10.0-mg portion of compound (H-B-14) and 20.0 mg of compound (H-B-54) were weighed out and introduced into Examples 20 to 22 and Comparative Examples 11 and 12

Compositions were prepared in the same manner as in Example 19, except that the compound (H-B-14) and the compound (H-B-54) were replaced by the compounds shown in Table 5 and that the proportions and solvents shown in the table were used. The period required for a solid to separate out in each composition was measured. Whether a solid had separated out was visually ascertained using a 10-power magnifying lens. The results thereof are summarized in Table 5.

TABLE 5

| | Compound α1 | Compound α2 (degree of identity) | Material α3 (degree of identity) | Proportion | Solvent | Number of days to separating-out |
|---|---|---|---|---|---|---|
| Example 19 | H-B-14 | H-B-54 (80%) | | 1:2 | diethylbenzene | >60 days |
| Example 20 | H-B-14 | H-B-18 (80%) | H-B-60 (60%) | 2:2:1 | diethylbenzene | 7 days |
| Comparative Example 11 | H-B-14 | | | | diethylbenzene | 1 day |
| Example 21 | H-B-14 | H-B-54 (80%) | | 1:2 | decaline | >60 days |
| Example 22 | H-B-14 | H-B-18 (80%) | H-B-60 (60%) | 2:2:1 | decaline | 7 days |
| Comparative Example 12 | H-B-14 | | | | decaline | 1 day |

Example 23

A composition which contained a compound group α (1:2 mixture of compound (H-B-14) and compound (H-B-54)) and compound (L-C-2) was prepared in a brown sample bottle. This composition can be used as a coating fluid for forming blue-light-emitting layers in the production of organic electroluminescent element. This composition was stored for 1 week and was then used to produce an organic electroluminescent element by the method shown in Example 14. The luminescent layer 5 in this element had a thickness of 45 nm. This element emitted blue light upon voltage application thereto, and had the properties shown in Table 6. Incidentally, the L-C-2 was prepared by the method disclosed in International Publication WO 2006/082705.

<Conditions for Preparing the Composition>

| Solvent | cyclohexylbenzene | |
|---|---|---|
| Solid concentrations | compound group α | 3.5 wt % |
| | L-C-2 | 0.35 wt % |

Comparative Example 13

A composition was prepared in the same manner as in Example 23, except that the compound group α was replaced by compound (H-B-14). On the day when the composition was prepared, this composition was used to produce an organic electroluminescent element in the same manner as in Example 23. This element emitted blue light upon voltage application thereto, and had the properties shown in Table 6.

TABLE 6

| | Compound α1 | Compound α2 (degree of identity) | Proportion | Composition used for element production | Luminous efficacy (lm/W at 10 mA/cm$^2$; value relative to Comparative Example 13, taken as 100) |
|---|---|---|---|---|---|
| Example 23 | H-B-14 | H-B-54 (80%) | 1:2 | stored for 1 week | 107 |
| Comparative Example 13 | H-B-14 | | | prepared on the day | 100 |

As apparent from Tables 5 and 6, the compositions prepared according to the invention were inhibited from suffering crystallizing-out and hence had improved storage stability. It was also found that even when one of these compositions was stored for 1 week and then used to produce an organic electroluminescent element, this organic electroluminescent element differed little in electric-power efficiency from the organic electroluminescent element produced using a composition on the day when the composition was prepared.

Example 24

A 1.5-mg portion of compound (L-C-3) and 1.5 mg of compound (L-C-7) were weighed out and introduced into a brown sample bottle. Cyclohexylbenzene was added thereto to adjust the total amount to 860 mg. Thereafter, the mixture was heated to 120° C. with a hot plate to completely dissolve the compound (L-C-3) and the compound (L-C-7). Thus, a composition (solid concentration, 0.35% by weight) which contained a 1:1 mixture of compound (L-C-3) and compound (L-C-7) (compound group α) was prepared. In this case, since the two compounds are equal in the number of aromatic ring groups, compound (L-C-3) was taken as compound α1 here. The composition prepared was placed in the dark having a room temperature of about 15-20° C., and the period required for a solid to separate out therein was measured. Whether a solid had separated out was visually ascertained using a 10-power magnifying lens. The results thereof are summarized in Table 7.

Comparative Example 14

A composition was prepared in the same manner as in Example 24, except that the compound group α was replaced by compound (L-C-3). The period required for a solid to separate out in the composition was measured. Whether a solid had separated out was visually ascertained using a 10-power magnifying lens. The results thereof are summarized in Table 7.

TABLE 7

| | Material α1 | Material α2 (degree of identity) | Material α3 (degree of identity) | Proportion | Number of days to separating-out |
|---|---|---|---|---|---|
| Example 24 | L-C-3 | L-C-7 (100%) | | 1:1 | 10 days |
| Comparative Example 14 | L-C-3 | | | | 4 days |

Example 25

A composition which contained a compound group α (1:1 mixture of compound (L-C-3) and compound (L-C-7)) and compound (H-B-52) was prepared in a brown sample bottle. This composition can be used as a coating fluid for forming blue-light-emitting layers in the production of organic electroluminescent element. This composition was stored for 1 week and was then used to produce an organic electroluminescent element by the method shown in Example 23. This element emitted blue light upon voltage application thereto, and had the properties shown in Table 8. Incidentally, the H-B-52 was prepared by the method disclosed in JP-A-2011-100942.

<Conditions for Preparing the Composition>

| Solvent | cyclohexylbenzene | |
|---|---|---|
| Solid concentrations | compound group α | 0.35 wt % |
| | H-B-52 | 3.5 wt % |

Comparative Example 15

A composition was prepared and stored for 1 week in the same manner as in Example 25, except that the compound group α was replaced by compounds (L-C-3) and (L-C-10). Thereafter, this composition was used to produce an organic electroluminescent element in the same manner as in Example 25. This element emitted blue light upon voltage application thereto, and had the properties shown in Table 8.

TABLE 8

| | Compound α1 | Material α2 (degree of identity) | Proportion | Composition used for element production | Luminous efficacy (lm/W at 10 mA/cm$^2$; value relative to Comparative Example 15, taken as 100) |
|---|---|---|---|---|---|
| Example 25 | L-C-3 | L-C-7 (100%) | 1:1 | stored for 1 week | 121 |
| Comparative Example 15 | L-C-3 | L-C-10 (20%) | 1:1 | stored for 1 week | 100 |

As apparent from Tables 7 and 8, the composition prepared according to the invention was inhibited from suffering crystallizing-out and hence had improved storage stability. It was also found that the organic electroluminescent element obtained using the material of the invention had an improved electric-power efficiency.

Example 26

A 15.0-mg portion of compound (H-E-33) and 15.0 mg of compound (H-E-42) were weighed out and introduced into a brown sample bottle. Cyclohexylbenzene was added thereto to adjust the total amount to 625 mg. Thereafter, the mixture was heated to 120° C. with a hot plate to completely dissolve the compound (H-E-33) and the compound (H-E-42). Thus, a composition (solid concentration, 4.8% by weight) which contained a 1:1 mixture of compound (H-E-33) and compound (H-E-42) (compound group α) was prepared. In this case, since compound (H-E-33) is the smaller in the number of aromatic ring groups, compound (H-E-33) is taken as compound α1. The composition prepared was placed in the dark having a room temperature of about 15-20° C., and the period required for a solid to separate out therein was measured. Whether a solid had separated out was visually ascertained using a 10-power magnifying lens. The results thereof are summarized in Table 9.

Examples 27 to 33 and Comparative Examples 16 to 19

Compositions were prepared in the same manner as in Example 26, except that the compound group α was replaced by the compounds shown in Table 9 and the proportion was changed as shown in the table. The period required for a solid to separate out in each composition was measured. Whether a solid had separated out was visually ascertained using a 10-power magnifying lens. The results thereof are summarized in Table 9. Incidentally, the compounds shown in the table were prepared by the method disclosed in any of the following documents: JP-A-2006-352088, JP-A-2007-110093, JP-A-2010-206191, JP-A-2011-51936, and JP-A-2011-26237.

TABLE 9

| | Compound α1 | Compound α2 (degree of identity) | Compound α3 (degree of identity) | Proportion | Number of days to separating-out |
|---|---|---|---|---|---|
| Example 26 | H-E-33 | H-E-42 (89%) | | 1:1 | 32 days |
| Example 27 | H-E-45 | H-E-33 (88%) | | 1:2 | 10 days |
| Example 28 | H-E-33 | H-E-83 (89%) | | 1:2 | >60 days |
| Example 29 | H-E-33 | H-E-22 (78%) | H-E-77 (78%) | 1:1:2 | 17 days |
| Example 30 | H-E-33 | H-E-43 (89%) | | 4:1 | 43 days |
| Example 31 | H-E-43 | H-E-63 (78%) | | 1:1 | >60 days |
| Example 32 | H-E-43 | H-E-77 (78%) | | 1:1 | >60 days |
| Example 33 | H-E-43 | H-E-87 (67%) | | 1:1 | 32 days |
| Comparative Example 16 | H-E-33 | | | | 1 day |
| Comparative Example 17 | H-E-43 | | | | 1 day |
| Comparative Example 18 | H-E-87 | | | | 17 days |
| Comparative Example 19 | H-E-22 | | | | residual solid |

Example 34

A composition which contained a compound group α (1:1:2 mixture of compound (H-E-33), compound (H-E-22), and compound (H-E-77)), compound (H-E-23), and compound (L-1) was prepared in a brown sample bottle. This composition can be used as a coating fluid for forming green-light-emitting layers in the production of organic electroluminescent element. This composition was stored for 1 week and was then used to produce an organic electroluminescent element by the method shown in Example 14. This element emitted green light upon voltage application thereto, and had the properties shown in Table 10.

<Conditions for Preparing the Composition>

| Solvent | cyclohexylbenzene | |
|---|---|---|
| Solid concentrations | compound group α | 3.6 wt % |
| | H-A-11 | 1.2 wt % |
| | L-1 | 0.48 wt % |

Example 35

A composition was prepared in the same manner as in Example 34, except that the compound group α was replaced by a 1:1 mixture of compound (H-E-43) and compound (H-E-77). After 1 week, this composition was used to produce an organic electroluminescent element. This element emitted green light upon voltage application thereto, and had the properties shown in Table 10.

Comparative Examples 20 and 21

Compositions were prepared in the same manner as in Example 34, except that the compound group α was replaced by the compounds shown in Table 10. On the day when the compositions were prepared, these compositions were used to produce organic electroluminescent element. These elements emitted green light upon voltage application thereto, and had the properties shown in Table 10.

TABLE 10

| | Compound α1 | Compound α2 (degree of identity) | Compound α3 (degree of identity) | Proportion | Composition used for element production | Luminous efficacy (lm/W at 10 mA/cm$^2$; value relative to Comparative Example 20, taken as 100) |
|---|---|---|---|---|---|---|
| Example 34 | H-E-33 | H-E-22 (78%) | H-E-77 (78%) | 1:1:2 | stored for 1 week | 100 |
| Example 35 | H-E-43 | H-E-77 (78%) | | 1:1 | stored for 1 week | 100 |
| Comparative Example 20 | H-E-33 | | | | prepared on the day | 100 |
| Comparative Example 21 | H-E-43 | | | | prepared on the day | 90 |

As apparent from Tables 9 and 10, the compositions prepared according to the invention were inhibited from suffering crystallizing-out and hence had improved storage stability. It was also found that even when these compositions were stored for 1 week and then used to produce organic electroluminescent element, these organic electroluminescent element differed little in electric-power efficiency from the organic electroluminescent element produced using compositions on the day when the compositions were prepared.

While the invention has been described in detail and with reference to specific embodiments thereof, it will be apparent to one skilled in the art that various changes and modifications can be made therein without departing from the spirit and scope thereof. This application is based on a Japanese patent application filed on Jan. 11, 2011 (Application No. 2011-003081), the contents thereof being incorporated herein by reference.

DESCRIPTION OF THE REFERENCE NUMERALS

1 Substrate
2 Anode
3 Hole injection layer
4 Hole transport layer
5 Emissive layer
6 Hole blocking layer
7 Electron transport layer
8 Electron injection layer
9 Cathode

The invention claimed is:
1. A composition comprising a compound group α for organic electroluminescent element and a solvent, wherein:
the compound group α is constituted of at least two kinds of compounds which each have a molecular weight of 3,000 or less and have a structure comprising a plurality of aromatic ring groups linked to each other;
the compound group α comprises a first compound α1, which is the smallest in the number of aromatic ring groups, a second compound α2, optionally a third compound α3, and optionally a fourth compound α4;
when a structure which is the largest in the number of the aromatic ring groups, of partial structures that are common between the compound α1 and the compounds α2, α3, and α4, is taken as a basic framework, 60% or more of the structure of the compound α1 is identical with the basic framework;
the compounds which constitute the compound group α each is mixed in an amount of 1% by weight or larger; and
each of the compounds included in the compound group α is any of the compounds represented by formulae (A-5) and (A-6):

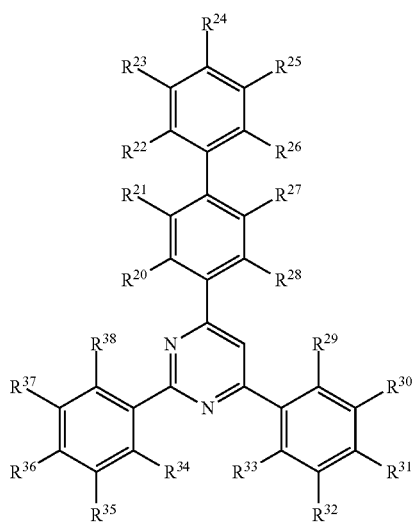
(A-5)

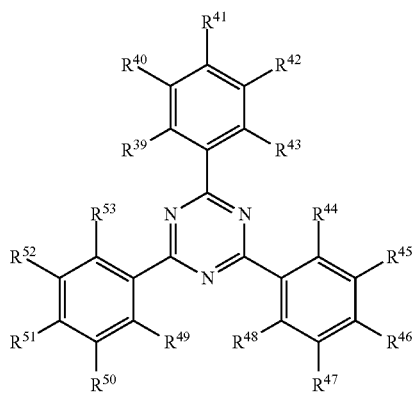
(A-6)

wherein $R^{20}$ to $R^{53}$ each independently represent a hydrogen atom, a nitrogen atom, an oxygen atom, a sulfur atom, an aromatic hydrocarbon ring group which has 6-30 carbon atoms and may have a substituent, or a heteroaromatic ring group which has 3-30 carbon atoms and may have a substituent, with the proviso that when $R^{20}$ to $R^{53}$ each are a nitrogen atom, an oxygen atom, or a sulfur atom, this atom combines with part of an adjoining substituent to form a ring.

2. The composition of claim 1, wherein the proportion of the compound group α to all solid components of the composition is 0.1-100% by weight.

3. The composition of claim 1, wherein the proportion of the solvent in the composition is 10% by weight or higher.

4. The composition of claim 1, wherein the compounds included in the compound group α each are a charge transport material.

5. The composition of claim 1, wherein the compounds included in the compound group α are represented by only one formula selected from the group consisting of formulae (A-5) and (A-6).

6. An organic electroluminescent element, comprising:
an anode;
a cathode; and
at least one organic layer interposed between the anode and the cathode,
wherein at least one of the organic layer(s) is a layer formed using the composition for organic electroluminescent element of claim 1.

7. The organic electroluminescent element of claim 6, wherein the layer formed using the composition for organic electroluminescent element is an emissive layer.

8. A display, comprising the organic electroluminescent element of claim 6.

9. A lighting, comprising:
the organic electroluminescent element of claim 6.

10. A composition comprising a compound group α for organic electroluminescent element and a solvent, wherein;
the compound group α is constituted of at least two kinds of compounds which each have a molecular weight of 3,000 or less and have a structure comprising a plurality of aromatic ring groups linked to each other;
the compound group α comprises a first compound α1, which is the smallest in the number of aromatic ring groups, a second compound α2, and optionally a third compound α3;
when a structure which is the largest in the number of the aromatic ring groups, of partial structures that are common between the compound α1 and the compounds α2 and α3, is taken as a basic framework, 60% or more of the structure of the compound α1 is identical with the basic framework;
the compounds which constitute the compound group α each is mixed in an amount of 1% by weight or larger; and
each of the compounds included in the compound group α is any of the compounds represented by formulae (A-5) and (A-6):

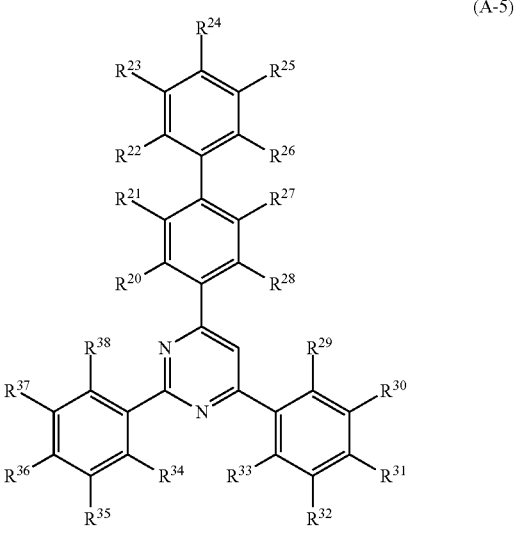
(A-5)

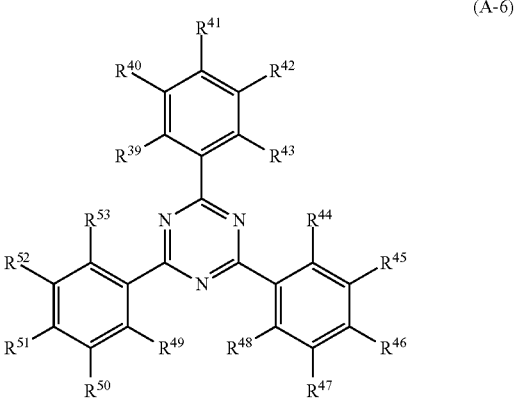
(A-6)

wherein $R^{20}$ to $R^{53}$ each independently represent a hydrogen atom, a nitrogen atom, an oxygen atom, a sulfur atom, an aromatic hydrocarbon ring group which has 6-30 carbon atoms and may have a substituent, or a heteroaromatic ring group which has 3-30 carbon atoms and may have a substituent, with the proviso that when $R^{20}$ to $R^{53}$ each are a nitrogen atom, an oxygen atom, or a sulfur atom, this atom combines with part of an adjoining substituent to form a ring.

* * * * *